United States Patent [19]
Meyer

[11] 4,275,950
[45] Jun. 30, 1981

[54] LIGHT-GUIDE LENS

[76] Inventor: Stanley A. Meyer, U.S. Post Office Tri-Village Station, Columbus, Ohio 43212

[21] Appl. No.: 104,081

[22] Filed: Feb. 4, 1980

[51] Int. Cl.$^3$ ............................ G02B 5/16; F24J 3/02
[52] U.S. Cl. ................................. 350/96.10; 126/440; 126/450; 350/96.18
[58] Field of Search ............... 350/96.10, 96.15, 96.18, 350/96.24, 96.25, 167, 211, 212; 250/227; 126/417, 440, 450, 451

[56] References Cited

U.S. PATENT DOCUMENTS

| | | | |
|---|---|---|---|
| 3,780,722 | 12/1973 | Swet | 350/96.15 |
| 4,026,267 | 5/1977 | Coleman | 126/440 |
| 4,057,048 | 11/1977 | Maine | 350/167 |
| 4,078,548 | 3/1978 | Kapany | 126/440 |
| 4,136,670 | 1/1979 | Davis | 126/450 |

*Primary Examiner*—Stewart J. Levy

[57] ABSTRACT

The light-guide silo collector-concentrator lens is a component assembly of light-guide lenses, comprising of array of light-steering lens embodiments having different refractive index material light-guide semi-transparent and reflective to incident light radiation- to control, focus, or disperse the transmission angle of the light radiation from that of the incident light rays. The component assembly is contoured in a capping relationship over a focusing lens to provide an extremely high concentration of solar energy irrespective of the angle of the sun. The light-guide lenses increase by several orders of magnitude the amount of solar energy striking the surface of the focusing lens. The focusing lens is a plurality of flat surface type of lenses stacked one over the other in spaced relationship and operable to concentrate the solar energy to a central region. Surrounding the perimeter of the plurality of focusing lenses is an array in a "wall" configuration of light-guide lenses similar in construction to the aforesaid capping light-guide lenses. The angle of the reflective surface of the capping lenses and the wall lenses is such to receive and direct to the focusing lenses the maximum amount of incident light radiation at all times of the day or season.

10 Claims, 371 Drawing Figures

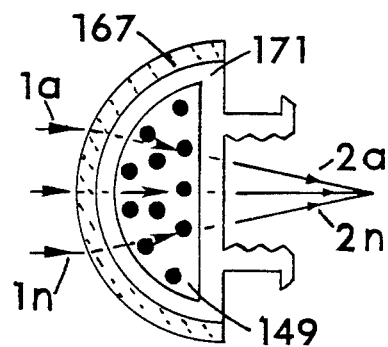
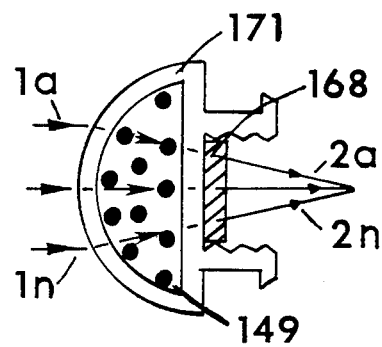
FIG.123  FIG.124
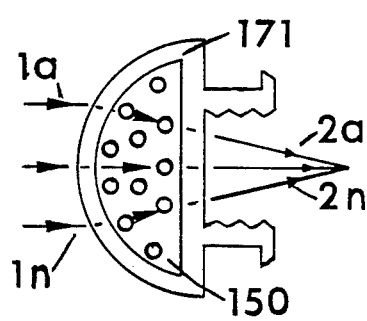
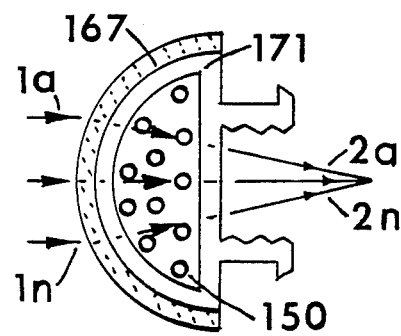
FIG.125  FIG.126
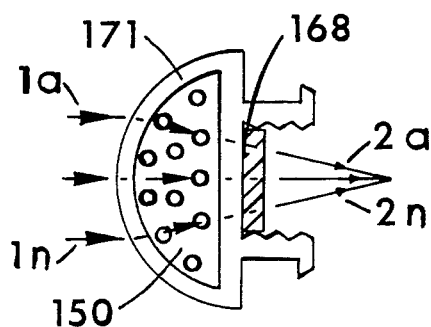
FIG.127

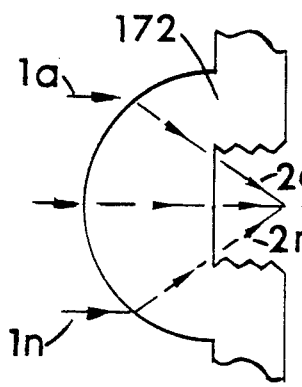
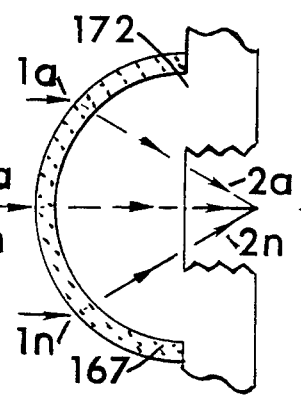
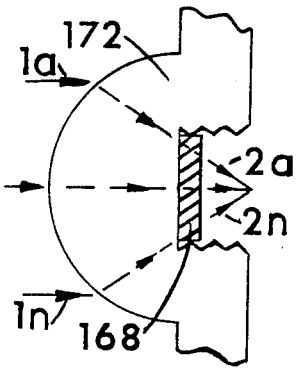
FIG.155  FIG.156  FIG.157
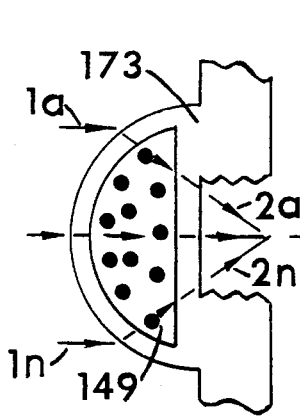
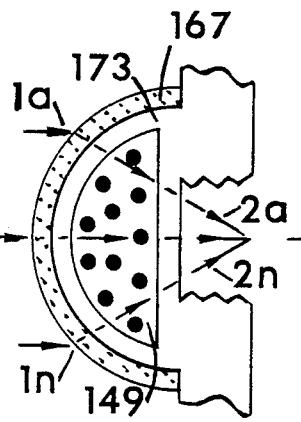
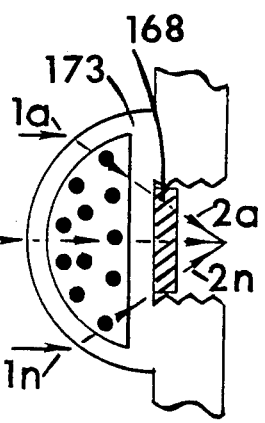
FIG.158  FIG.159  FIG.160
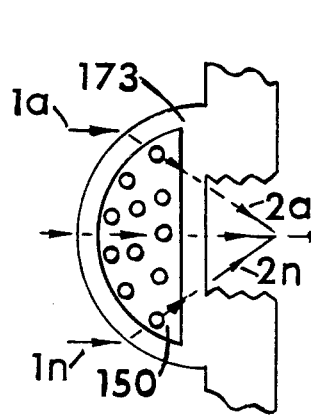
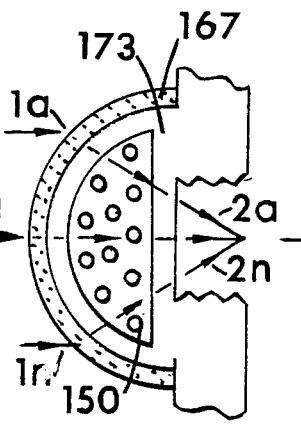
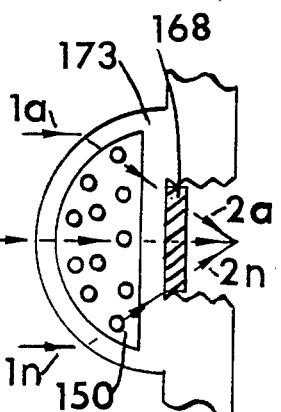
FIG.161  FIG.162  FIG.163

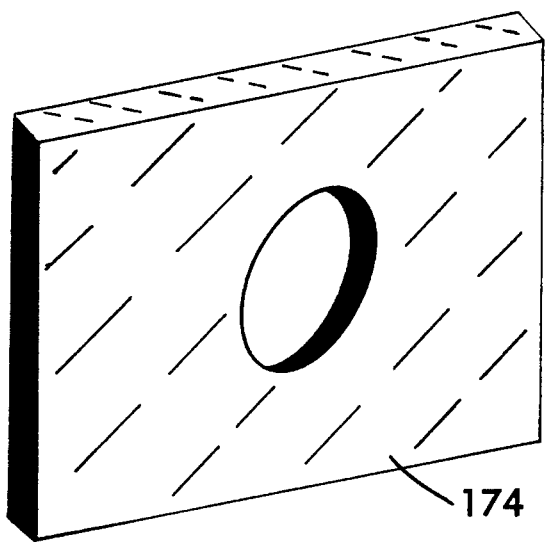
FIG. 227
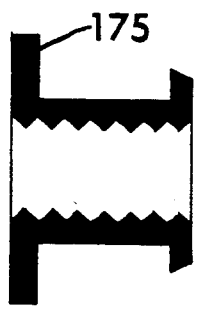 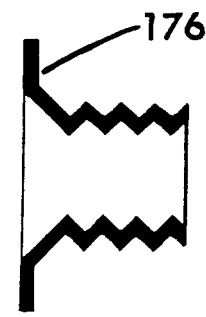
FIG. 228   FIG. 229

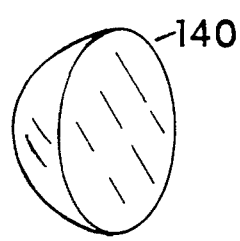
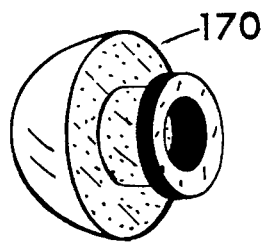
FIG. 294    FIG. 295
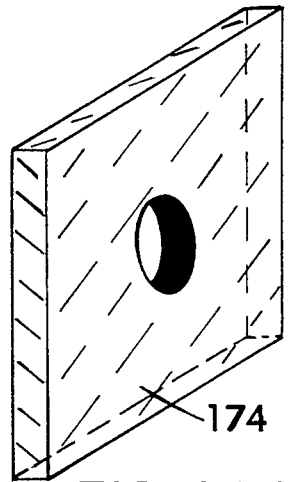
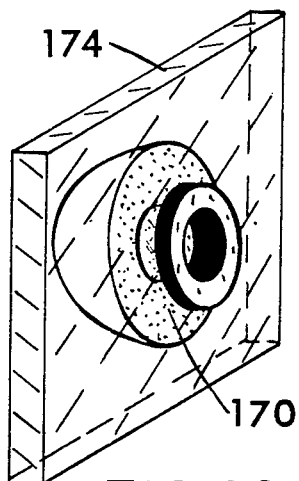
FIG. 296    FIG. 297
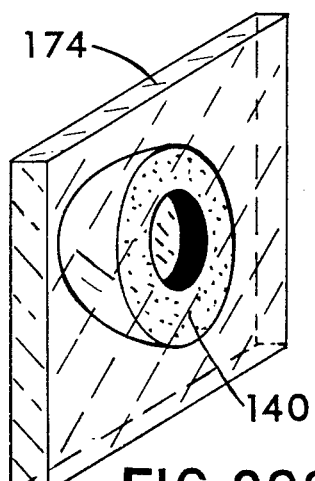
FIG. 299
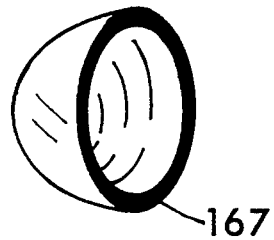
FIG. 298    FIG. 300

LIGHT-GUIDE LENS

BACKGROUND

With the energy crises created by the impact of consumption of non-renewable natural resources, together with a new emphasis in establishing clean-air-standards associated with the usage of such natural resources, a considerable amount of effort has been directed to other forms of energy. Although there are several other forms of energy, the emphasis has been placed on solar energy as the most logical non-polluting recyclable energy source. Consequently there are on the market many so-called solar focusing lenses.

These prior art devices generally comprise a focusing lens that is limited to a scan range of sixty degrees (60°); and, consequently are not capable of varying the effective scan angle while directionally focusing or dispersing the incident light radiation. The bulk of lenses of the various types are designed for use with a single stationary light source whether it be of a single beam or incident light radiation in planar array. Accordingly, the problems encountered with a single light source continuously varying its angular position are not appreciated by the prior art. In those instances where the problem has been encountered efforts have been made to have the lens "follow" the source.

In other instances where the light source is dispersed, the incident light rays upon the lens may be insufficient for practical applications-even when focused. Still, in other lens arrangement the apparatus becomes extremely large, bulky, and of course expensive.

SUMMARY OF INVENTION

The invention comprises in its most general aspects a unitary silo collector-concentrator lens enclosure that houses a combination of light-guide lenses made up of arrays of light-steering lenses that collects, redirects, transfers, and focuses or disperses incident light radiation to a central region irrespective of the angle of the sun during the day or season. The lens system provides a heat source with an extremely larger capacity of high concentration of solar energy and operable to low-angle sun rays for an extended period of time over that of the prior art.

The silo collector - concentrator lens configuration includes an upper or top contoured capping light-guide lens positioned over a first flat-surface focusing lens. Beneath the focusing lens there is positioned in spaced relationship several additional focusing lenses. Surrounding the perimeter of the plurality of focusing lenses is an array, in wall-like arrangement of light-guide lenses similar in embodiment to the flat-surface and capping light-guide focusing lenses. All of the lenses are joined in a unitary structure. Each of the light-guide lenses is made up of a series of light-steering lenses having a focusing lens affixed to one end of a different refractive index material light-guide stem. The light-steering lens embodiments are uniform in size, evenly distributed, and may be linearly or non-linearly alligned.

The light-guide stem, angular or curved configurations, varies in its adaptability to the particular intended use. Fundamentally the light-guide stem is a light transparent area between highly reflective surfaces. The incident light radiation passes uninhibited until it strikes a reflective surface of the low refractive material and is then reflected back and forth for the length of the light-guide stem.

OBJECTS

It is accordingly the principal object of the present invention to provide a new and improved light-guide lens that controls the distribution of incident light radiation emanating from a fixed or variable light source.

It is a further object of the invention to provide a solar energy collector-concentrator that substantially increases the amount of incident solar radiation at all angle of the sun.

Another object of the present invention is to utilize a collector-concentrator lens comprising a contoured upper lens and a plurality of focusing lenses completely surrounded by a wall-like light-guide lenses.

Still another object of the present invention is to provide a lens that controls the concentration or dispersion of the transmitted light from a source displaced at all angles relative to the lens.

Still another object of the present invention is to provide a lens that is relatively simple in principle of operation, inexpensive to manufacture, and that can be designed with ease for a particular application.

Other objects and features of the present invention will become apparent from the following detailed description when taken in conjunction with the drawings in which:

BRIEF DESCRIPTION OF DRAWINGS

FIG. 123 Illustrates schematically a side view cross-section of a filter coated curved-surface transparent thin-walled material light transmittal gas filled grip-lock collar lens-cap structure combined with light dispersing means and their effect upon the projected light beams.

FIG. 124 Illustrates schematically a side view cross-section of a filter coated flat-surface transparent thin-walled material light transmittal gas filled grip-lock collar lens-cap structure combined with light dispersing means and their effect upon the projected light beams.

FIG. 125 Illustrates schematically a side view cross-section of a transparent thin-walled light transmittal liquid filled grip-lock collar lens-cap structure combined with light dispersing means and their effect upon the projected light beams.

FIG. 126 Illustrates schematically a side view cross-section of a filter coated curved-surface transparent thin-walled material light transmittal liquid filled grip-lock collar lens-cap structure combined with light dispersing means and their effect upon the projected light beams.

FIG. 127 Illustrates schematically a side view cross-section of a filter coated flat-surface transparent thin-walled material light transmittal liquid filled grip-lock collar lens-cap structure combined with light dispersing means and their effect upon the projected light beams.

FIG. 155 Illustrates schematically a side view cross-section of a transparent solid material matrix lens-cap structure in its simplest form combined with light dispersing means and their effect upon the projected light beams.

FIG. 156 Illustrates schematically a side view cross-section of a filter coated curved-surface transparent solid material matrix lens-cap structure combined with light dispersing means and their effect upon the projected light beams.

FIG. 157 Illustrates schematically a side view cross-section of a filter coated flat-surface transparent solid material matrix lens-cap structure combined with light dispersing means and their effect upon the projected light beams.

FIG. 158 Illustrates schematically a side view cross-section of a transparent thin-walled material light transmittal gas filled matrix lens-cap structure combined with light dispersing means and their effect upon the projected light beams.

FIG. 159 Illustrates schematically a side view cross-section of a filter coated curved-surface transparent thin-walled material light transmittal gas filled matrix lens-cap structure combined with light dispersing means and their effect upon the projected light beams.

FIG. 160 Illustrates schematically a side view cross-section of a filter coated flat-surface transparent thin-walled material light transmittal gas filled matrix lens-cap structure combined with light dispersing means and their effect upon the projected light beams.

FIG. 161 Illustrates schematically a side view cross-section of a transparent thin-walled material light transmittal liquid filled matrix lens-cap structure combined with light dispersing means and their effect upon the projected light beams.

FIG. 162 Illustrates schematically a side view cross-section of a filter coated curved-surface transparent thin-walled material light transmittal liquid filled matrix lens-cap structure combined with light dispersing means and their effect upon the projected light beams.

FIG. 163 Illustrates schematically a side view cross-section of a filter coated flat-surface transparent thin-walled material light transmittal liquid filled matrix lens-cap structure combined with light dispersing means and their effect upon the projected light beams.

Figure 224:
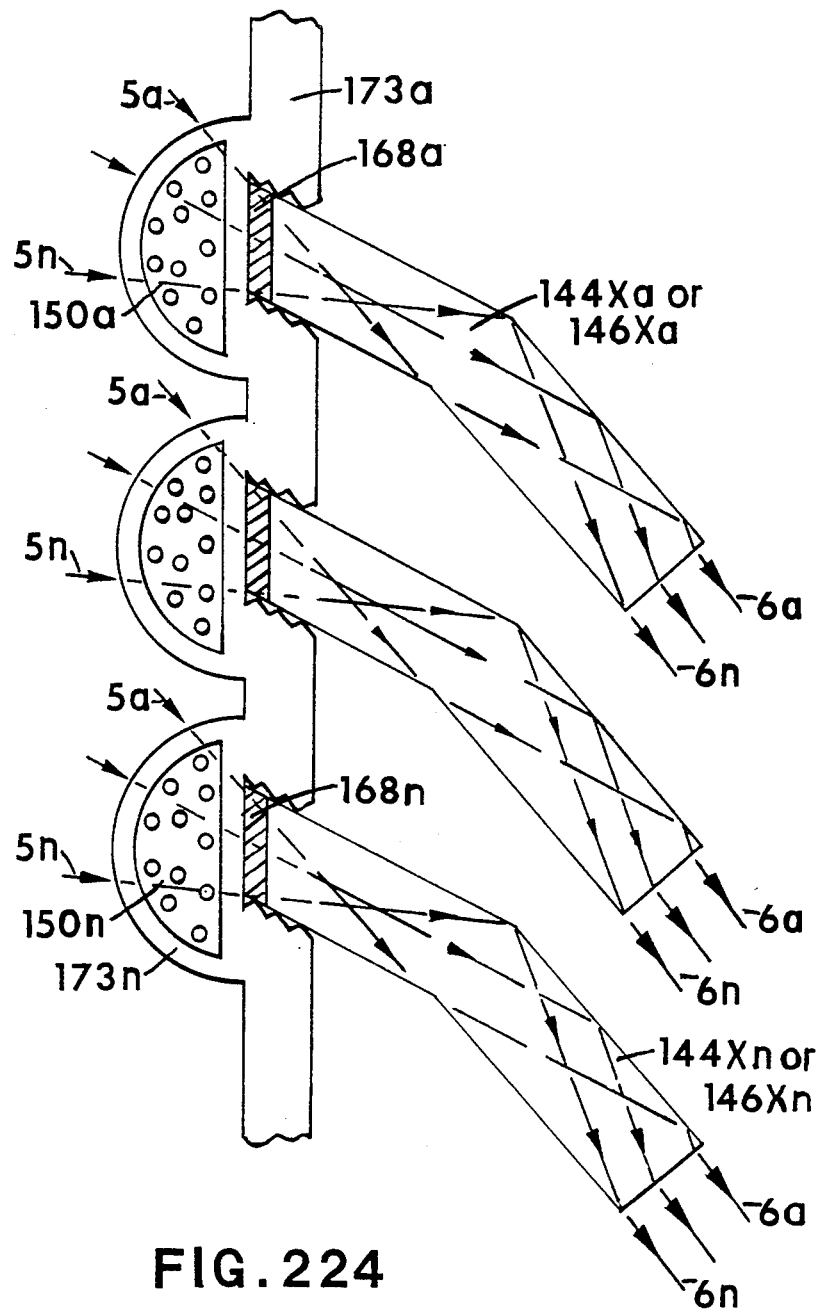
Figure 225:
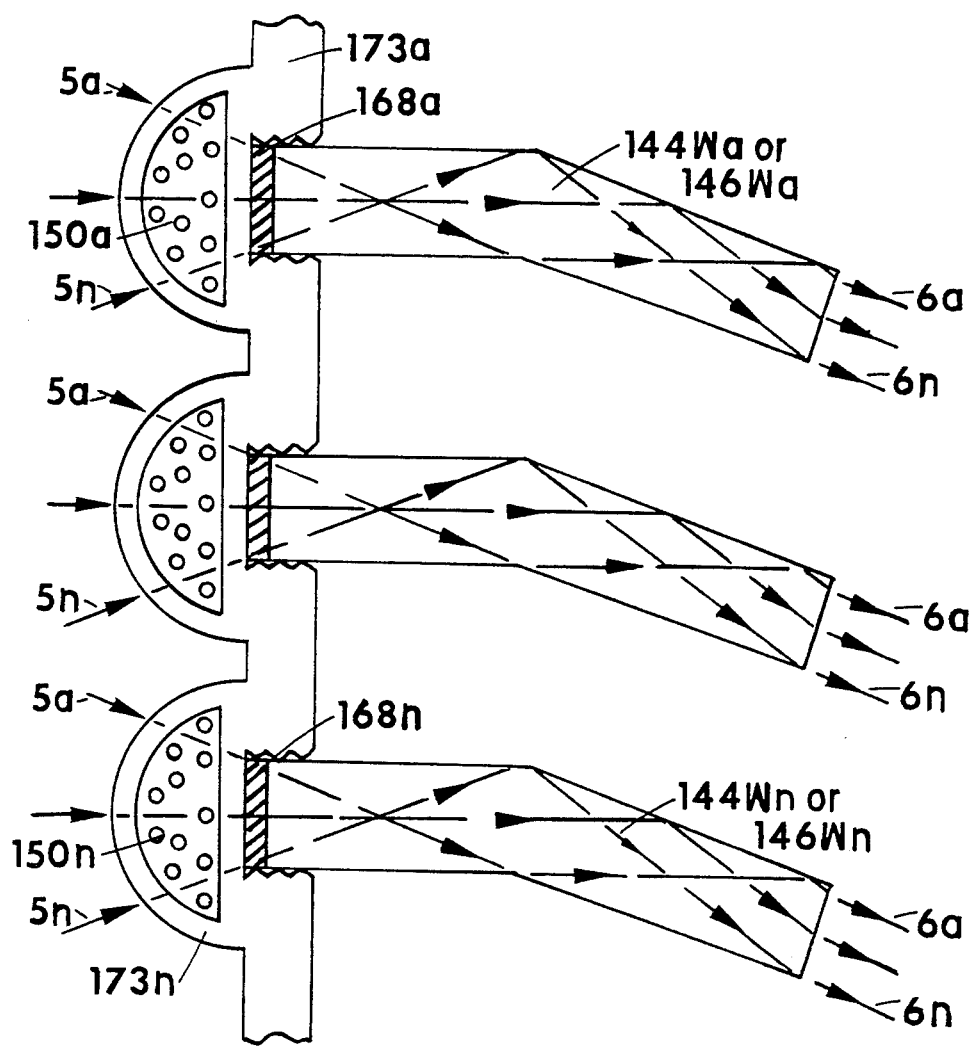
Figure 226:
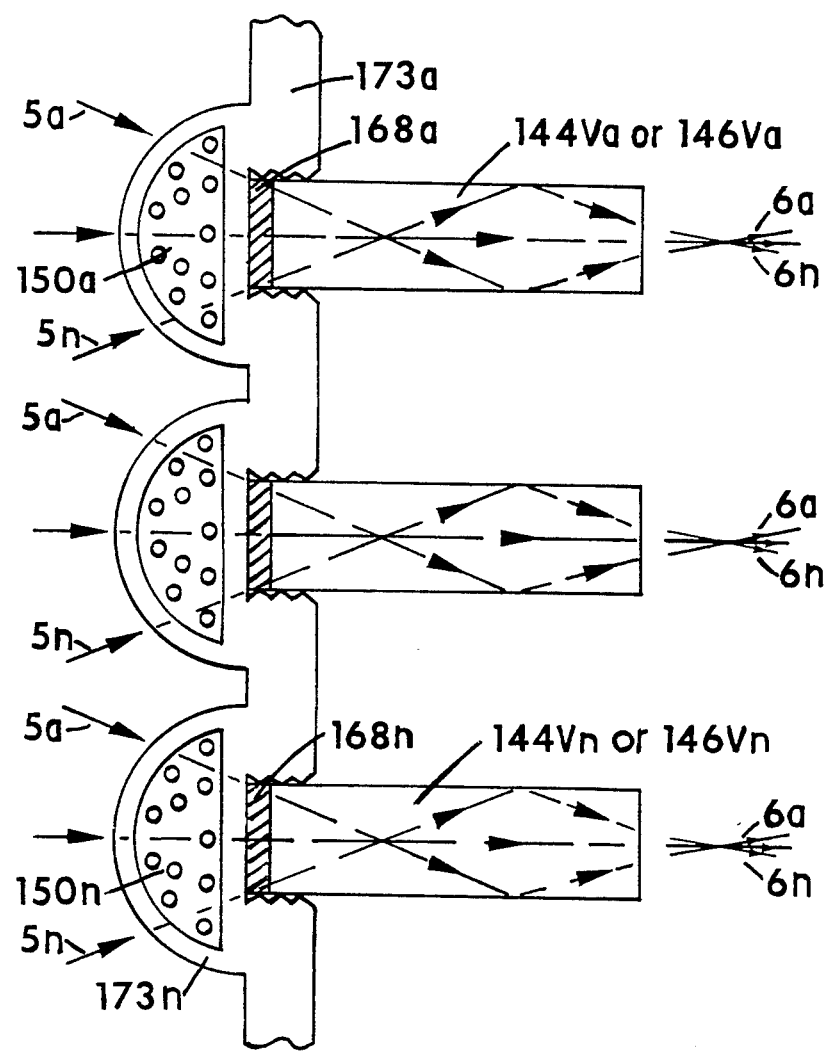

FIGS. 224, 225, and 226 Illustrates schematically a side view cross-section of an array of filter coated flat-surface transparent thin-walled material light transmittal liquid filled matrix lens-cap modular assembled light-steering lens embodiment combined with light dispersing means and their effect upon the projected light beams.

FIG. 227 Illustrates a overall view configuration of a lens-plate structure in its simplest form.

FIG. 228 Illustrates schematically a side view cross-section of a snap-lock gripping collar in its simplest form.

FIG. 229 Illustrates schematically a side view cross-section of a matrix lens-cap grip-lock collar in its simplest form.

Figure 230:
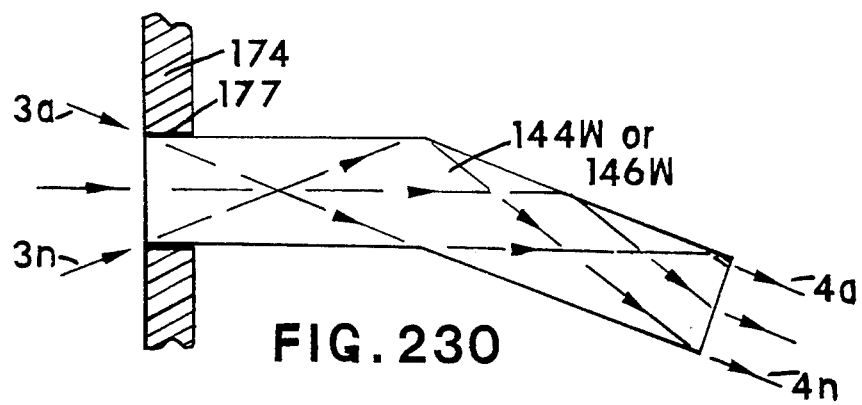
Figure 231:
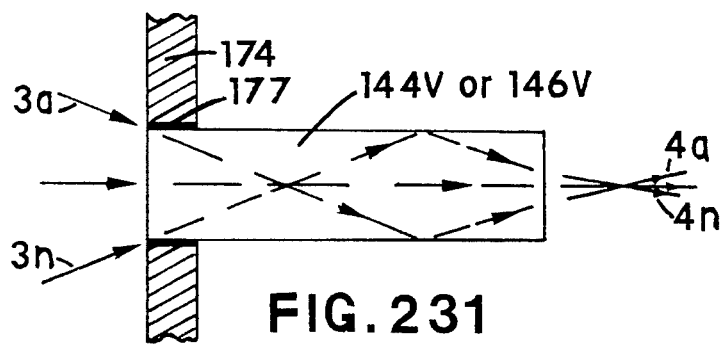
Figure 232:
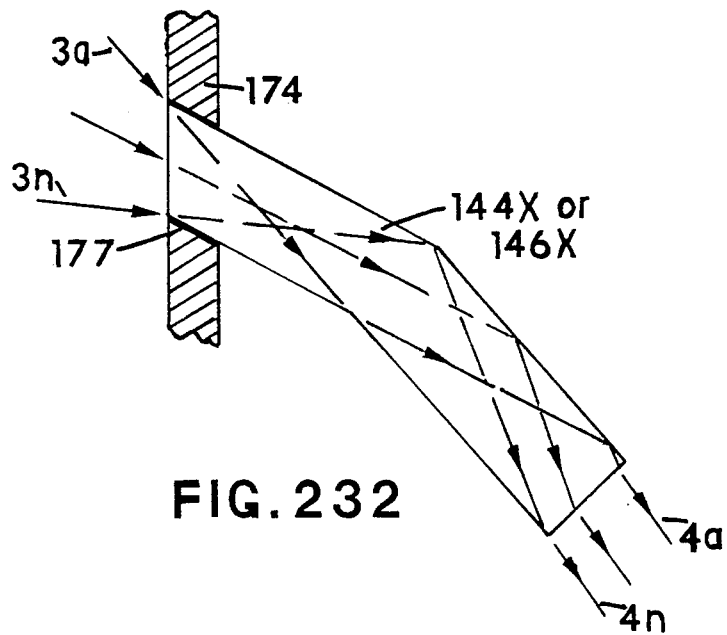

FIGS. 230, 231, and 232 Illustrates schematically a side view cross-section of a non-removable light-guide stem lens-plate modular assembled light-guide lens embodiment in its simplest form combined with light dispersing means and their effect upon the projected light beams.

Figure 233:
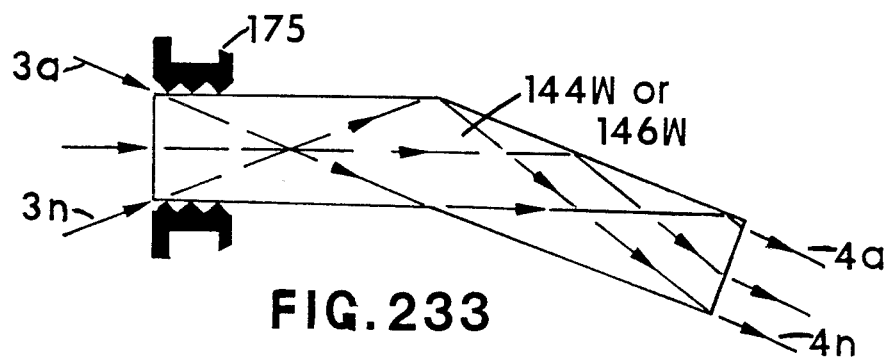
Figure 234:
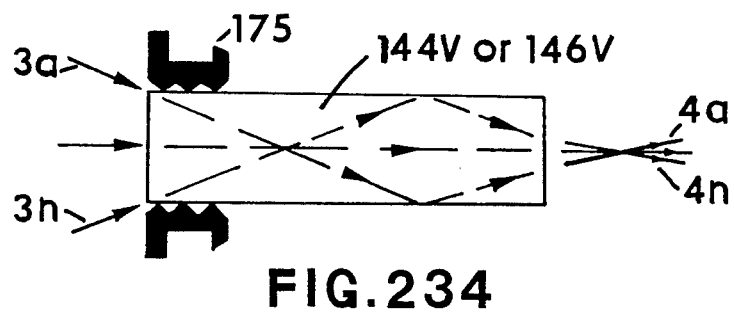
Figure 235:
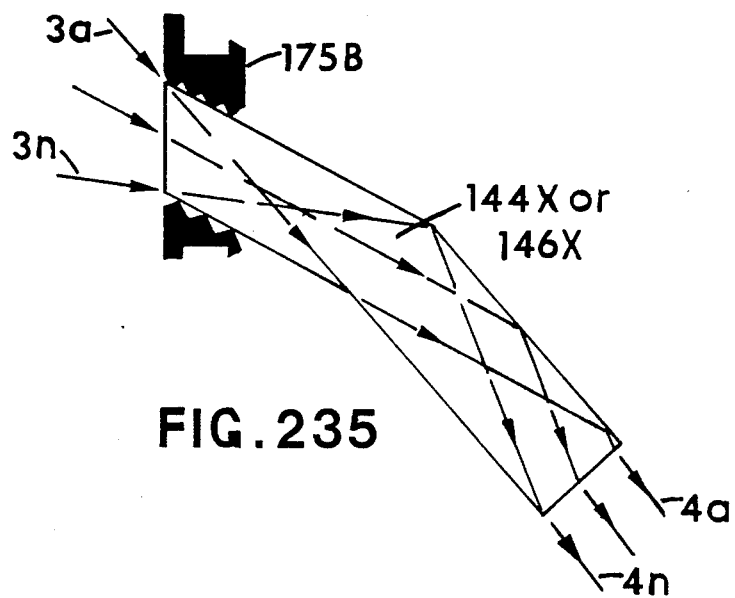

FIGS. 233, 234, and 235 Illustrates schematically a side view cross-section of a removable snap-lock gripping collar light-guide stem embodiment in its simplest form combined with light dispersing means and their effect upon the projected light beams.

Figure 236:
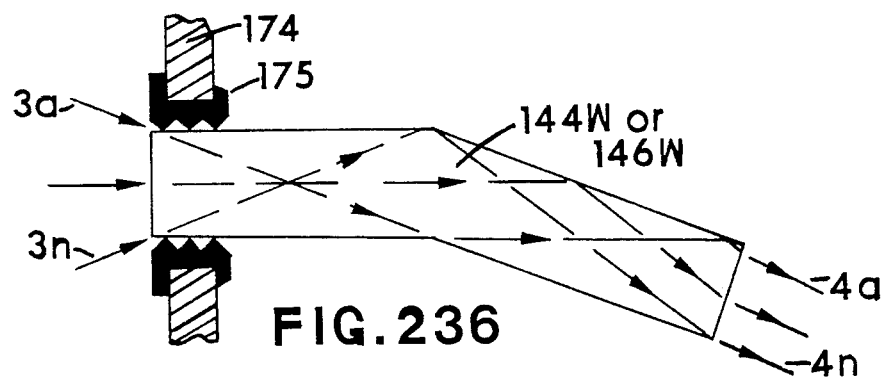
Figure 237:
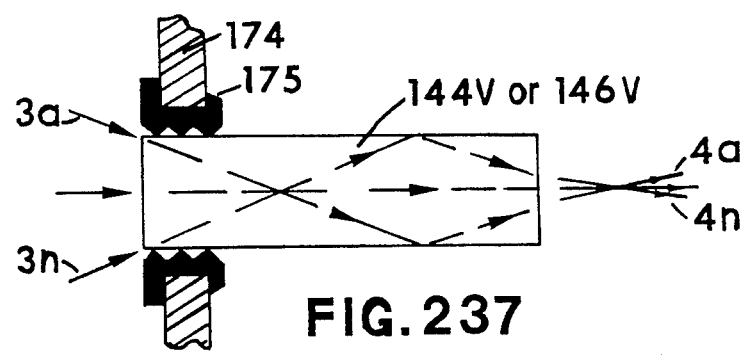
Figure 238:
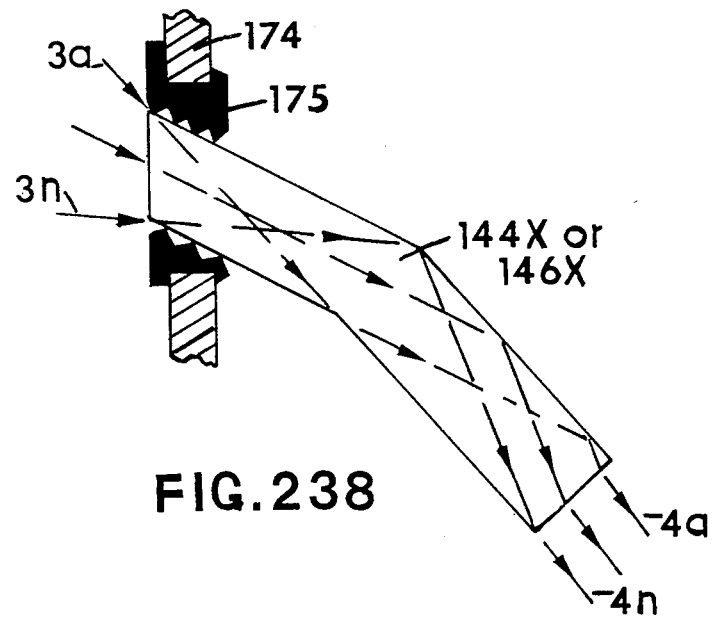

FIGS. 236, 237, and 238 Illustrates schematically a side view cross-section of a removable snap-lock gripping collar light-guide stem lens-plate modular assembled light-guide lens embodiment in its simplest form combined with light dispersing means and their effect upon the projected light beams.

Figure 239:
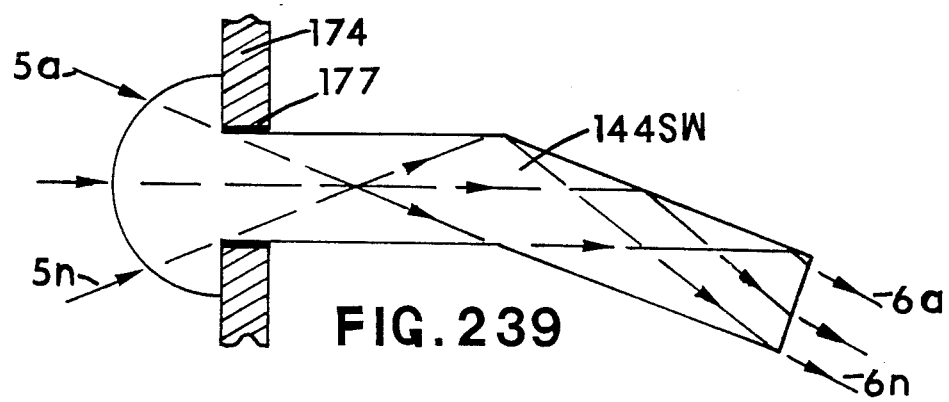
Figure 240:
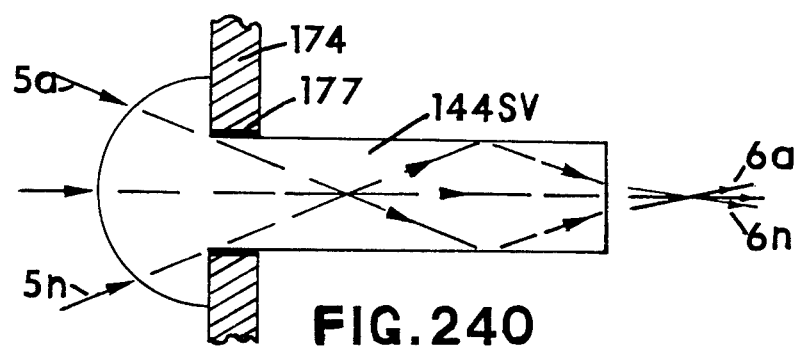
Figure 241:
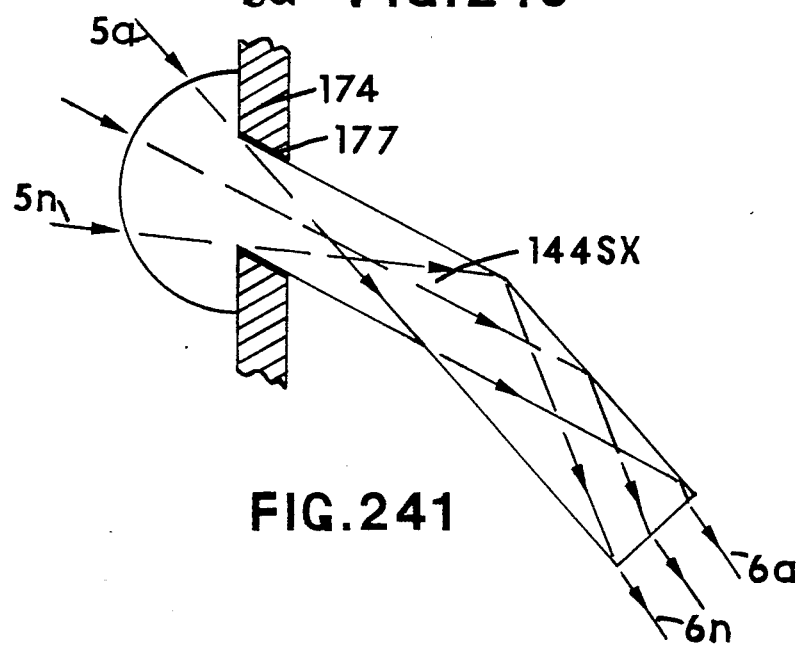

FIGS. 239, 240, and 241 Illustrates schematically a side view cross-section of a non-removable light-steering lens lens-plate modular assembled light-guide lens embodiment in its simplest form combined with light dispersing means and their effect upon the projected light beams.

Figure 242:
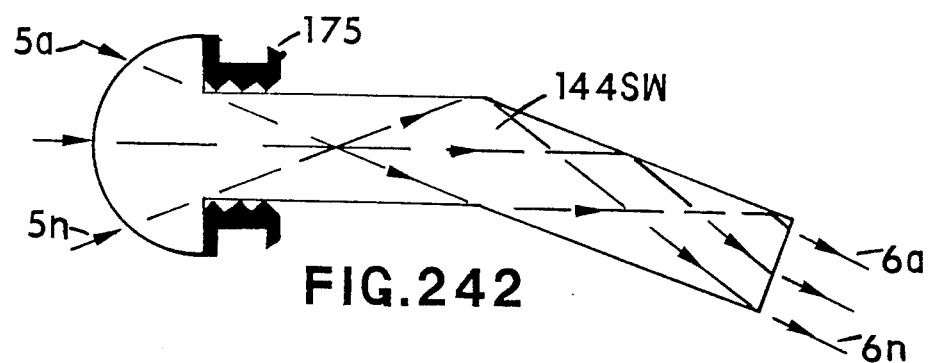
Figure 243:
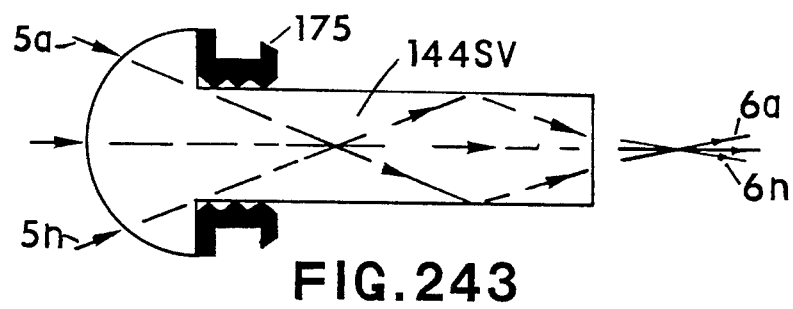
Figure 244:
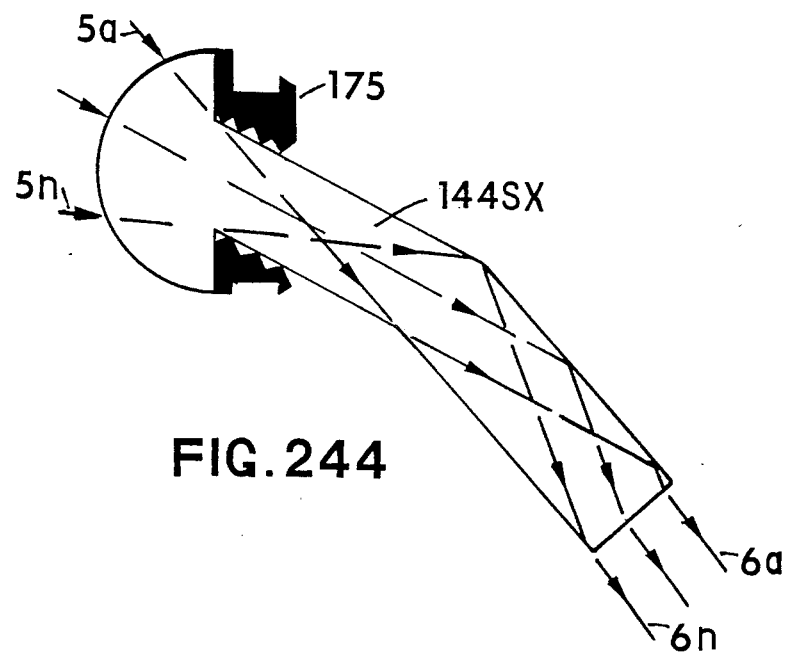

FIGS. 242, 243, 244 Illustrates schematically a side view cross-section of a removable snap-lock gripping collar light-steering lens embodiment in its simplest form combined with light dispersing means and their effect upon the projected light beams.

Figure 245:
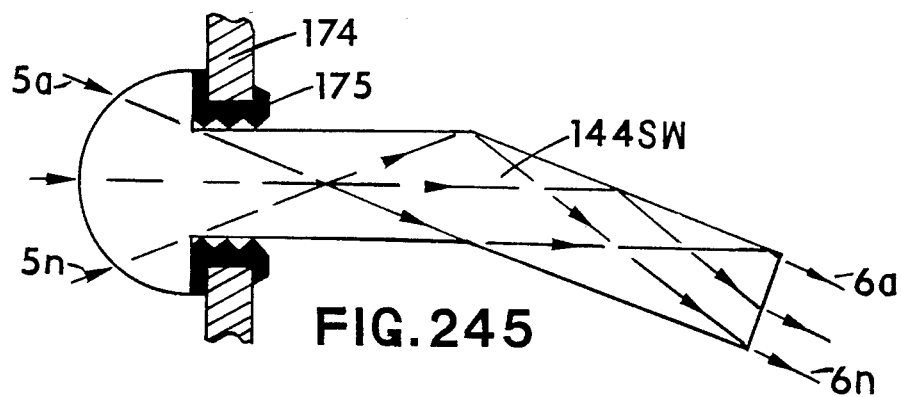
Figure 246:
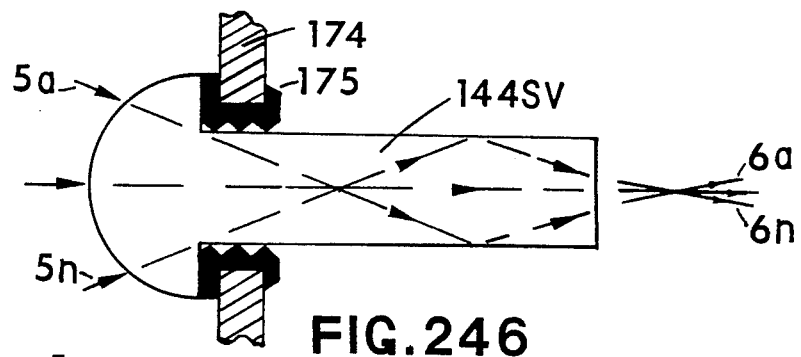
Figure 247:
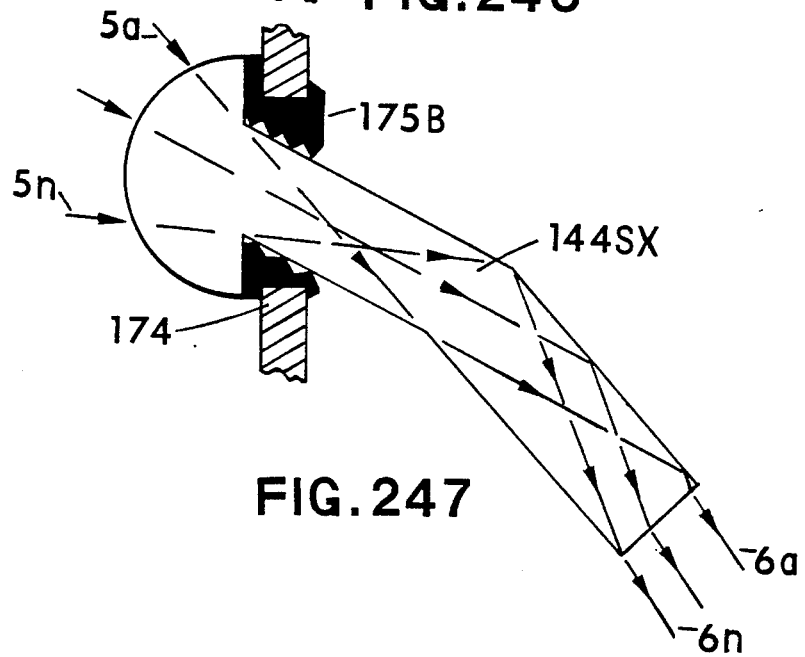

FIGS. 245, 246, and 247 Illustrates schematically a side view cross-section of a removable snap-lock gripping collar light-steering lens lens-plate modular assembled light-guide lens embodiment combined with light dispersing means and their effect upon the projected light beams.

Figure 248:
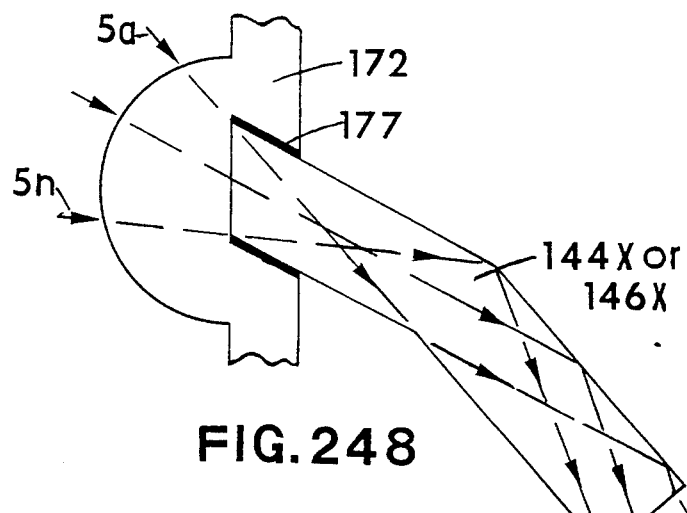
Figure 249:
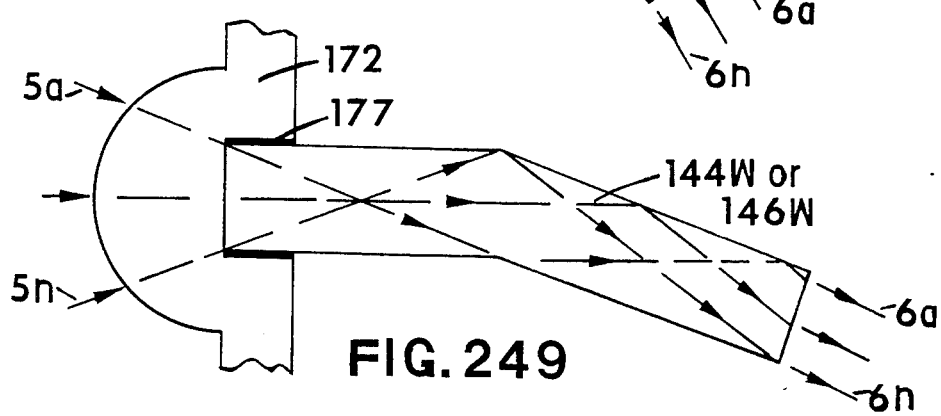
Figure 250:
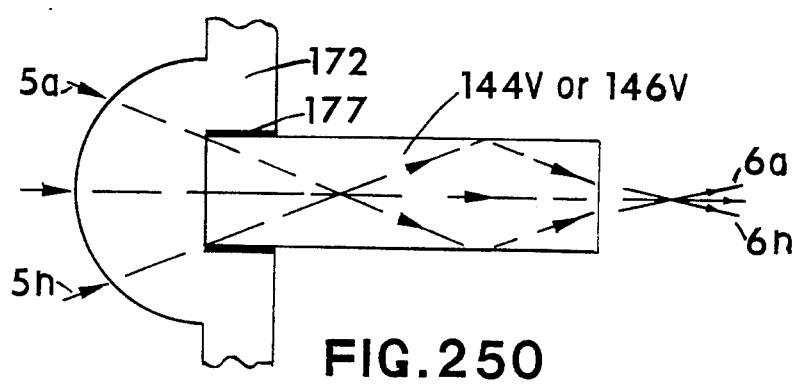

FIGS. 248, 249, and 250 Illustrates schematically a side view cross-section of a non-removable matrix lens-cap light-guide stem modular assembled light-guide lens embodiment combined with light dispersing means and their effect upon the projected light beams.

Figure 251:
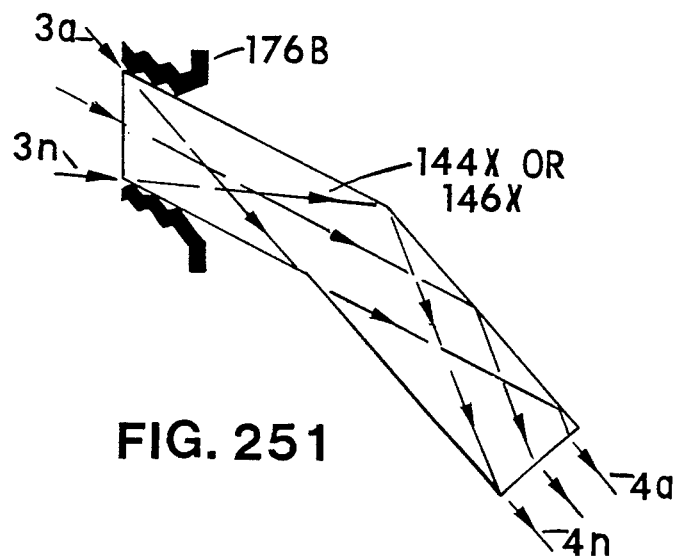
Figure 252:
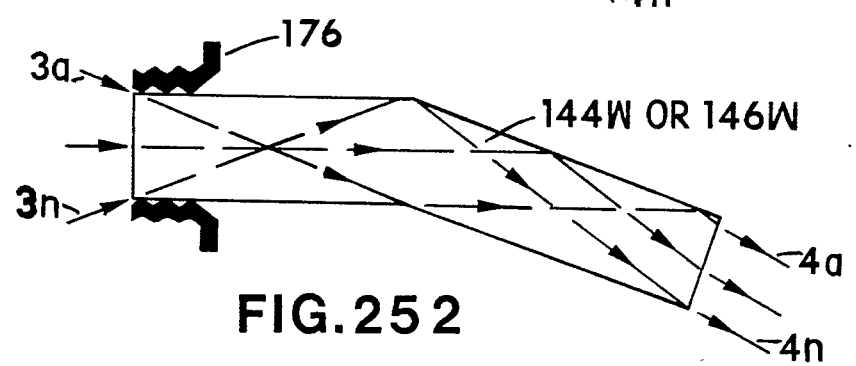
Figure 253:
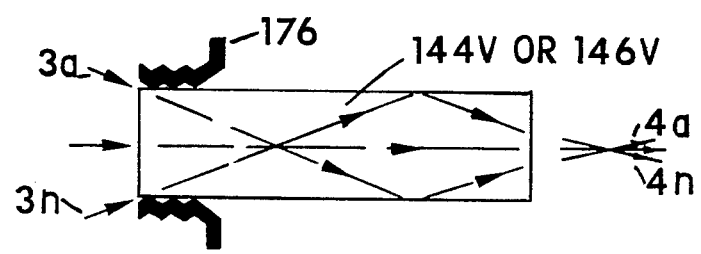

FIGS. 251, 252, and 253 Illustrates schematically a side view cross-section of a removable matrix lens-cap grip-lock collar light-guide stem embodiment in its simplest form combined with light dispersing means and their effect upon the projected light beams.

Figure 254:
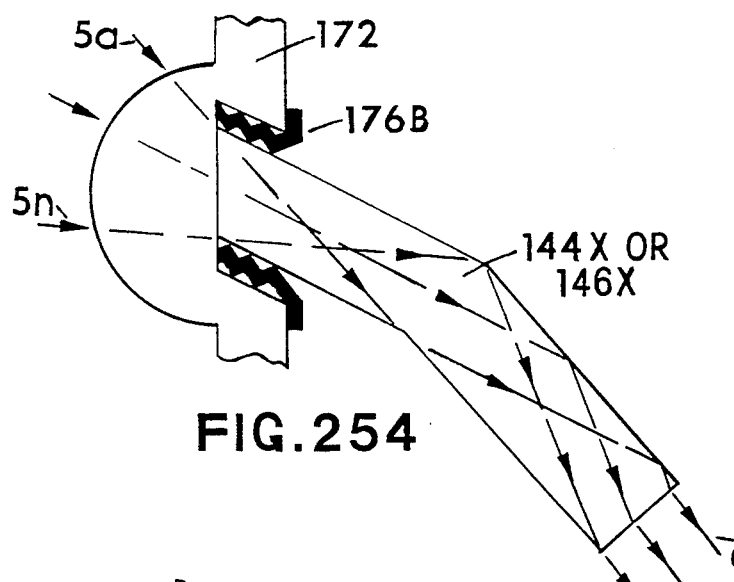
Figure 255:
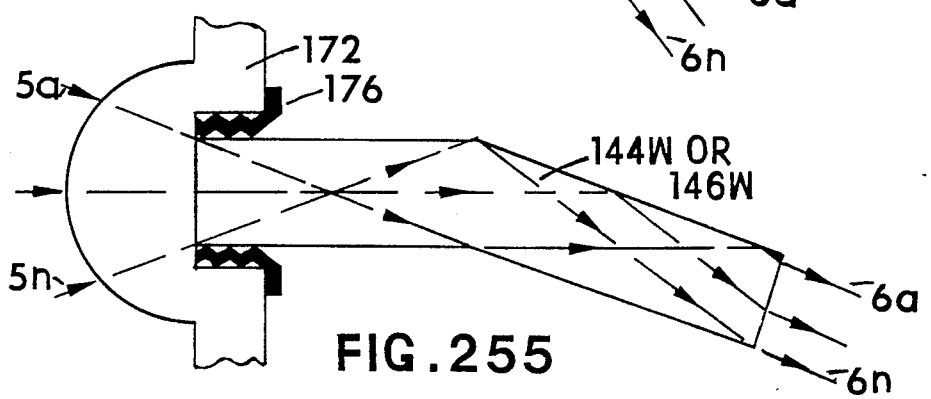
Figure 256:
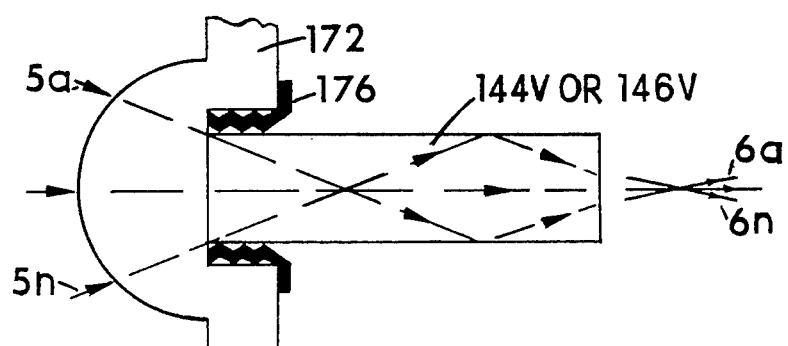

FIGS. 254, 255, and 256 Illustrates schematically a side view cross-section of a removable grip-lock collar light-guide stem matrix lens-cap modular assembled light-guide lens embodiment combined with light dispersing means and their effect upon the projected light beams.

Figure 257:
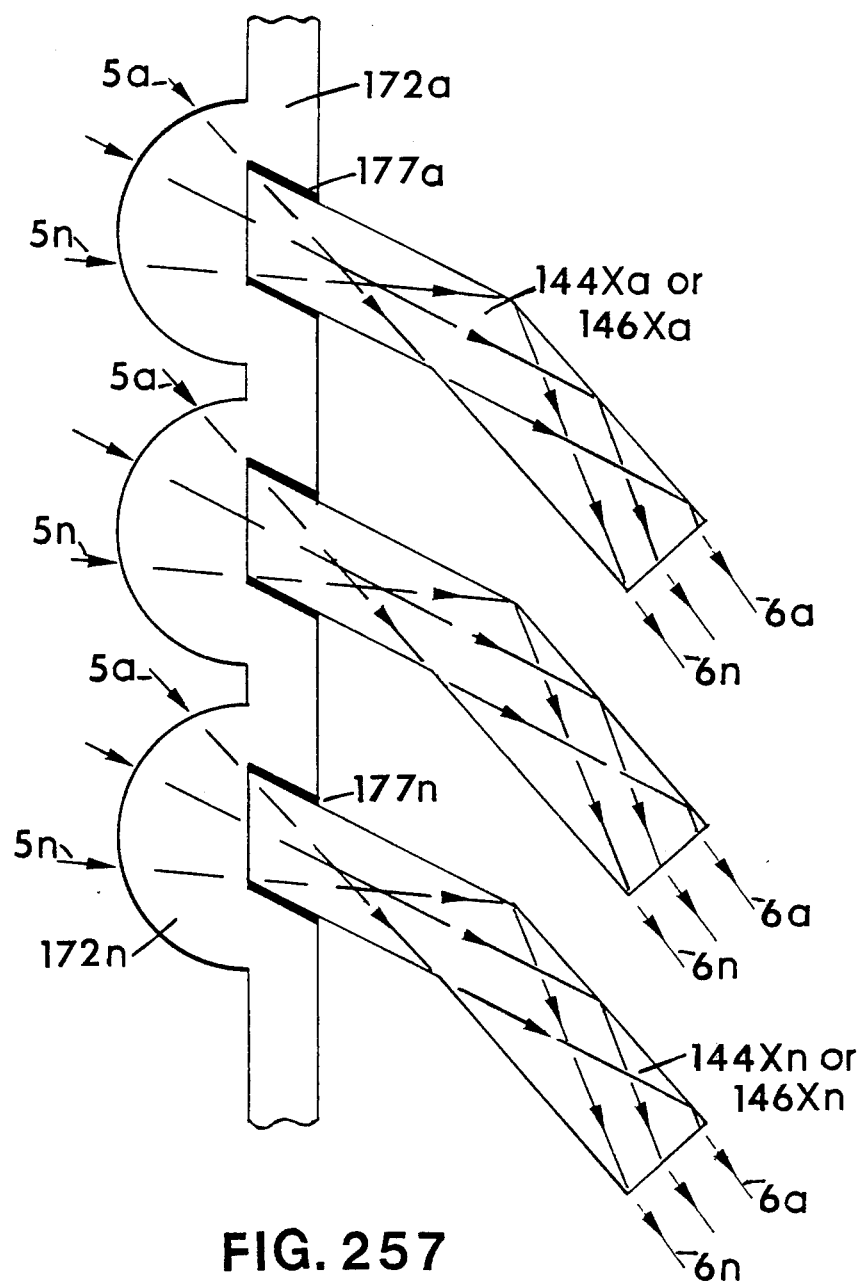
Figure 259:
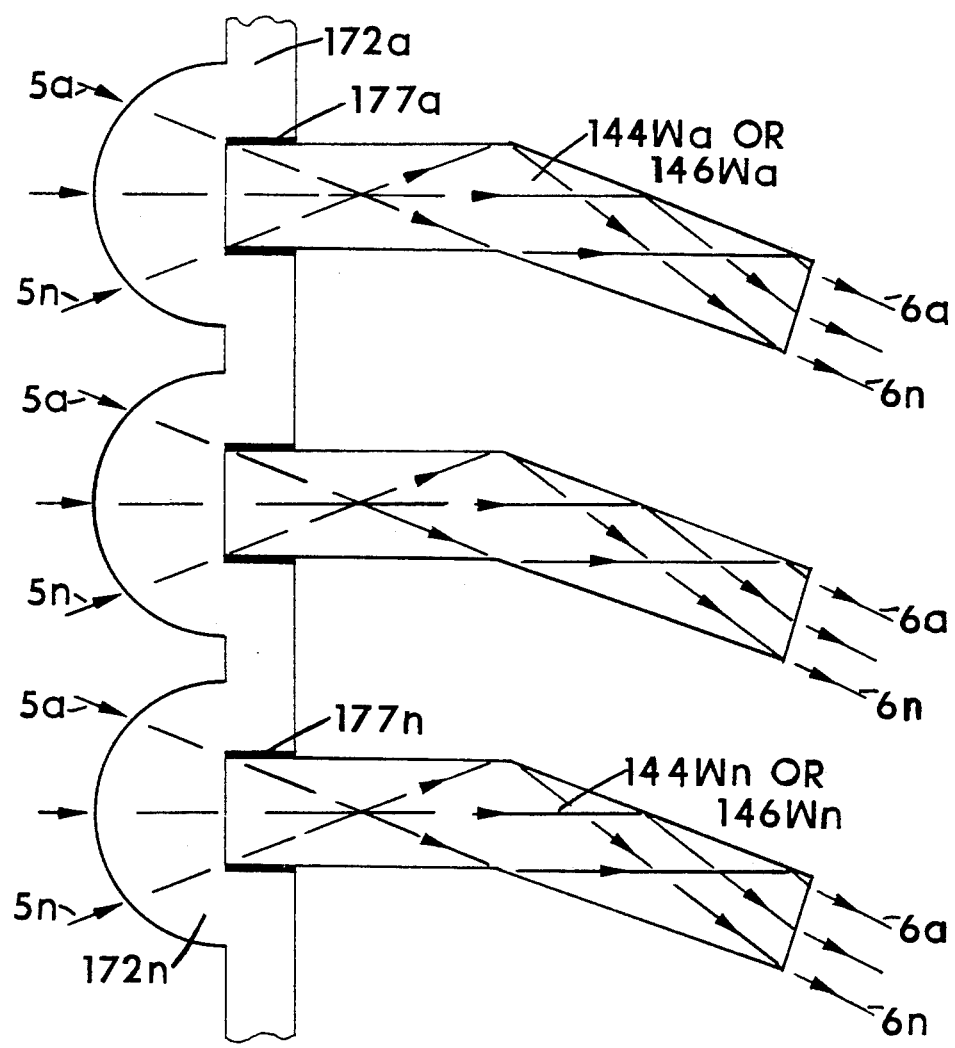
Figure 261:
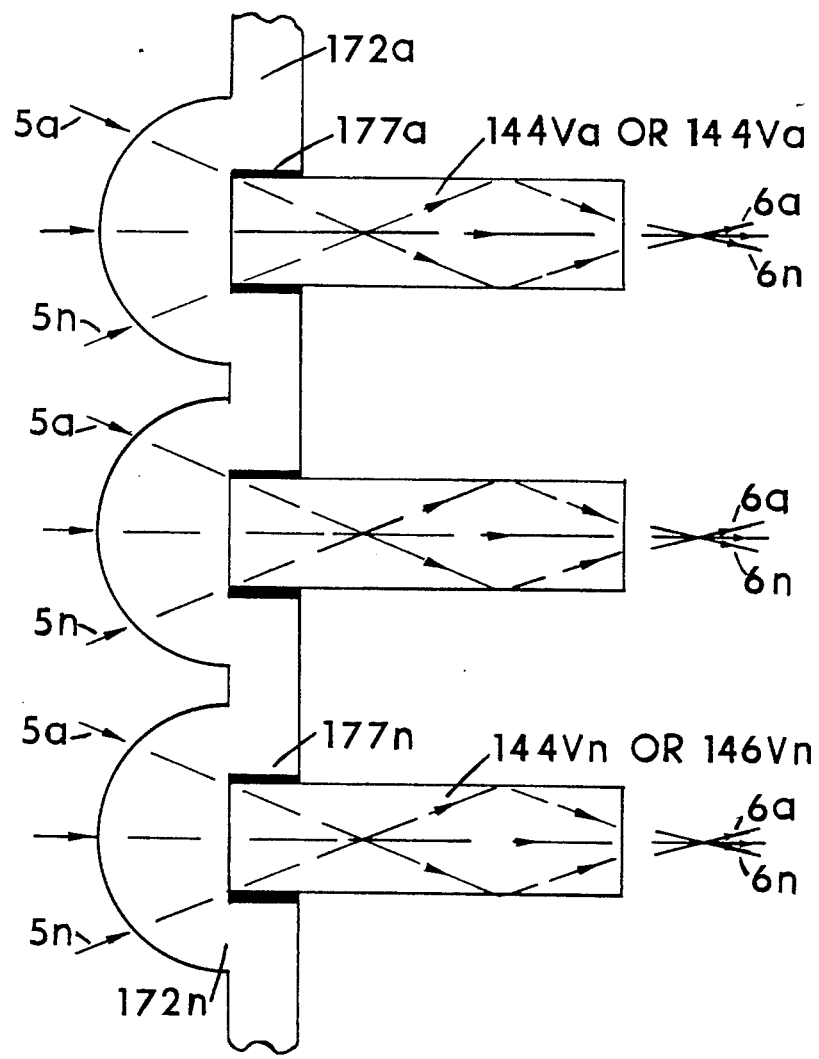

FIGS. 257, 259, and 261 Illustrates schematically a side view cross-section of a non-removable unitary array matrix lens-cap light-guide stem modular assembled light-guide lens embodiment combined with light dispersing means and their effect upon the projected light beams.

Figure 258:
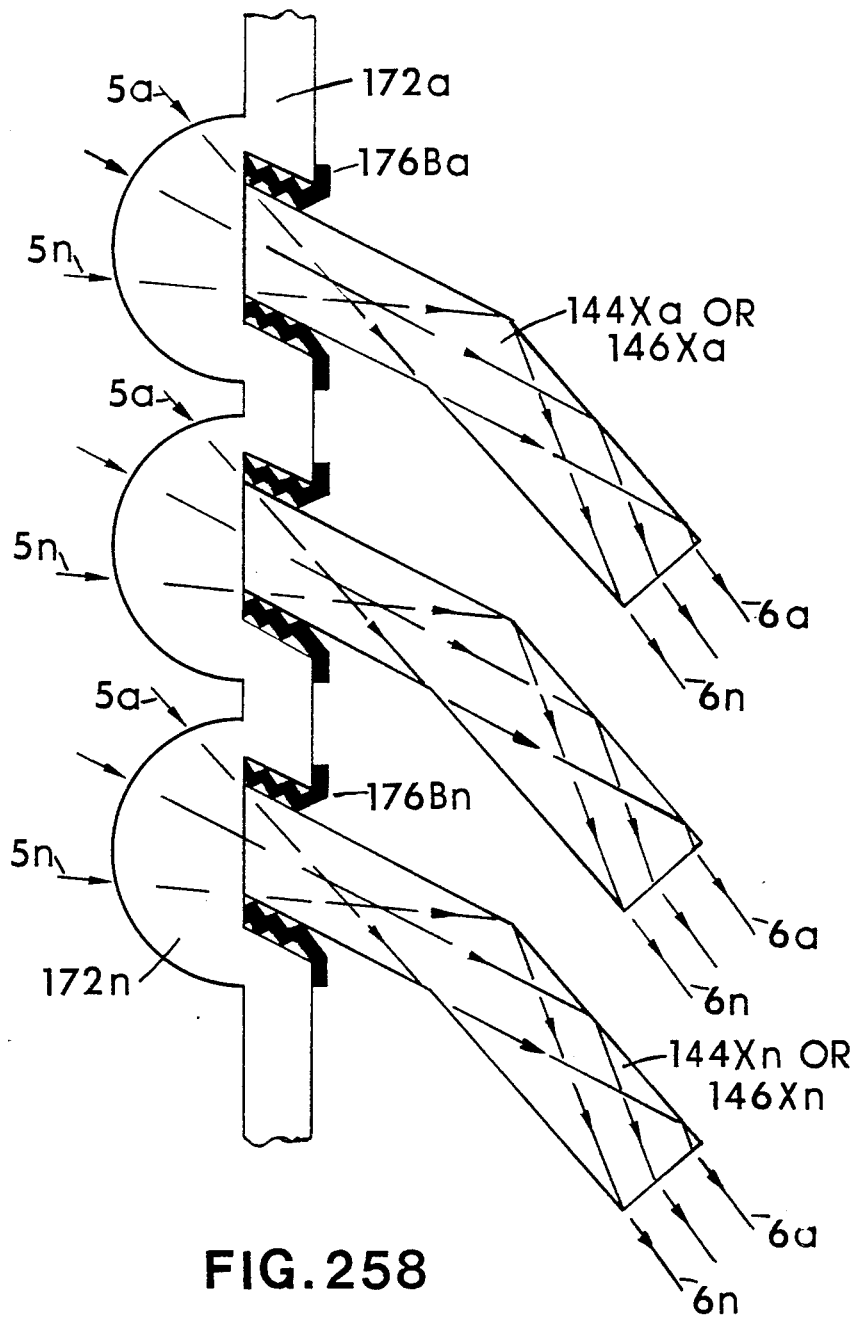
Figure 260:
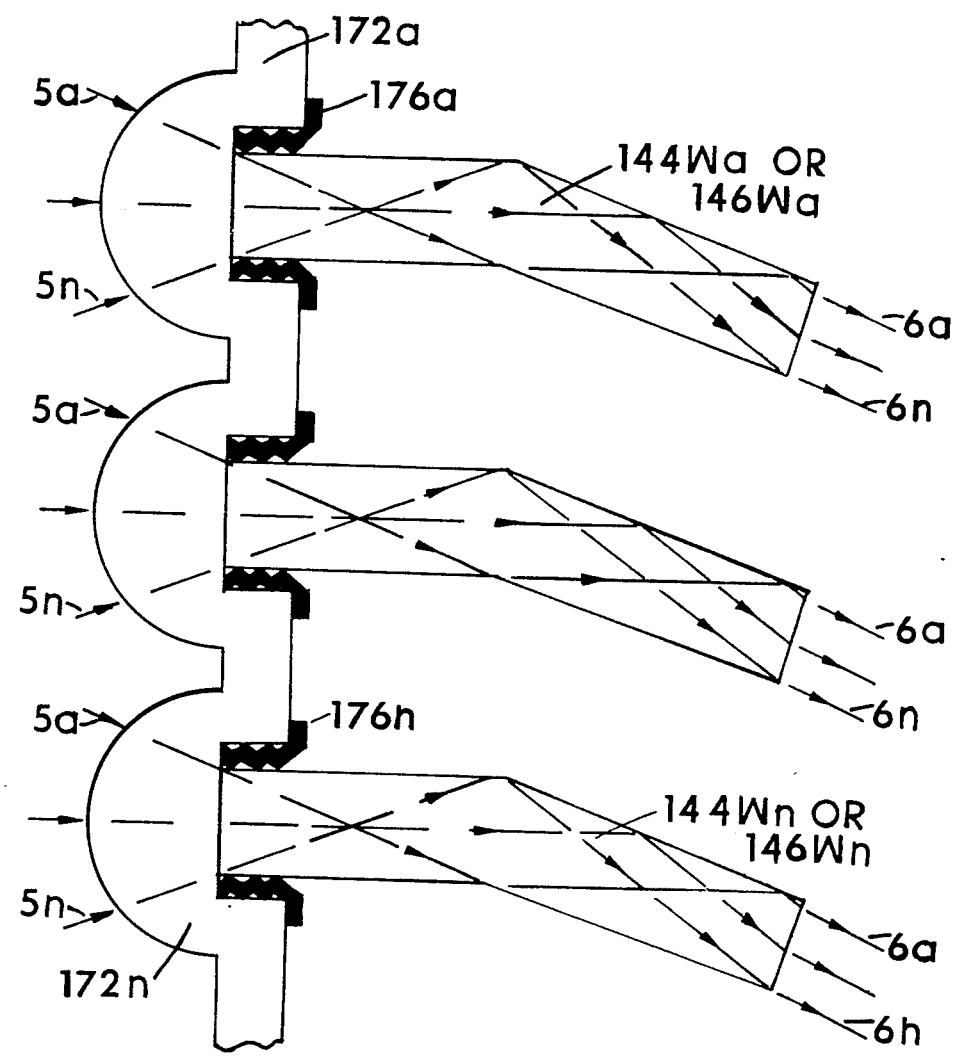
Figure 262:
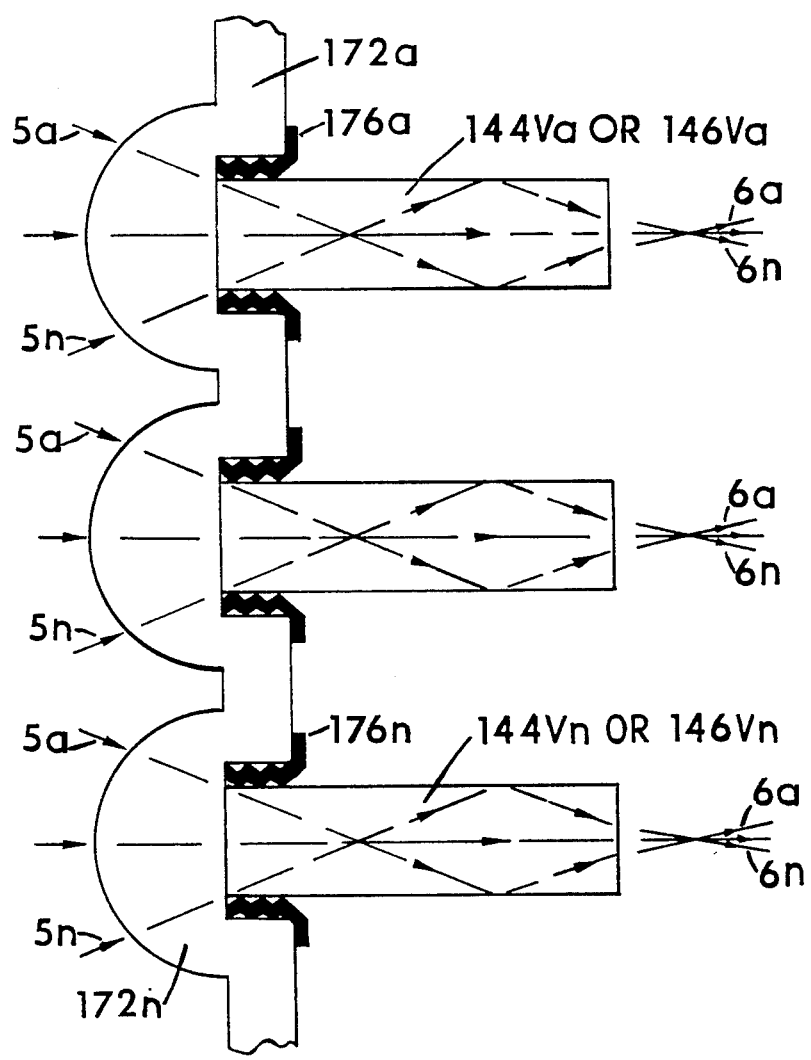

FIGS. 258, 260, and 262 Illustrates schematically a side view cross-section of a removable unitary array matrix lens-cap light-guide stem modular assembled light-guide lens embodiment combined with light dispersing means and their effect upon the projected light beams.

Figure 263:
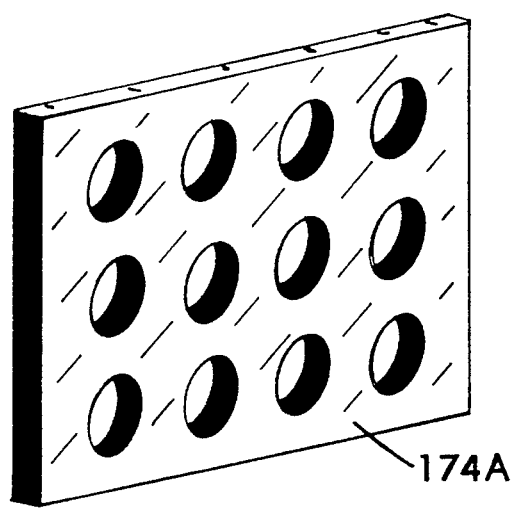

FIG. 263 Illustrates an overall view configuration of an inline hole spacing matrix lens-plate.

Figure 264:
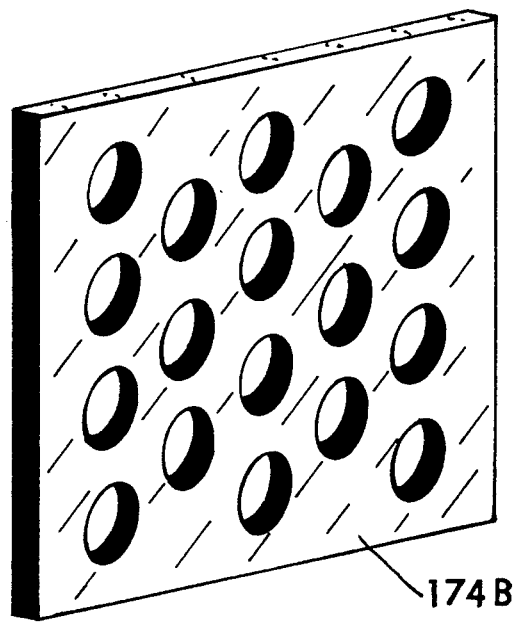
Figure 265:
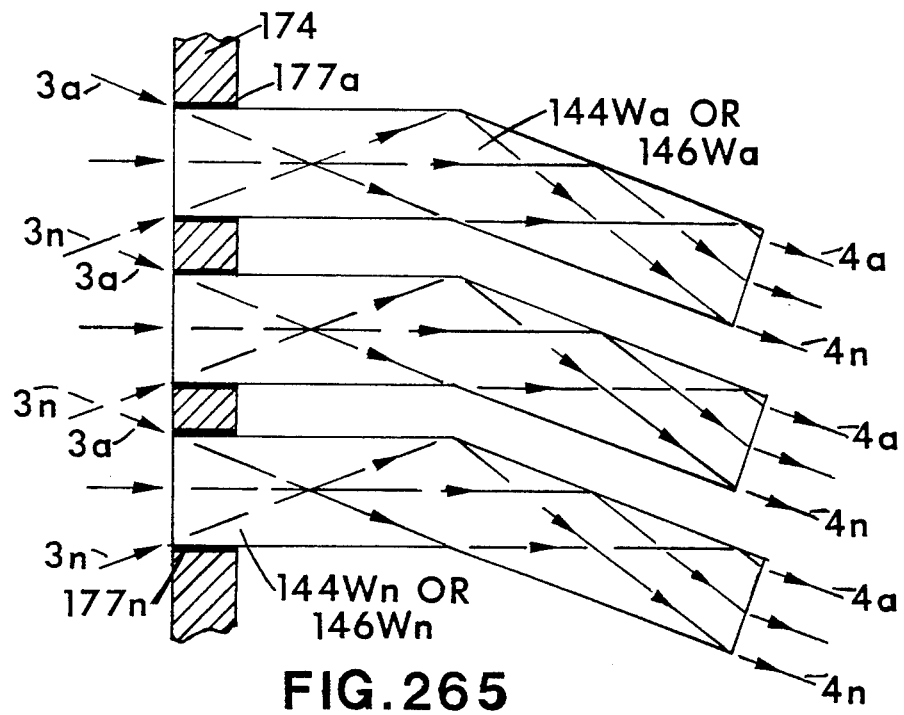
Figure 266:
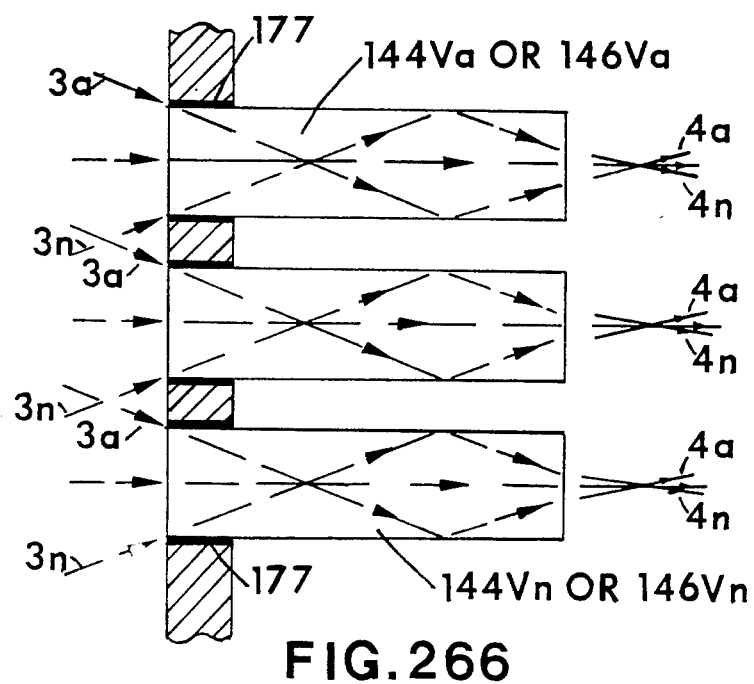
Figure 267:
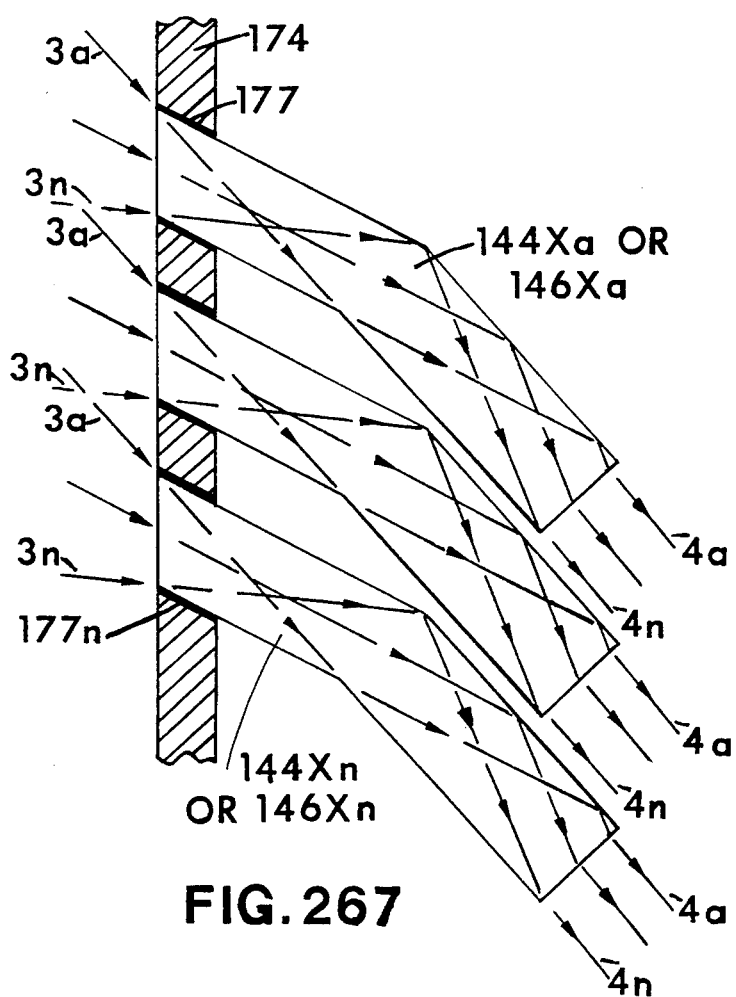

FIG. 264 Illustrates an overall view configuration of an alternate hole spacing matrix lens-plate. FIGS. 265, 266, and 267 Illustrates schematically a side view cross-section of a unitary array of non-removable light-guide stem lens-plate modular assembled light-guide lens embodiment combined with light dispersing means and their effect upon the projected light beams.

Figure 268:
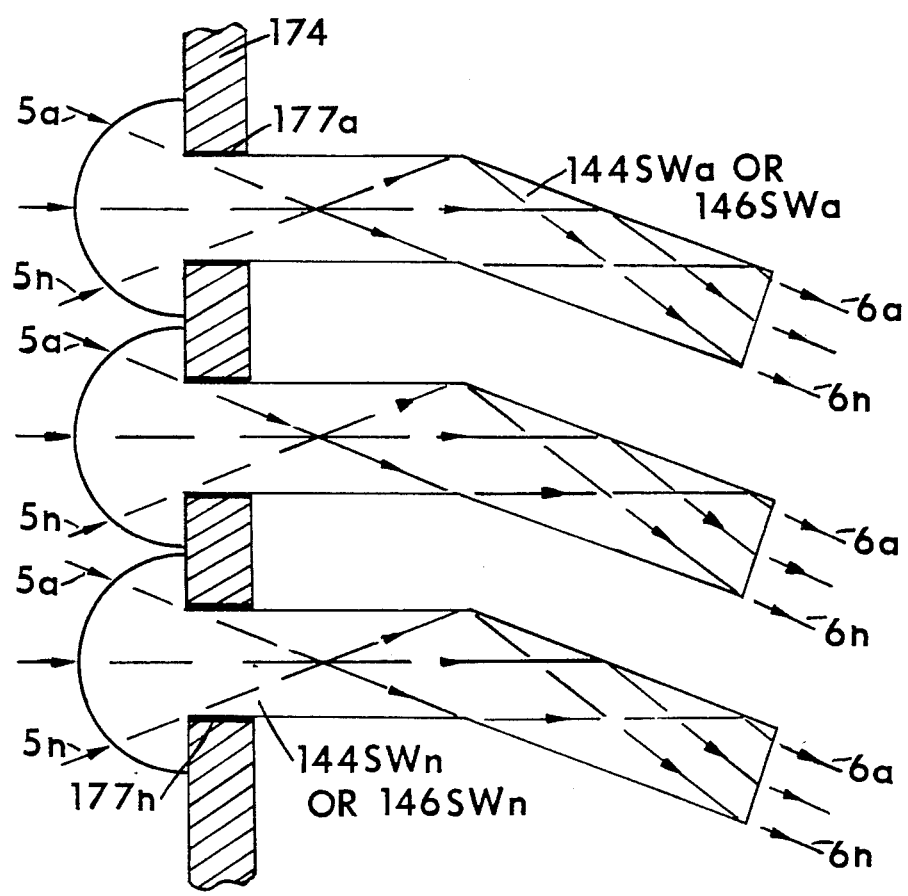
Figure 269:
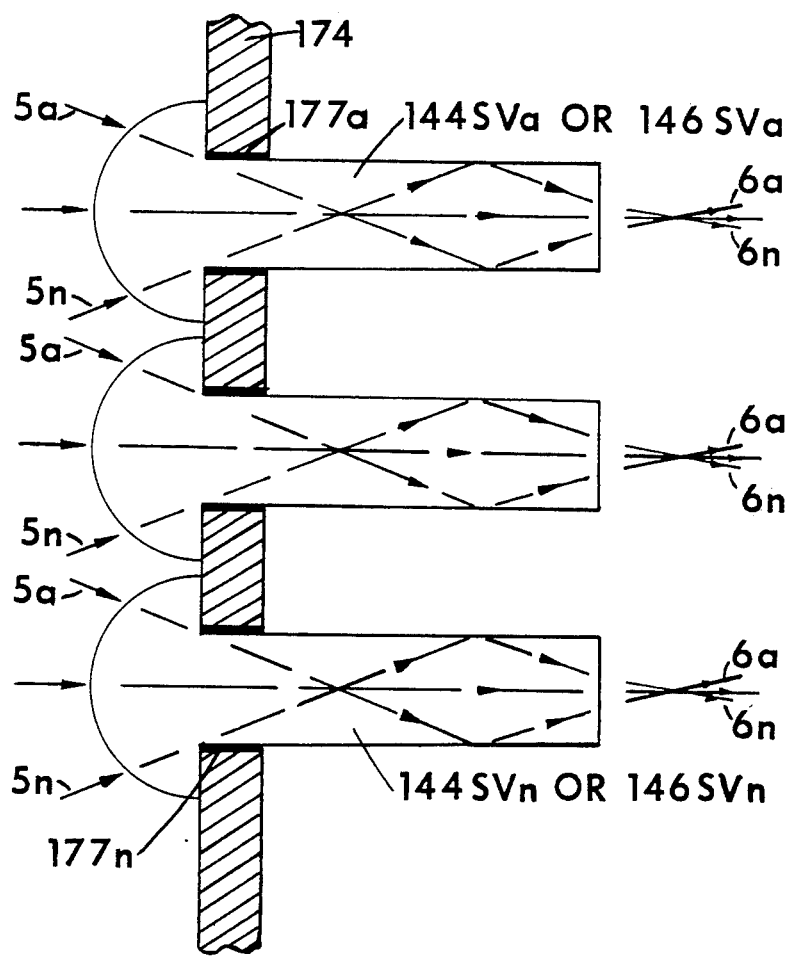
Figure 270:
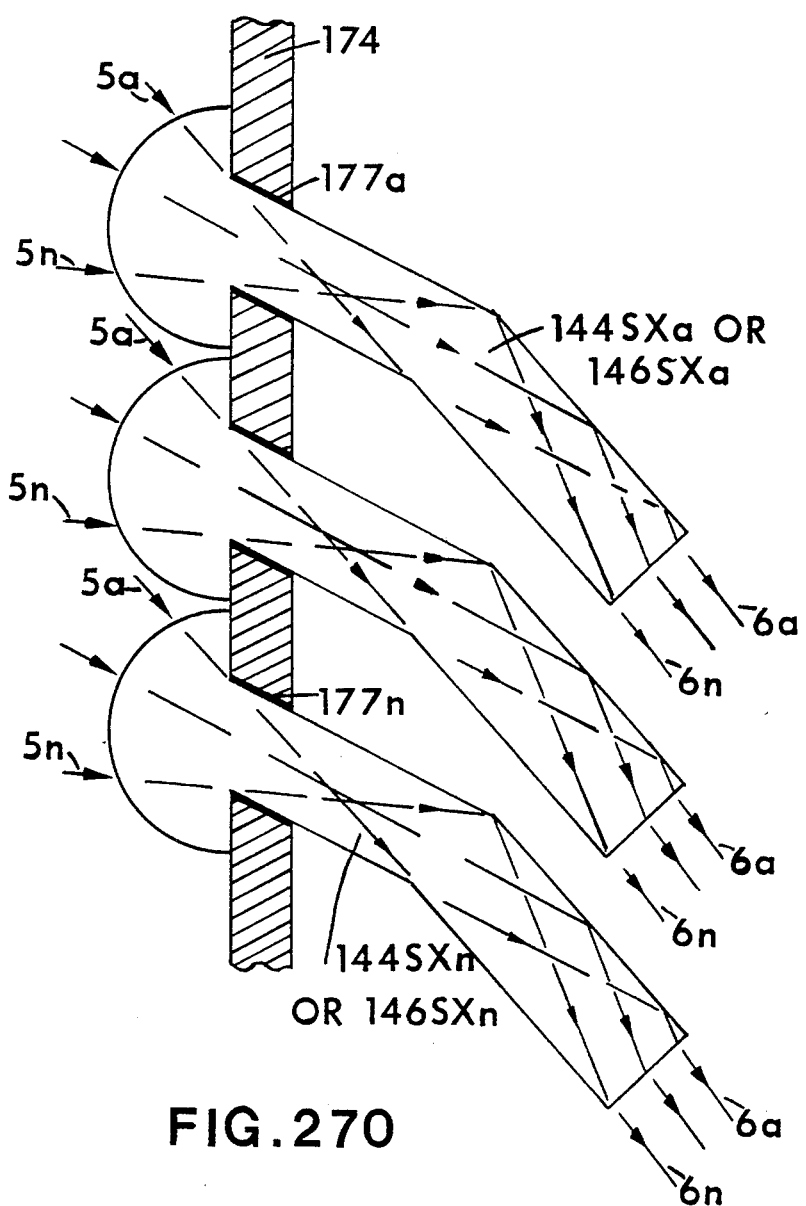

FIGS. 268, 269, and 270 Illustrates schematically a side view cross-section of a unitary array of non-removable light-steering lens lens-plate modular assembled light-guide lens embodiment combined with light dispersing means and their effect upon the projected light beams.

Figure 271:
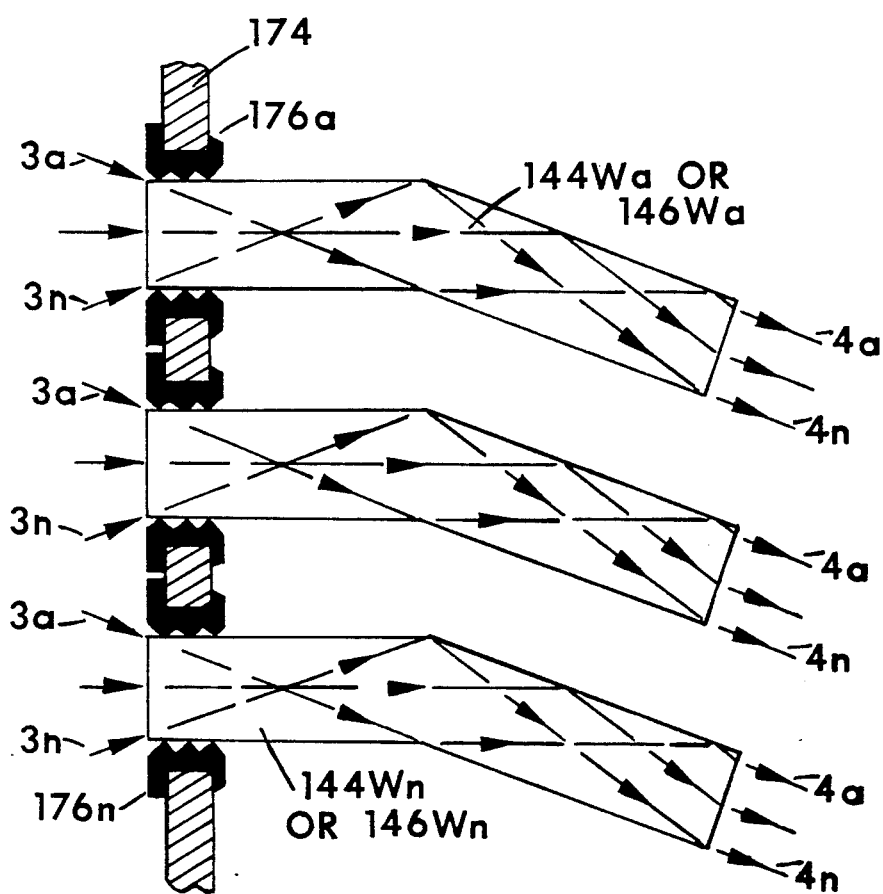
Figure 272:
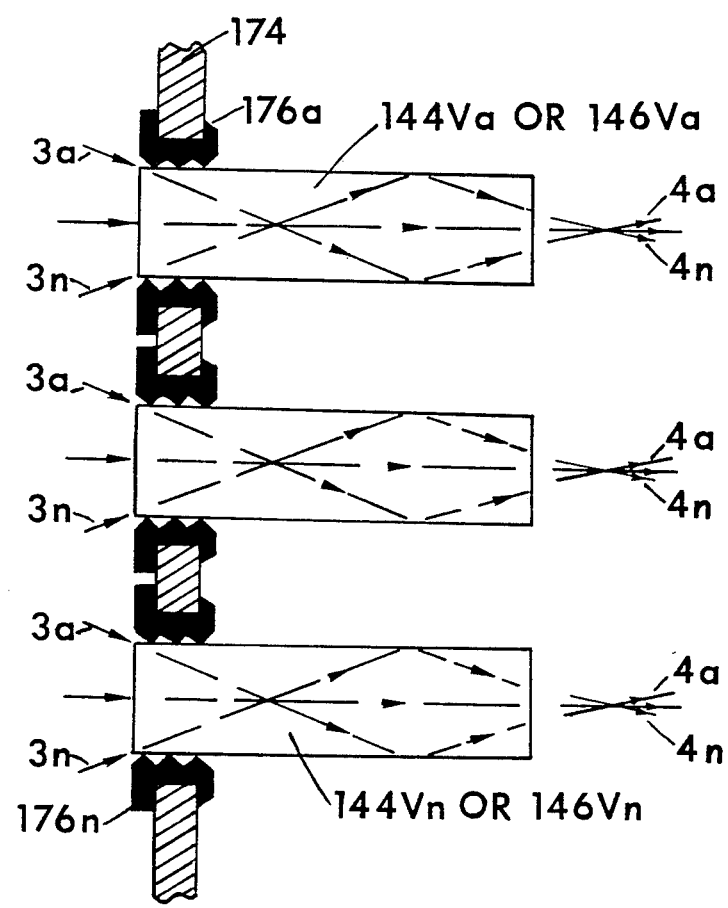
Figure 273:
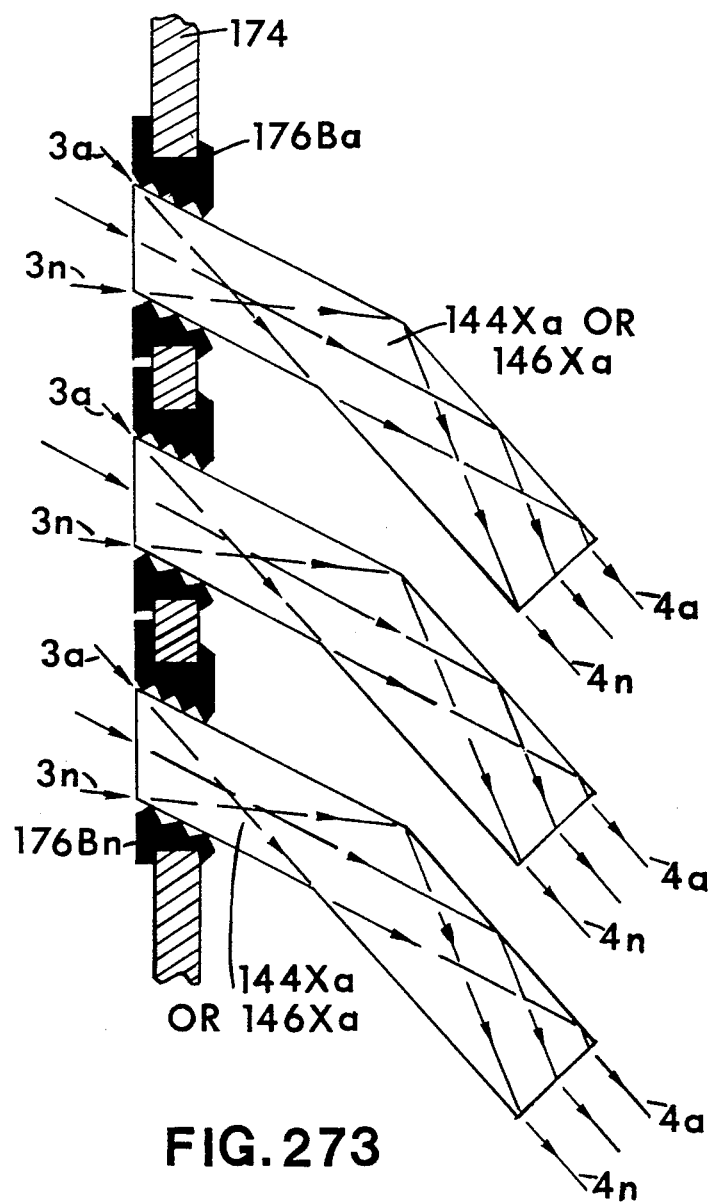

FIGS. 271, 272, and 273 Illustrates schematically a side view cross-section of a unitary array of removable snap-lock gripping collar light-guide stem lens-plate modular assembled light-guide lens embodiment combined with light dispersing means and their effect upon the projected light beams.

Figure 274:
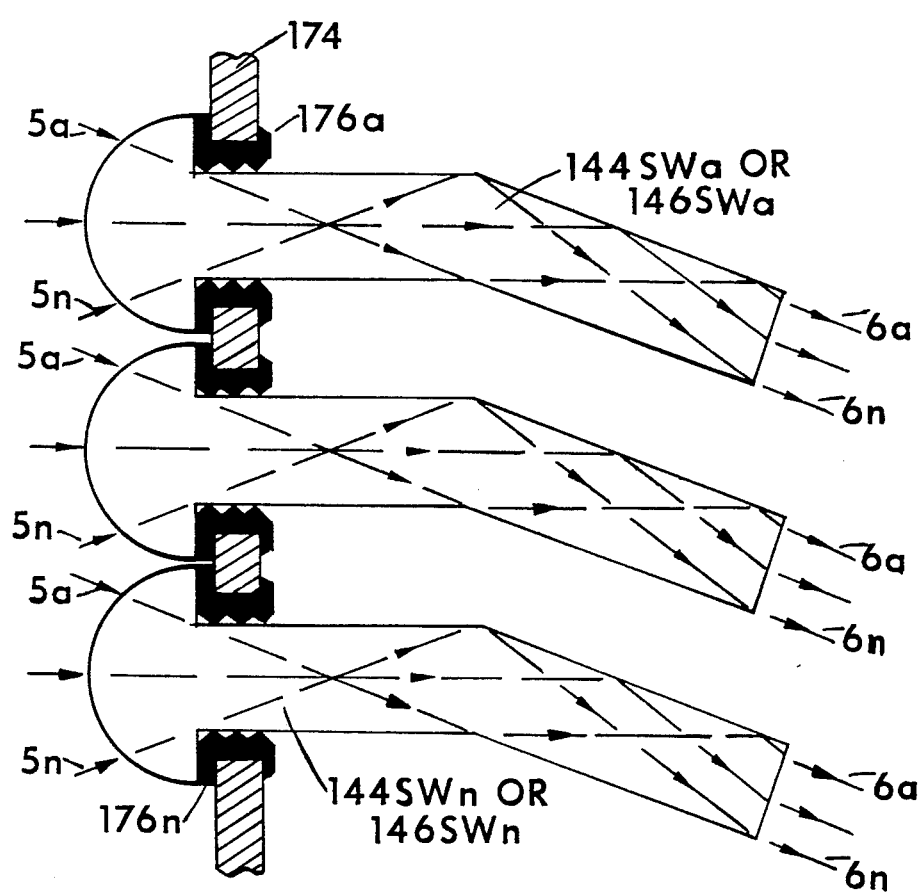
Figure 275:
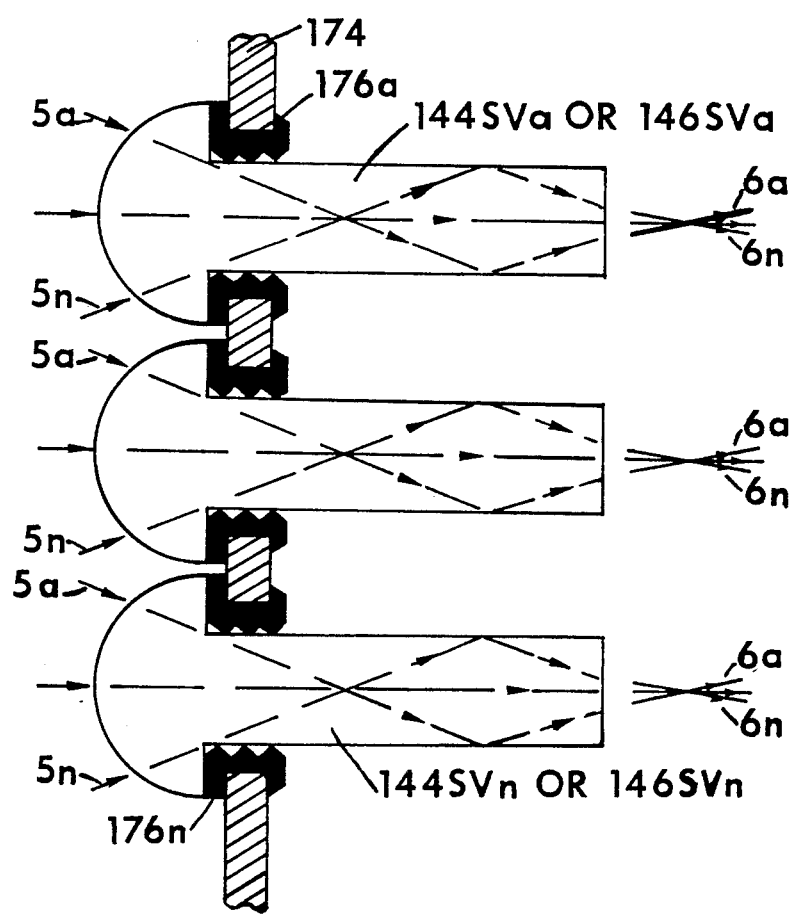
Figure 276:
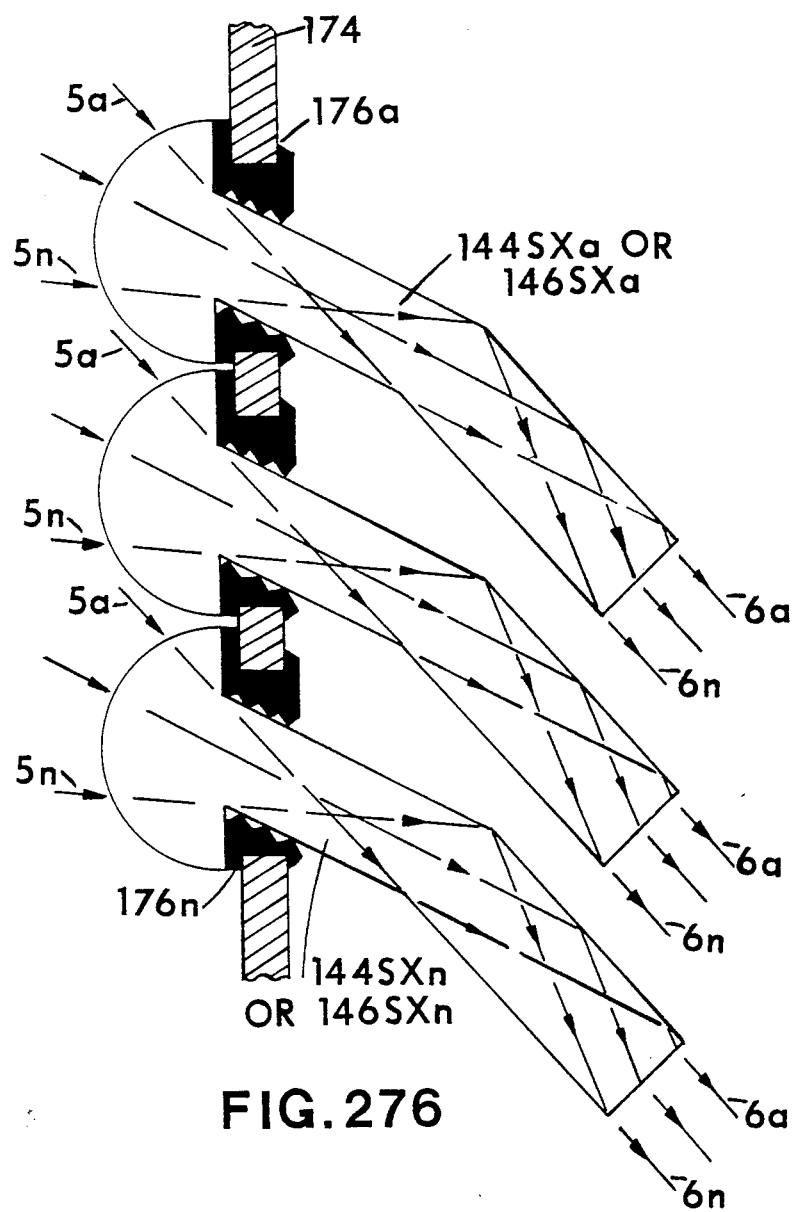

FIGS. 274, 275, and 276 Illustrates schematically a side view cross-section of a unitary array of removable snap-lock gripping collar light-steering lens lens-plate modular assembled light-guide lens embodiment combined with light dispersing means and their effect upon the projected light beams.

Figure 277:
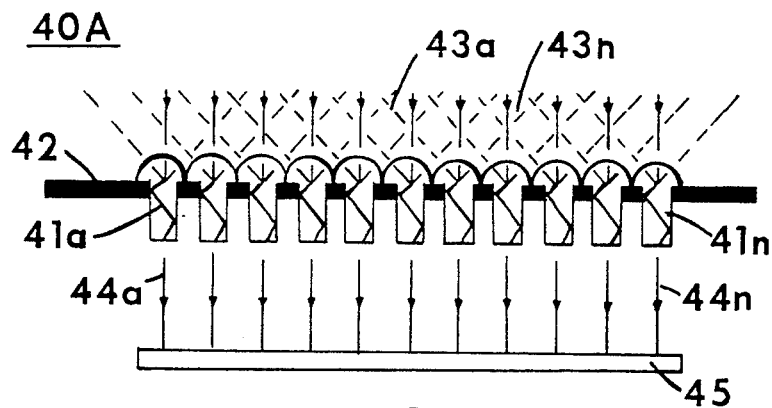

FIG. 277 Illustrates schematically a side view cross-section of unitary array flat-surface light-guide lens embodiment operable to angularly displaced incident light radiation focused to vertical displaced light radiation.

Figure 278:
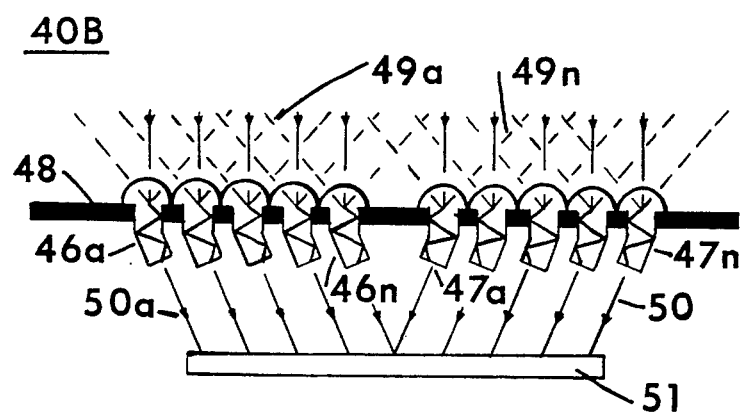

FIG. 278 Illustrates schematically a side view cross-section of a unitary array flat-surface light-guide lens embodiment operable to angularly displaced incident light radiation focused to convergent displaced light radiation.

Figure 279:
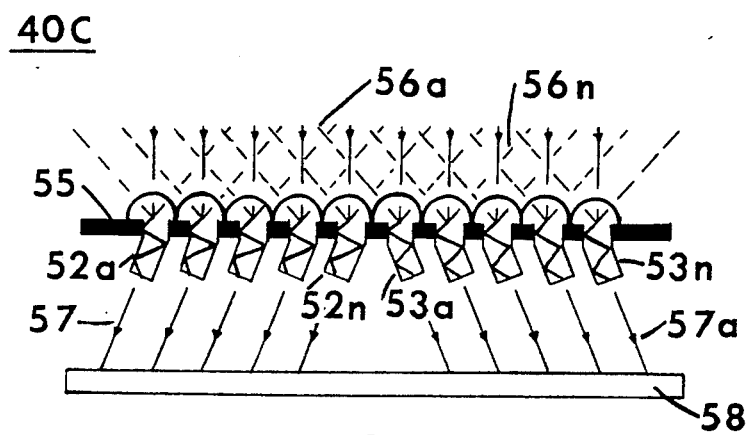

FIG. 279 Illustrates schematically a side view cross-section of a unitary array flat-surface light-guide lens embodiment operable to angularly displaced incident light radiation focused to divergent light radiation.

Figure 280:
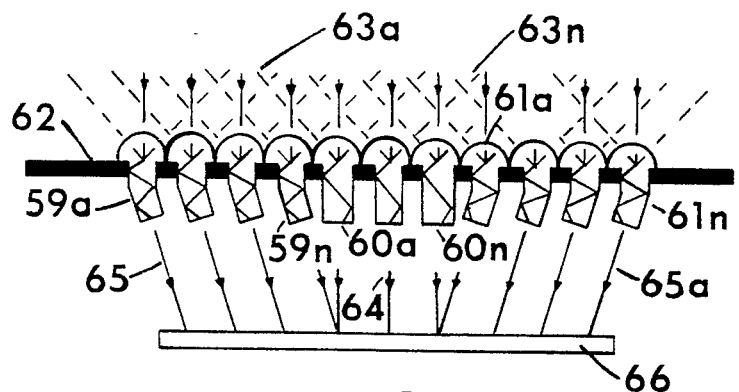

FIG. 280 Illustrates schematically a side view cross-section of a unitary array flat-surface light-guide lens embodiment operable to angularly displaced incident light radiation focused to central vertical-peripheral convergent displaced light radiation.

Figure 281:
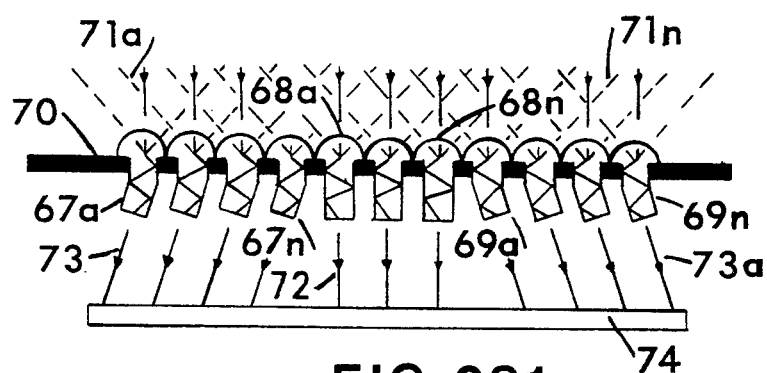

FIG. 281 Illustrates schematically a side view cross-section of a unitary array flat-surface light-guide lens embodiment operable to angularly displaced incident light radiation focused to central vertical-peripheral divergent displaced light radiation.

Figure 282:
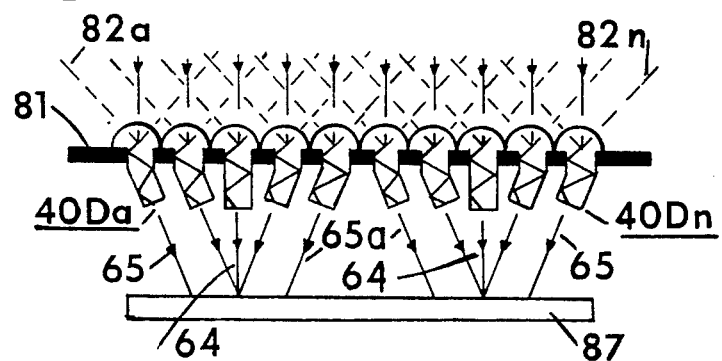

FIG. 282 Illustrates schematically a side view cross-section of a unitary array flat-surface light-guide lens embodiment operable to angularly displaced incident light radiation focused to multi-regional central vertical-peripheral convergent displaced light radiation.

Figure 283:
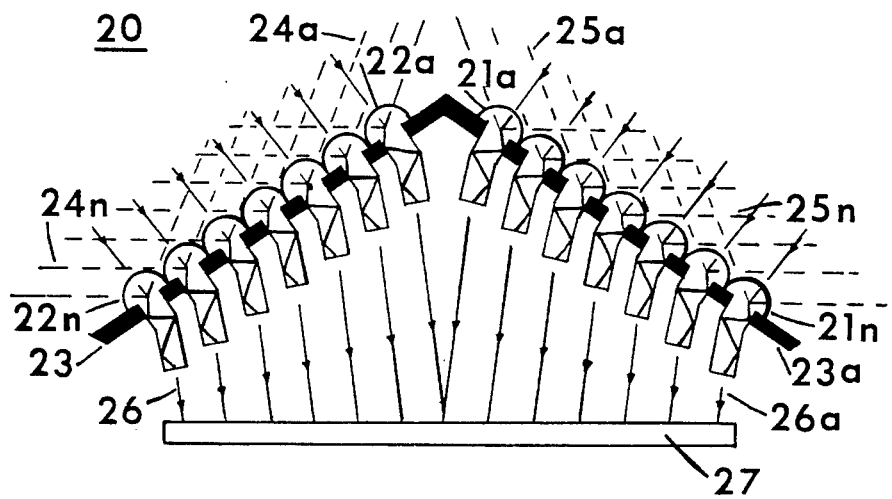

FIG. 283 Illustrates schematically a side view cross-section of a unitary array cone-shaped light-guide lens embodiment operable to angularly displaced incident light radiation focused to convergent displaced light radiation.

Figure 284:
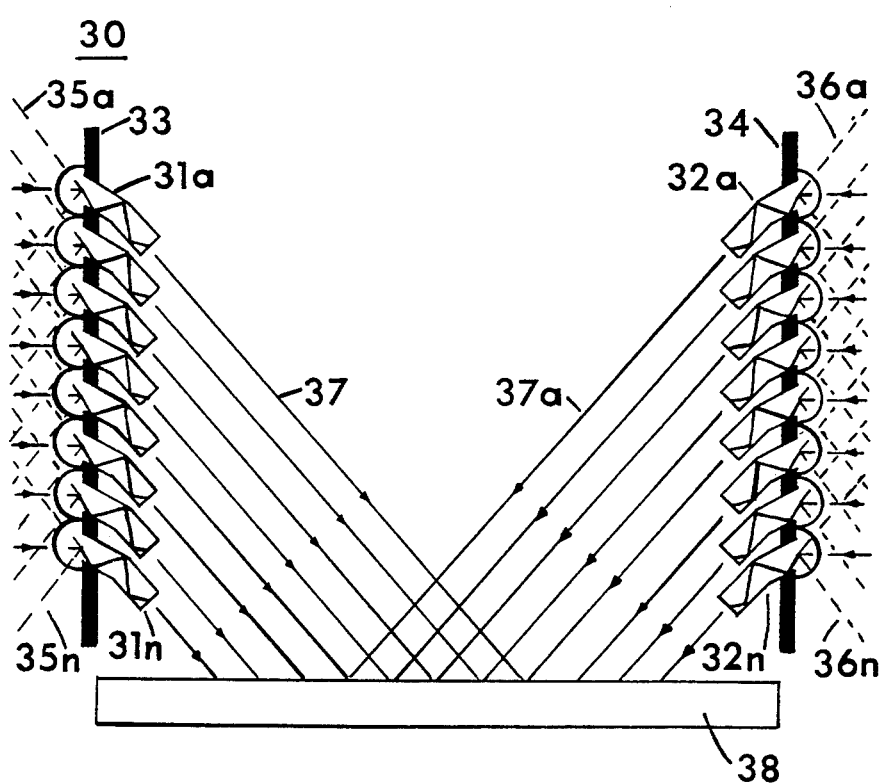

FIG. 284 Illustrates schematically a side view cross-section of a unitary array cylindrical-shaped light-guide lens embodiment operable to angularly displaced incident light radiation focused to circular convergent-angularly convergent displaced light radiation.

Figure 285:
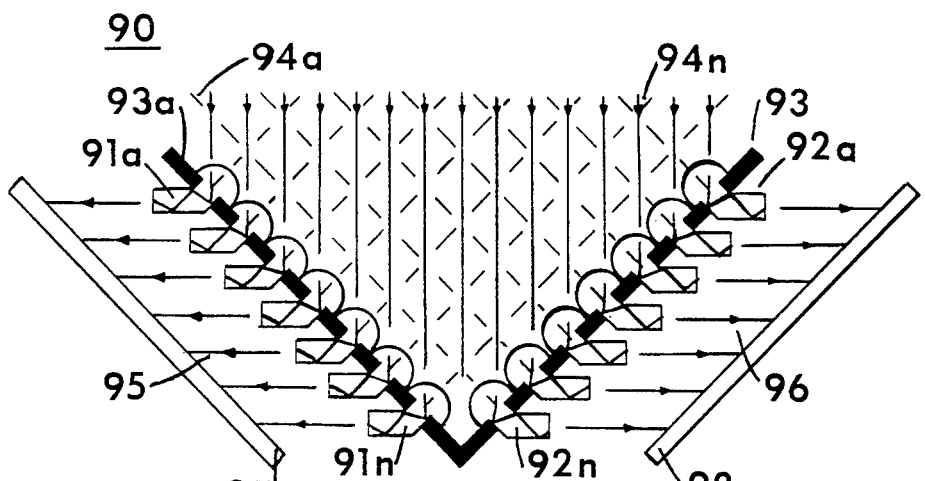

FIG. 285 Illustrates schematically a side view cross-section of a unitary array inverted cone-shaped light-guide lens embodiment operable to angularly displaced incident light radiation focused to divergent light radiation.

Figure 286:
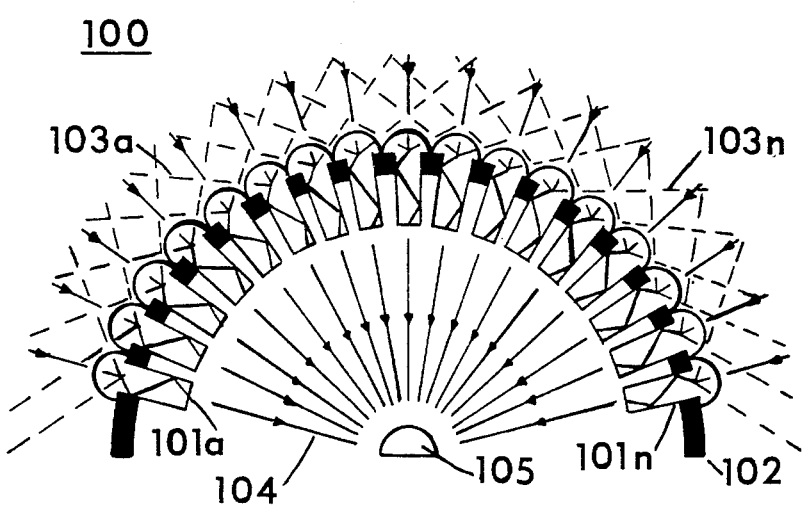

FIG. 286 Illustrates schematically a side view cross-section of a unitary array hemispherical-shaped light-guide lens embodiment operable to angularly displaced incident light radiation focused to convergent displaced light radiation.

Figure 287:
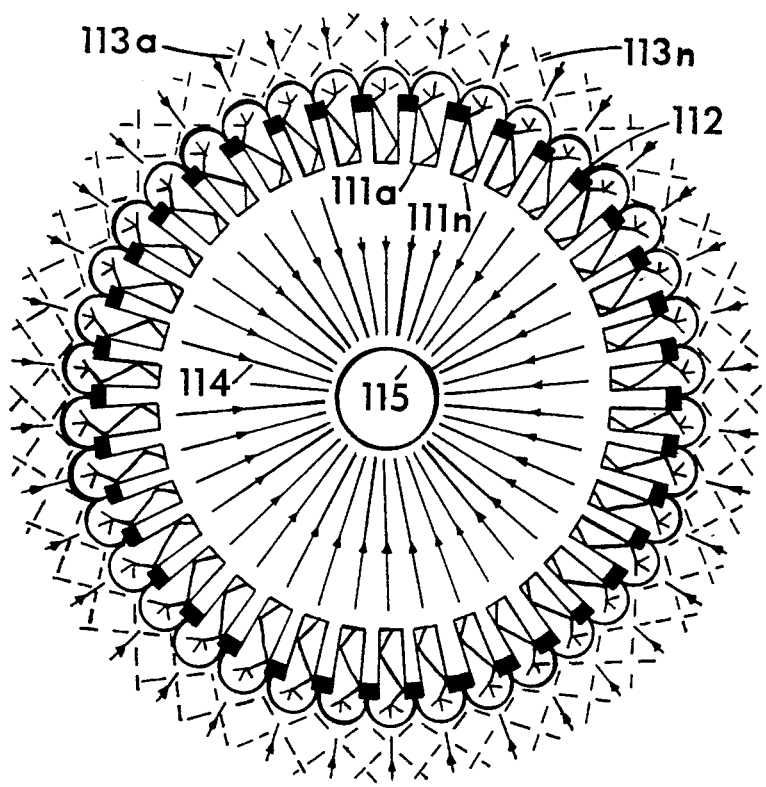

FIG. 287 Illustrates schematically a side view cross-section of a unitary array circular-shaped light-guide lens embodiment operable to angularly displaced incident light radiation focused to circular-convergent displaced light radiation.

Figure 288:
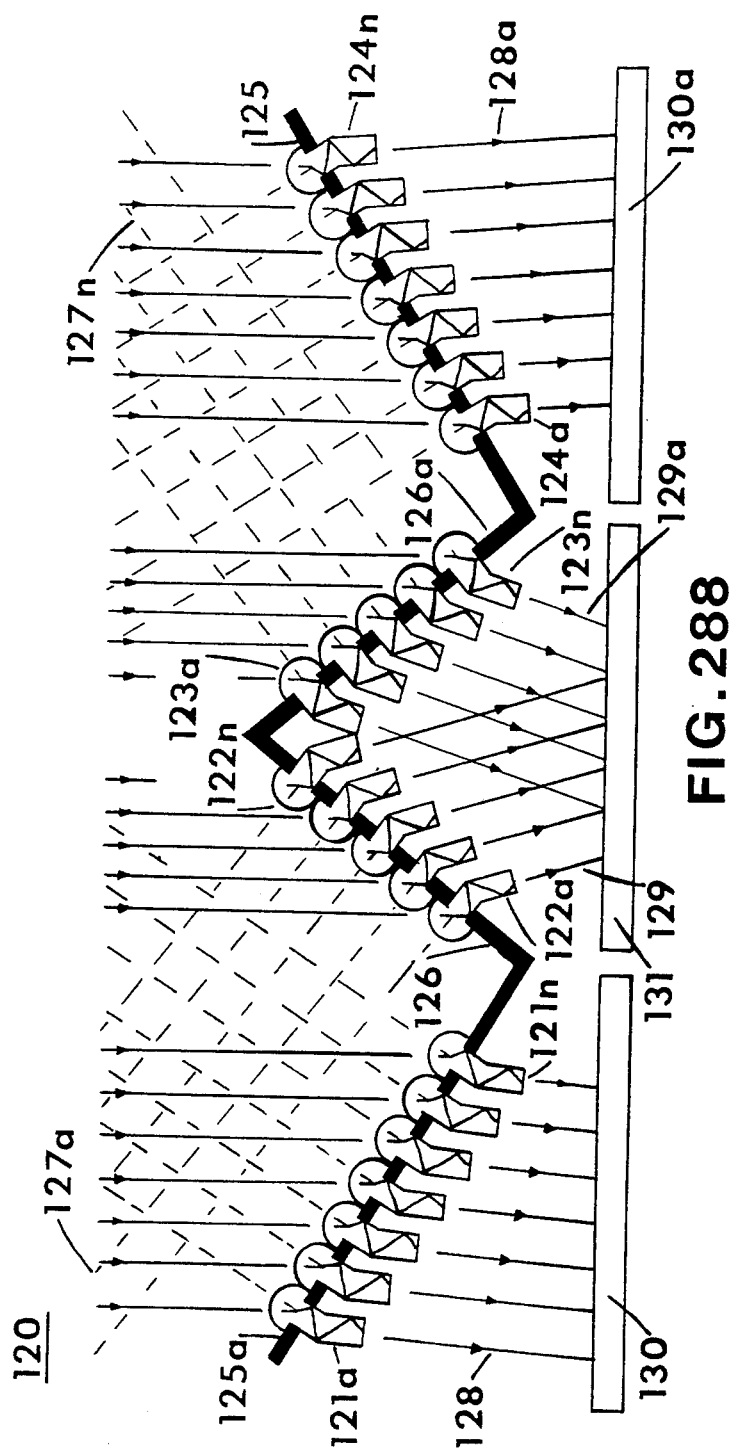

FIG. 288 Illustrates schematically a side view cross-section of a unitary array peripheral non-apex inverted cone-shaped/central upright cone-shaped light-guide lens embodiment operable to angularly displaced incident light radiation focused to central convergent-peripheral divergent displaced light radiation.

Figure 289:
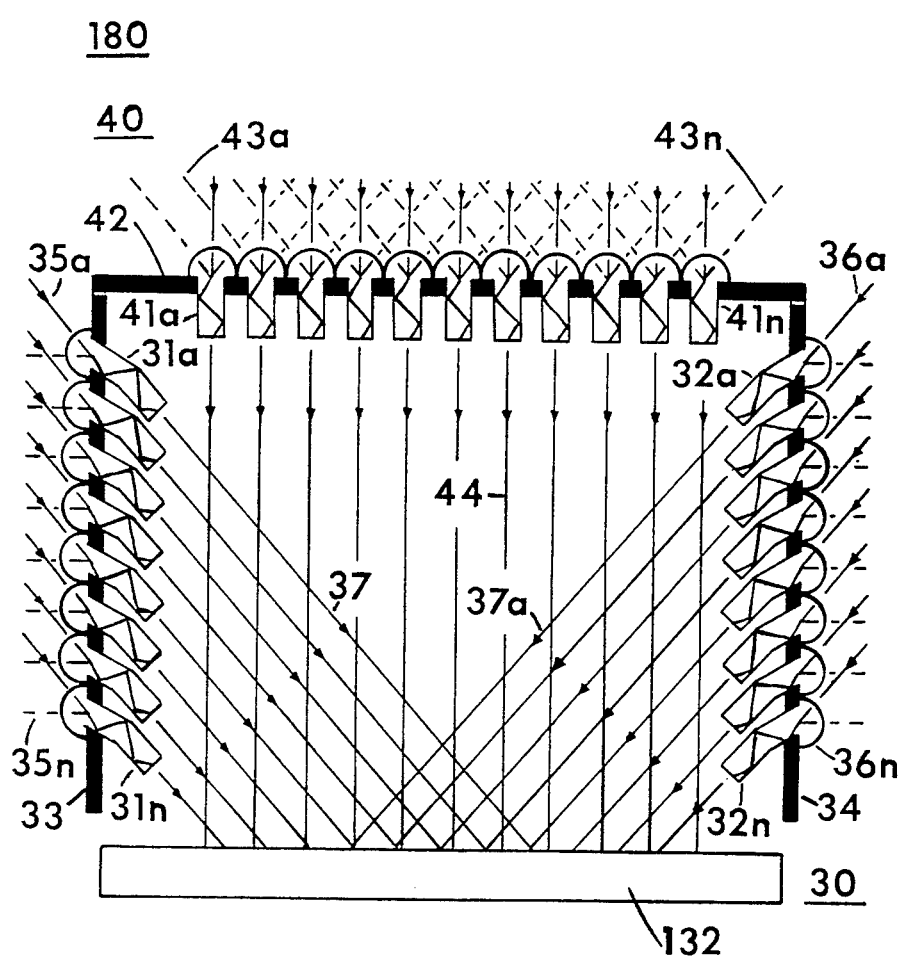

FIG. 289 Illustrates schematically a side view cross-section of a unitary array peripheral cylindrical-shaped/top positioned flat-surface-shaped light-guide lens embodiment operable to angularly displaced incident light radiation focused to peripheral convergent-angularly convergent displaced light radiation.

Figure 290:
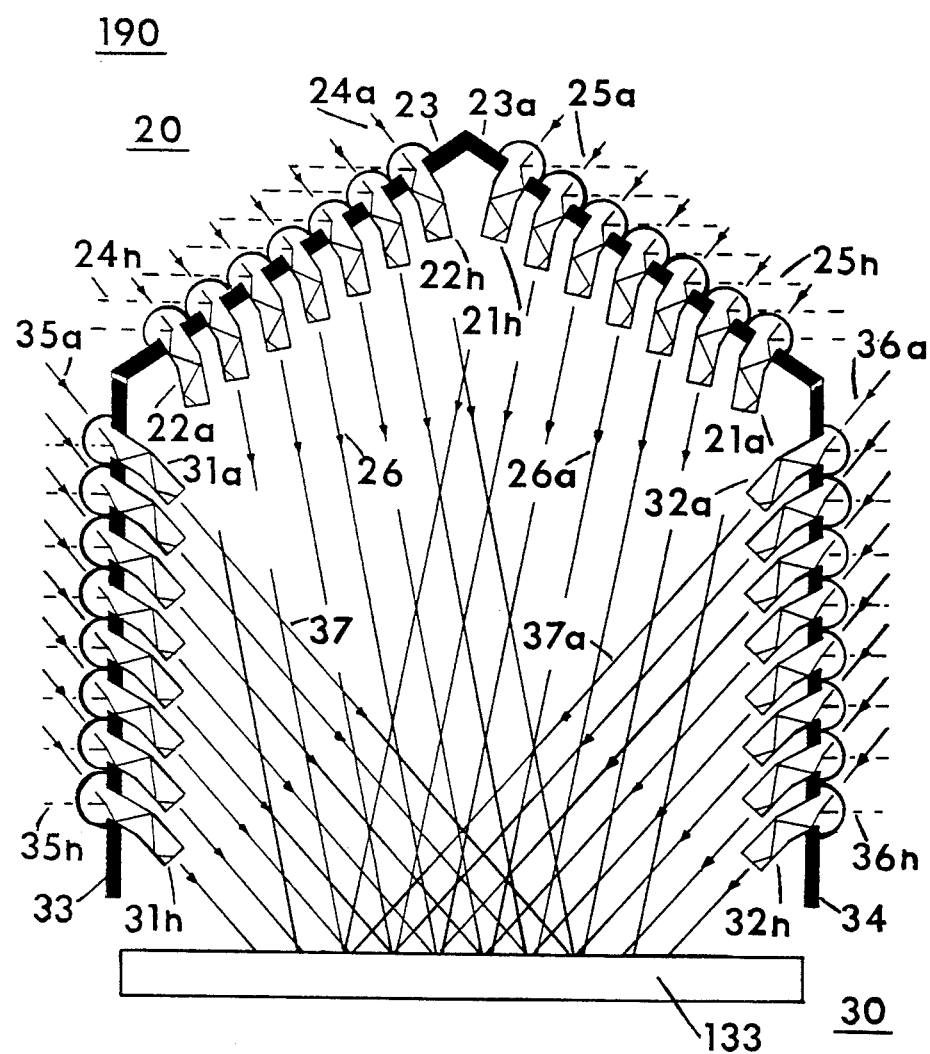

FIG. 290 Illustrates schematically a side view cross-section of a unitary array peripheral cylindrical-shaped/top positioned cone-shaped light-guide lens embodiment operable to angularly—displaced incident light radiation focused to circular convergent angularly convergent displaced light radiation.

Figure 291:
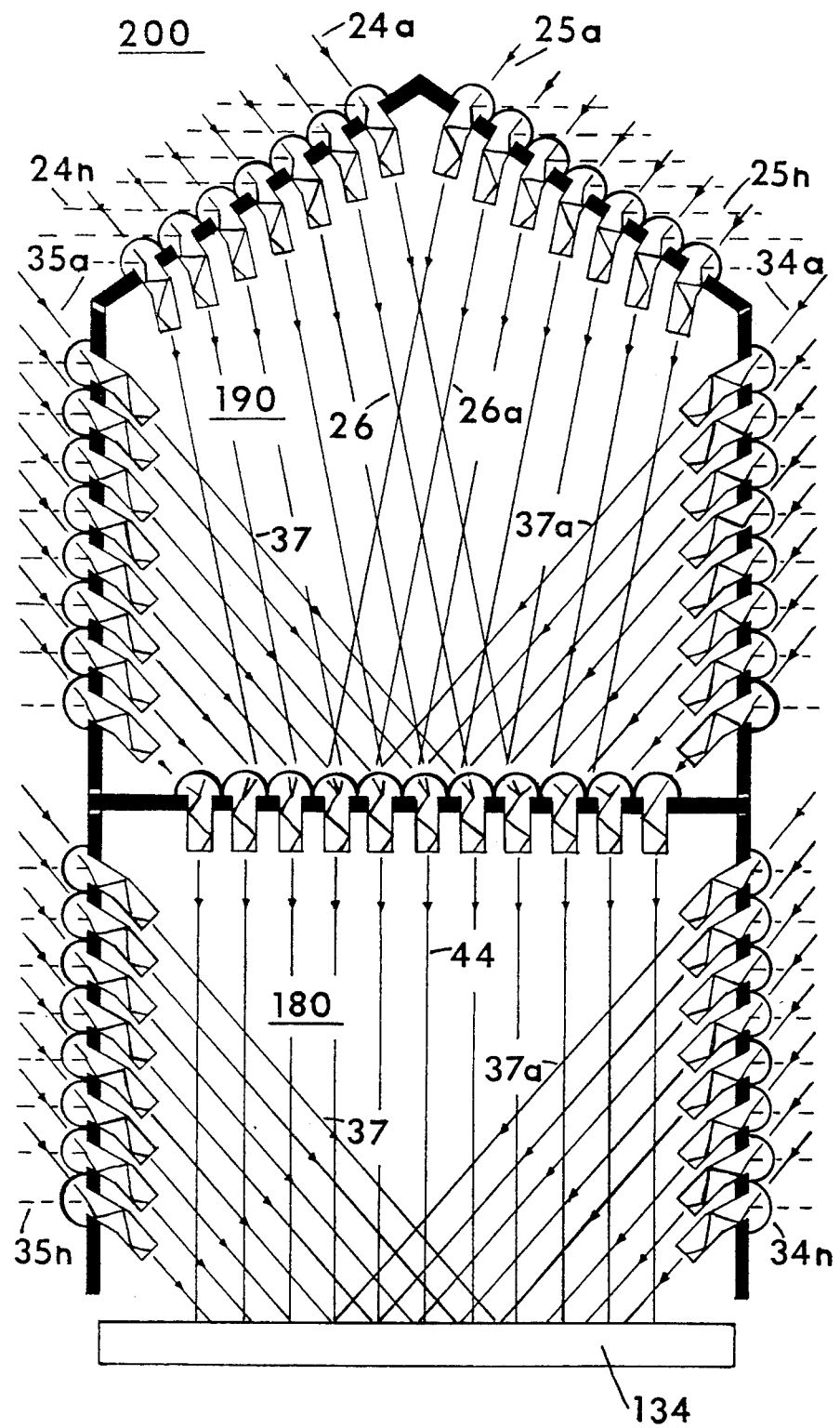

FIG. 291 Illustrates schematically a side view cross-section of a unitary array peripheral cylindrical-shaped/top positioned cone-shaped/inside mid-regional positioned flat-surface light-guide lens embodiment operable to angularly displaced incident light radiation focused to circular convergent—angularly convergent displaced light radiation.

Figure 292:
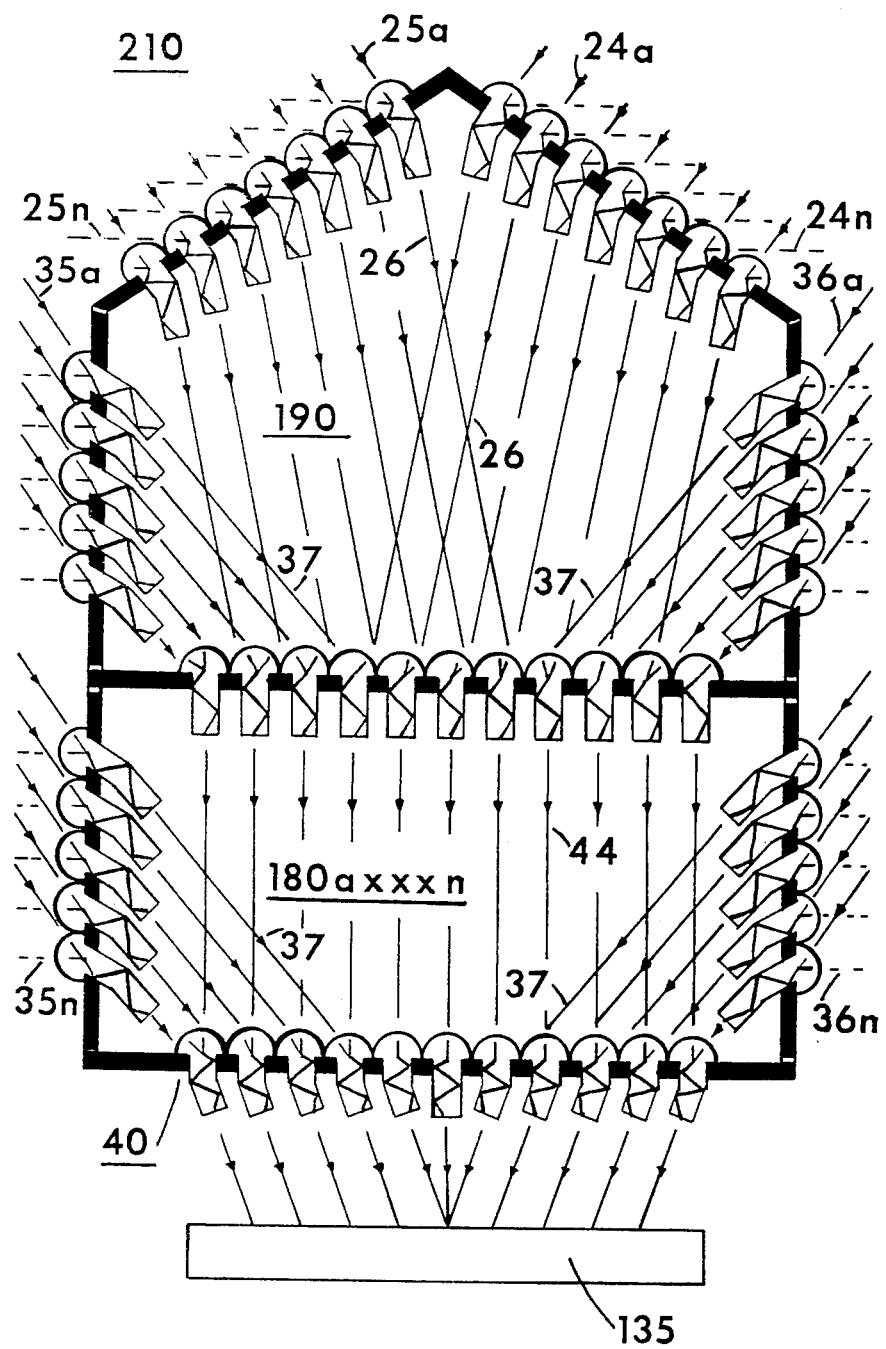

FIG. 292 Illustrates schematically a side view cross-section of a unitary array peripheral cylindrical-shaped/top positioned cone-shaped/inside mid-regional and lower positioned flat-surface light-guide lens embodiment operable to angularly displaced incident light radiation focused to circular convergent-angularly convergent displaced light radiation.

Figure 293:
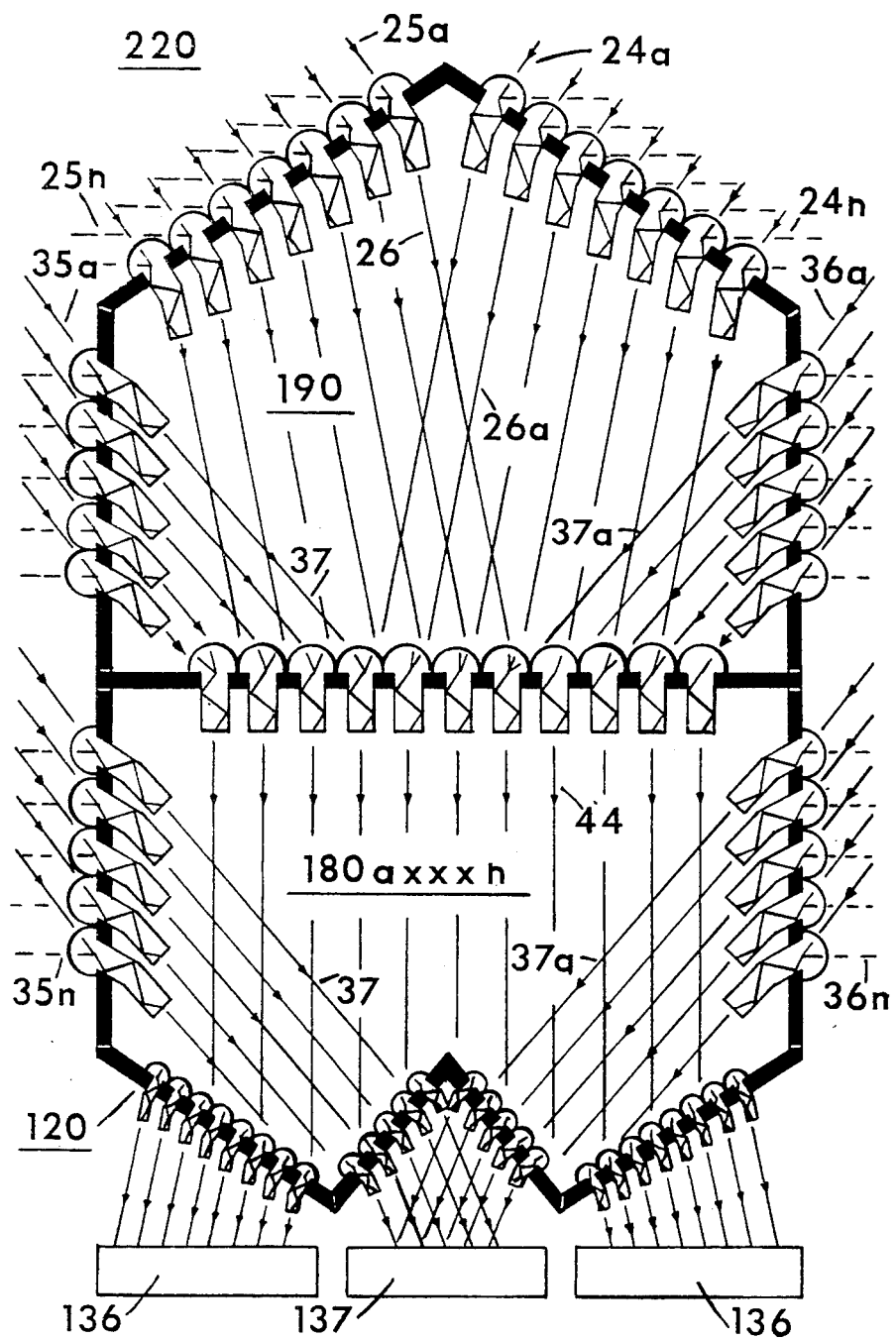
Figure 301:
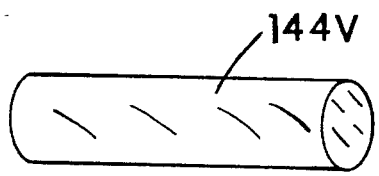
Figure 302:
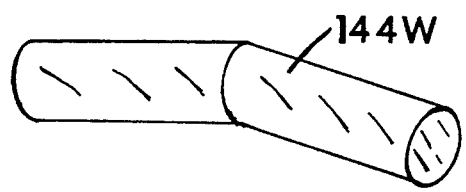
Figure 303:
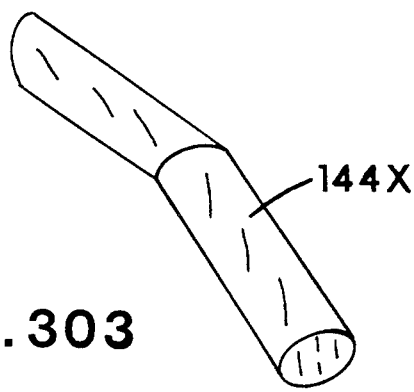
Figure 304:
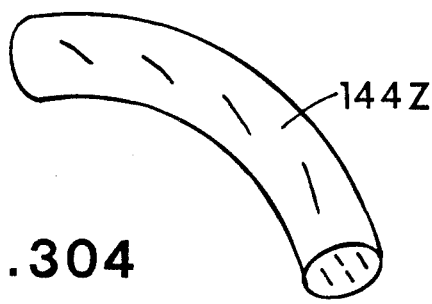
Figure 305:
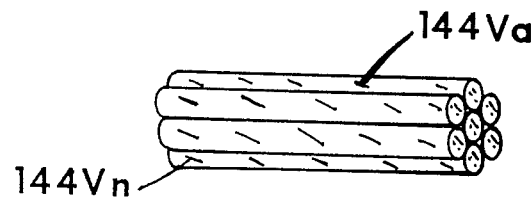
Figure 306:
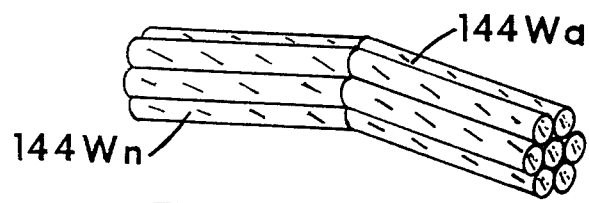
Figure 307:
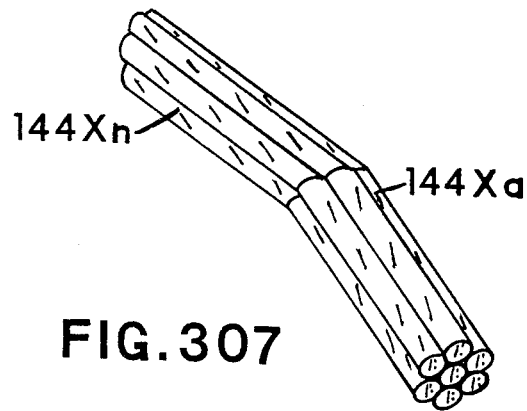
Figure 308:
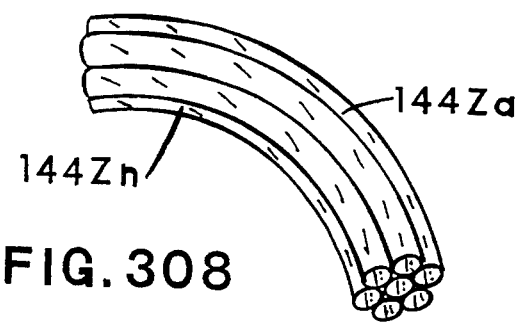
Figure 309:
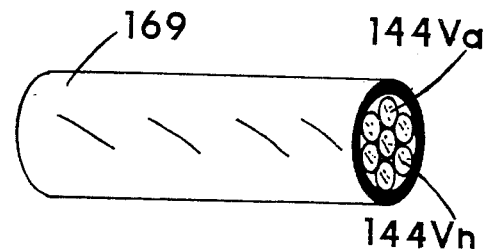
Figure 310:
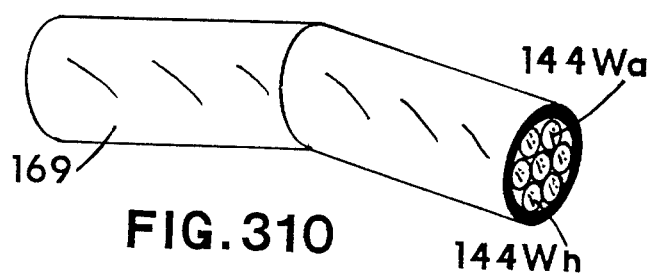
Figure 311:
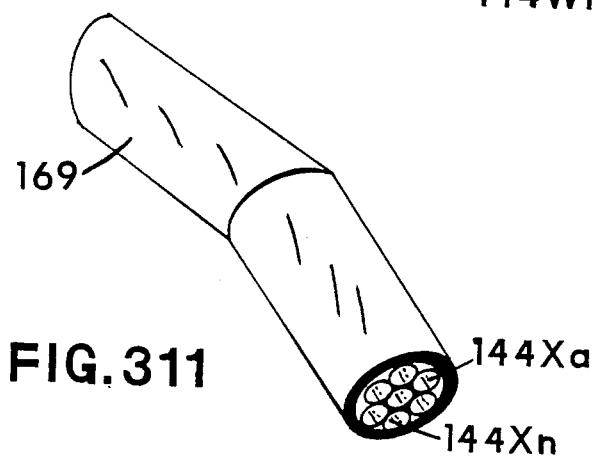
Figure 312:
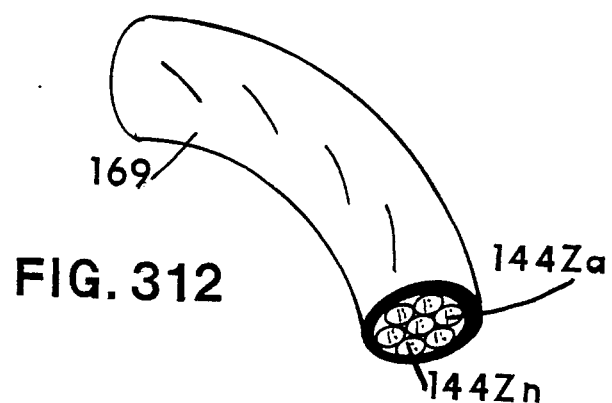
Figure 313:
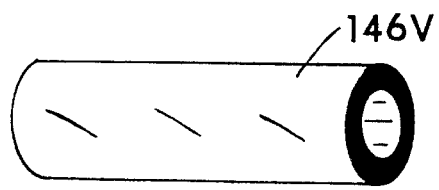
Figure 314:
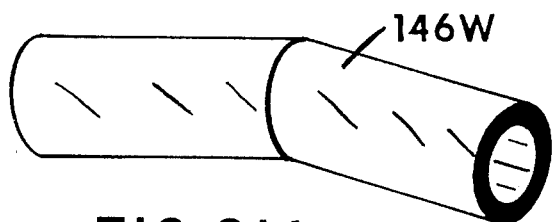
Figure 315:
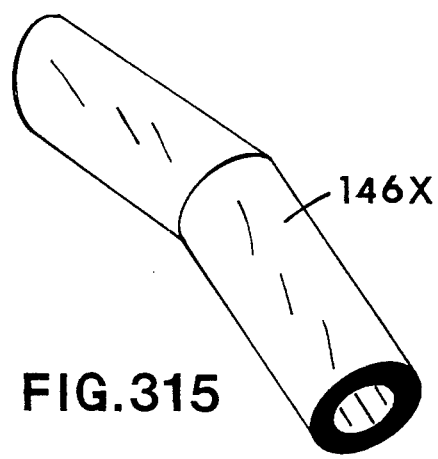
Figure 316:
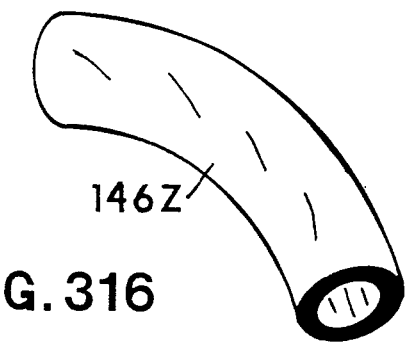

FIG. 293 Illustrates schematically a side view cross-section of a unitary array peripheral cylindrical-shaped/top positioned cone-shaped/inside mid-regional positioned flat-surface/lower positioned peripheral non-apex inverted cone-shaped central upright cone-shaped light-guide lens embodiment operable to angularly displaced incident light radiation focused to circular-convergent-angularly convergent displaced light radiation.

FIG. 294 Illustrates an overall view in pictorial of a light-guide lens-cap configuration.

FIG. 295 Illustrates an overall view in pictorial of a grip-lock collar lens-cap configuration.

FIG. 296 Illustrates an overall view in pictorial of a lens-plate configuration.

FIG. 297 Illustrates an overall view in pictorial of a modular assembled lens-cap lens-plate configuration.

FIG. 298 Illustrates an overall view in pictorial of a unitary structure lens-cap-plate configuration.

FIG. 299 Illustrates an overall view in pictorial of a filter disc configuration.

FIG. 300 Illustrates an overall view in pictorial of a hemispherical-shaped lens-cap filter configuration.

FIGS. 301, 302, 303, and 304 Illustrates an overall view in pictorial of transparent solid material light-guide stem configurations.

FIGS. 305, 306, 307, and 308 Illustrates an overall view in pictorial of bundle-array transparent solid material light-guide stem configurations.

FIGS. 309, 310, 311, and 312 Illustrates an overall view in pictorial of sheathe-bundle-array transparent solid material light-guide stem configurations.

FIGS. 313, 314, 315, and 316 Illustrates an overall view in pictorial of transparent tubular material light-guide stem configurations.

Figure 317:
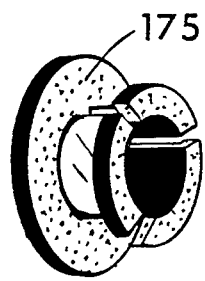

FIG. 317 Illustrates an overall view in pictorial of a light-guide stem snap-lock gripping collar configuration.

Figure 318:
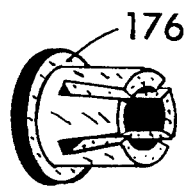
Figure 319:
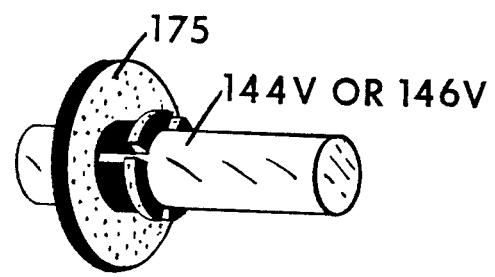
Figure 320:
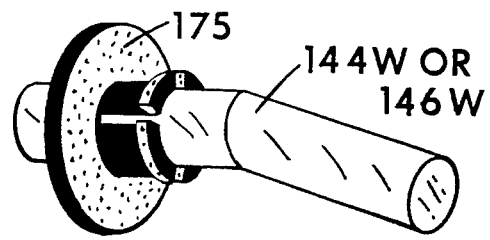
Figure 321:
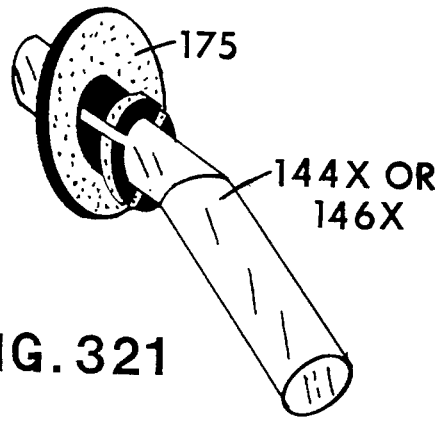
Figure 322:
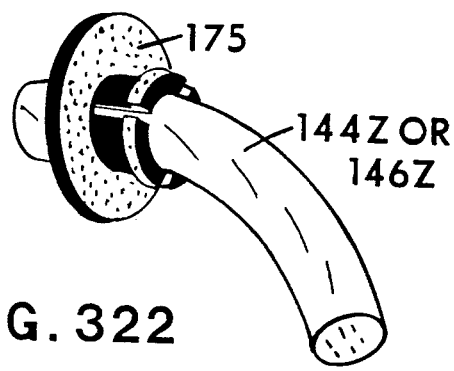
Figure 323:
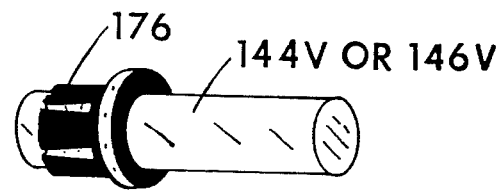
Figure 324:
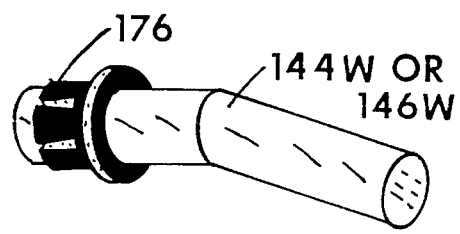
Figure 325:
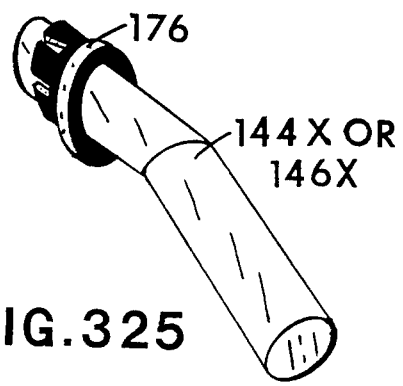
Figure 326:
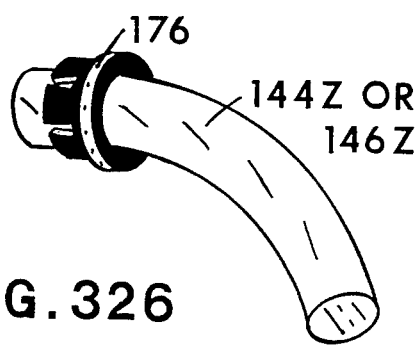
Figure 327:
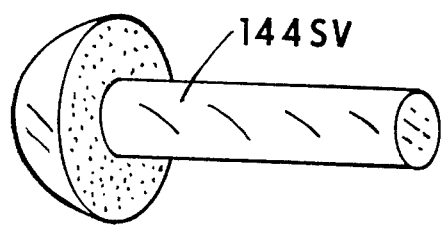
Figure 328:
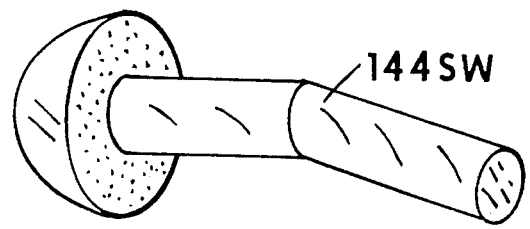
Figure 329:
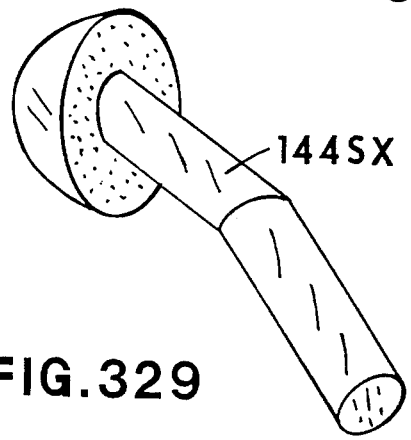
Figure 330:
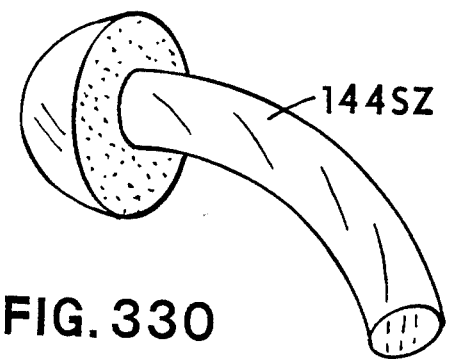
Figure 331:
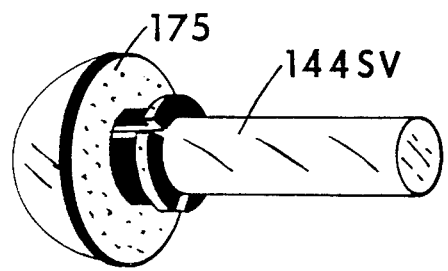
Figure 332:
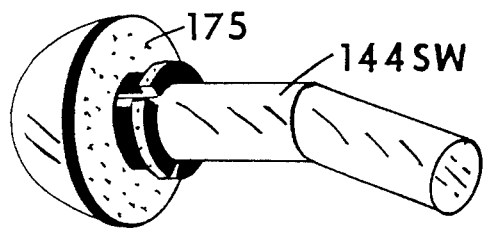
Figure 333:
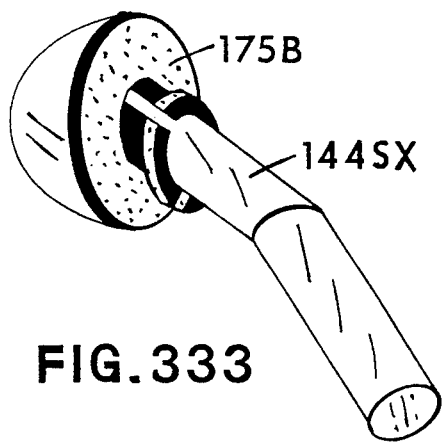
Figure 334:
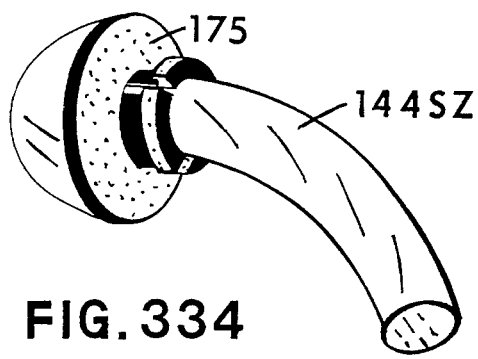
Figure 335:
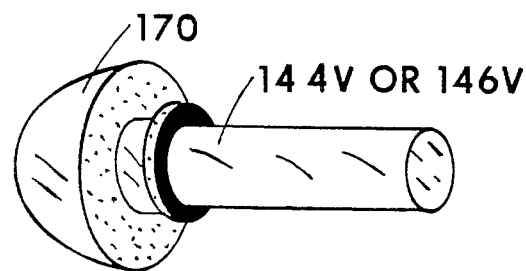
Figure 336:
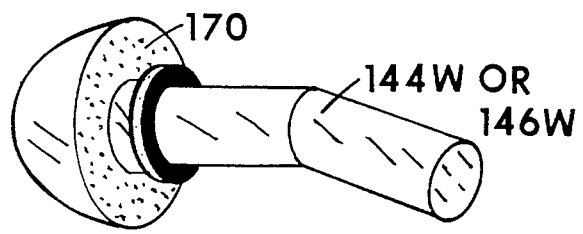
Figure 337:
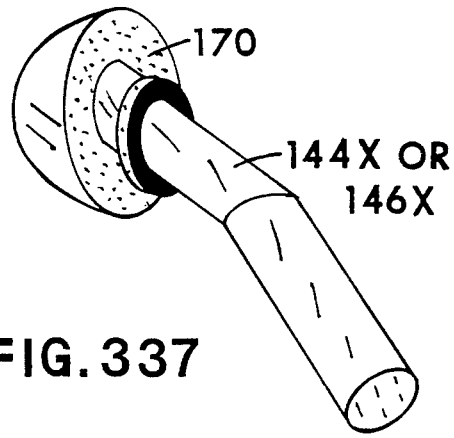
Figure 338:
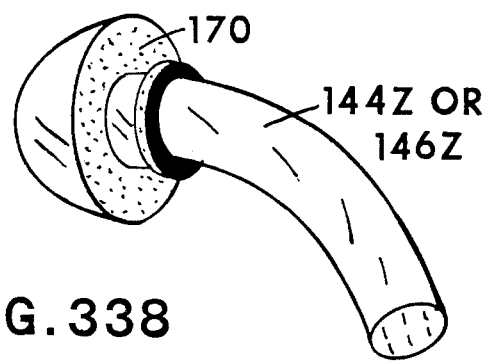
Figure 339:
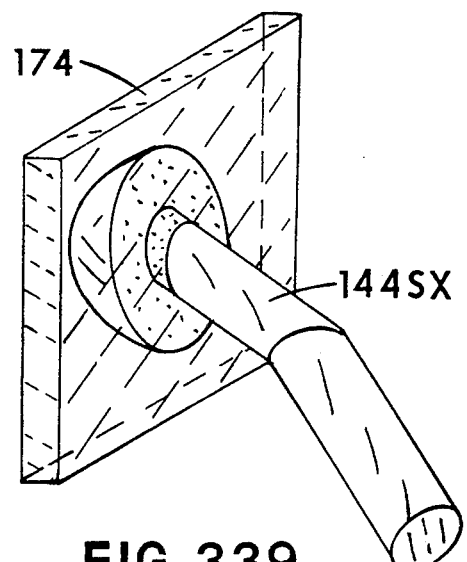
Figure 340:
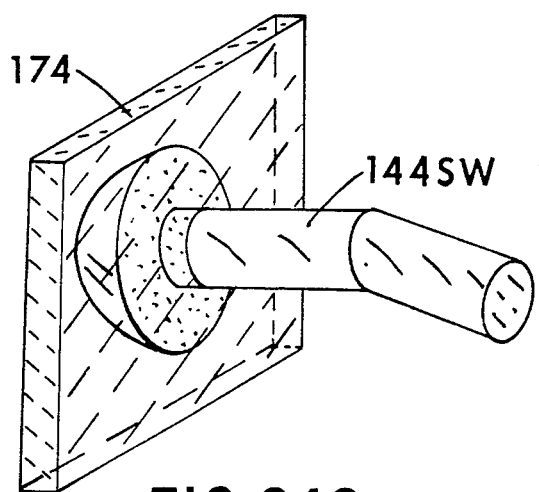
Figure 341:
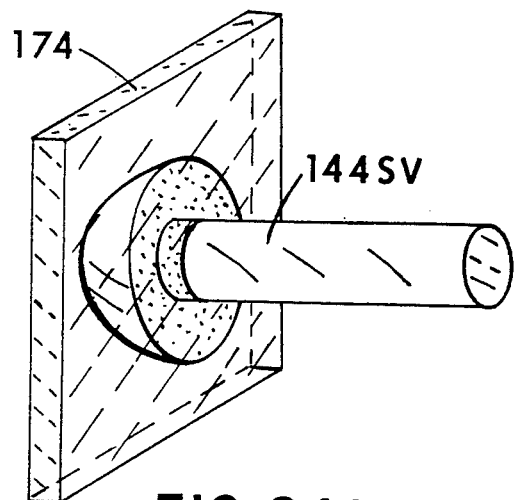
Figure 342:
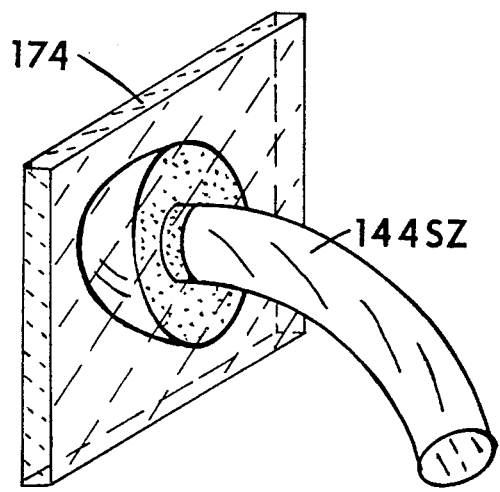
Figure 343:
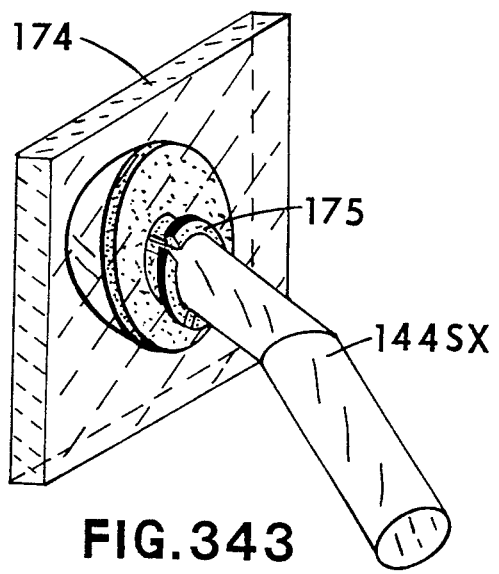
Figure 344:
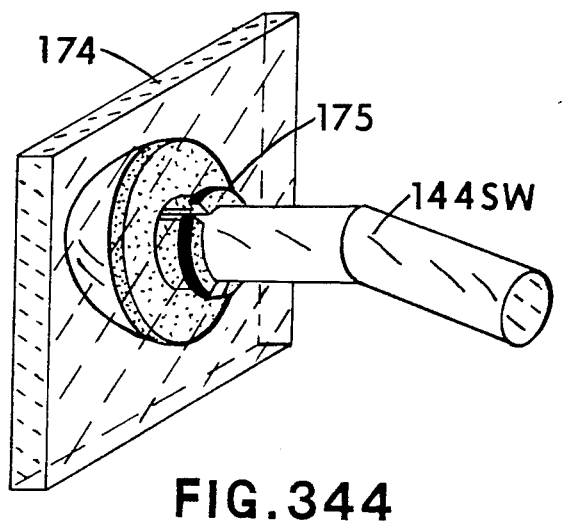
Figure 345:
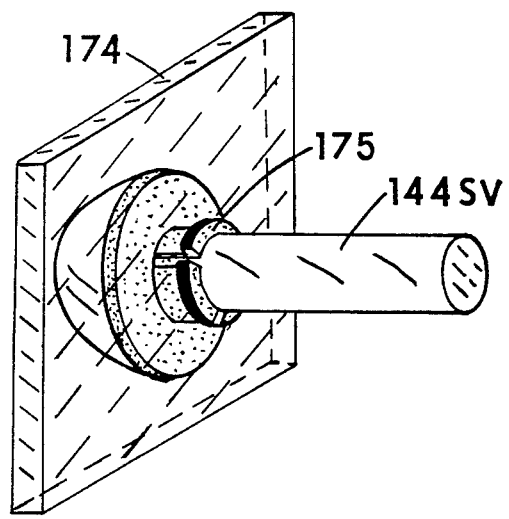
Figure 346:
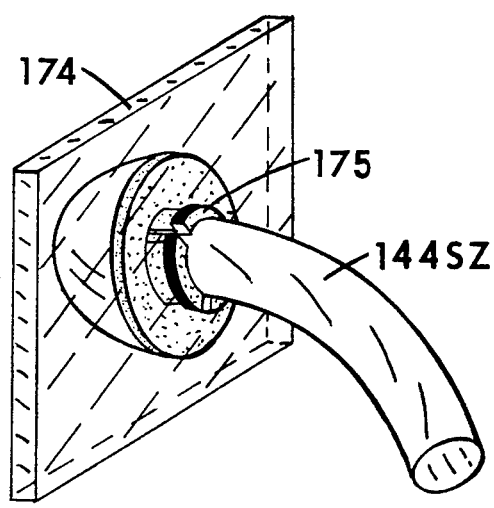
Figure 347:
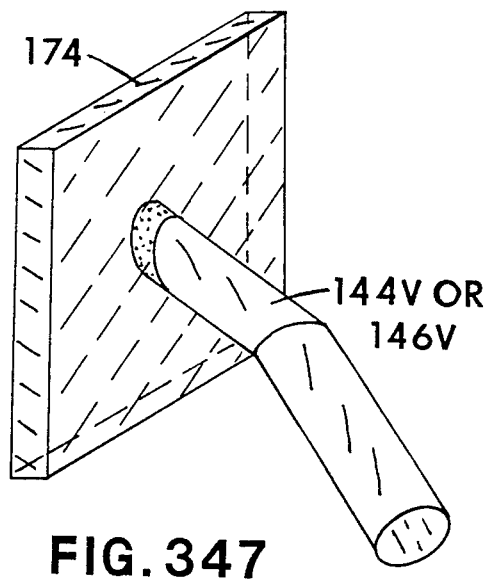
Figure 348:
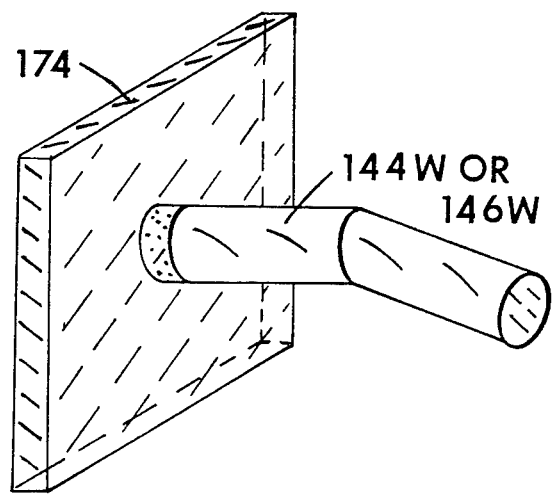
Figure 349:
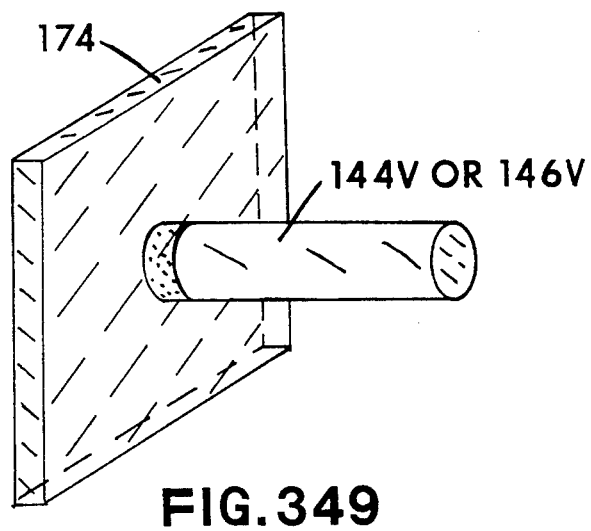
Figure 350:
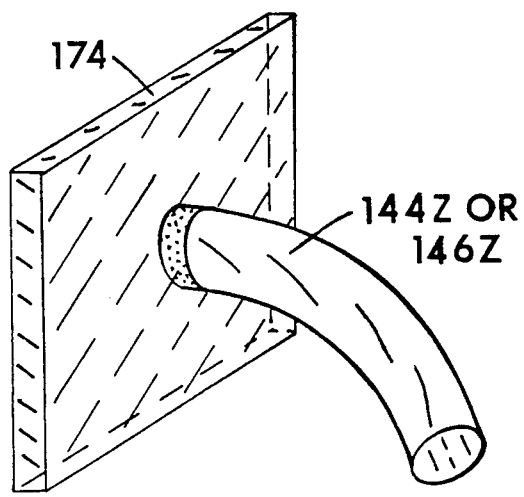

FIG. 318 Illustrates an overall view in pictorial of a matrix lens-cap grip-lock collar configuration.

FIGS. 319, 320, 321, and 322 Illustrates an overall view in pictorial of snap-lock gripping collar placement on light-guide stem configurations.

FIGS. 323, 324, 325, and 326 Illustrates an overall view in pictorial of grip-lock collar placement on light-guide stem configurations.

FIGS. 327, 328, 329, and 330 Illustrates an overall view in pictorial of transparent solid material light-steering lens configurations.

FIGS. 331, 332, 333, and 334 Illustrates an overall view in pictorial of snap-lock gripping collar placement on transparent solid material light-steering lens configurations.

FIGS. 335, 336, 337, and 338 Illustrates an overall view in pictorial of modular assembled light-steering lens configurations.

FIGS. 339, 340, 341 and 342 Illustrates an overall view in pictorial of transparent solid material light-guide lens configurations. FIGS. 343, 344, 345, and 346 Illustrates an overall view in pictorial of modular assembled transparent solid material light-guide lens configurations.

FIGS. 347, 348, 349, and 350 Illustrates an overall view in pictorial of transparent solid material light-guide-stem light-guide lens configurations.

Figure 351:
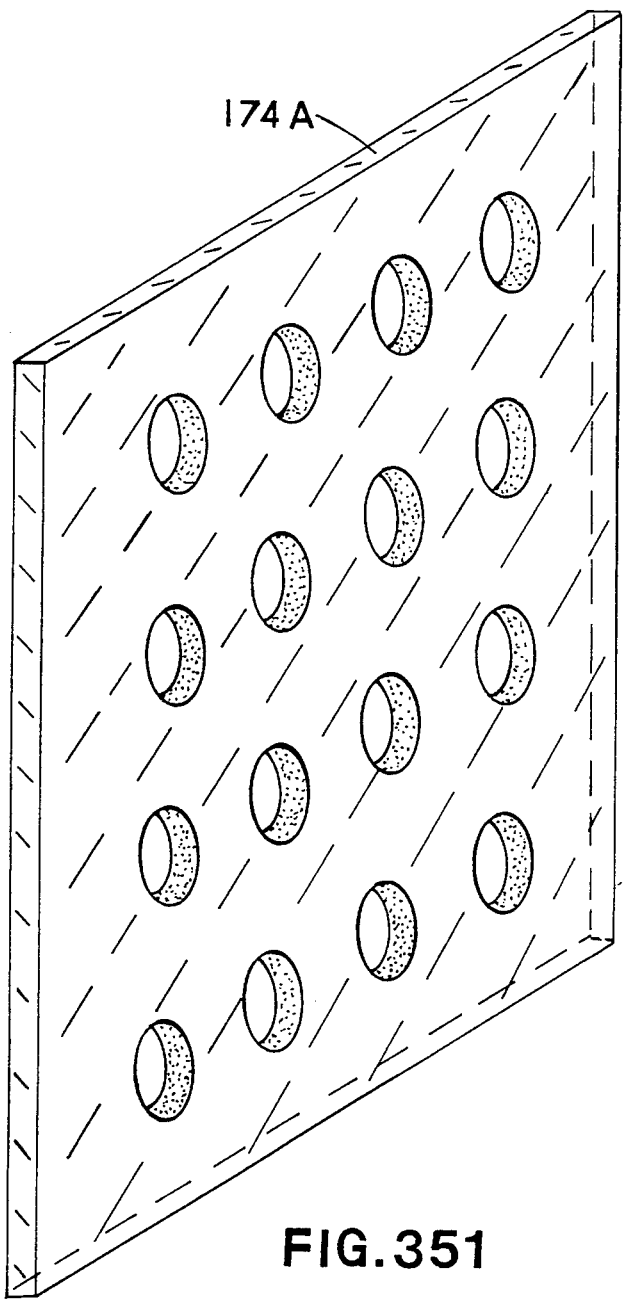

FIG. 351 Illustrates an overall view in pictorial of a matrix lens-plate configuration.

Figure 352:
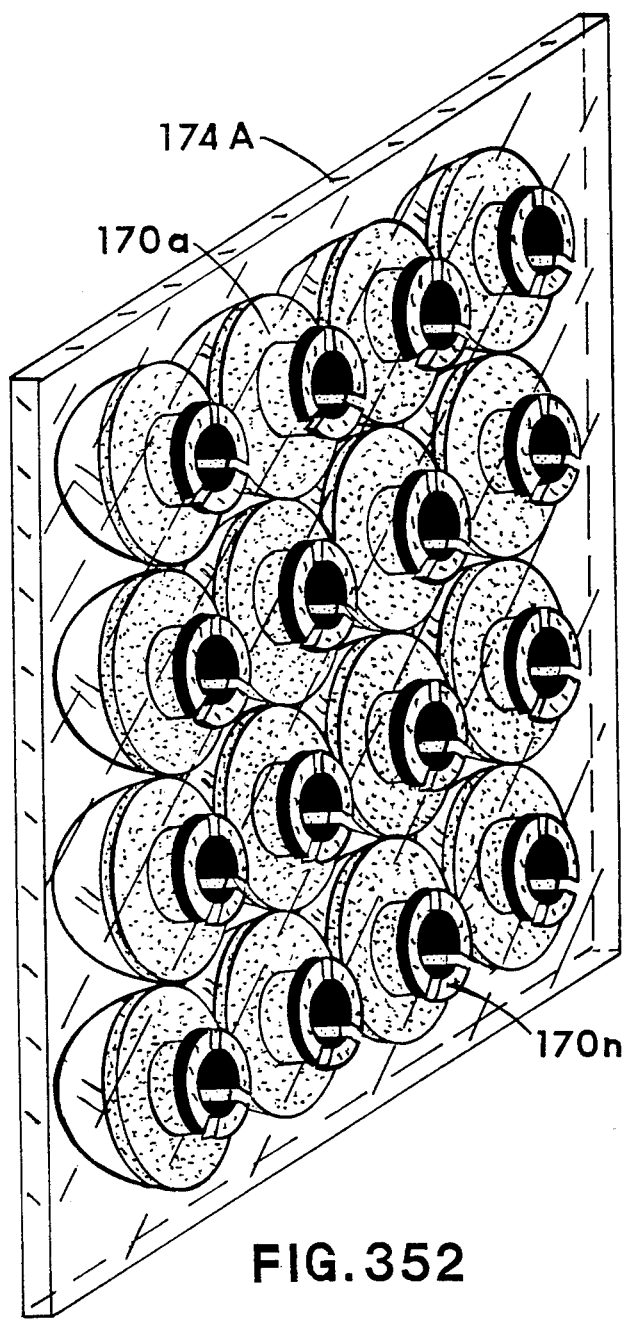

FIG. 352 Illustrates an overall view in pictorial of a removable snap-lock lens-cap lens-plate configuration.

Figure 353:
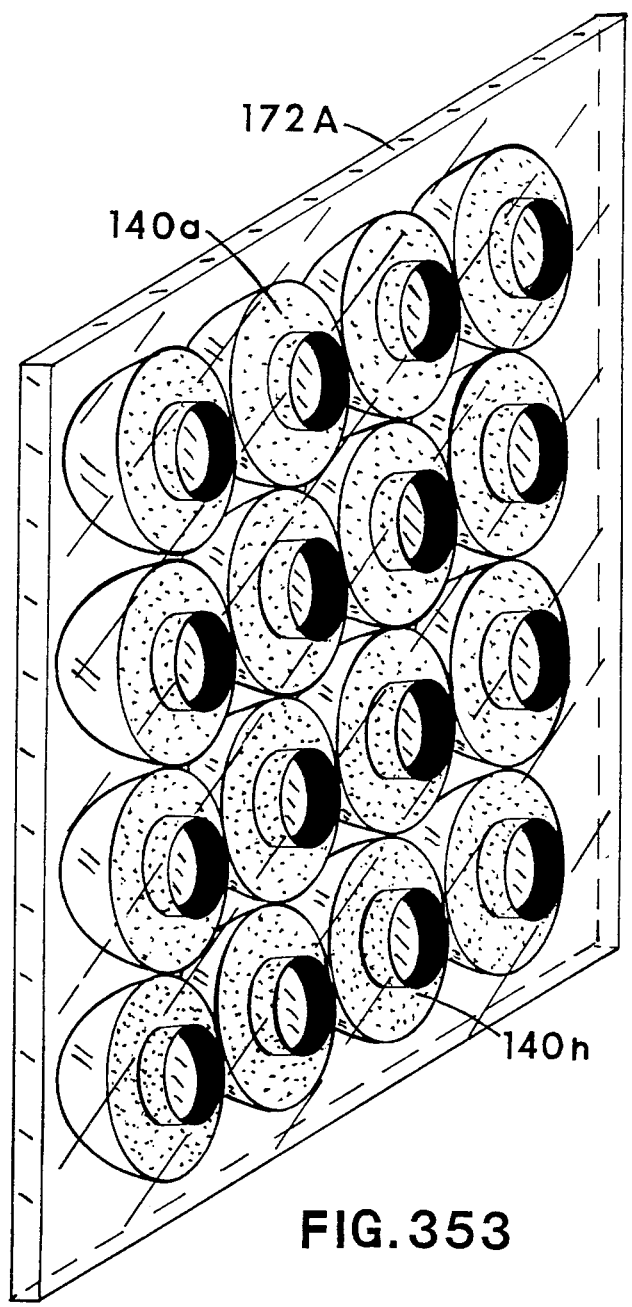

FIG. 353 Illustrates an overall view in pictorial of a matrix lens-cap-plate configuration.

Figure 354:
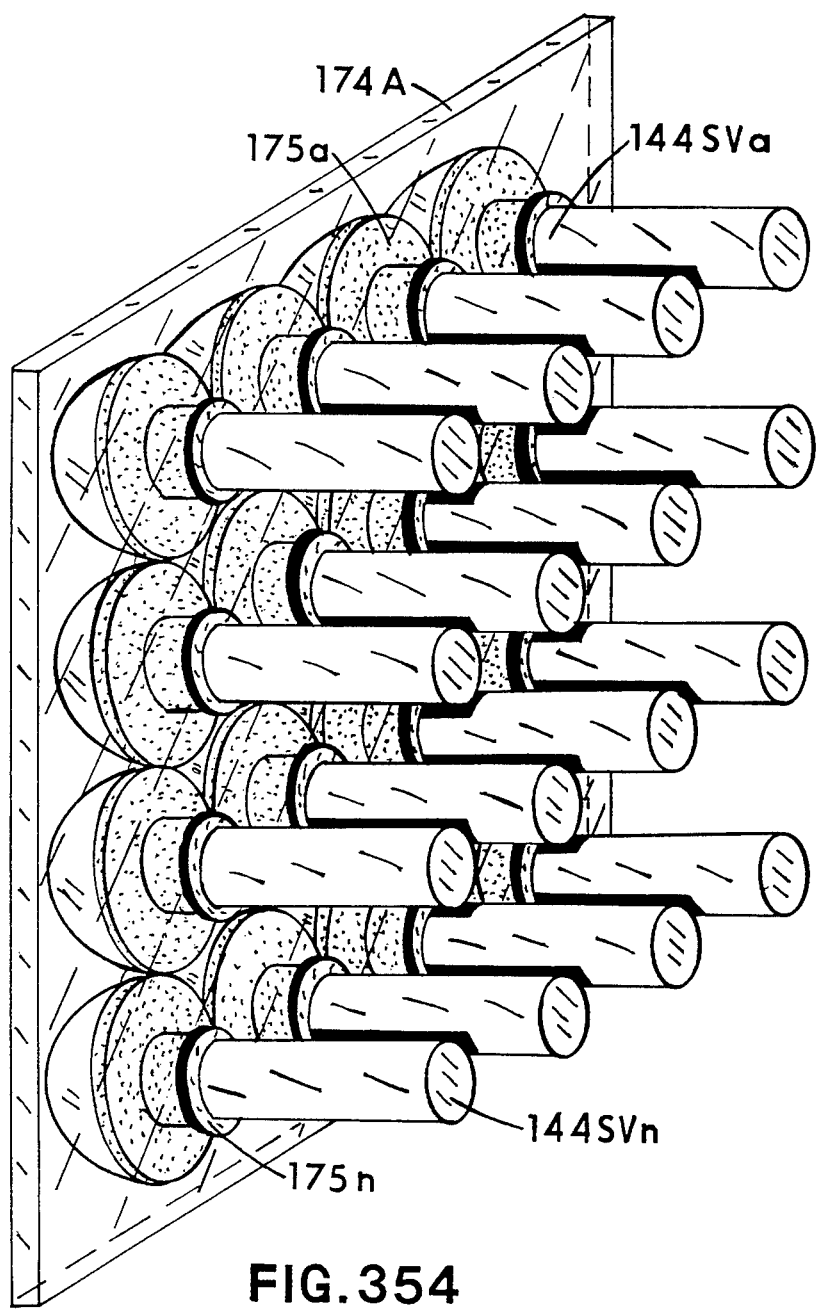

FIG. 354 Illustrates an overall view in pictorial of a linear-array light-guide lens configuration.

Figure 355:
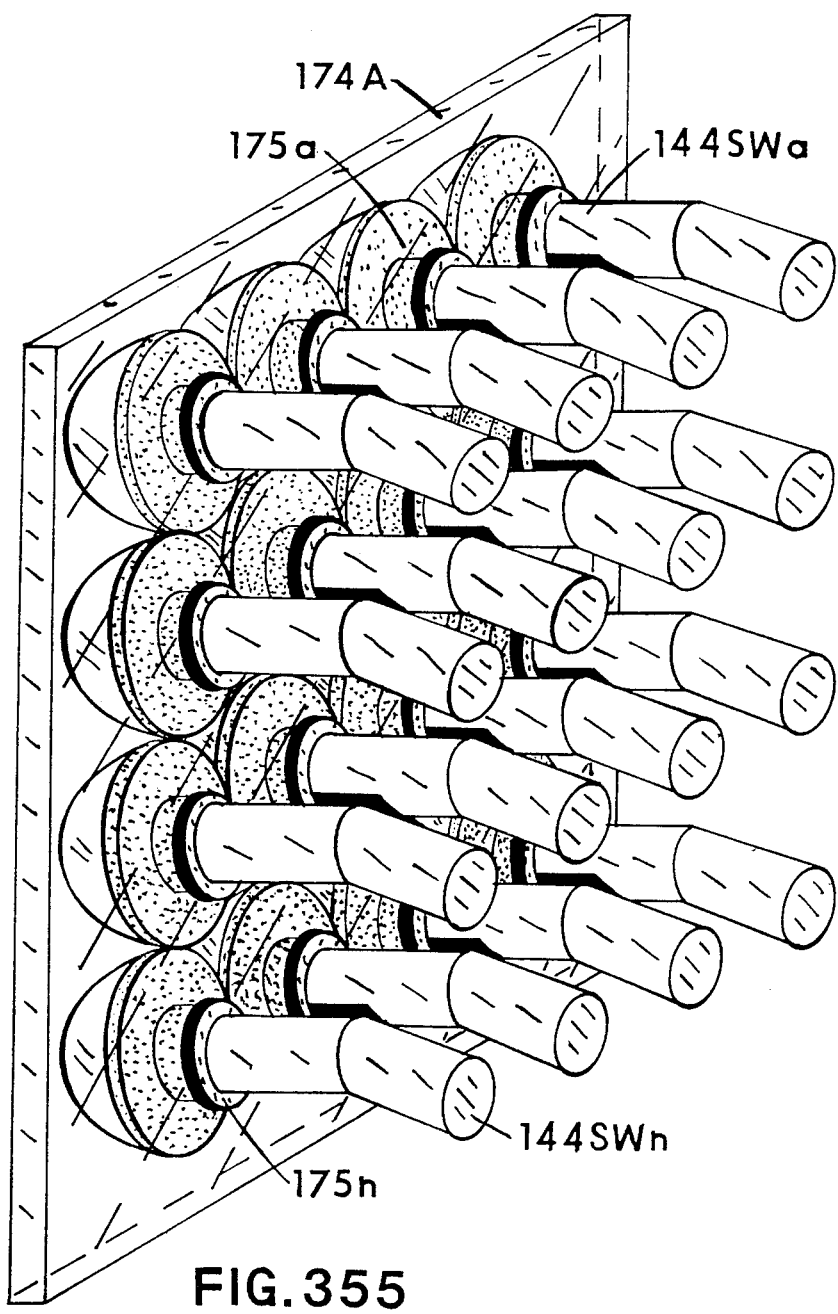

FIG. 355 Illustrates an overall view in pictorial of a angular-array light-guide lens configuration.

Figure 356:
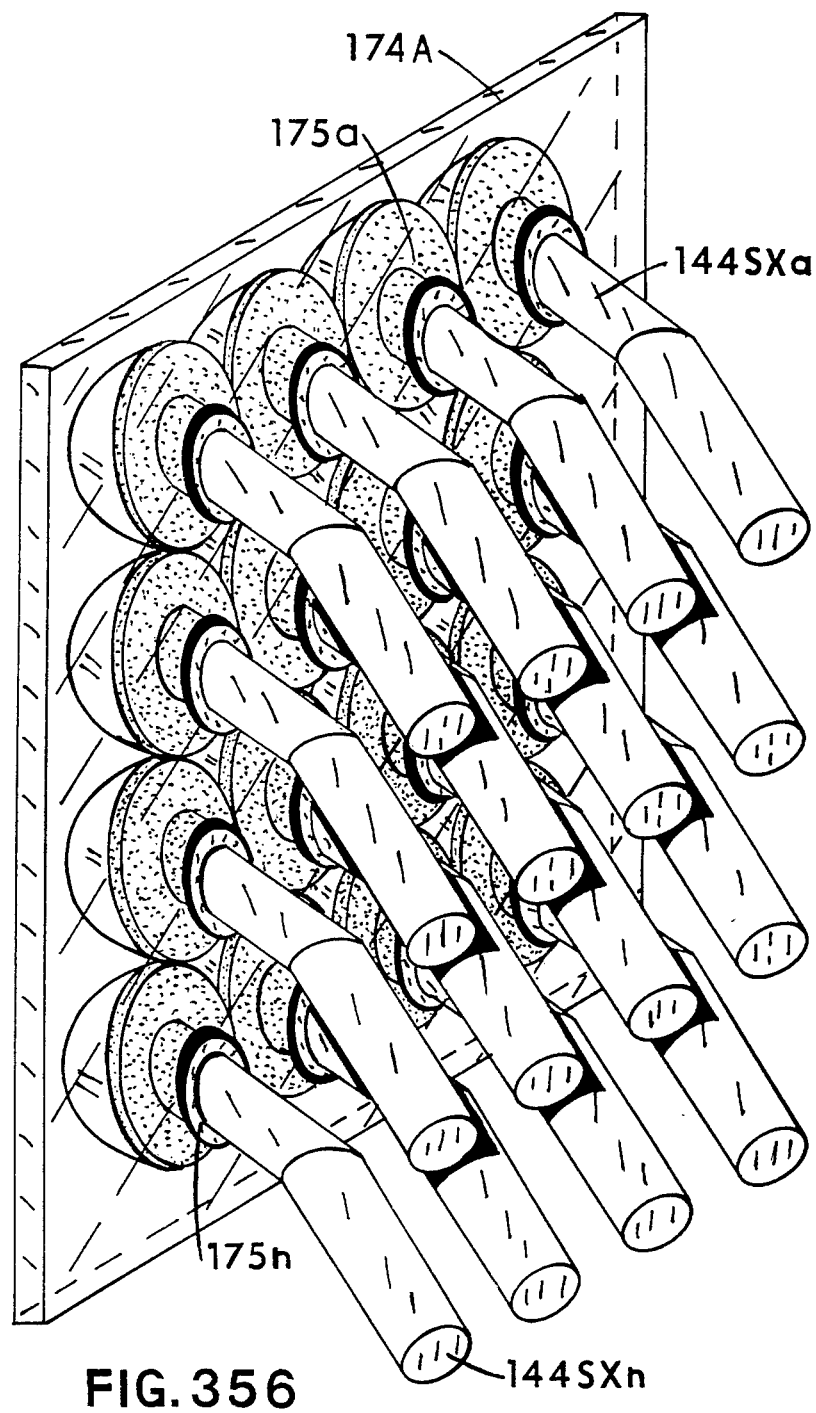

FIG. 356 Illustrates an overall view in pictorial of a tilt-angular-array light-guide lens configuration.

Figure 357:
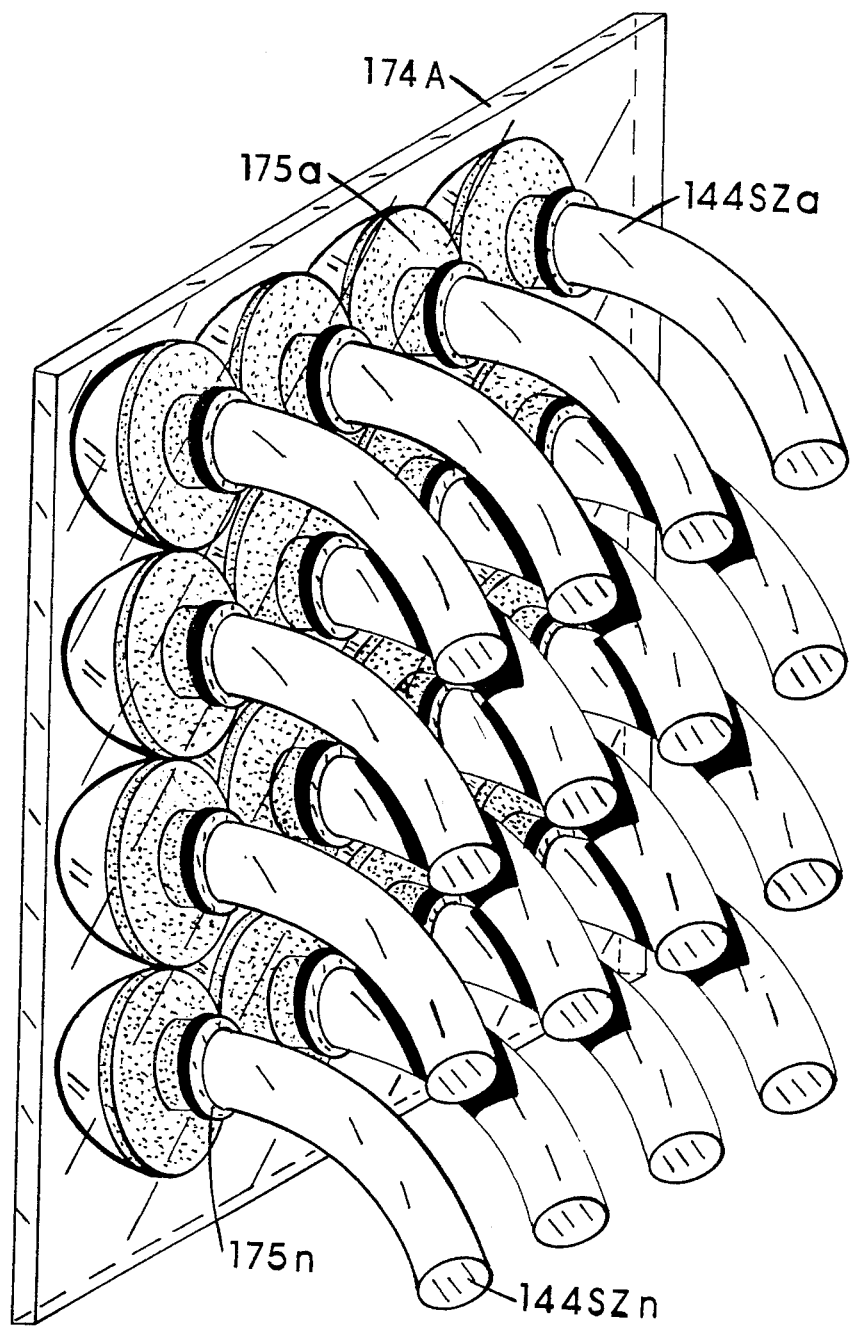

FIG. 357 Illustrates an overall view in pictorial of a curved-angular-array light-guide lens configuration.

Figure 358:
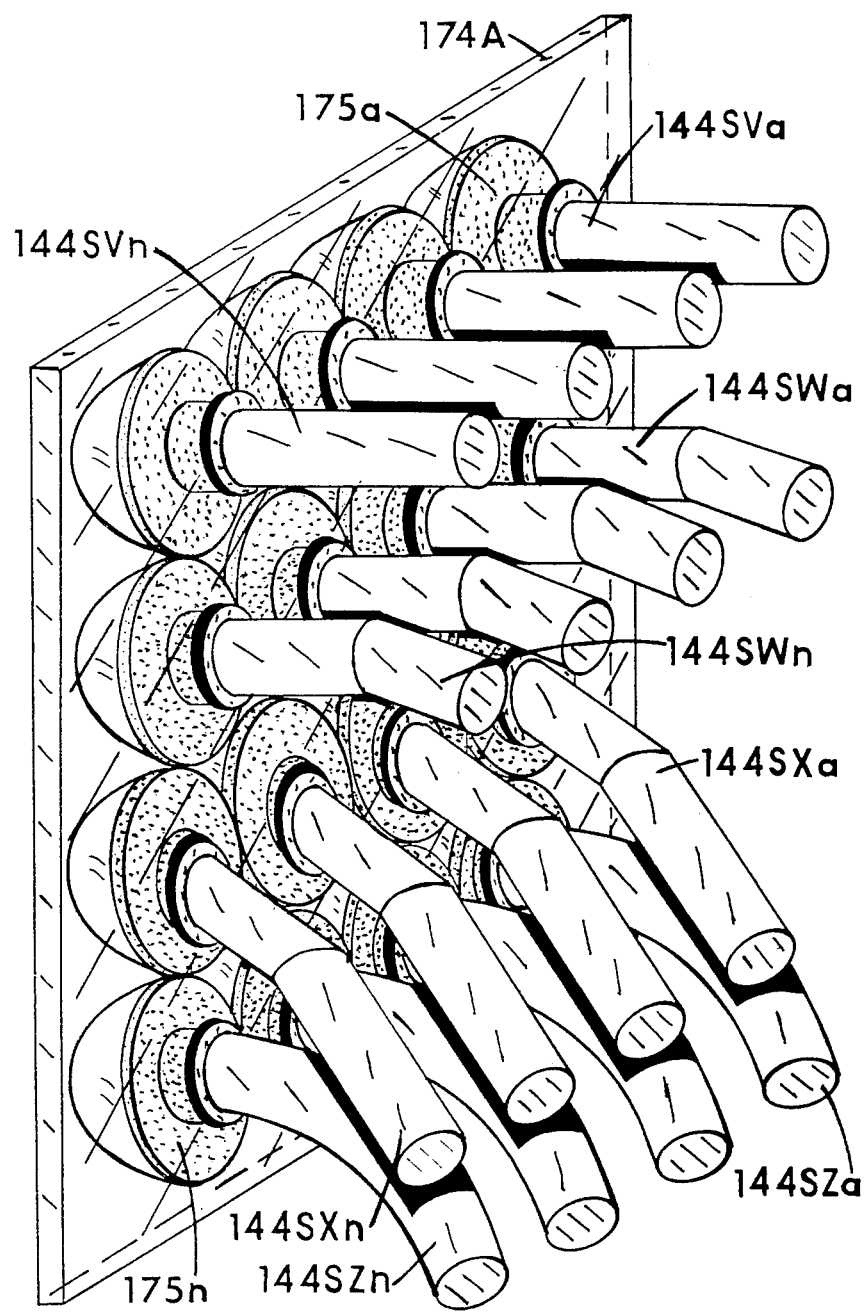

FIG. 358 Illustrates an overall view in pictorial of a linear-angular-tilt angular-curved angular-array light-guide lens configuration.

Figure 359:
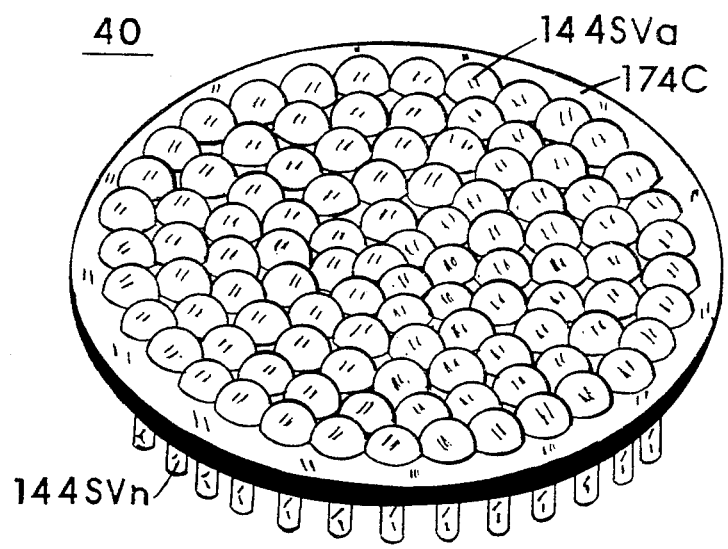
Figure 360:
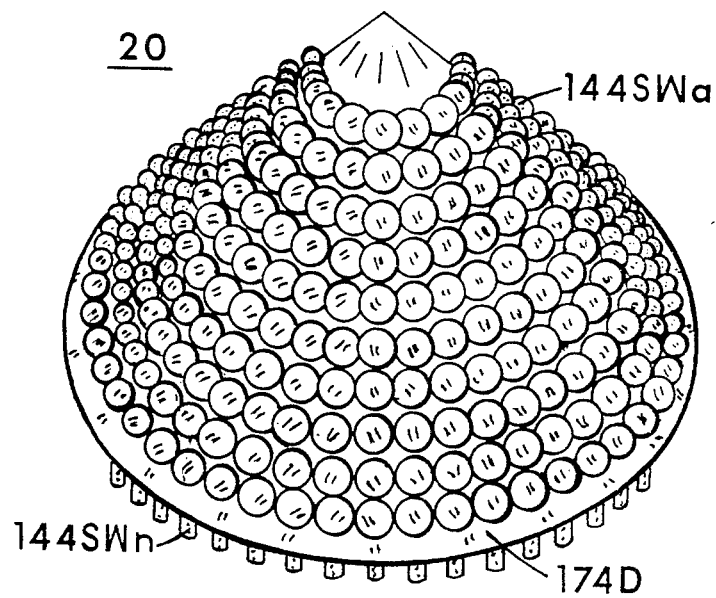

FIG. 359 Illustrates an overall view in pictorial of a disc-shaped light-guide lens configuration. FIG. 360 Illustrates an overall view in pictorial of a conical-shaped light-guide lens configuration.

Figure 361:
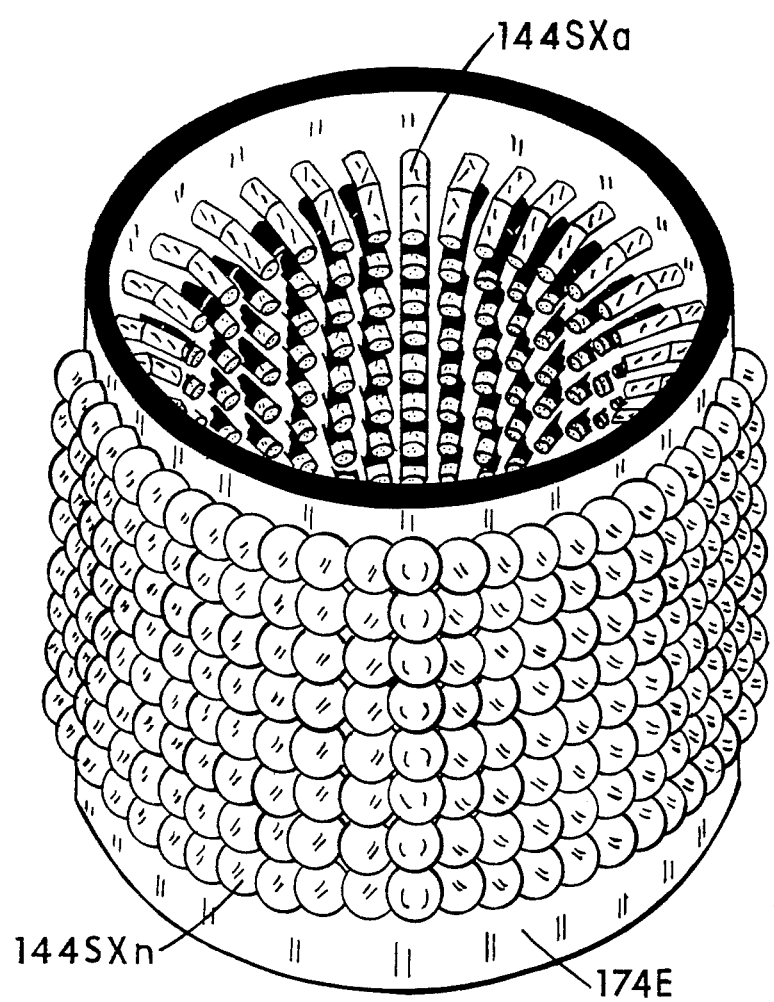

FIG. 361 Illustrates an overall view in pictorial of a cylindrical-shaped light-guide lens configuration.

Figure 362:
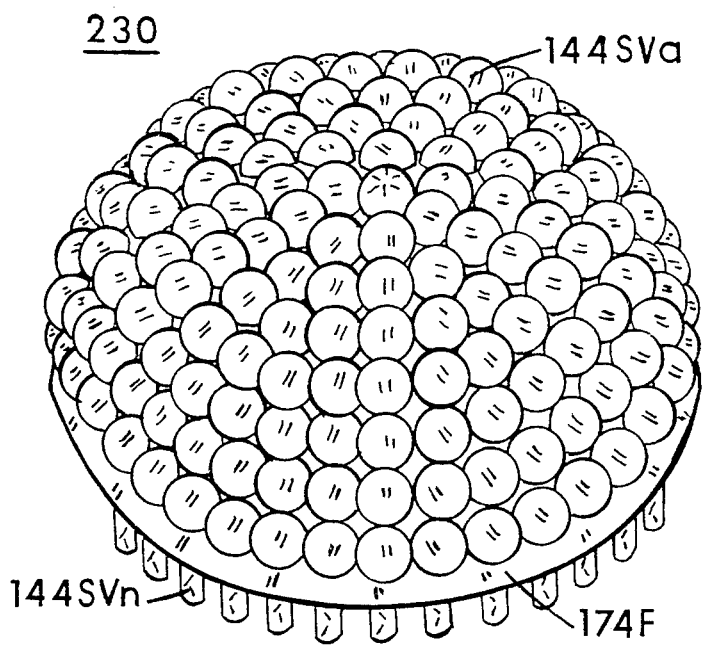

FIG. 362 Illustrates an overall view in pictorial of a hemispherical-shaped light-guide lens configuration.

Figure 363:
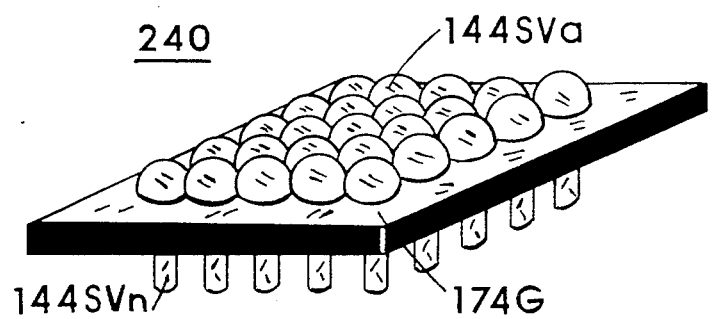

FIG. 363 Illustrates an overall view in pictorial of a rectangular-shaped light-guide lens configuration.

Figure 364:
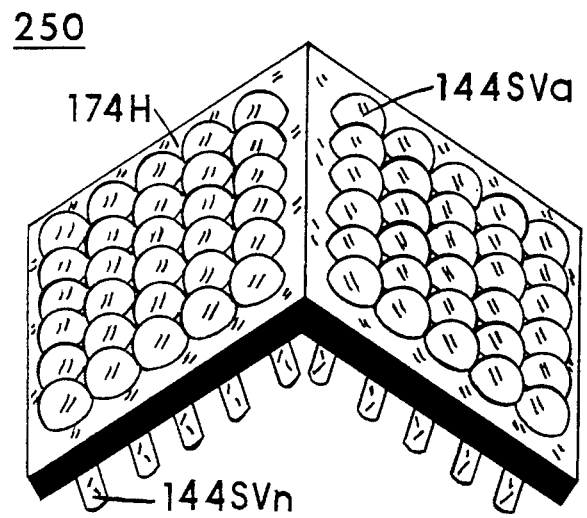

FIG. 364 Illustrates an overall view in pictorial of a peak-shaped light-guide lens configuration.

Figure 365:
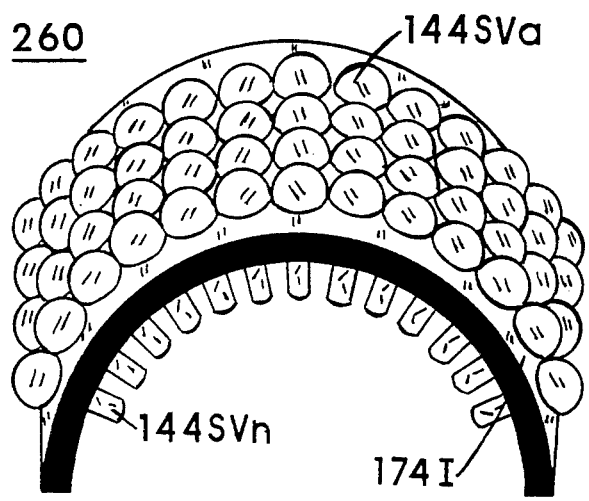

FIG. 365 Illustrates an overall view in pictorial of a semi-circle-shaped light-guide lens configuration.

Figure 366:
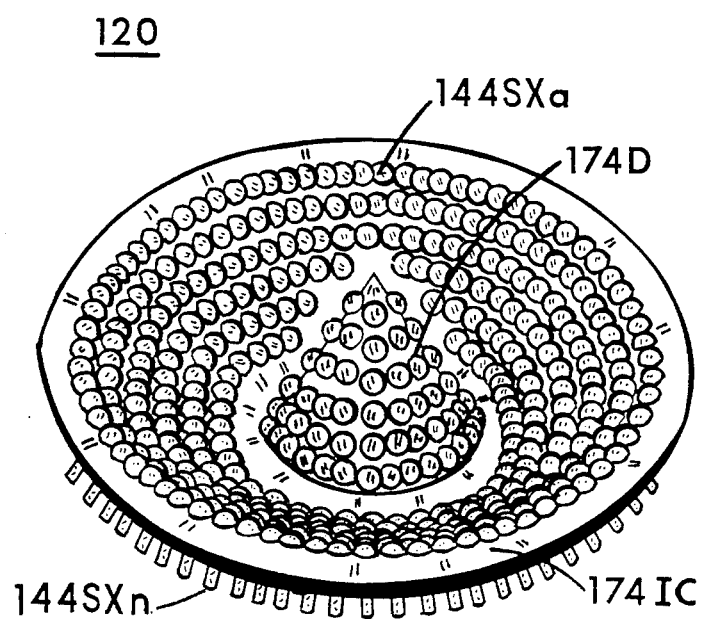

FIG. 366 Illustrates an overall view in pictorial of a central cone-peripheral disc-shaped light-guide lens configuration.

Figure 367:
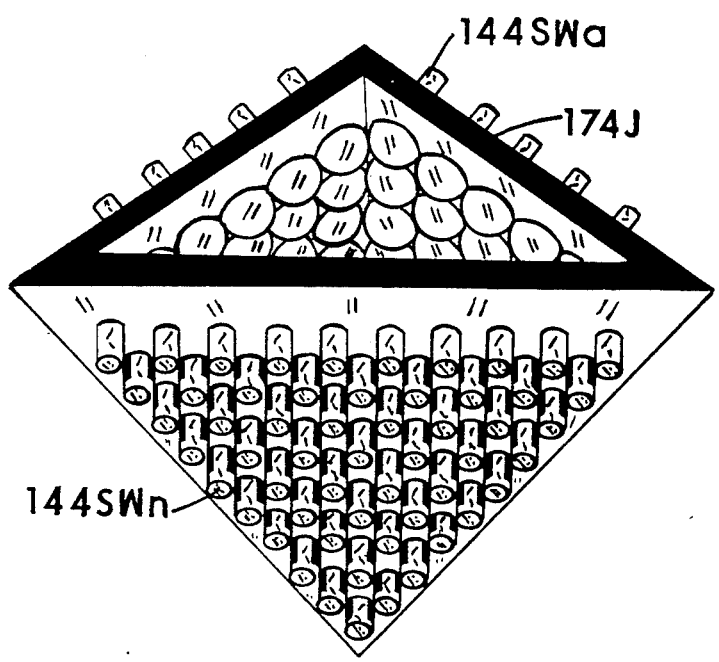

FIG. 367 Illustrates an overall view in pictorial of a multi-triangular-shaped light-guide lens configuration.

Figure 368:
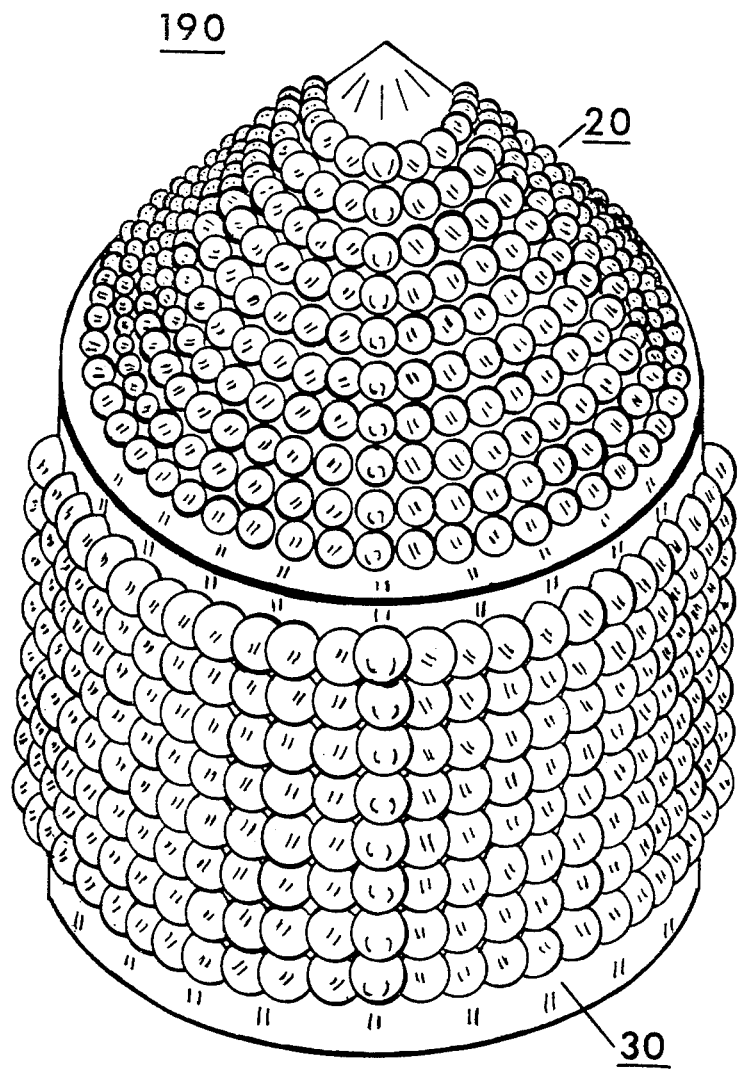

FIG. 368 Illustrates an overall view in pictorial of a silo-shaped light-guide lens configuration.

Figure 369:
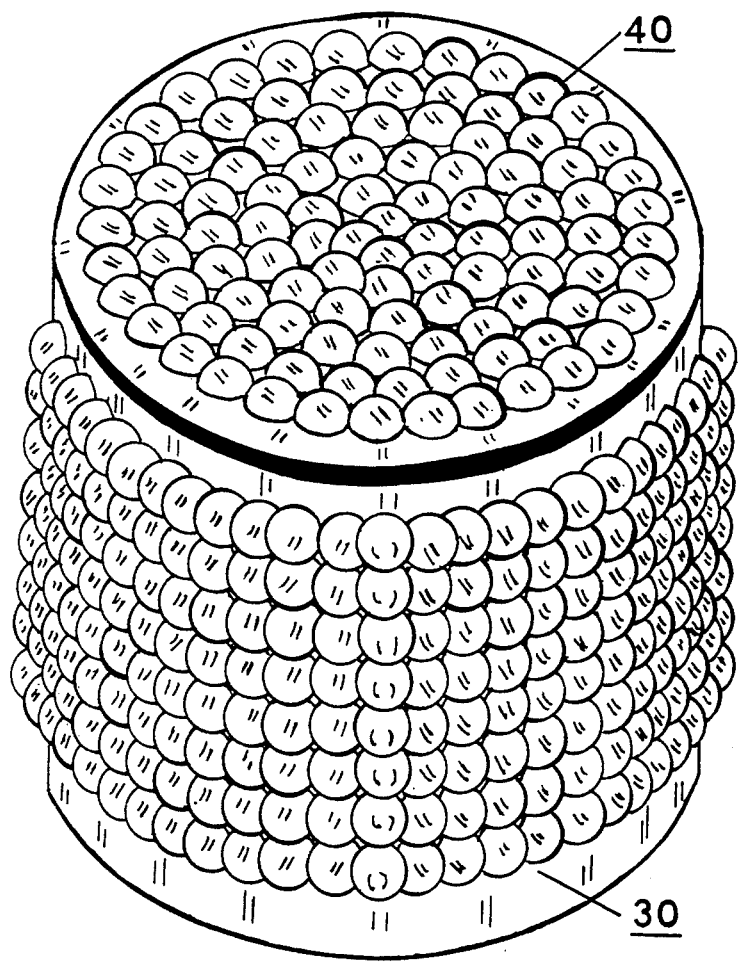

FIG. 369 Illustrates an overall view in pictorial of a drum-shaped light-guide lens configuration.

Figure 370:
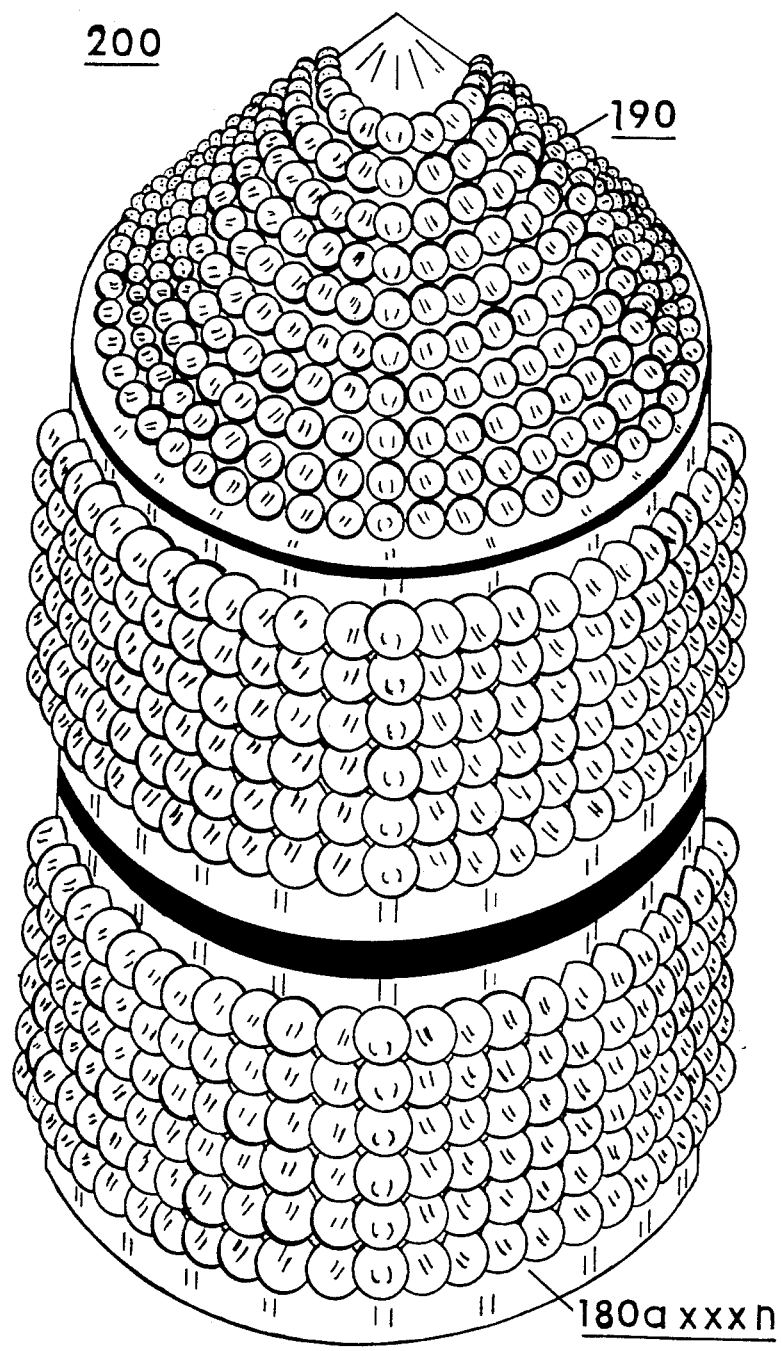

FIG. 370 Illustrates an overall view in pictorial of a modular assembled silo-shaped light-guide lens configuration.

Figure 371:
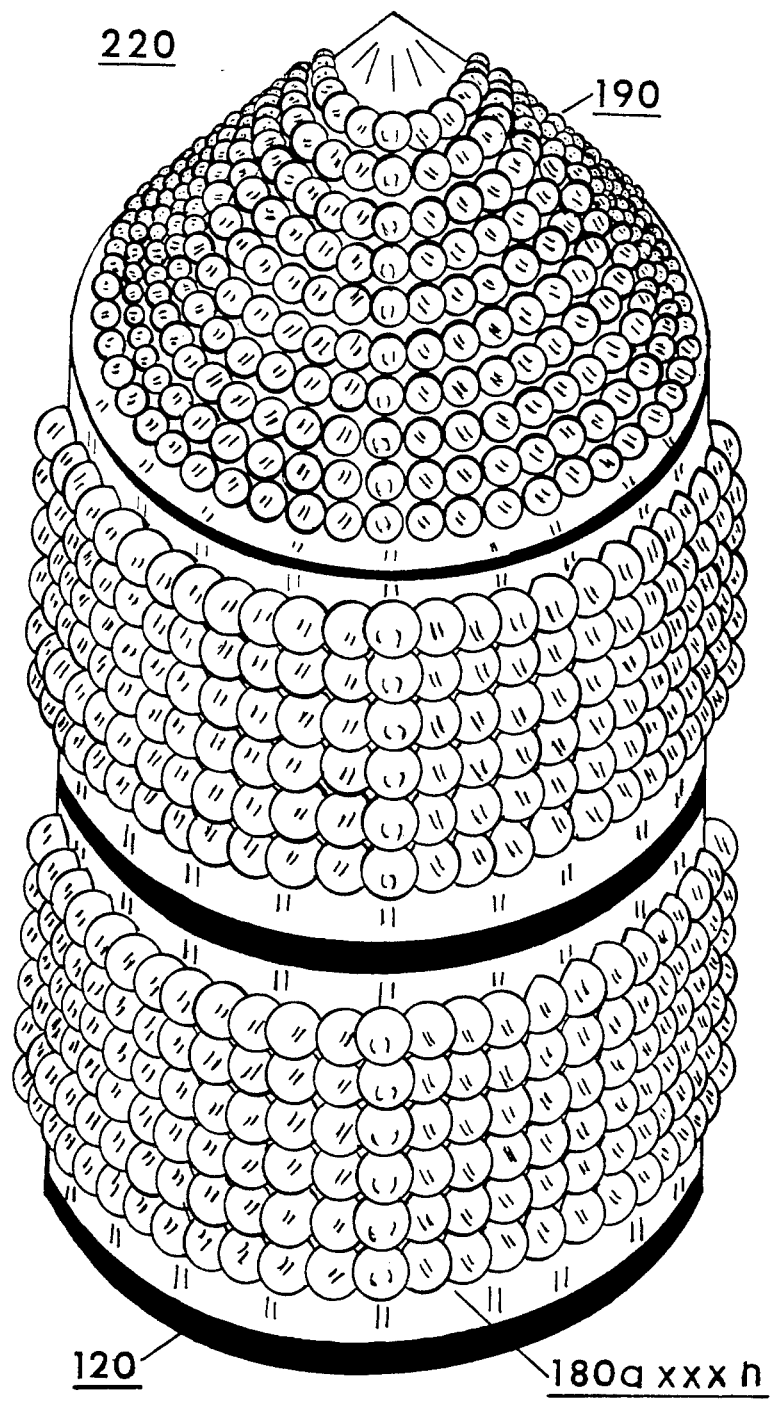

FIG. 371 Illustrates an overall view in pictorial of a modular assembled silo-focusing lens-shaped light-guide lens configuration.

DETAILED DESCRIPTION OF INVENTION WITH REFERENCE TO DRAWINGS

With particular reference now to FIG. 292, there is illustrated schematically a preferred embodiment of the present invention. In its most fundamental form the silo collector-concentrator lens comprises a housing or enclosure 210, a contoured capping light-guide lens 20, a wall light-guide lens 30, and a plurality of flat-surface light-guide focusing lenses 40a xxx n.

In principle of operation, the solar incident radiation is collected, redirected, and focused as it passes through the contoured capping lens 20 and wall lens 30. The transmission angle of the light radiation from that of the incident light rays is altered still further by the same light bending method as it passes through a plurality of flat-surface focusing lenses 40a xxx n stacked one over the other in spaced relationship and operable to concentrate the solar energy to a focal region 135. All the lenses are joined in a unitary structure 210. Placement of a angular-surface focusing lens 120 of FIG. 293 at bottom of lens 210 provides a split-focal region 136 and another focal region 137. In each case, the silo collector-concentrator lens arrangement 210 is capable of directing a maximum amount of solar radiation to a central focusing lens. The solar radiation is directed to the central focusing lens from all angles irrespective of the position of the sun overhead or on the horizon. The prior art lenses are not capable of varying the effective scan angle while directionally focusing or dispersing the solar incident light radiation.

The solar radiation energy lens 210 of FIG. 292 is shown more explicity (again schematically) in FIG. 289, FIG. 290, and FIG. 291 to which particular reference now may be made as to its modular component assembly construction. The basic unitary silo lens stage 190 of FIG. 290 is a composite assembly of a contoured capping lens 20 atop a wall lens 30a. An additive feeder lens stage 180 of FIG. 289 which is made up of a flat-surface focusing lens 40 atop another wall lens 30n is position beneath the silo lens 190 to form lens structure 200 of FIG. 291—increasing the vertical scanning surface. The solar energy capacity of any size silo lens is directly determined by the actual surface area of the silo lens stage 190 plus wall-surface area 34 of whatever number of feeder lens stage 180a xxx n being used.

Contrary to prior art lenses that project real images, the silo lens is specifically designed to concentrate solar radiant energy in an extremely large BTU'S flow capacity at very high temperatures hereintofore not possible.

With reference to FIGS. 277 through 288, there are illustrated several other light-guide lens embodiments in an overall cross-sectional schematic view to demonstrate various functions and operations to control the transmission of light rays emanating from a source at various angles FIG. 277, FIG. 278, FIG. 279, FIG. 280, FIG. 281, and FIG. 282 are flat-surface focusing lenses that are interchangeable in whatever combination of arrangement with 40 a xxx n of silo lens 210 of FIG. 292. Conical lens 283 and hemispherical lens 286 are peak-surface contour focusing lenses that are interchangeable as a capping lens 20 for any silo lens. Cylindrical lens 284 is a vertical wall structure focusing lens used in all silo lens configurations. Omnidirectional lens 285 is interchangeable with angular-surface focusing lens 120 of FIG. 293. Spherical lens 110 of FIG. 287 is an all directional focusing lens.

Light-guide lens 20 of FIG. 283, light-guide lens 30 of FIG. 284, light-guide lens 40A of FIG. 277, light-guide lens 40B of FIG. 278, light-guide lens 40C of FIG. 279, light-guide lens 40D of FIG. 280, light-guide lens 40E of FIG. 281, light guide lens 40F of FIG. 282, light-guide lens 90 of FIG. 285, light-guide lens 100 of FIG. 286, light-guide lens 110 of FIG. 287, and light-guide lens 120 of FIG. 288 can be used separate or apart or in combination with any or all other light-guide lenses to form any geometrical design configuration.

Basically each light-guide lens is an array of light-steering lenses 144a xxx n of FIG. 269 inserted into lens-plate 174. The light-steering lenses 144a xxx n are uniform in size, evenly distributed, and linearly alligned. The light-steering lens embodiments 144a xxx n controls the directivity of incident light radiation while lens-plate 174 is simply a non-optical geometrical support plate.

Figure 1:
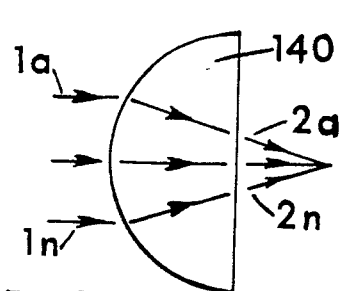
FIG. 1 Illustrates schematically a side view cross-section of a transparent solid material light-guide lens-cap structure in its simplest form combined with light dispersing means and their effect upon the projected light beams.
Figure 4:
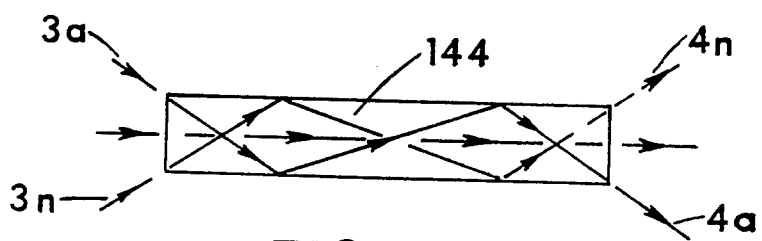
FIG. 4 Illustrates schematically a side view cross-section of a transparent solid rod light-guide stem structure in its simplest form combined with light dispersing means and their effect upon the projected light beams.
Figure 10:
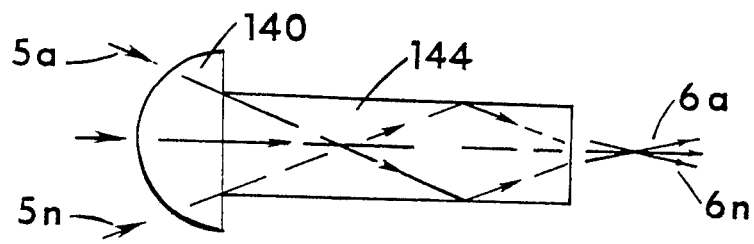
FIG. 10 Illustrates schematically a side view cross-section of a transparent solid material light-steering lens embodiment with its lens-cap structure affixed to a light-guide stem structure combined with light dispersing means and their effect upon the projected light beams.

Fundamentally a light-steering lens embodiment FIG. 10 is made up of a collector-focusing lens-cap FIG. 1 attached to a light-guide stem FIG. 4. The lens-cap FIG. 1 collects the incident light rays 1a xxx n and focuses the projected light rays 2a xxx n as the light energy passes through the lens material. The light-guide stem FIG. 4 simply transmits the focused light energy 2a xxx n of FIG. 1 as it passes through the stem material and is projected outwardly 4a xxx n as shown in FIG. 4.

Figure 13:
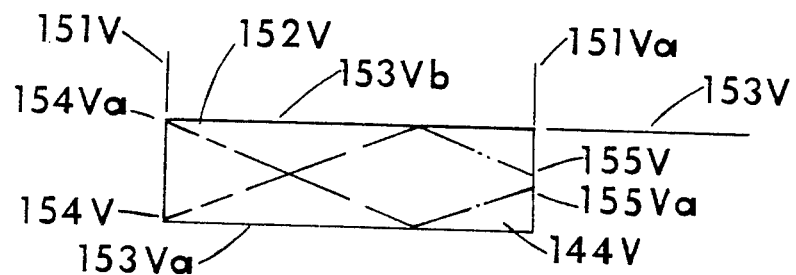
FIG. 13 Illustrates diagrammatically a side view cross-section of a transparent solid material light-guide stem structure combined with its geometrical straight design configuration principle.
Figure 14:
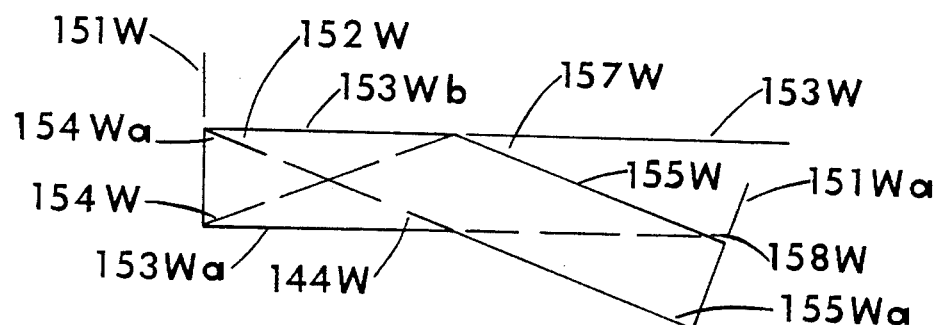
FIG. 14 Illustrates diagrammatically a side view cross-section of a transparent solid material light-guide stem structure combined with its geometrical angular design configuration principle.
Figure 15:
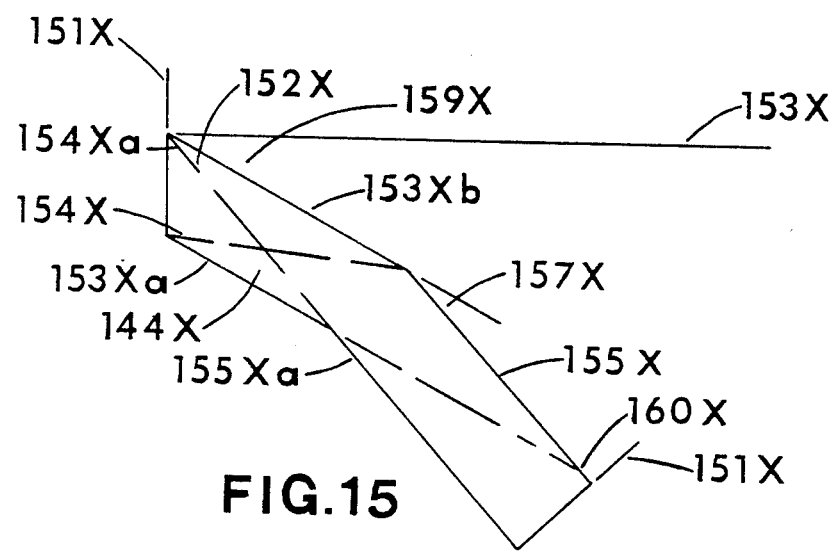
FIG. 15 Illustrates diagrammatically a side view cross-section of a transparent solid material light-guide stem structure combined with its geometrical tilt-angular design configuration principle.
Figure 16:
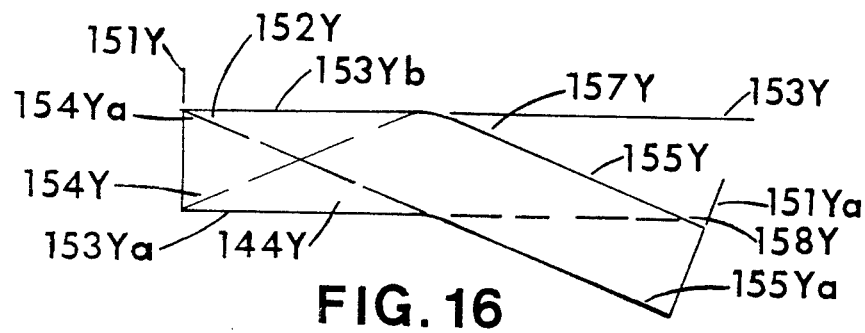
FIG. 16 Illustrates diagrammatically a side view cross-section of a transparent solid material light-guide stem structure combined with its geometrical curved-angular design configuration principle.
Figure 17:
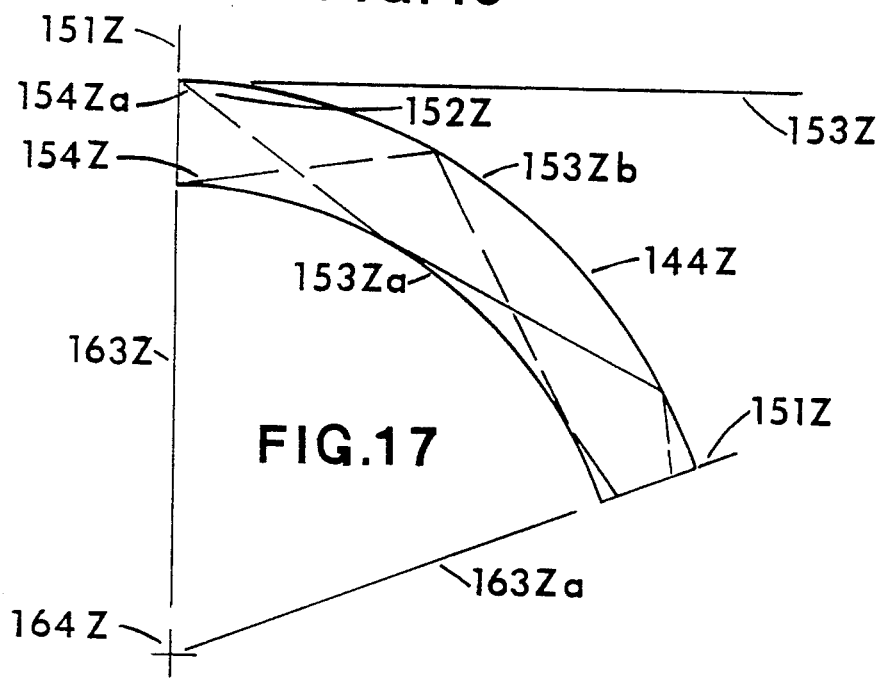
FIG. 17 Illustrates diagrammatically a side view cross-section of a transparent solid material light-guide stem structure combined with its geometrical curved design configuration principle.
Figure 18:
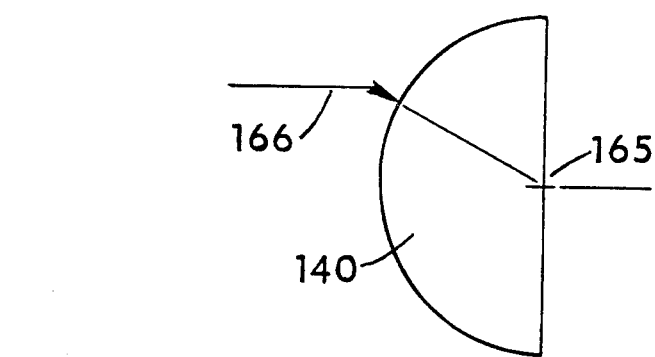
FIG. 18 Illustrates diagrammatically a side view cross-section of a transparent solid material lens-cap structure combined with its geometrical radius design configuration principle.

The transmission angle of the projected light rays 4a xxx n is strictly determined by the degree of angular displacement of the light-guide stem 144 from horizontal line 153 of FIG. 13 to vertical line 151 of FIG. 15. FIG. 13 illustrates a linear light-guide stem 144V configuration; FIG. 14 illustrates a angular light-guide stem 144W configuration; FIG. 15 illustrates a tilt-angular light-guide stem 144X configuration; FIG. 16 illustrates a curved-angular light-guide stem 144Y configuration; and FIG. 17 is a curved light-guide stem 144Z configuration.

The light-guide stem configuration 144V, 144W, 144X, 144Y and 144Z varies in its adaptability to the particular intended use within a given light-guide lens embodiment. Most generally, light-guide stem 144V of FIG. 13 can be used with feed lens 40A of FIG. 277, 40D of FIG. 280, 40E of FIG. 281, 40F of FIG. 282, with hemispherical lens 100 of FIG. 286, and spherical lens 110 of FIG. 287. Light-guide stem 144W can be used with feedlens 40B of FIG. 278, 40C of FIG. 279, 40D of FIG. 280, 40E of FIG. 281, 40F of FIG. 282, with conical lens 20 of FIG. 283, with V-shaped lens 90 of FIG. 285, and with angular surface lens 120 of FIG. 288. Light-guide stem 144X can be used in wall lens 30 of FIG. 284. Light-guide stem 144Z of FIG. 17 can be used in place of any light-guide stem configuration-by simply arcing or curving the stem surface to the desired transmission angle.

Figure 5:
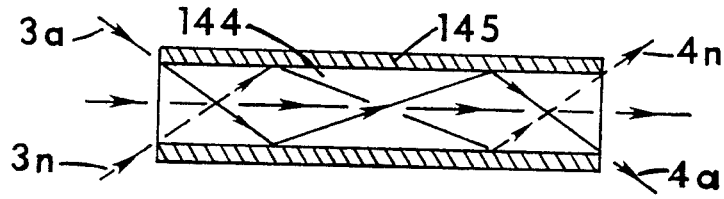
FIG. 5 Illustrates schematically a side view cross-section of a transparent solid rod light-guide stem structure with a different refractive index material outer-surface coating combined with light dispersing means and their effect upon the projected light beams.

Referring now to FIG. 5, there is illustrated the principle of the present invention in its most simplified planar embodiment. The light-guide stem FIG. 5 comprises of a light refractive (transparent) material lens-core 144 with a low refractive outer surface coating material 145. The zone between the high refractive material 144 and the low refractive material 145 produces a reflective surface to incident light rays. The incoming incident light rays 3a of FIG. 5, whether from a natural or artificial source, enters the lens-core 144 at end 3 and travel in a straight line to one wall-reflective surface. Relative to the angle of the incoming light 3a, the light rays will be reflected back and forth through the high refractive area 144 (transparent area)—and thereafter transmitted there from as angularly displaced light 4a. The ability to transmit light radiation by such a method is known in the field of optic's as total internal reflection.

For purposes of illustration the low refractive area 145 is highly exaggerated in demension. In actuality, area 145 is a very thin coating of highly polished material to prevent any light blockage. The high refractive area 144 is transparent and passes the maximum amount of light whereas the low refractive area 145 is reflective and passes no light energy. Together, the transparent lens-core 144 and the very highly reflective surface make up the light-guide stem.

In practical application the light rays 3a xxx n of FIG. 5 as shown do not enter the lens-core 144 linearly or straight. At zero degree angle the light would pass directly through the transparent area 144 uninhibited; and, the light-guide stem (linear or straight configuration only) would be of little benefit. However, light sources, whether they be the sun or room light, are always at some angle to an object to be illuminated. The incident light rays 3a xxx n will, therefore, always be at some angle from the vertical or the horizontal.

With continued reference to FIG. 5, the space between the two low refractive areas (reflective surfaces) and hence the diameter of the high refractive area 144 (light-guide stem) is such to permit the entrance of the incident light rays from an arc of sixty degrees (60°). The length of the "light-guide stem" 144, its diameter or its width, control in known principles of optics the angle of the transmitted light 4a. Therefore if the angle of the incoming light rays 3a, in the simple embodiment of FIG. 5, were reversed to that of incident light rays 3n, the angle of the transmitted light 4a would be reversed to the transmitted light 4n. Further, with a continuously movable light source swinging through the sixty degrees arc (60°) from that of light rays 3a to light rays 3n, the angle of the transmitted light 4a will complimentarily swing through a sixty degree arc (60°) in the opposite direction to 4n.

Figure 6:
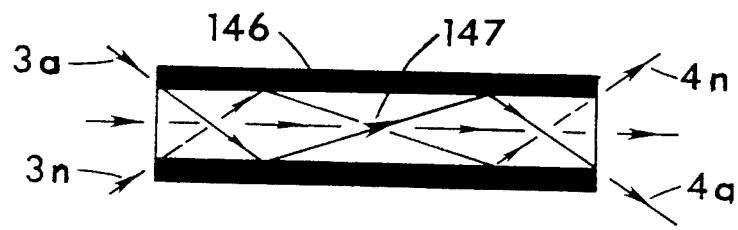
FIG. 6 Illustrates schematically a side view cross-section of a hollow tube light-guide stem structure with a highly reflective inner-surface in its simplest form combined with light dispersing means and their effect upon the projected light beams.
Figure 7:
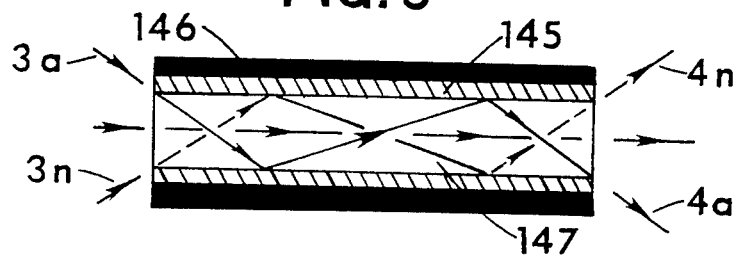
FIG. 7 Illustrates schematically a side view cross-section of a hollow tube light-guide stem structure with a different refractive index material inner-surface coating combined with light dispersing means and their effect upon the projected light beams.
Figure 8:
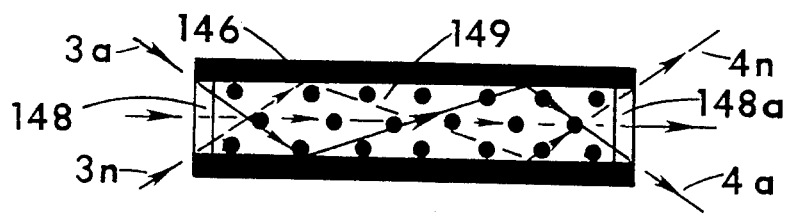
FIG. 8 Illustrates schematically a side view cross-section of a transparent sealed ends hollow tube light-guide stem structure filled with a light transmittal gas combined with light dispersing means and their effect upon the projected light beams.
Figure 9:
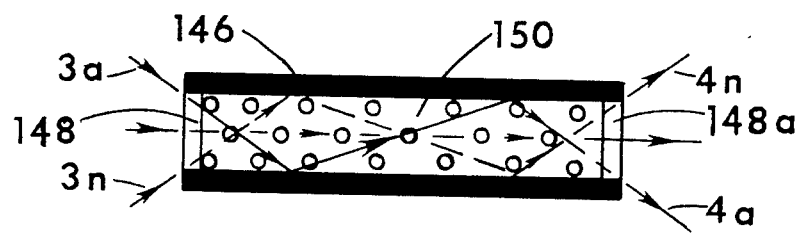
FIG. 9 Illustrates schematically a side view cross-section of a transparent sealed ends hollow tube light-guide stem structure filled with a light transmittal liquid combined with light dispersing means and their effect upon the projected light means.

With further reference to FIG. 5, there is illustrated the fundamental principle of a straight light-guide stem of the present invention in controlling the directivity of the incident light radiation in a linear light transmission mode. Optical-rod of FIG. 4, optical-tubing of FIG. 6 and FIG. 7, and encapsulated optical-tubing of FIG. 8 and FIG. 9 all demonstrate linear light transmission under the same light controlling principle of FIG. 5. This principle of linear light control transmission applies to solid material (transparent) lens-core 144 of FIG. 4 and FIG. 5, to air-lens-core 147 of FIGS. 6 and 7, to gas-lens-core (other than air) 149 of FIG. 8, and to liquid-lens-core 150 of FIG. 9. Whenever there is a combination of different refractive index material (low to high density material such as—solid 144 to air 147 of FIG. 4, solid 144 to solid 145 of FIG. 5, air 147 to solid 146 of FIG. 6 and FIG. 7, solid 146 to gas 149 (other than air) of FIG. 8, and solid 146 to liquid 150 of FIG. 9) the light-guide principle can be used. Since the wall-zone between the high refractive material 144 and the low refractive material 145 provides a reflective surface to incident light rays, a critical angle of reflection 152 (typically 21°) is formed within the lens-core 144. To exceed the critical angle of reflection 152 (as illustrated in FIG. 13 through FIG. 17) would cause light rays 3a xxx n to pass through the transparent refractive material 145 and be lost for further light transmission. Any angle of light rays less then the critical angle of reflection 152 would, of course, remain inside the lens-core 144 and be transmitted onward until they are emitted at end 4 of FIG. 5.

Beyond the light-lost factor, the critical angle of reflection 152 can, now, be used to increase the directivity of incident light radiation from that of linear to angular displacement of light transmission. FIG. 13, FIG. 14, FIG. 15, FIG. 16 and FIG. 17, illustrates different critical angle of reflection geometrical design configuration for solid 144 and/or tubular 146 light-guide stems.

FIG. 13 illustrates critical angle of reflection geometrical design configuration 144V for linear or straight light-guide stems. Diagonal line 154V of FIG. 13 cuts parallel sides of light-guide stem at an angle equal to the critical angle of reflection 152V of FIG. 13 from intersect points 153Va–151V to intersect point 153Vb–154V of FIG. 13. The minimum linear length of light-guide stem is, now, formed from intersect point 151V–153Vb to intersect point 154V–153Vb of FIG. 13. Line 155V of FIG. 13 starts at intersect point 154V–153Vb at an angle equal to the critical angle of reflection and extends to line 151Va of FIG. 13. Line segment 153Vb of FIG. 13 at intersect point 154V-153Vb to intersect point 151Va-153Vb of FIG. 13 is used both for ambient temperature compensation (expansion or contraction of material due to temperature changes) and for light dispersion control of linear light transmission. Diagonal line 154Va of FIG. 13 cuts parallel side (opposite from line 154V) at an angle equal to angle 154V from intersect point 151V-153Vb to intersect point 153Va-154Va of FIG. 13 to form width (or diameter) of light-guide stem 144V. Front interface surface 151V of FIG. 13 is perpendicular to 153Vb of FIG. 13. Rear emitting surface 151Va is also perpendicular to the same line 153Vb of FIG. 13.

FIG. 14 illustrates the critical angle of reflection geometrical design configuration 144W for a angular-surface light-guide stem. Diagonal line 154W of FIG. 14 cuts parallel side of light-guide stem at an angle equal to the critical angle of reflection 152W of FIG. 14 from intersect point 153Wa-151W to intersect point 153W-155W of FIG. 14. Horizontal length (front section of light-guide stem) is now formed from intersect point 151W-153Wa to intersect point 151Wa-155Wa of FIG. 14. Parallel sides of light-guide stem is, now, bent (or rotated angularly) at intersect point 155Wa-153Wa to form an angle 157W of FIG. 14 equal to or less than critical angle of reflection 152W of FIG. 14. Diagonal line 154Wa of FIG. 14 cuts (opposite direction of line 154W) horizontal section 153Wb at an angle equal to the critical angle of reflection 152W of FIG. 14 from intersect point 151W-153Wb to intersect point 153Wa-155Wa of FIG. 14 to form the width (or diameter) of light-guide stem 144W of FIG. 14. By extending line 153Wa of FIG. 14 from intersect point 153Wa-155Wa of FIG. 14 to intersect point 153Wa (extended line section)—155W of FIG. 14 an angular linear length (rear section of light-guide stem) is, now, formed from intersect point 153Wb-155W to intersect point 153Wa-155W (point location 158W) of FIG. 14. The line from point location 158W to intersect point 151Wa (on line 155W) of FIG. 14 can vary in length to allow for ambient temperature compensation-like that of FIG. 13. Front interface surface line 151W of FIG. 14 is perpendicular to line 153Wb of FIG. 14. Rear emitting surface 151Wa is perpendicular to line 155W. By simply varying angle 157W (only) linear light transmission can be adjusted to any angle up to but not beyond the critical angle of reflection 152W of whatever transparent material being used as a light-guide stem.

FIG. 15 illustrates angular displaced light transmission beyond that of angle 157W of FIG. 14. The critical angle of reflection geometrical design configuration 144X is exactly the same as configuration 144W except for the fact that light-guide stem is angular displaced (tilted) from horizontal line 153 to form angle 159X—typically 27°.

In typical application of usage, light-guide stem 144W can vary light transmission from zero degree (0°) to twenty-one degrees (21°); whereas, light-guide stem 144X changes angular light transmission still further from twenty-one (21°) to forty-eight degrees (48°).

FIG. 16 illustrates critical angle of reflection geometrical design configuration 144Y. Configuration 144Y is exactly the same as light-guide stem 144W except for the fact that the "bend" area (intersect point 153Yb-155Y is arc-curved rather than a sharp intersection as shown in FIG. 14.

Unlike FIG. 13 through FIG. 16, the geometrical design configuration 144Z of FIG. 17 illustrates a curved or sloped light-guide stem. The arc-degree curvature or slant of light-guide stem 144Z of FIG. 17 can vary from zero degree (0°) to more than forty-five (45°) from horizontal line 153Z of FIG. 17 for any pre-determined light transmission angle. The arc-shaped line 153Za and 153Zb (line 153Zb is parallel to line 153Za) is uniformly formed around a central axis 164Z of FIG. 17. Line 163Z always remains constant while line 163Za can vary in length to adjust for the desired angle of light transmission. The arc-shaped light-guide stem is, however, limited to an arc-degree-curvature up to but not beyond the critical angle of reflection 152X of whatever transparent material being used as the light-guide stem.

Not only does light-guide stem configuration 144V, light-guide stem configuration 144W, light-guide stem configuration 144X, light-guide stem configuration 144Y, and light-guide stem configuration 144Z applies to any transparent solid material 144 but also applies to all tubular material 146.

Figure 24:
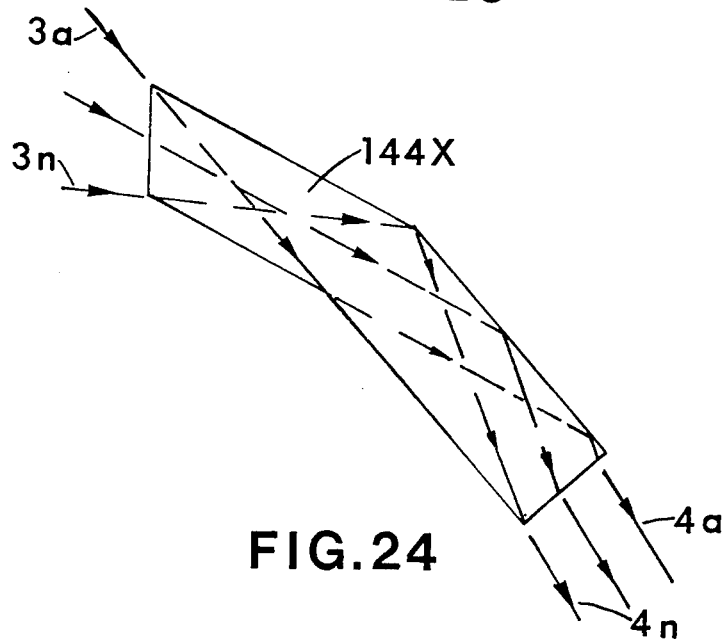
Figure 25:
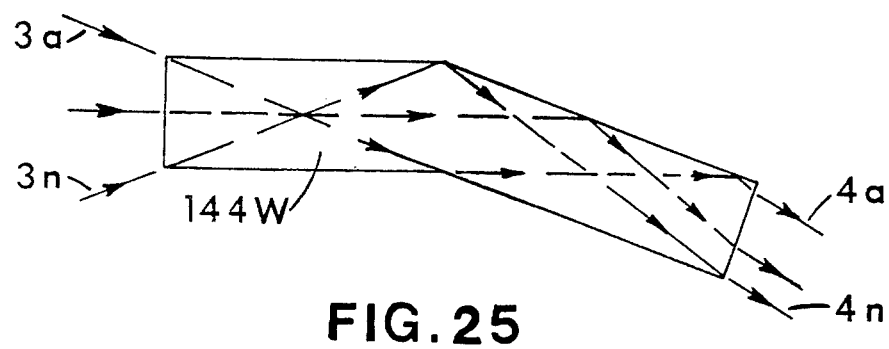
Figure 32:
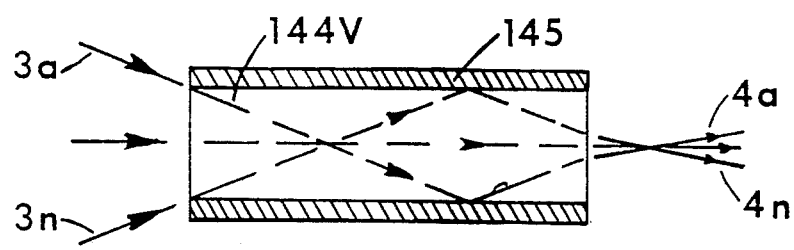
FIGS. 32, 33, and 34 Illustrates schematically a side view cross-section of a different refractive index material surface-coated transparent material light-guide stem structure combined with light dispersing means and their effect upon the projected light beams.
Figure 33:
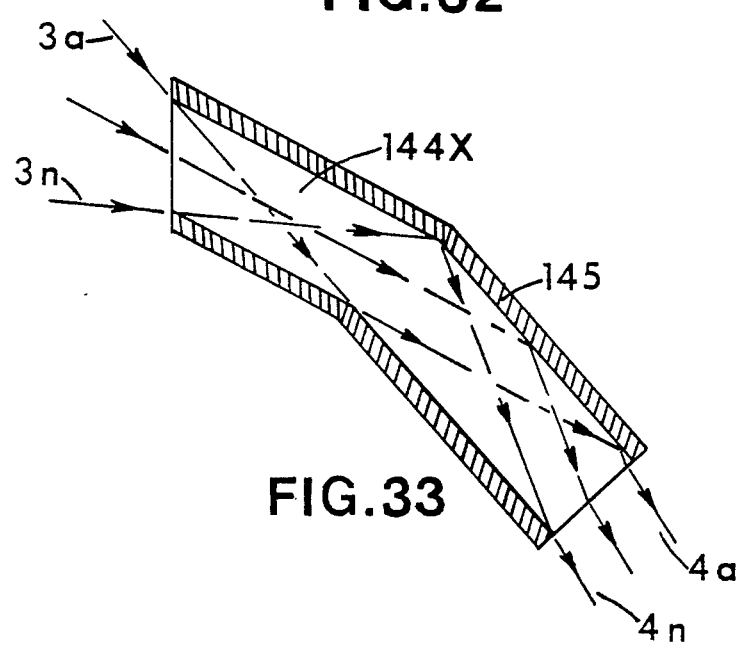
Figure 52:
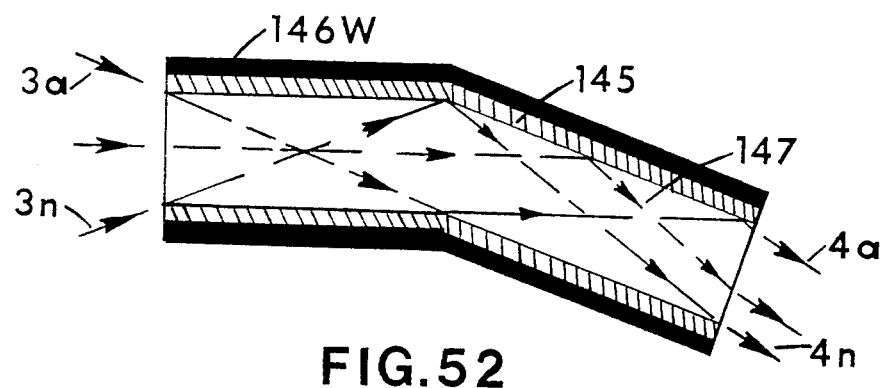
FIGS. 50, 51, and 52 Illustrates schematically a side view cross-section of a different refractive index material inner-surface coated hollow tube light-guide stem structure combined with light dispersing means and their effect upon the projected light beams.
Figure 26:
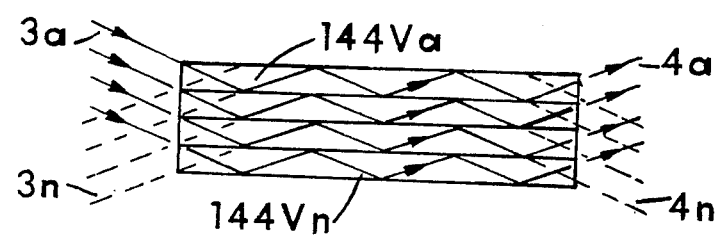
FIGS. 26, 27, and 28 Illustrates schematically a side view cross-section of a bundle array of transparent solid material light-guide stem structure combined with light dispersing means and their effect upon the projected light beams.
Figure 27:
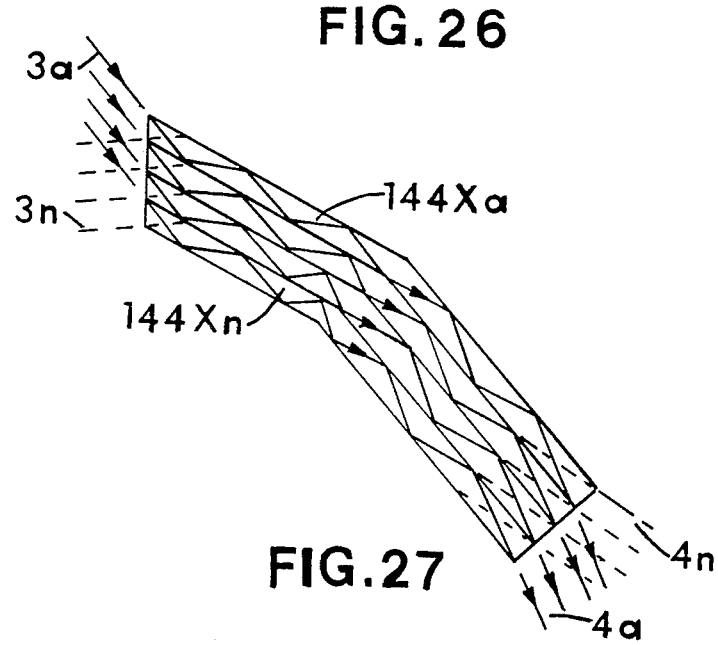
Figure 28:
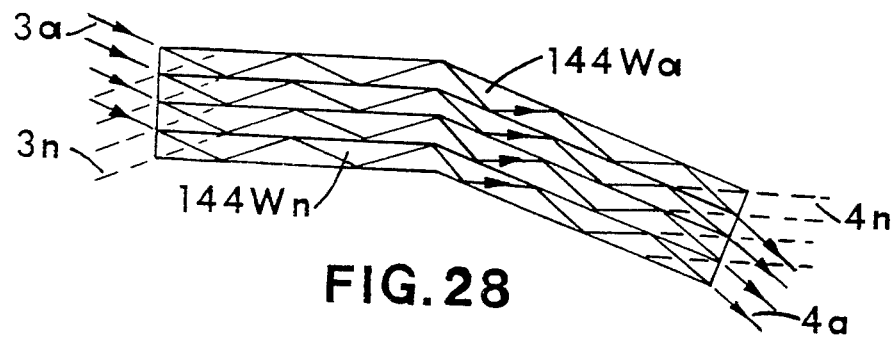

Since geometrical design configuration 144W of FIG. 14, configuration 144X of FIG. 15, configuration 144Y of FIG. 16, and configuration 144Z of FIG. 17, demonstrates non-linear light transmission, certain new and different changes in light ray directivity within the lens-core takes place as compared to FIG. 4 through FIG. 9. Instead of passing the light rays directly through the transparent lens-core 144 of FIG. 5 uninhibited at zero degree, FIG. 24 and FIG. 25 shows the zero degree light ray 3 being deflected at an angle equal to or less than the critical angle of reflection of the transparent lens-core material. Incident light rays 3a xxx n (60° arc) that are greater than the zero degree of entry are also deflected at an angle equal to or less than the same critical angle of reflection—resulting in a uniform deflection of light rays 4a xxx n as shown.

Figure 59:
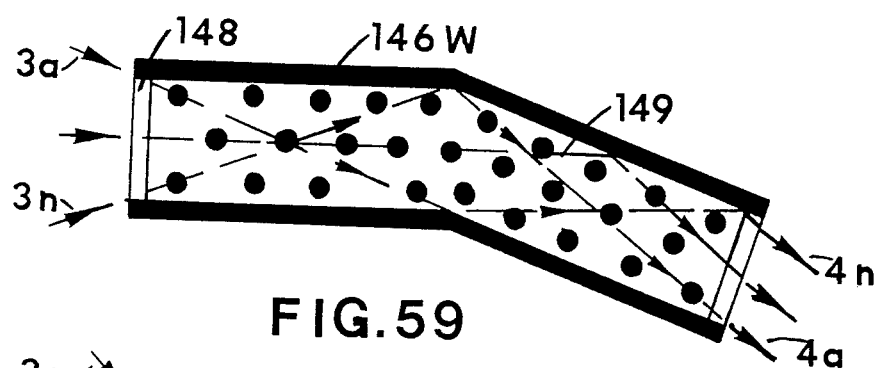
FIGS. 59, 60, and 61 Illustrates schematically a side view cross-section of a transparent sealed ends light transmittal gas filled hollow tube light-guide stem structure combined with light dispersing means and their effect upon the projected light beams.
Figure 60:
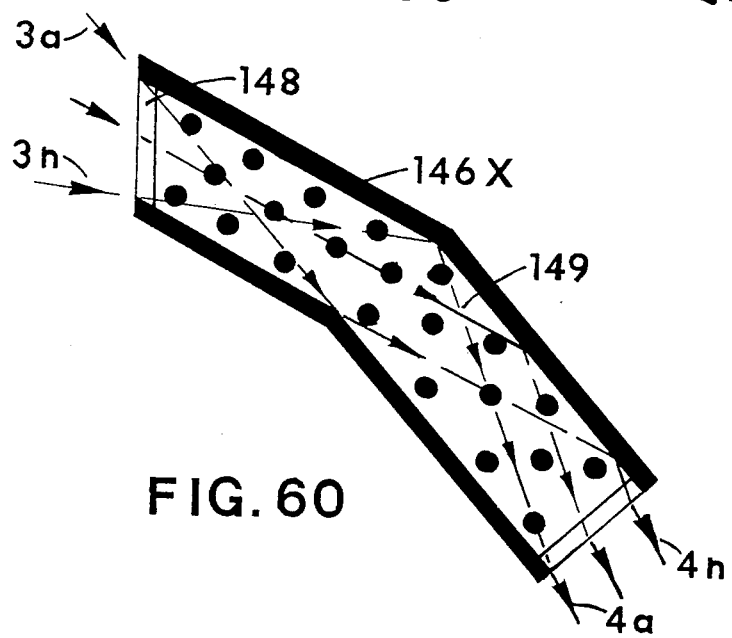
Figure 61:
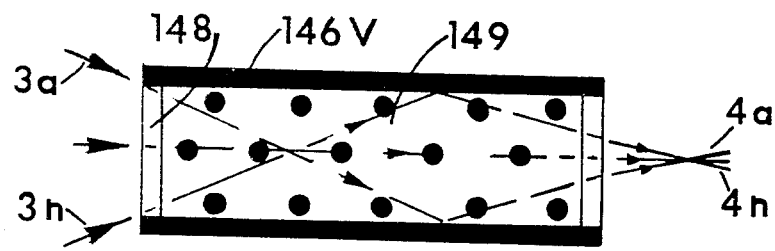
Figure 62:
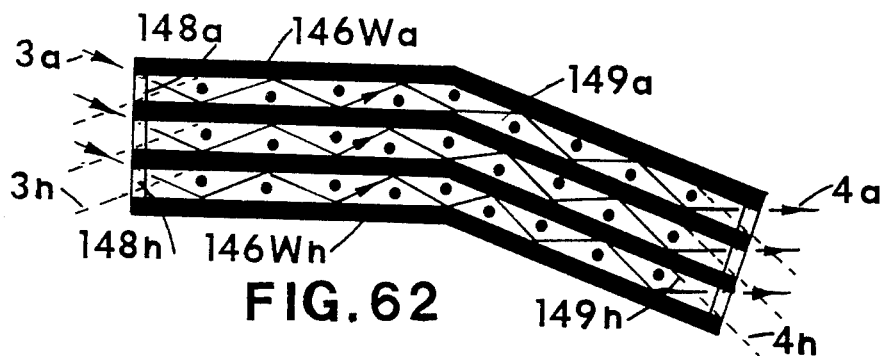
FIGS. 62, 63, and 64 Illustrates schematically a side view cross-section of a bundle array of transparent sealed ends light trasmittal gas filled hollow tube light-guide stem structures combined with light dispersing means and their effect upon the projected light beams.
Figure 63:
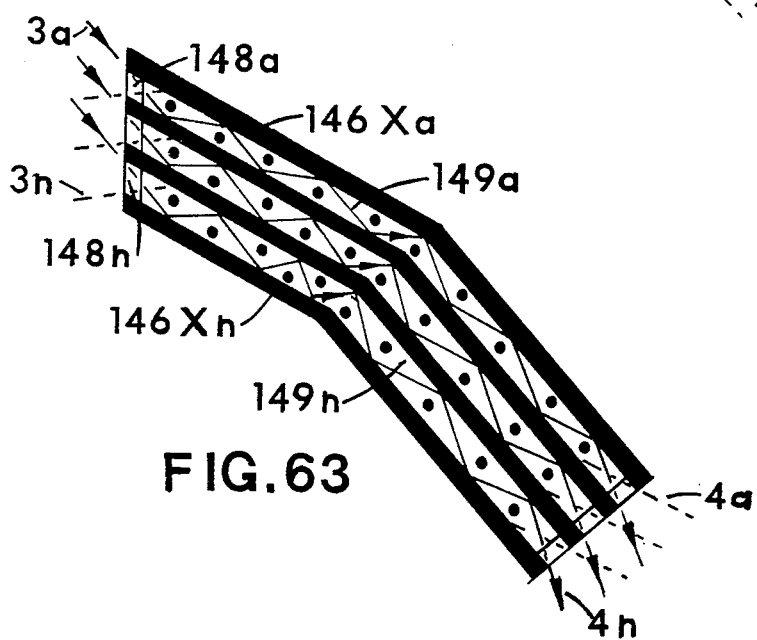
Figure 64:
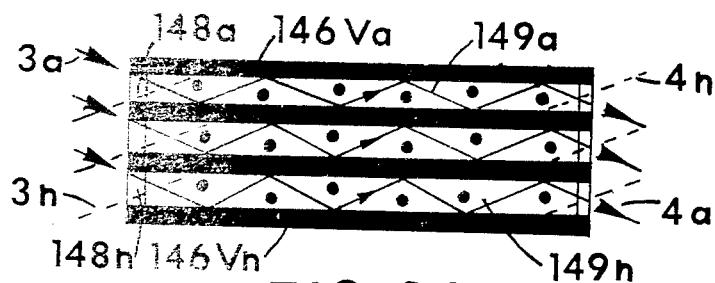
Figure 65:
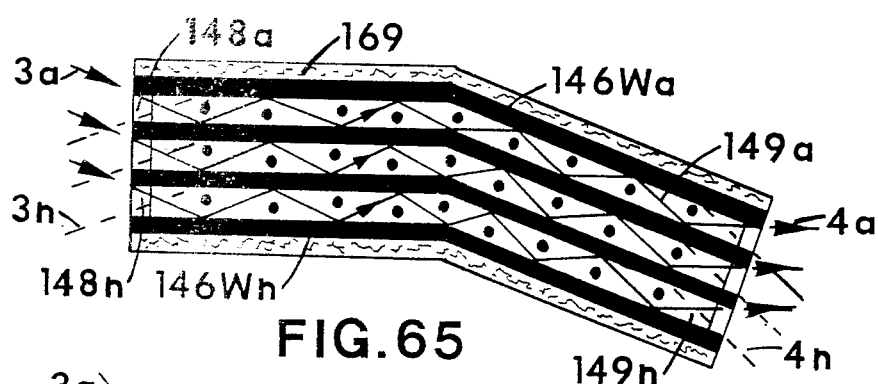
FIGS. 65, 66, and 67 Illustrates schematically a side view cross-section of a sheath bundle array of transparent sealed ends light transmittal gas filled hollow tube light-guide stem structures combined with light dispersing means and their effect upon the projected light beams.
Figure 66:
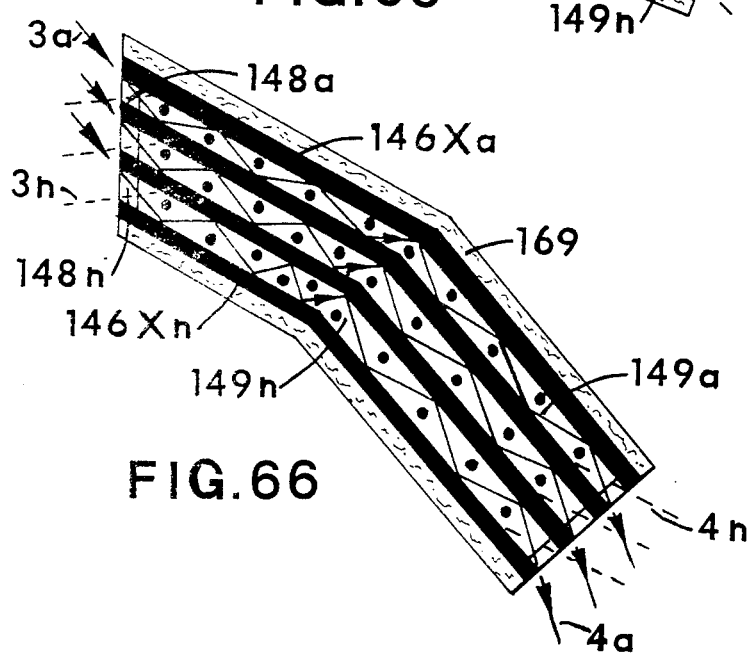
Figure 67:
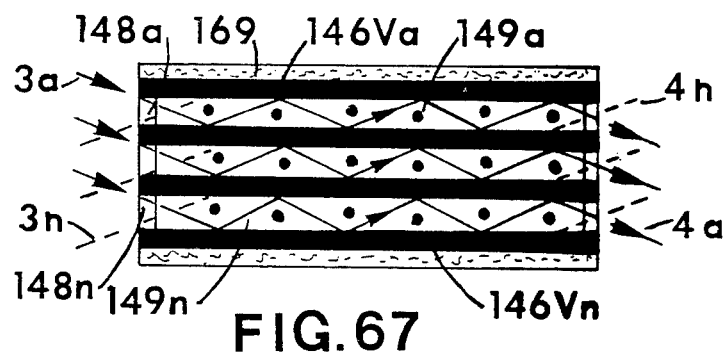
Figure 68:
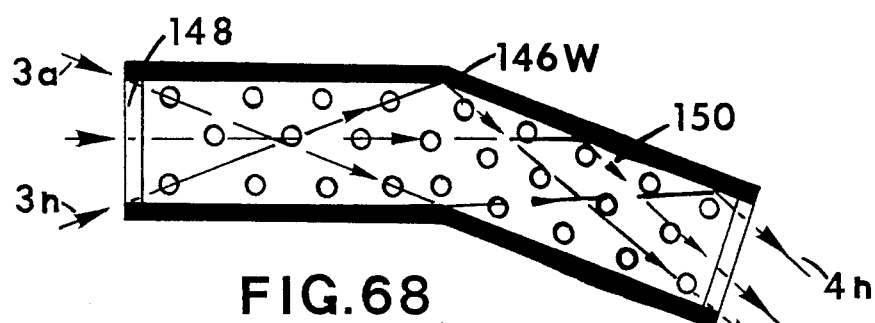
FIGS. 68, 69, and 70 Illustrates schematically a side view cross-section of a transparent sealed ends light transmittal liquid filled hollow tube light-guide stem structures combined with light dispersing means and their effect upon the projected light beams.
Figure 69:
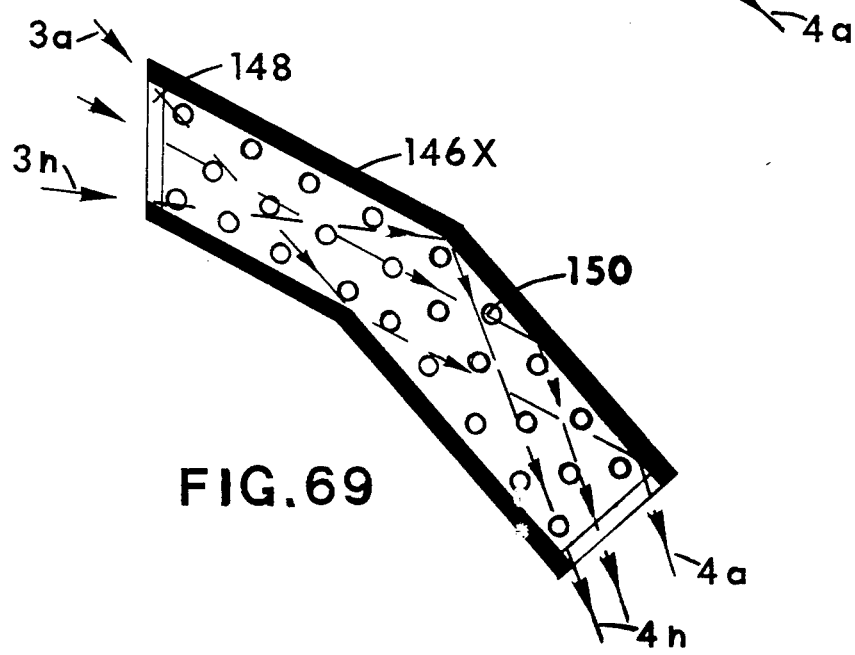
Figure 70:
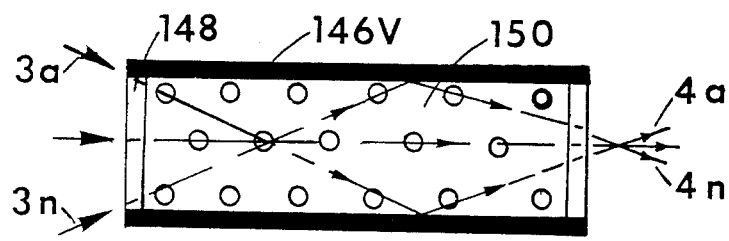
Figure 71:
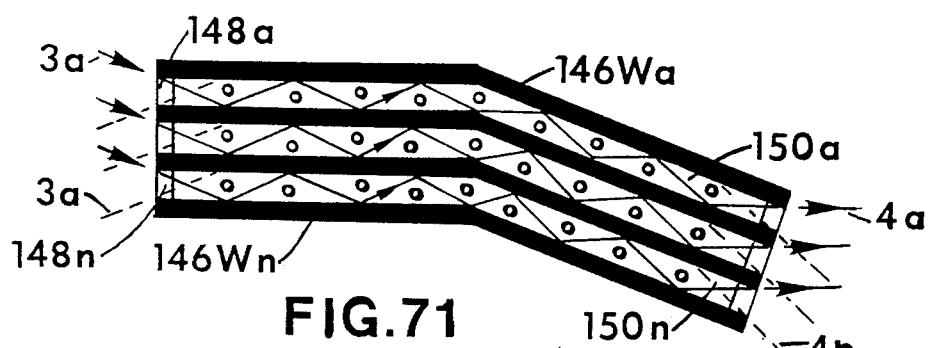
FIGS. 71, 72, and 73 Illustrates schematically a side view cross-section of a bundle array of transparent sealed ends light transmittal liquid filled hollow tube light-guide stem structures combined with light dispersing means and their effect upon the projected light beams.
Figure 72:
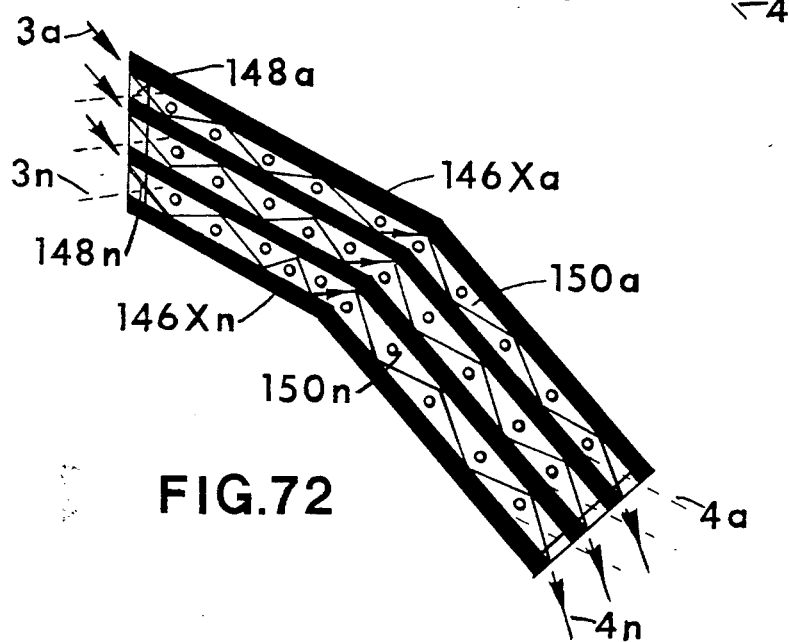
Figure 73:
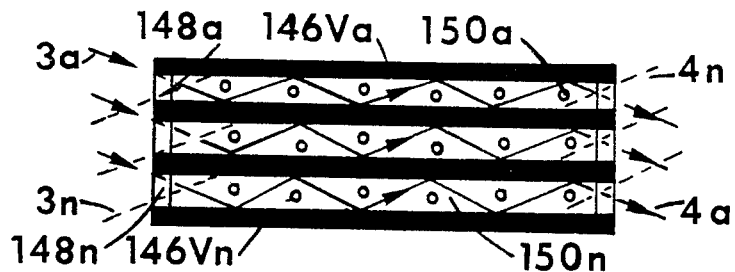
Figure 74:
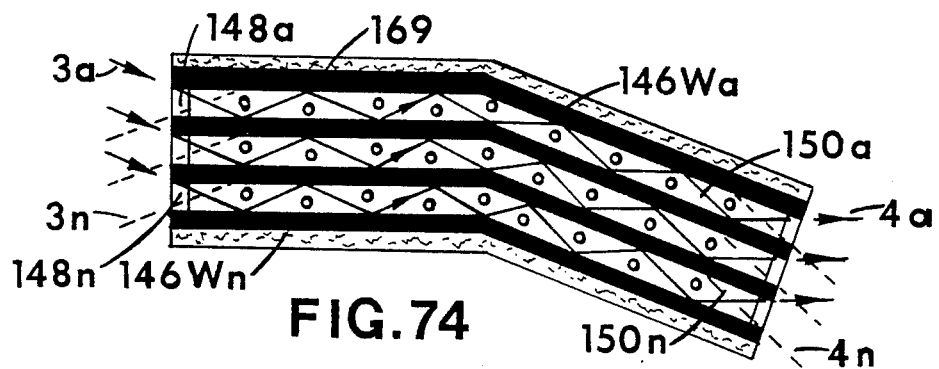
FIGS. 74, 75, and 76 Illustrates schematically a side view cross-section of a sheath bundle array of transparent sealed ends light transmittal liquid filled hollow tube light-guide stem structures combined with light dispersing means and their effect upon the projected light beams.
Figure 75:
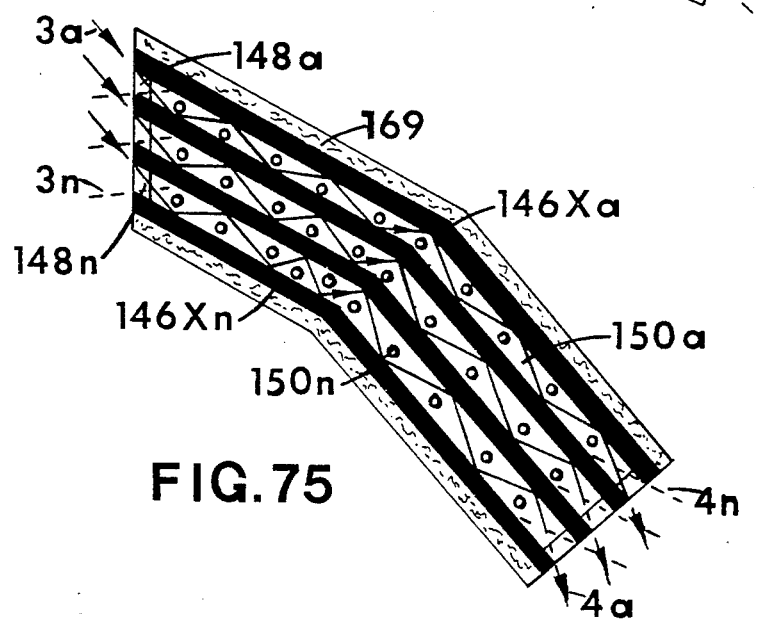
Figure 76:
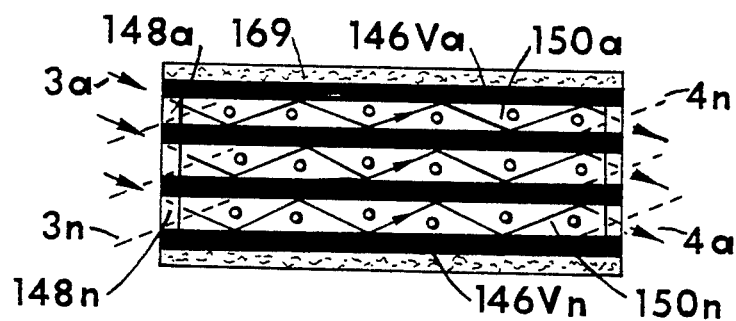
Figure 77:
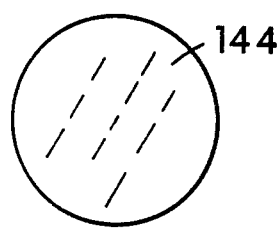
FIG. 77 Illustrates schematically an end view cross-section of a transparent solid material light-guide stem in its simplest form.
Figure 78:
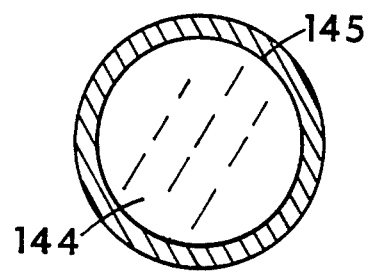
FIG. 78 Illustrates schematically an end view cross-section of a different refractive index material outer-surface coated transparent solid material light-guide stem.
Figure 79:
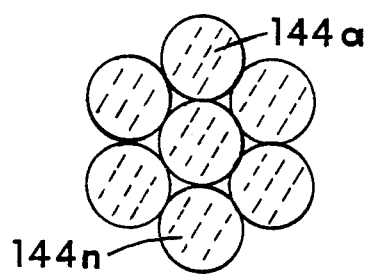
FIG. 79 Illustrates schematically an end view cross-section of a bundle array of transparent solid material light-guide stems.
Figure 80:
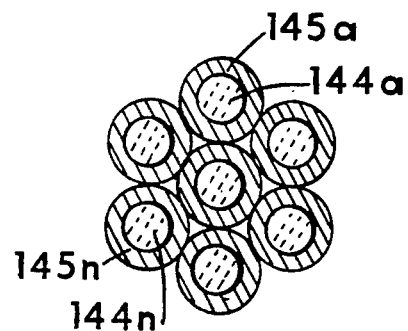
FIG. 80 Illustrates schematically an end view cross-section of a bundle array of different refractive index material outer-surface coated transparent solid material light-guide stems.
Figure 81:
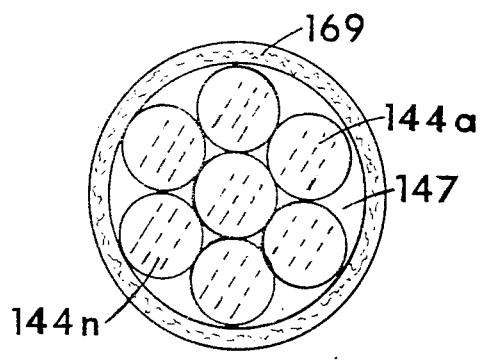
FIG. 81 Illustrates schematically an end view cross-section of a sheath bundle array of transparent solid material light-guide stems.
Figure 82:
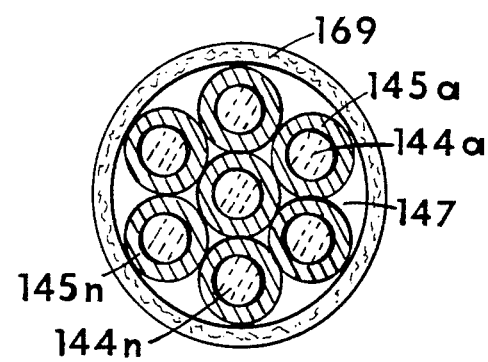
FIG. 82 Illustrates schematically an end view cross-section of a sheath bundle array of different refractive index material outer-surface coated transparent solid material light-guide stems.
Figure 83:
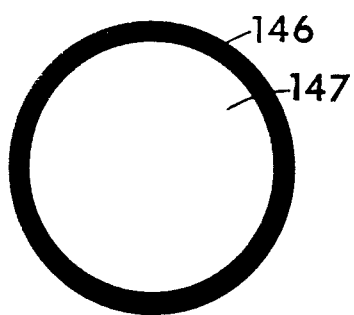
FIG. 83 Illustrates schematically an end view cross-section of a highly polished inner-surface hollow tube light-guide stem.
Figure 84:
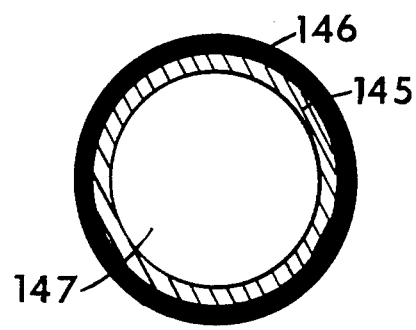
FIG. 84 Illustrates schematically an end view cross-section of a different refractive index material inner-surface coated hollow tube light-guide stem.
Figure 85:
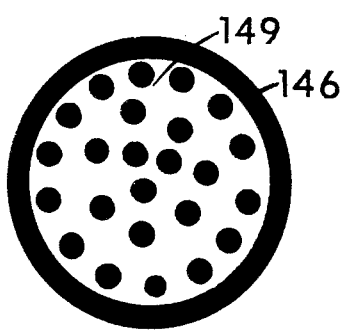
FIG. 85 Illustrates schematically an end view cross-section of a transparent sealed end light transmittal gas filled hollow tube light-guide stem.
Figure 86:
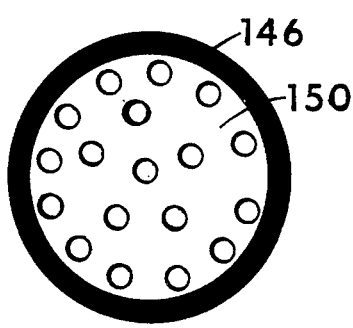
FIG. 86 Illustrates schematically an end view cross-section of a transparent sealed end light transmittal liquid filled hollow tube light-guide stem.
Figure 87:
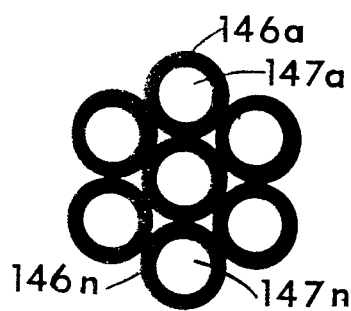
FIG. 87 Illustrates schematically an end view cross-section of a bundle array of highly polished inner-surface coated hollow tube light-guide stems.
Figure 88:
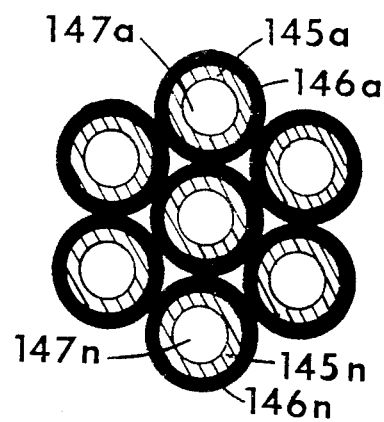
FIG. 88 Illustrates schematically an end view cross-section of a bundle array of different refractive index material inner-surface coated hollow tube light-guide stems.
Figure 89:
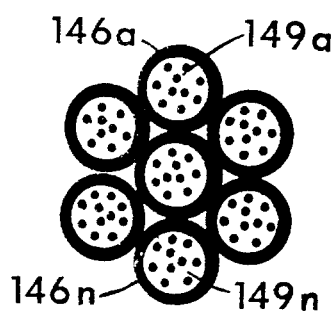
FIG. 89 Illustrates schematically an end view cross-section of a bundle array of transparent sealed ends light transmittal gas filled hollow tube light guide stems.
Figure 90:
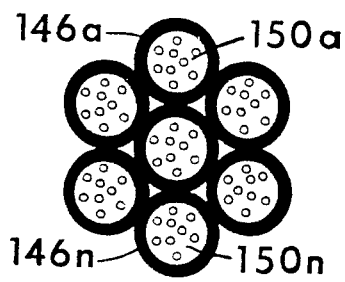
FIG. 90 Illustrates schematically an end view cross-section of a transparent sealed ends light transmittal liquid filled hollow tube light-guide stems.
Figure 91:
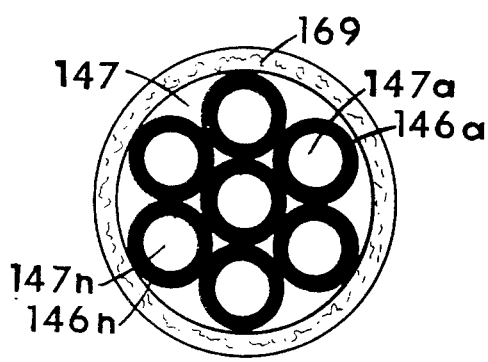
FIG. 91 Illustrates schematically an end view cross-section of a sheath bundle array of highly reflective inner-surface coated hollow tube light-guide stems.
Figure 92:
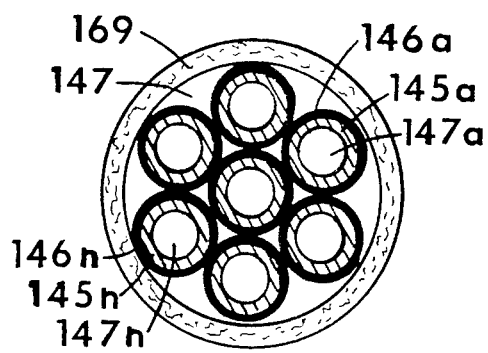
FIG. 92 Illustrates schematically an end view cross-section of a sheath bundle array of different refractive index material inner-surface coated hollow tube light-guide stems.
Figure 93:
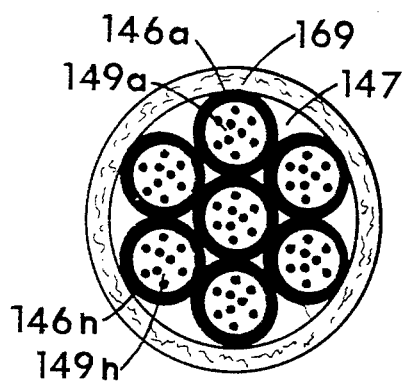
FIG. 93 Illustrates schematically an end view cross-section of a sheat bundle array of transparent sealed ends light transmittal gas filled hollow tube light-guide stems.
Figure 94:
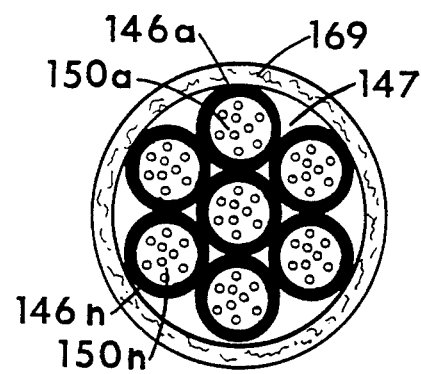
FIG. 94 Illustrates schematically an end view cross-section of a sheath bundle array of transparent sealed ends light transmittal liquid filled hollow tube light-guide stems.

Optical rod 144 light-guide stems (FIG. 24, FIG. 25, FIG. 33, and FIG. 34), air-core 147 optical tubing 146 light-guide stems (FIG. 42, FIG. 43, FIG. 51, and FIG. 52), gas-core 149 optical tubing 146 (FIG. 59 and FIG. 60), and liquid-core 150 optical tubing 146 (FIG. 68 and FIG. 69), all demonstrates the same light deflection principle for angular light transmission.

Figure 35:
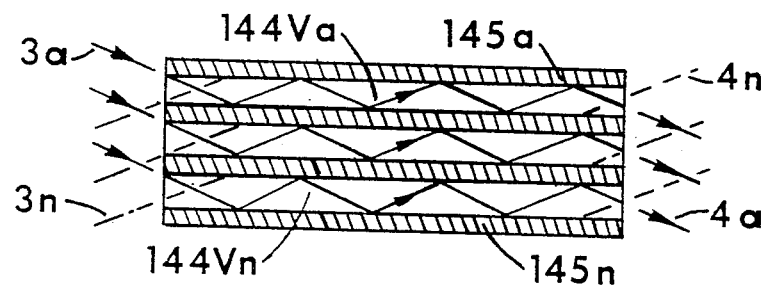
FIGS. 35, 36, and 37 Illustrates schematically a side view cross-section of a bundle array of different refractive index material surface-coated transparent material light-guide stem structure combined with light dispersing means and their effect upon the projected light beams.
Figure 36:
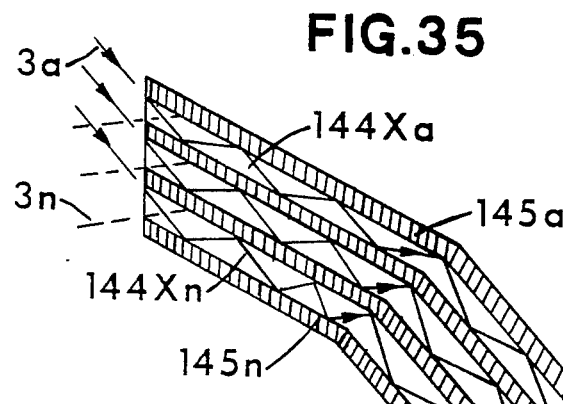
Figure 55:
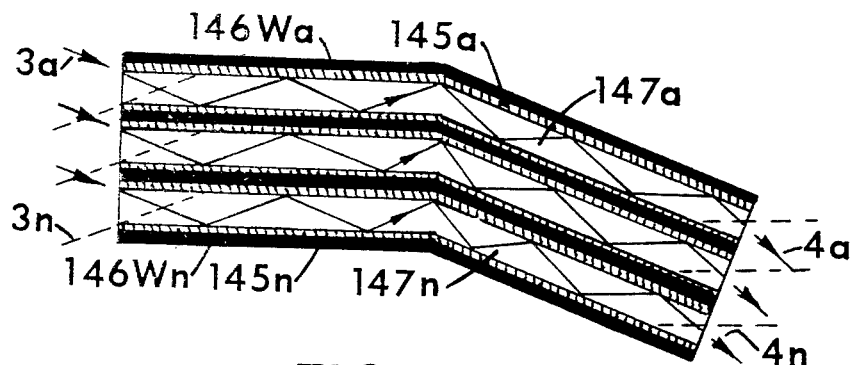
FIGS. 53, 54, and 55 Illustrates schematically a side view cross-secton of a bundle array of different refractive index material inner-surface coated hollow tube light-guide stem structure combined with light dispersing means and their effect upon the projected light beams.
Figure 29:
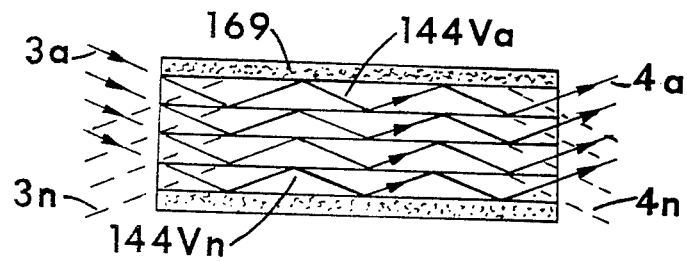
FIGS. 29, 30, and 31 Illustrates schematically a side view cross-section of a sheath bundle array of transparent solid material light-guide stem structure combined with light dispersing means and their effect upon the projected light beams.
Figure 30:
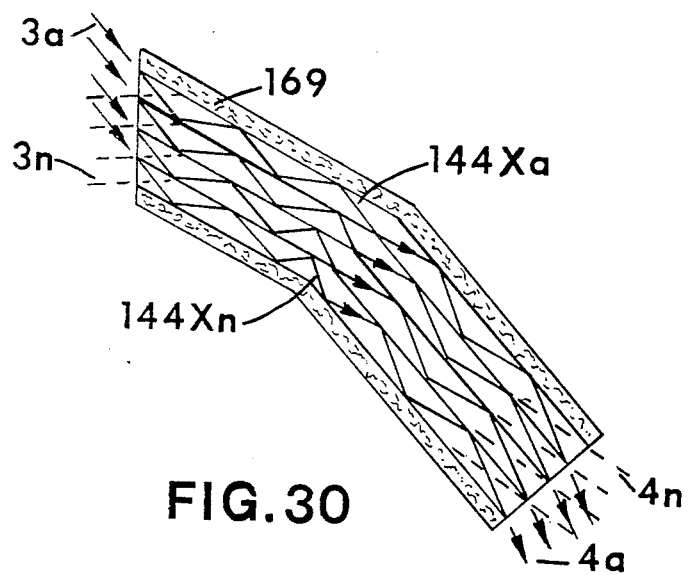
Figure 31:
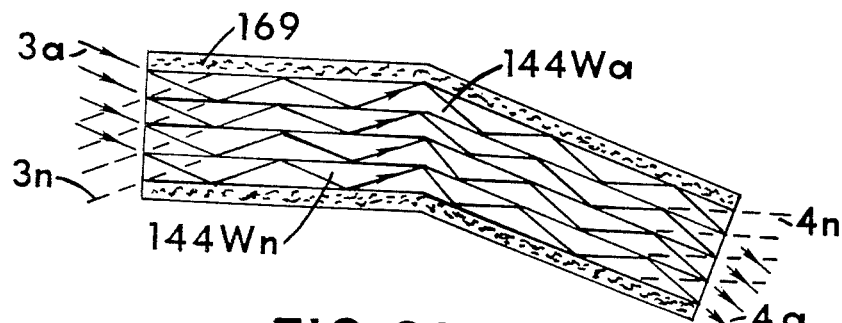
Figure 38:
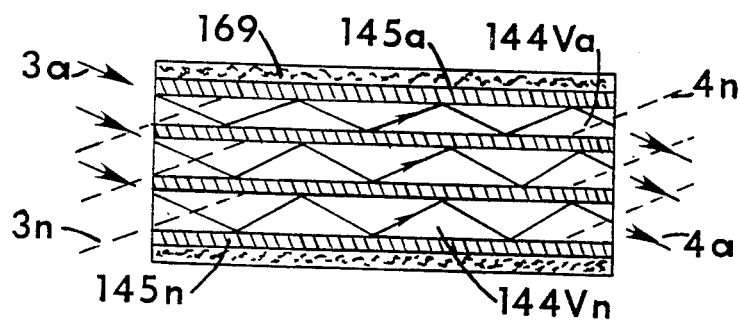
FIGS. 38, 39, and 40 Illustrates schematically a side view cross-section of a sheath bundle array of different refractive index material surface-coated transparent material light-guide stem structure combined with light dispersing means and their effect upon the projected light beams.
Figure 39:
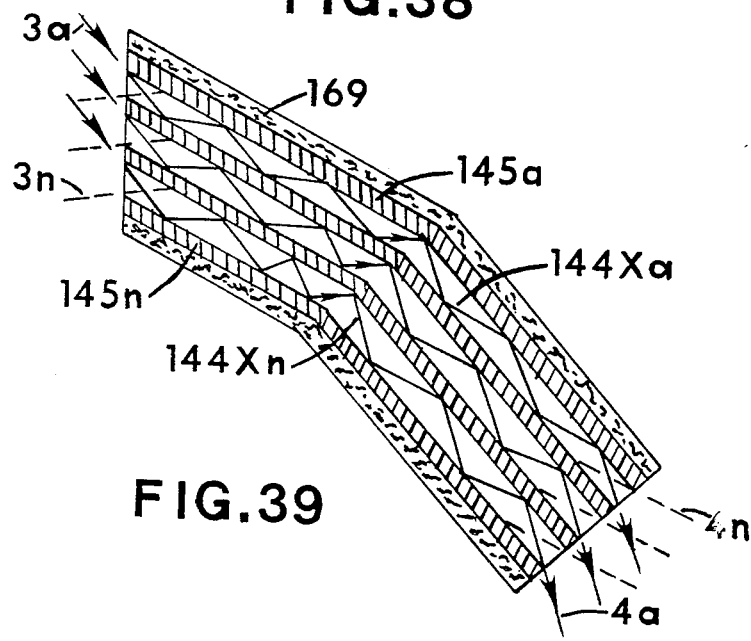
Figure 34:
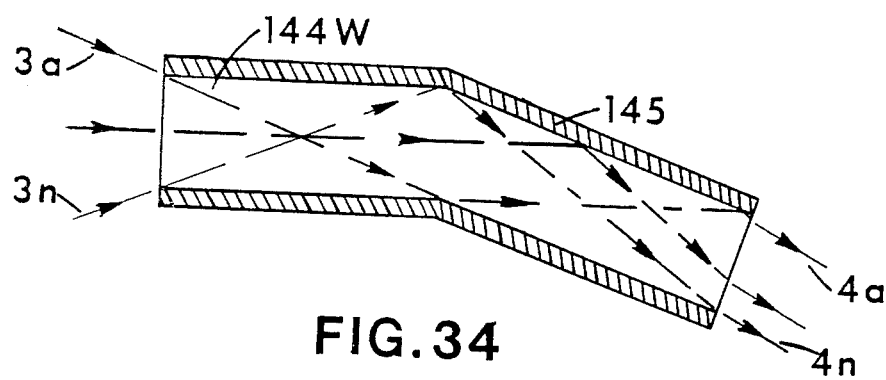
Figure 41:
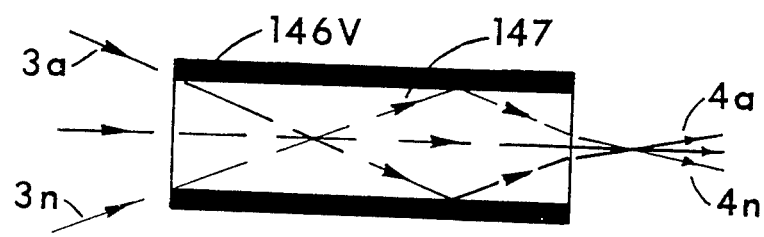
FIGS. 41, 42, and 43 Illustrates schematically a side view cross-section of a highly reflective inner-surface hollow tube light-guide stem structure combined with light dispersing means and their effect upon the projected light beams.
Figure 42:
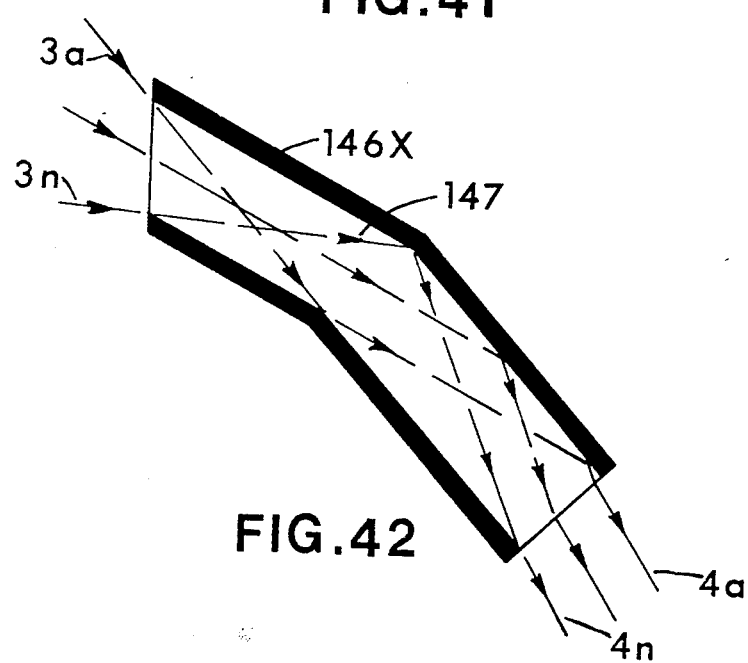
Figure 37:
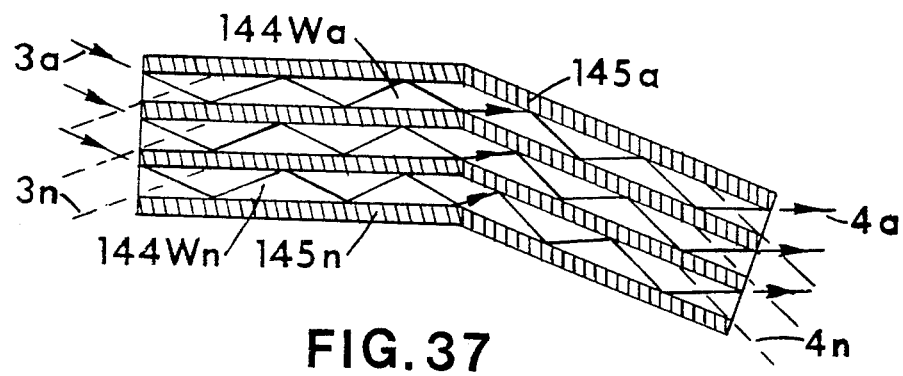
Figure 44:
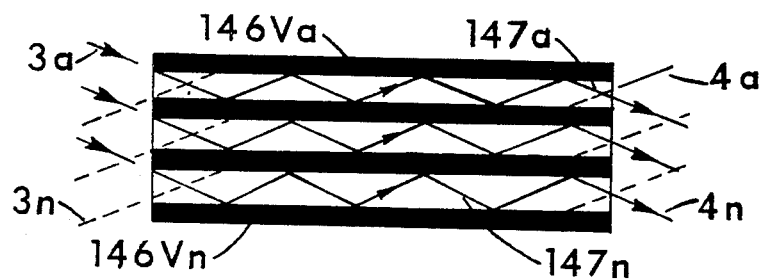
FIGS. 44, 45, and 46 Illustrates schematically a side view cross-section of a bundle array of highly reflective inner-surface hollow tube light-guide stem structure combined with light dispersing means and their effect upon the projected light beams.
Figure 45:
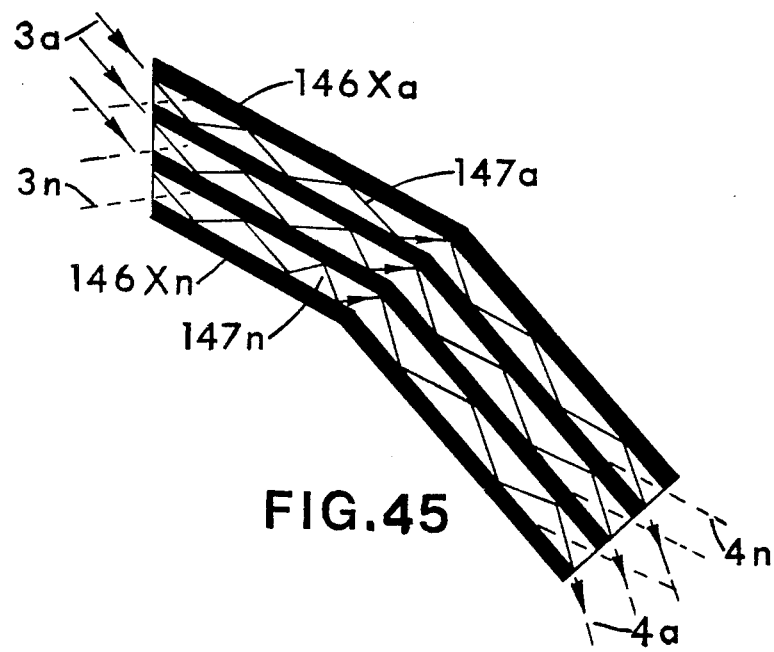
Figure 40:
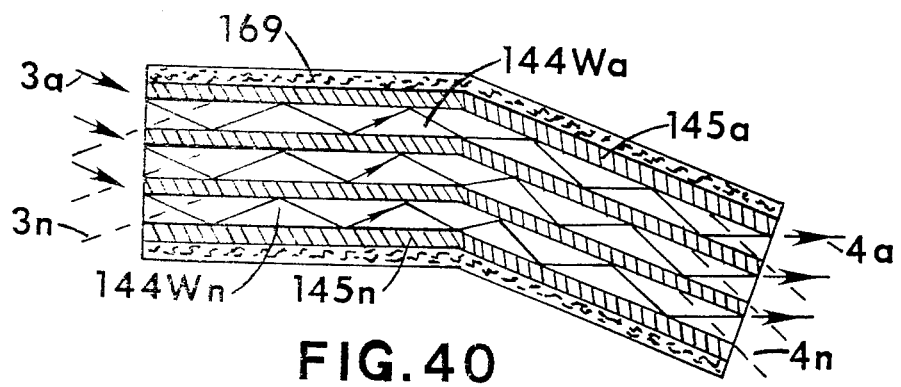
Figure 47:
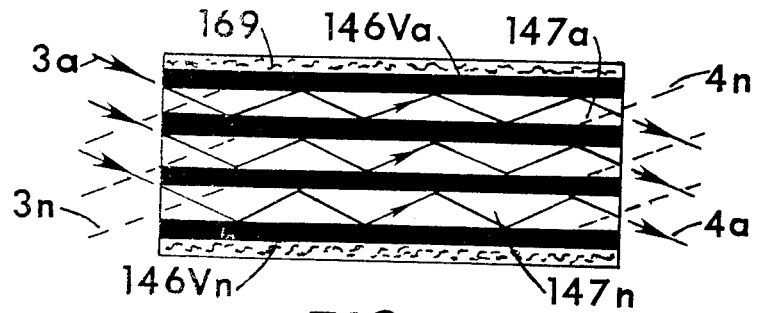
FIGS. 47, 48, and 49 Illustrates schematically a side view cross-section of a sheath bundle array of highly reflective inner-surface hollow tube light-guide stem structure combined with light dispersing means and their effect upon the projected light beams.
Figure 48:
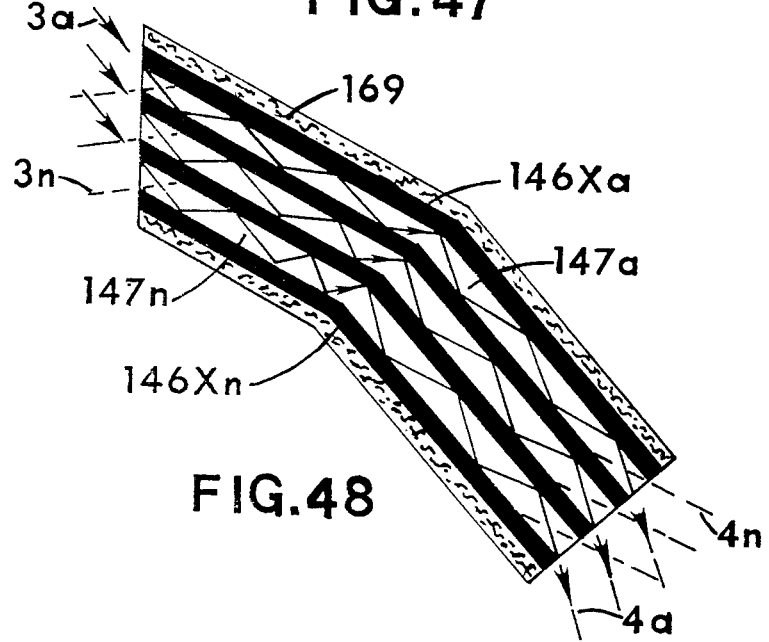
Figure 43:
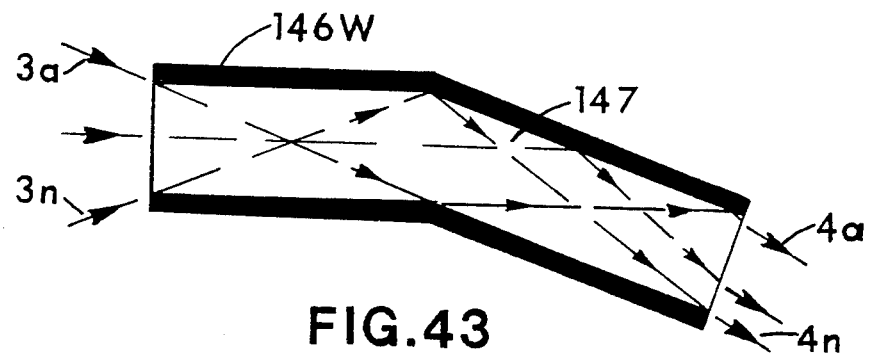
Figure 50:
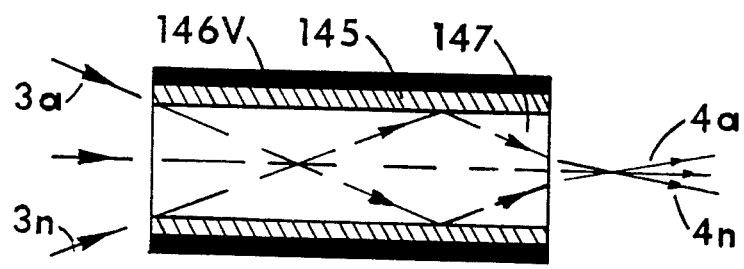
Figure 51:
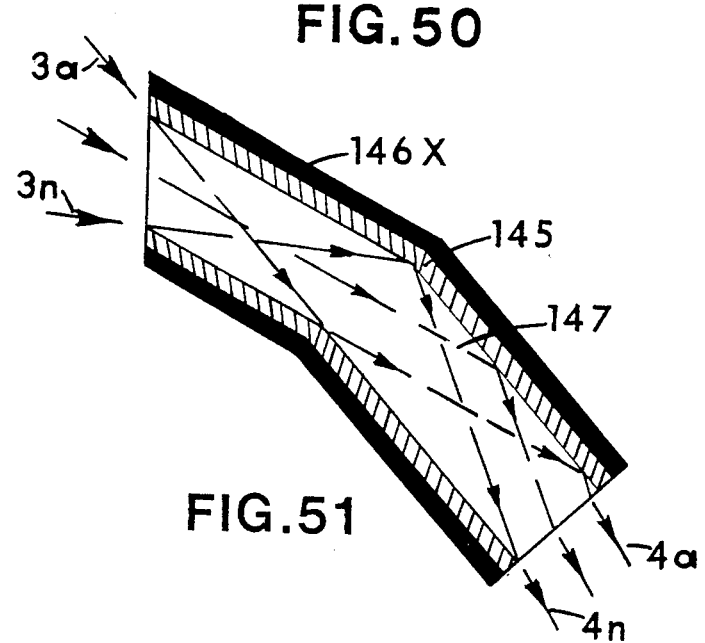
Figure 46:
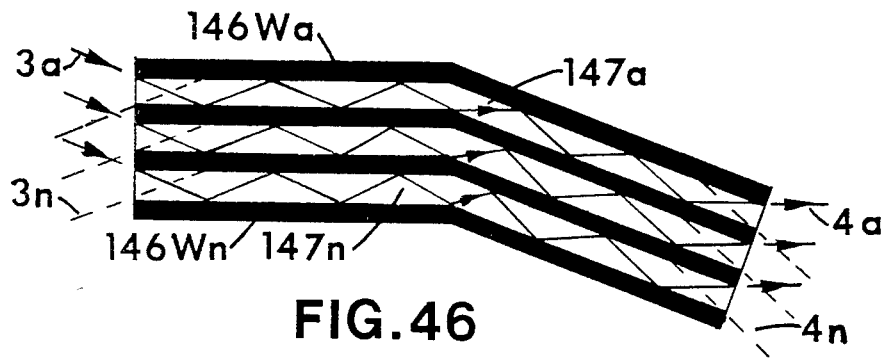
Figure 53:
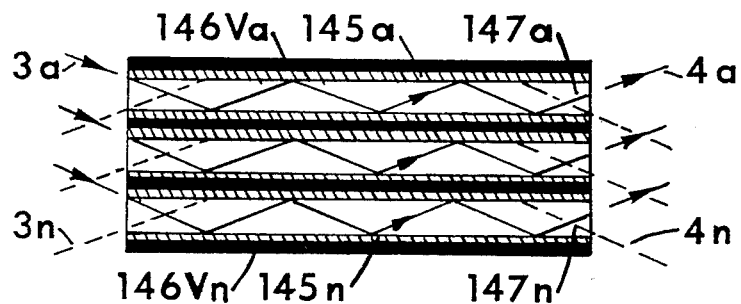
Figure 54:
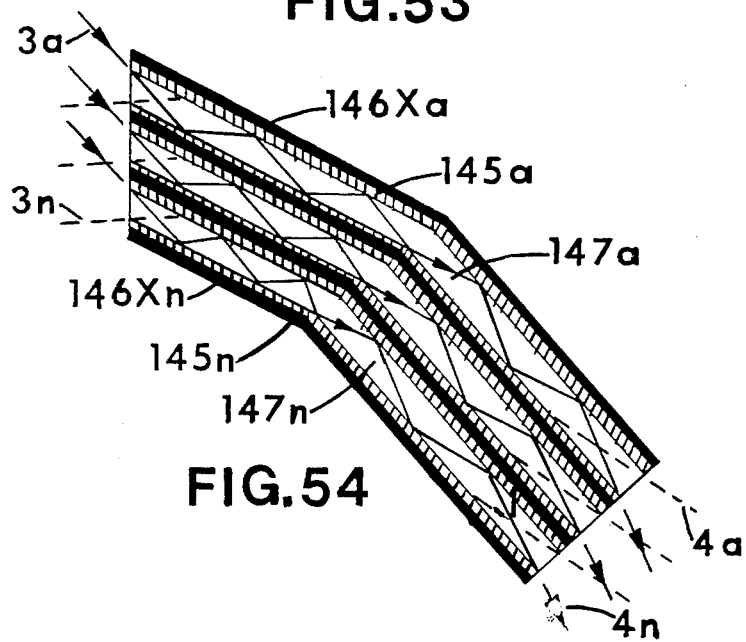
Figure 49:
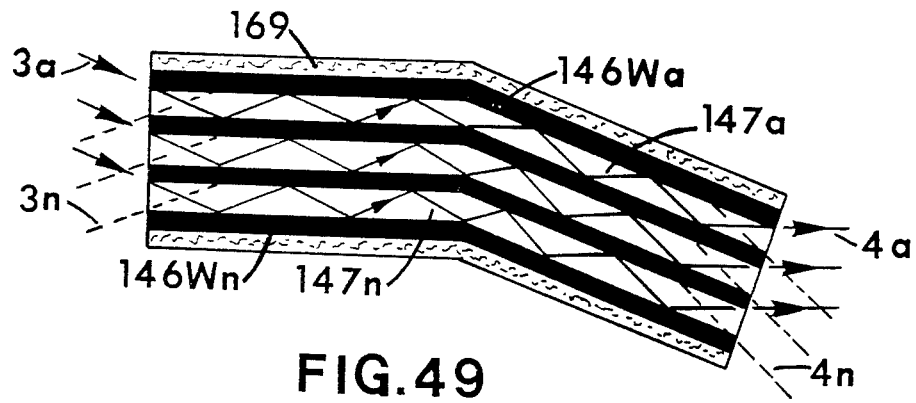
Figure 56:
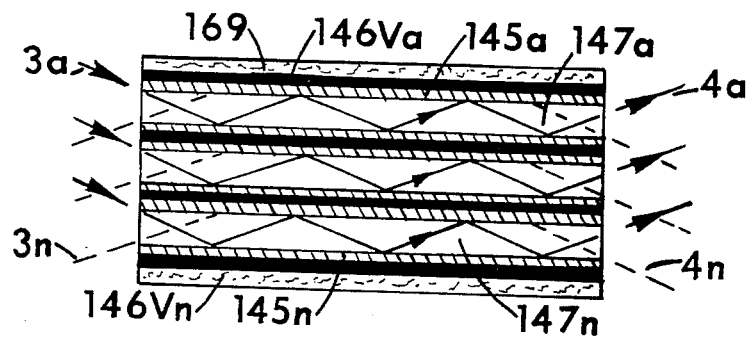
FIGS. 56, 57, and 58 Illustrates schematically a side view cross-section of a sheath bundle array of different refractive index material inner-surface coated hollow tube light-guide stem structure combined with light dispersing means and their effet upon the projected light beams.
Figure 57:
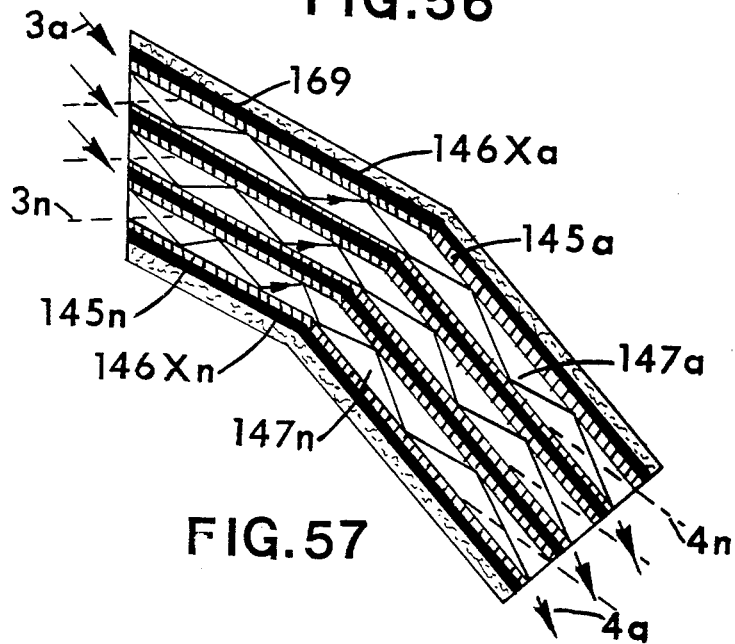
Figure 58:
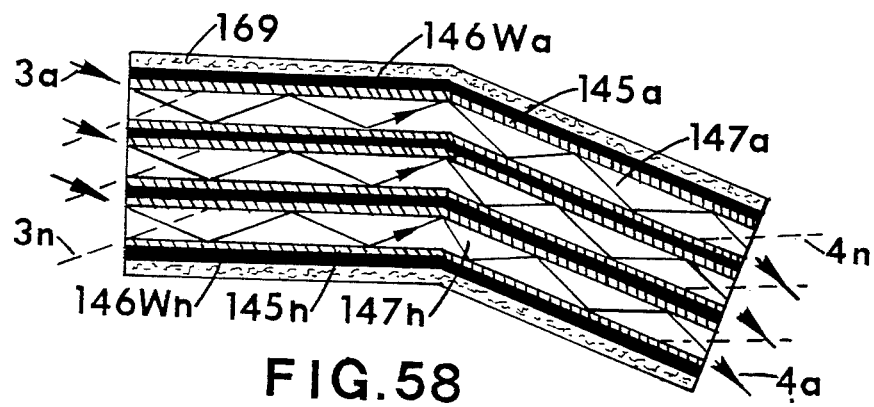

To expand the light-guide stem collection surface area 3 of FIG. 5 from a single lens-core 144 to a multi-surface collection area, a number of light-guide stems 144a xxx n of FIG. 35 (cross-sectional view) can be bundled together into a unitary assembly structure. Lens-core 146 of FIG. 6 can also be clustered together as shown in FIG. 44. In each case, the same linear light control transmission (total internal reflection) is exactly alike regardless of the number of light-guide stems within a given bundle array 144a xxx n. The more light-guide stems being used within a bundle array the greater flow volume of incident light energy.

Figure 144:
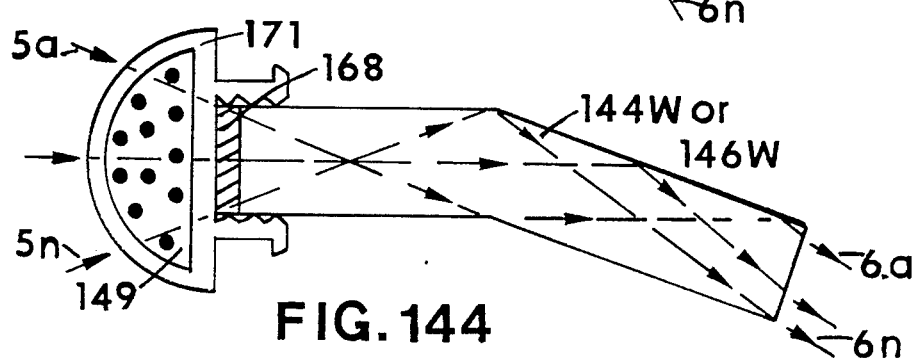
Figure 145:
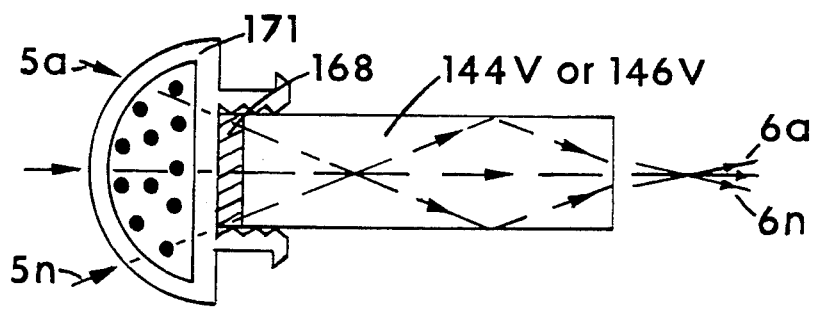
Figure 146:
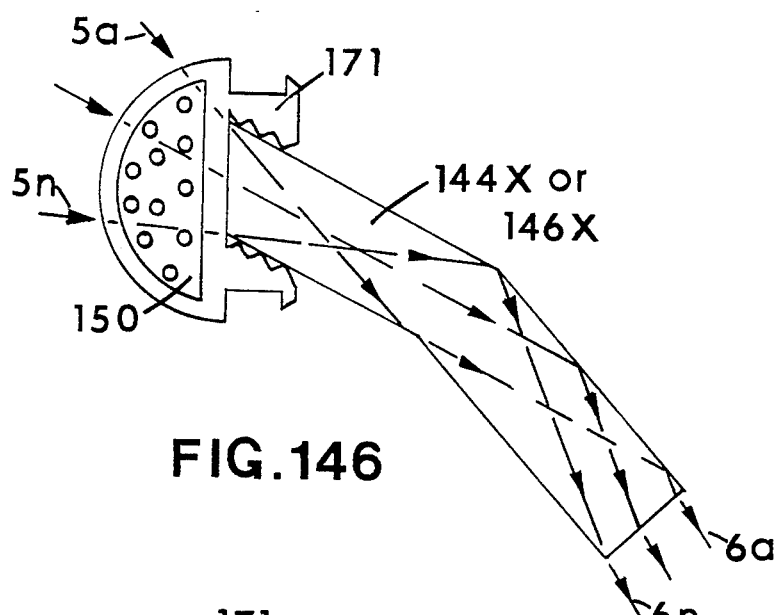
FIGS. 146, 147, and 148 Illustrates schematically a side view cross-section of a transparent thin-walled material light transmittal liquid filled modular assembled grip-lock light-steering lens embodiment combined with light dispersing means and their effect upon the projected light beams.
Figure 147:
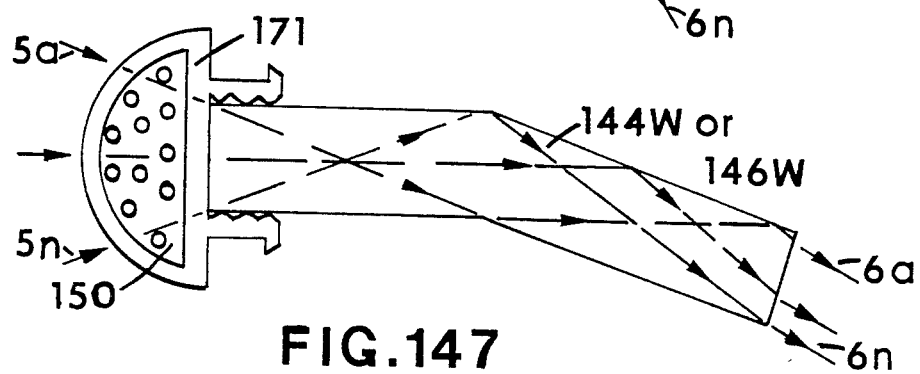
Figure 148:
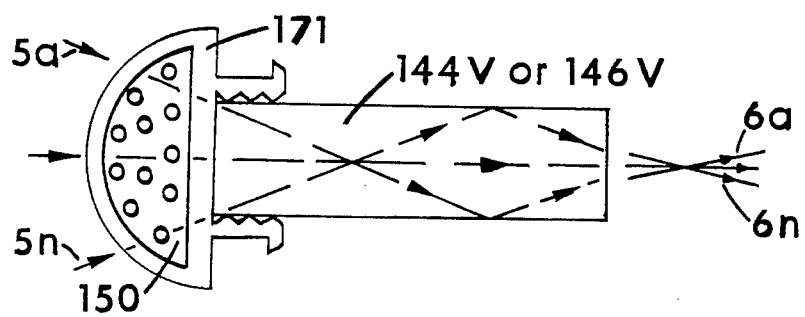
Figure 149:
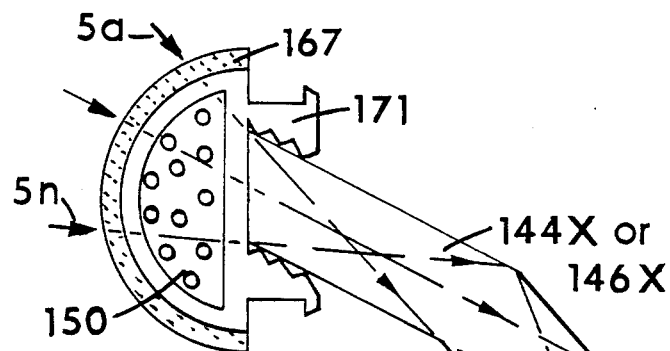
FIGS. 149, 150, and 151 Illustrates schematically a side view cross-section of a filter coated curved-surface transparent thin-walled material light transmittal liquid filled modular assembled grip-lock light-steering lens embodiment combined with light dispersing means and their effect upon the projected light beams.
Figure 150:
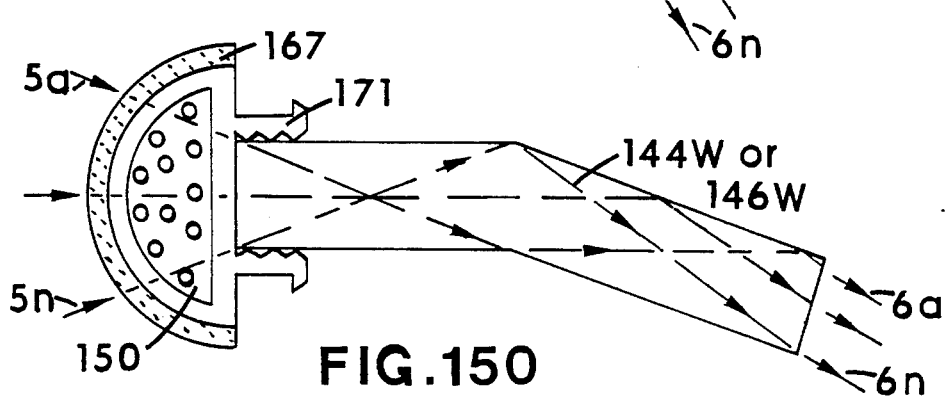
Figure 151:
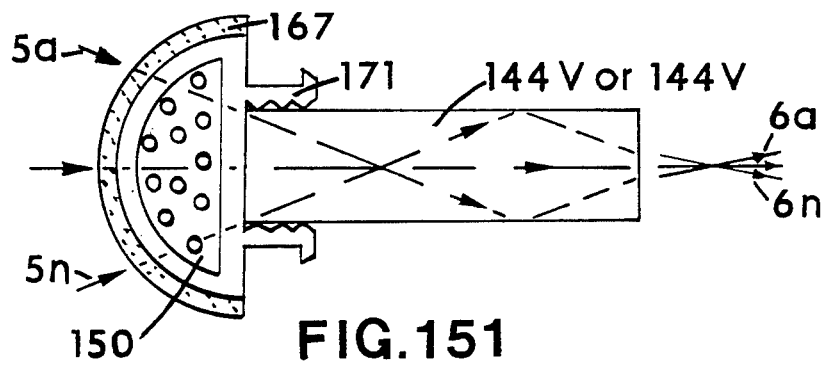
Figure 152:
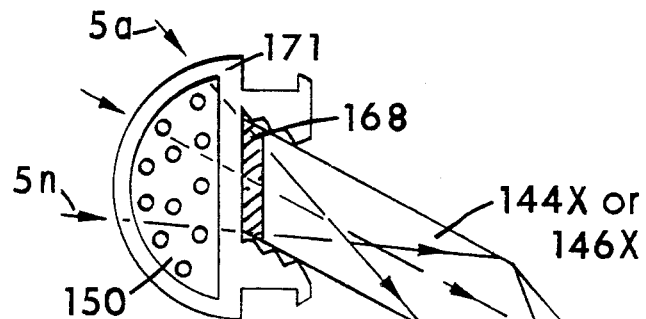
FIGS. 152, 153, and 154 Illustrates schematically a side view cross-section of a filter coated flat-surface transparent thin-walled material light transmittal liquid filled modular assembled grip-lock light-steering lens embodiment combined with light dispersing means and their effect upon the projected light beams.
Figure 153:
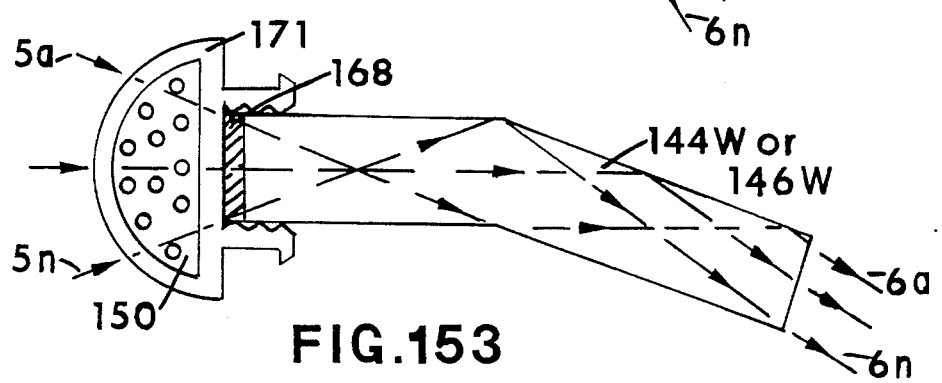
Figure 154:
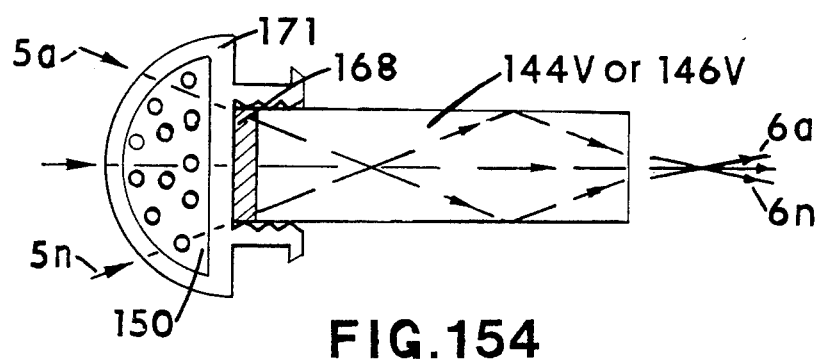
Figure 164:
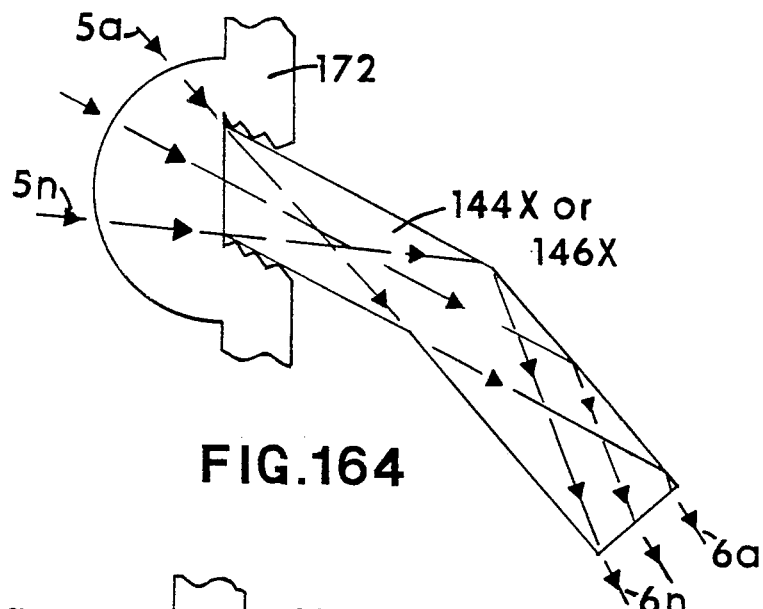
FIGS. 164, 165, and 166 Illustrates schematically a side view cross-section of a transparent solid material modular assembled matrix lens-cap light-steering lens embodiment in its simplest form combined with light dispersing means and their effect upon the projected light beams.
Figure 165:
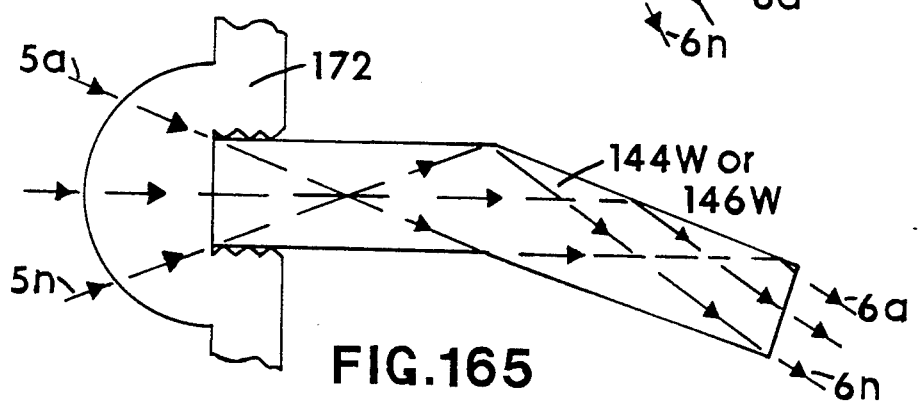
Figure 166:
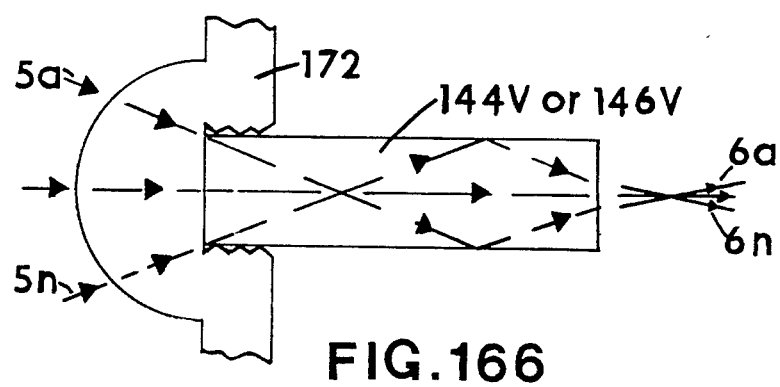
Figure 167:
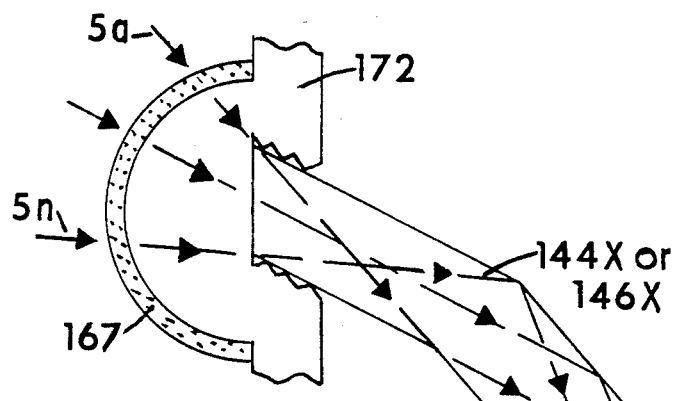
FIGS. 167, 168, and 169 Illustrates schematically a side view cross-section of a filter coated curved-surface transparent solid material modular assembled matrix lens-cap light-steering lens embodiment combined with light dispersing means and their effect upon the projected light beams.
Figure 168:
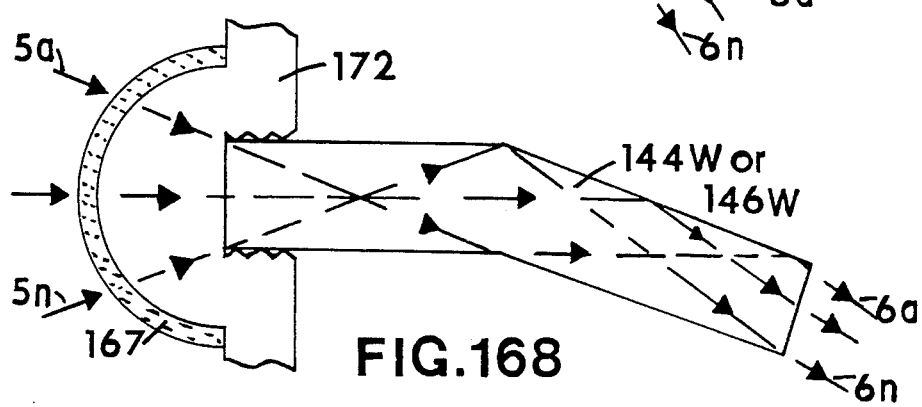
Figure 169:
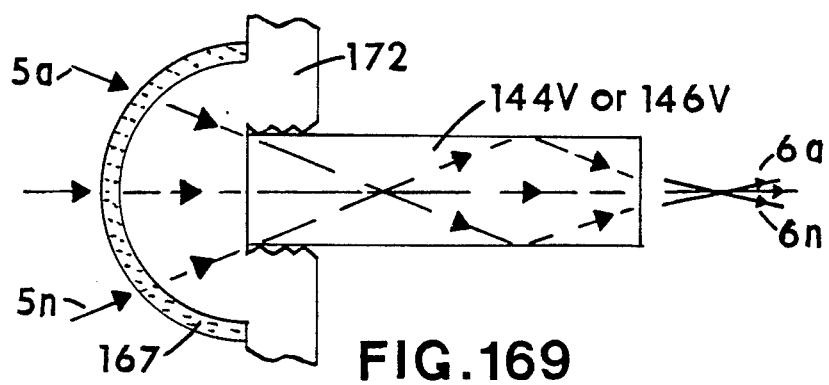
Figure 170:
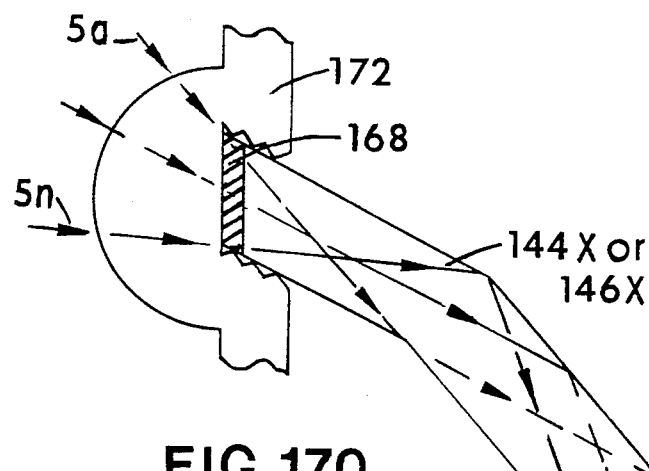
FIGS. 170, 171, and 172 Illustrates schematically a side view cross-section of a filter coated flat-surface transparent solid material modular assembled matrix lens-cap light-steering lens embodiment combined with light dispersing means and their effect upon the projected light beams.
Figure 171:
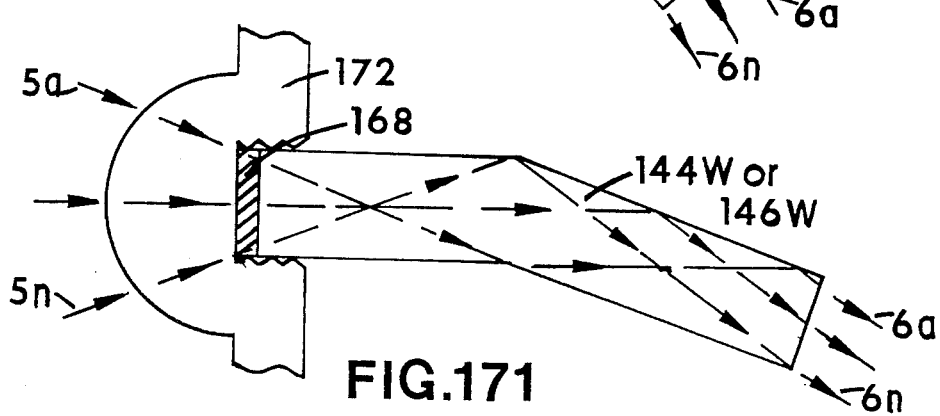
Figure 172:
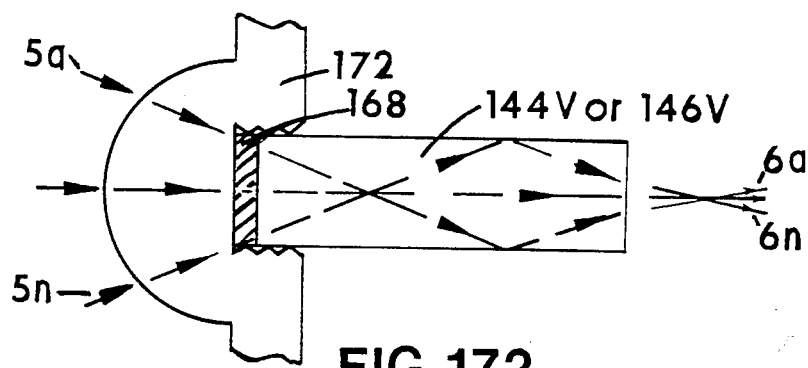
Figure 173:
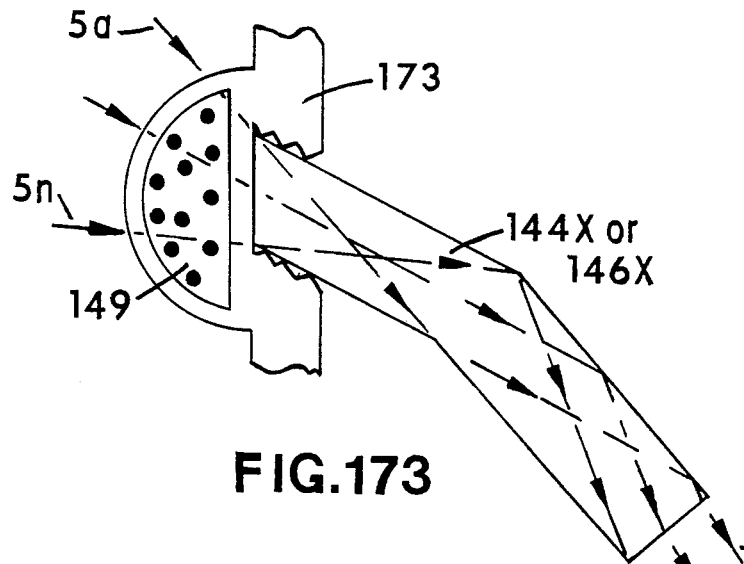
FIGS. 173, 174, and 175 Illustrates schematically a side view cross-section of a transparent thin-walled material light transmittal gas filled modular assembled matrix lens-cap light-steering lens embodiment combined with light dispersing means and their effect upon the projected light beams.
Figure 174:
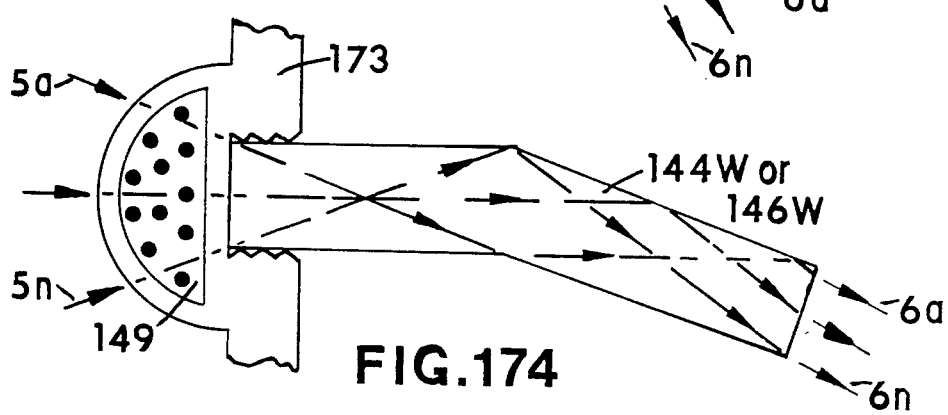
Figure 175:
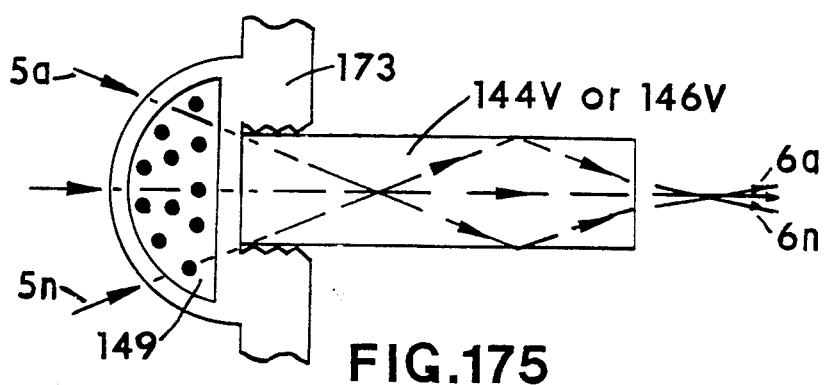
Figure 176:
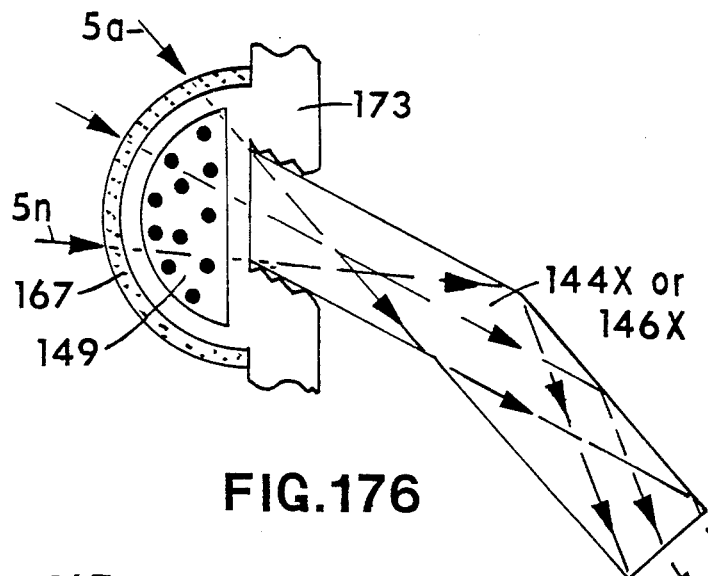
FIGS. 176, 177, and 178 Illustrates schematically a side view cross-section of a filter coated curved-surface transparent thin-walled material light transmittal gas filled modular assembled matrix lens-cap light-steering lens embodiment combined with light dispersing means and their effect upon the projected light beams.
Figure 177:
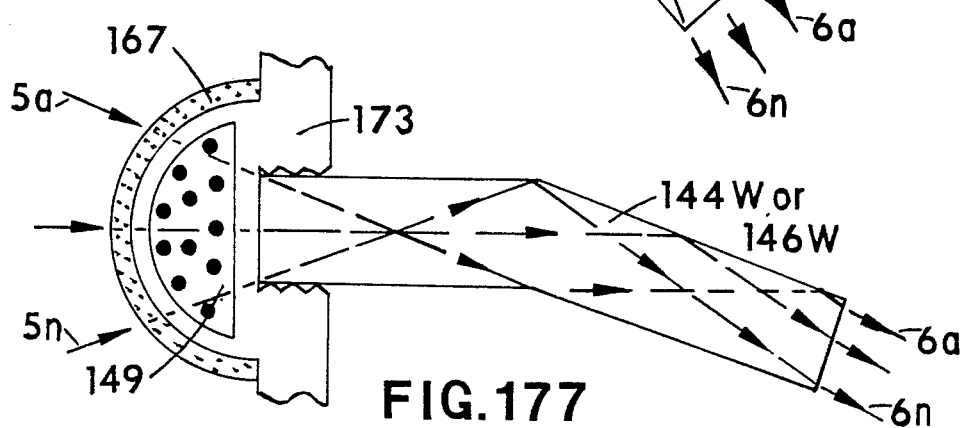
Figure 178:
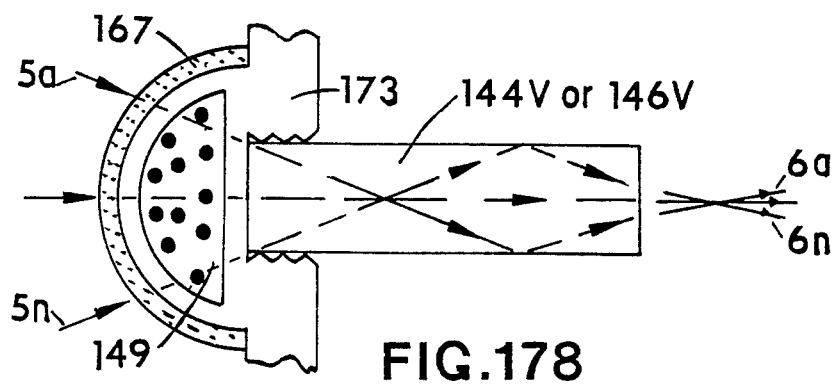
Figure 179:
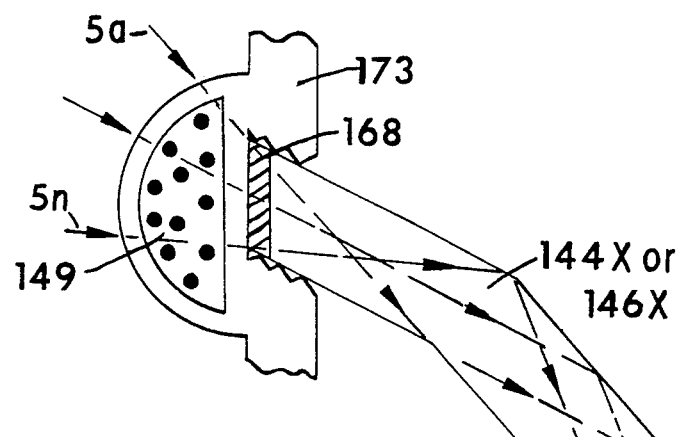
FIGS. 179, 180, and 181 Illustrates schematically a side view cross-section of a filter coated flat-surface transparent thin-walled material light transmittal gas filled modular assembled matrix lens-cap light-steering lens embodiment combined with light dispersing means and their effect upon the projected light beams.
Figure 180:
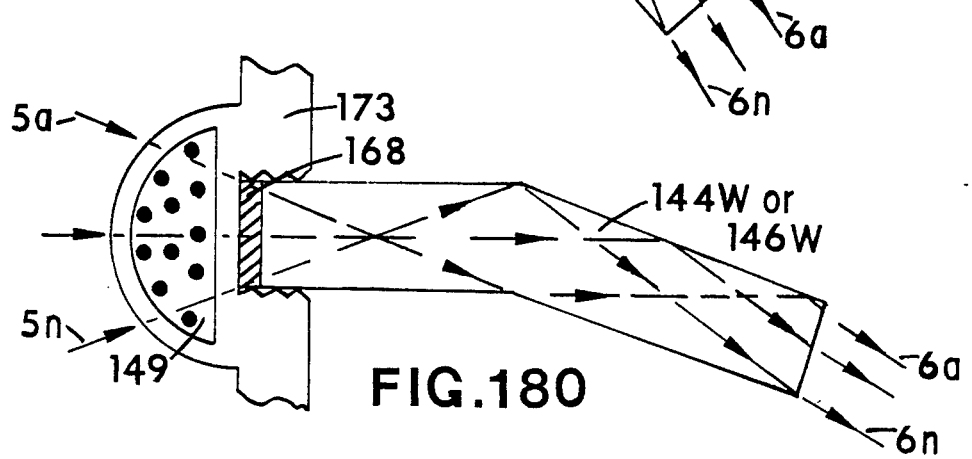
Figure 181:
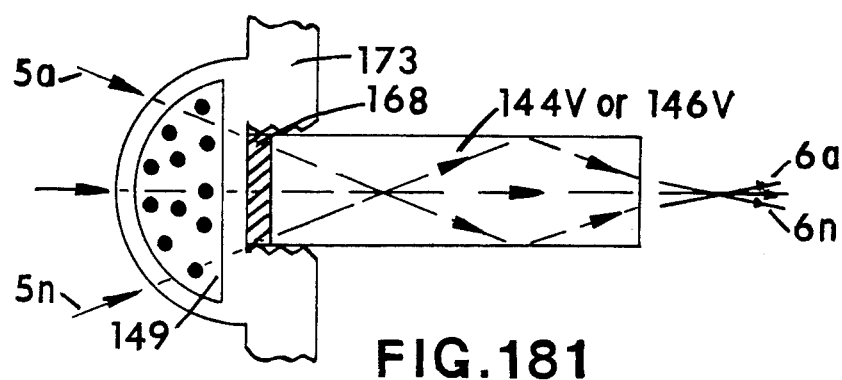
Figure 182:
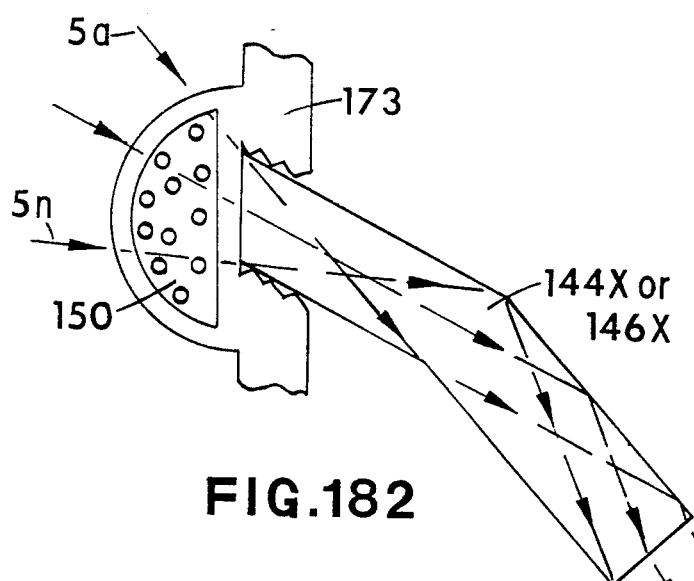
FIGS. 182, 183, and 184 Illustrates schematically a side view cross-section of a transparent thin-walled material light transmittal liquid filled modular assembled matrix lens-cap light-steering lens embodiment combined with light dispersing means and their effect upon the projected light beams.
Figure 183:
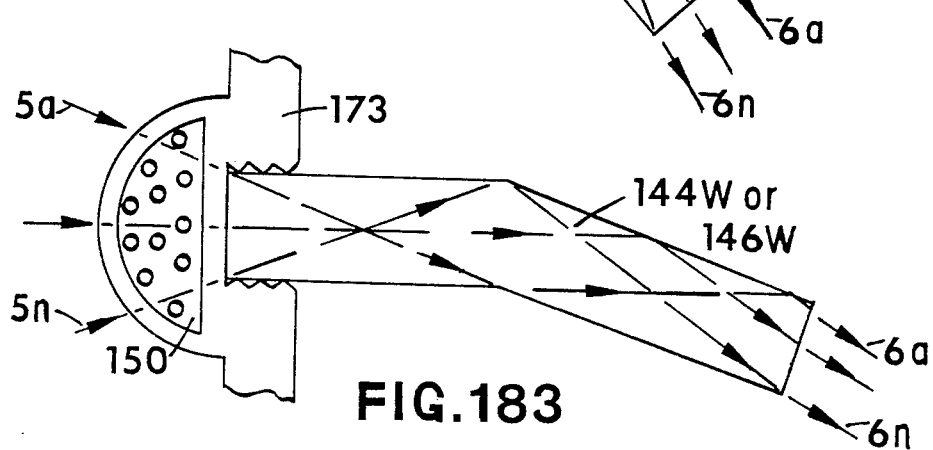
Figure 184:
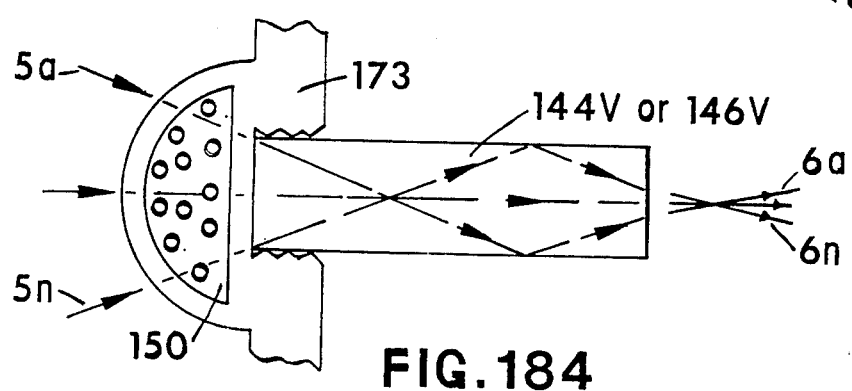
Figure 185:
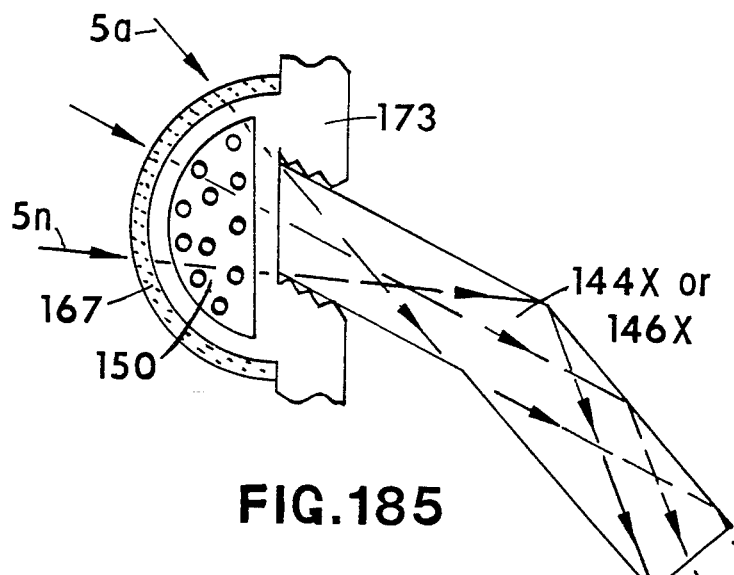
FIGS. 185, 186, and 187 Illustrates schematically a side view cross-section of a filter coated curved-surface transparent thin-walled material light transmittal liquid filled modular assembled matrix lens-cap light-steering lens embodiment combined with light dispersing means and their effect upon the projected light beams.
Figure 186:
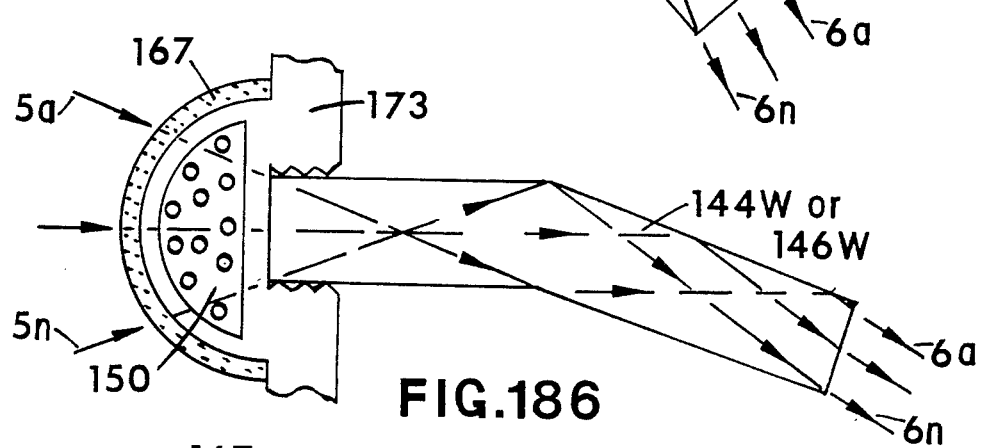
Figure 187:
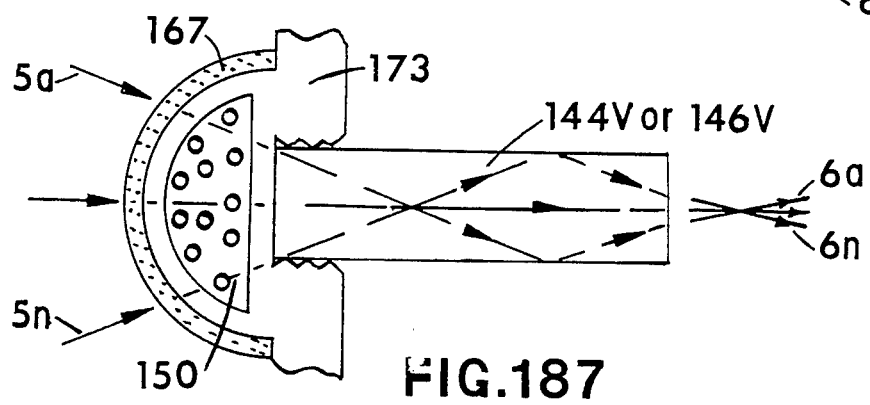
Figure 188:
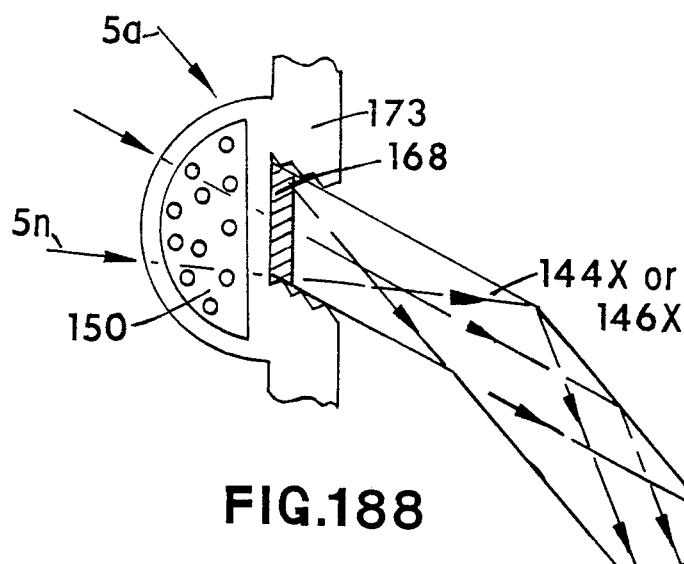
FIGS. 188, 189, and 190 Illustrates schematically a side view cross-section of a filter coated flat-surface transparent thin-walled material light transmittal liquid filled modular assembled matrix lens-cap light-steering lens embodiment combined with light dispersing means and their effect upon the projected light beams.
Figure 189:
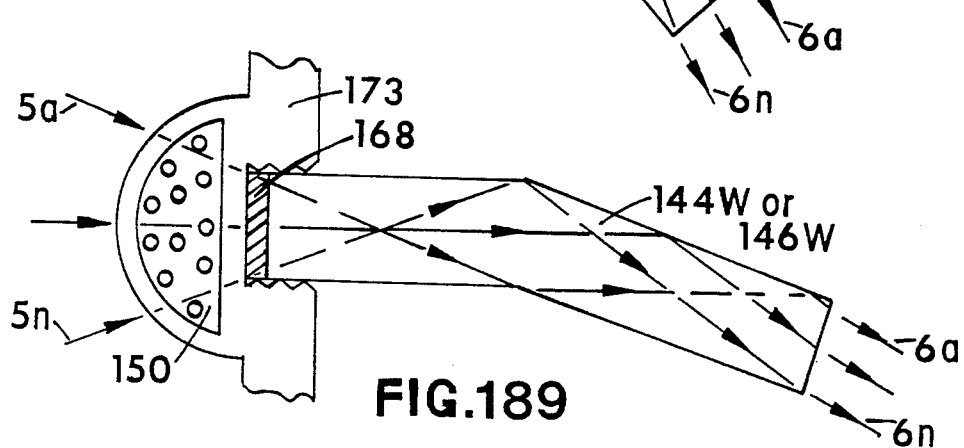
Figure 190:
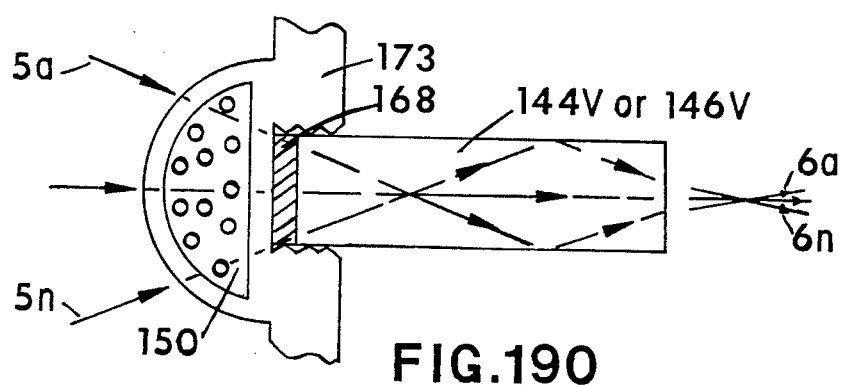
Figure 191:
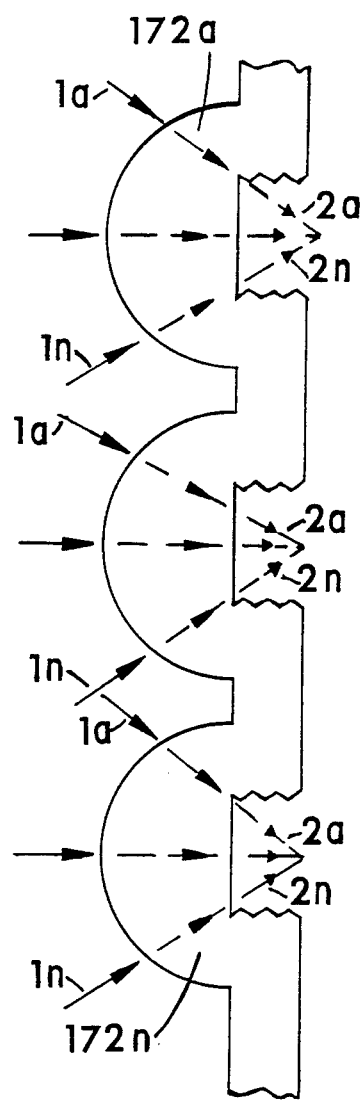
FIG. 191 Illustrates schematically a side view cross-section of an array of transparent solid material matrix lens-cap structure combined with light dispersing means and their effect upon the projected light beams.
Figure 192:
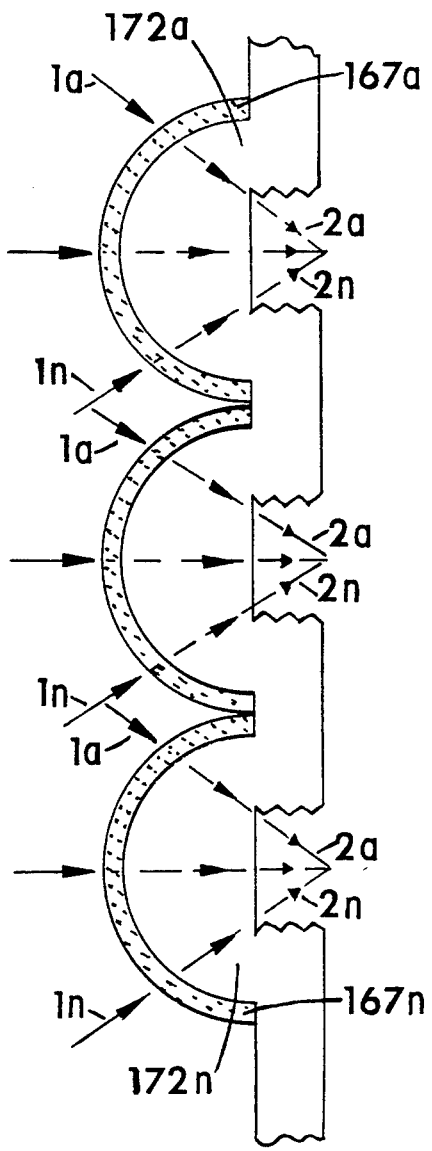
FIG. 192 Illustrates schematically a side view cross-section of an array of filter coated curved-surface transparent solid material matrix lens-cap structure combined with light dispersing means and their effect upon the projected light beams.
Figure 193:
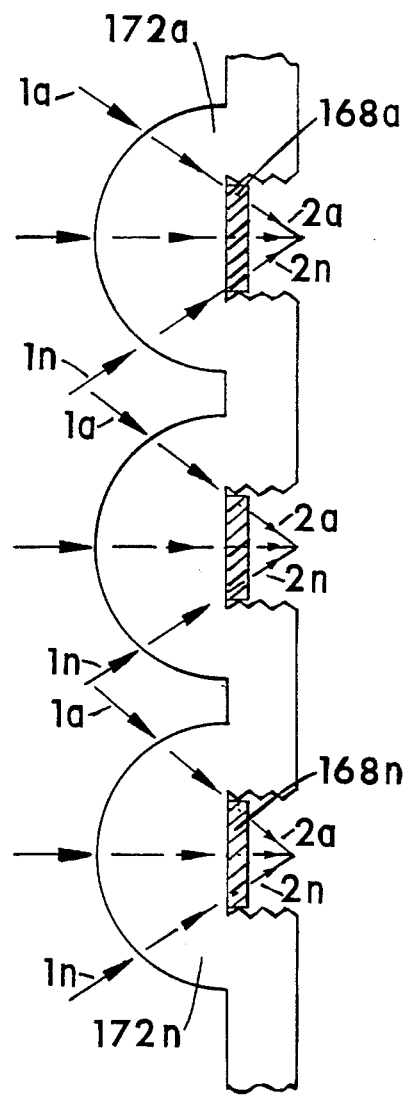
FIG. 193 Illustrates schematically a side view cross-section of an array of filter coated flat-surface transparent solid material matrix lens-cap structure combined with light dispersing means and their effect upon the projected light beams.
Figure 194:
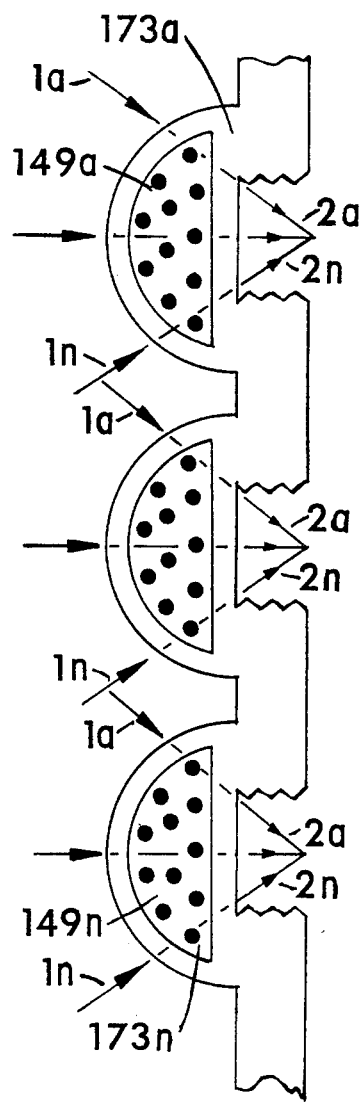
FIG. 194 Illustrates schematically a side view cross-section of an array of transparent thin-walled material light transmittal gas filled matrix lens-cap structure combined with light dispersing means and their effect upon the projected light beams.
Figure 195:
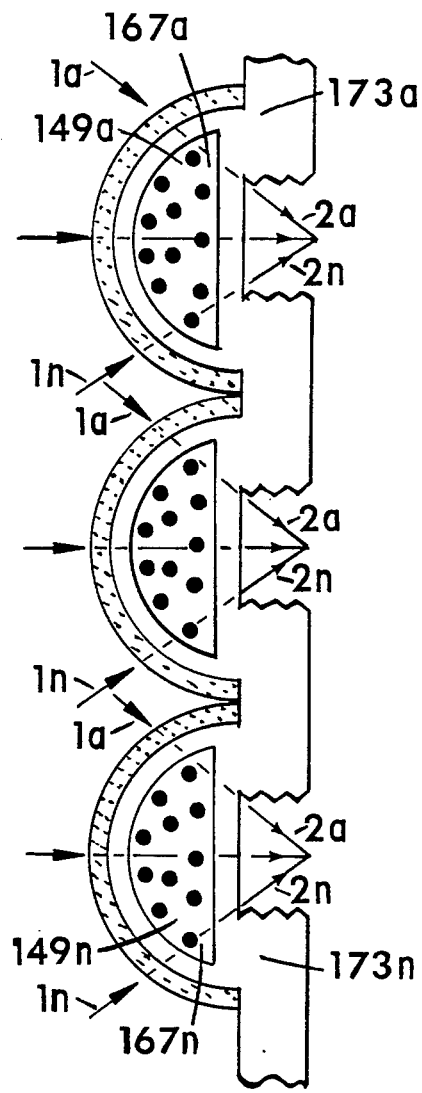
FIG. 195 Illustrates schematically a side view cross-section of an array of filter coated curved-surface transparent thin-walled material light transmittal gas filled matrix lens-cap structure combined with light dispersing means and their effect upon the projected light beams.
Figure 196:
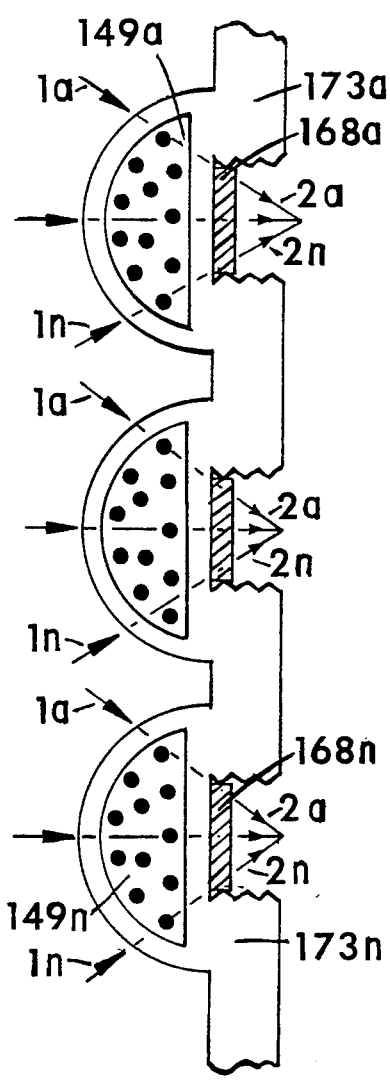
FIG. 196 Illustrates schematically a side view cross-section of an array of filter coated flat-surface transparent thin-walled material light transmittal gas filled matrix lens-cap structure combined with light dispersing means and their effect upon the projected light beams.
Figure 197:
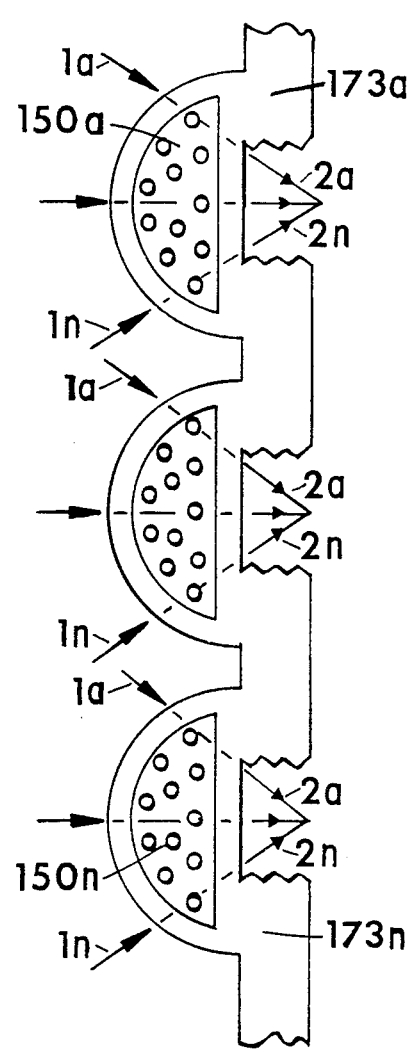
FIG. 197 Illustrates schematically a side view cross-section of an array of transparent thin-walled light transmittal liquid filled matrix lens-cap structure combined with light dispersing means and their effect upon the projected light beams.
Figure 198:
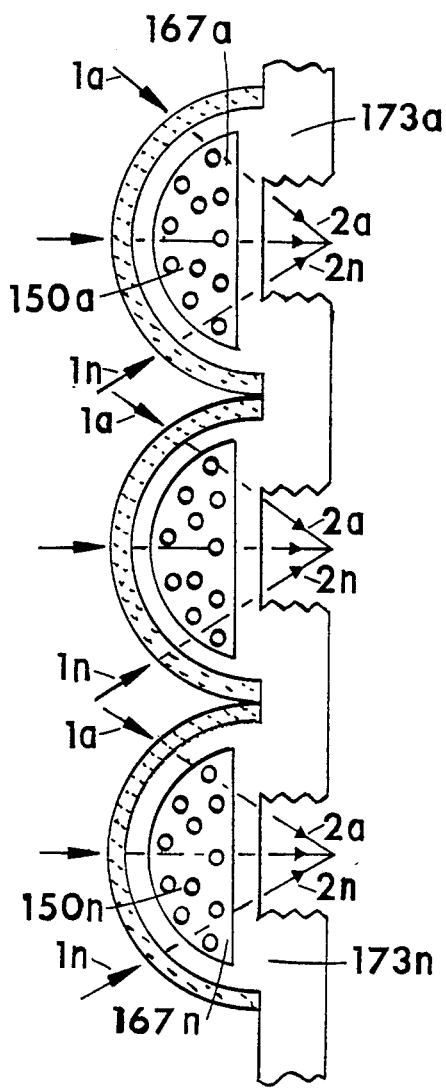
FIG. 198 Illustrates schematically a side view cross-section of an array of filter coated curved-surface transparent thin-walled material light transmittal liquid filled matrix lens-cap structure combined with light dispersing means and their effect upon the projected light beams.
Figure 199:
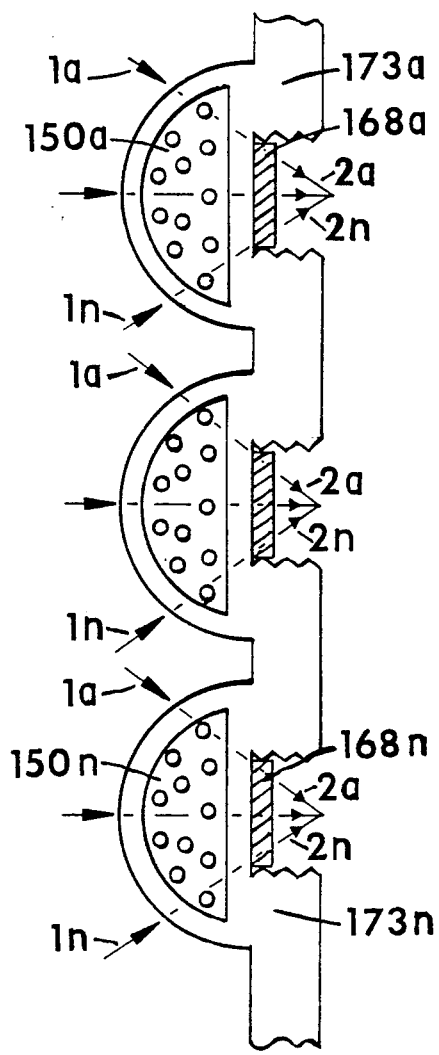
FIG. 199 Illustrates schematically a side view cross-section of an array of filter coated flat-surface transparent thin-walled light transmittal liquid filled matrix lens-cap structure combined with light dispersing means and their effect upon the projected light beams.
Figure 200:
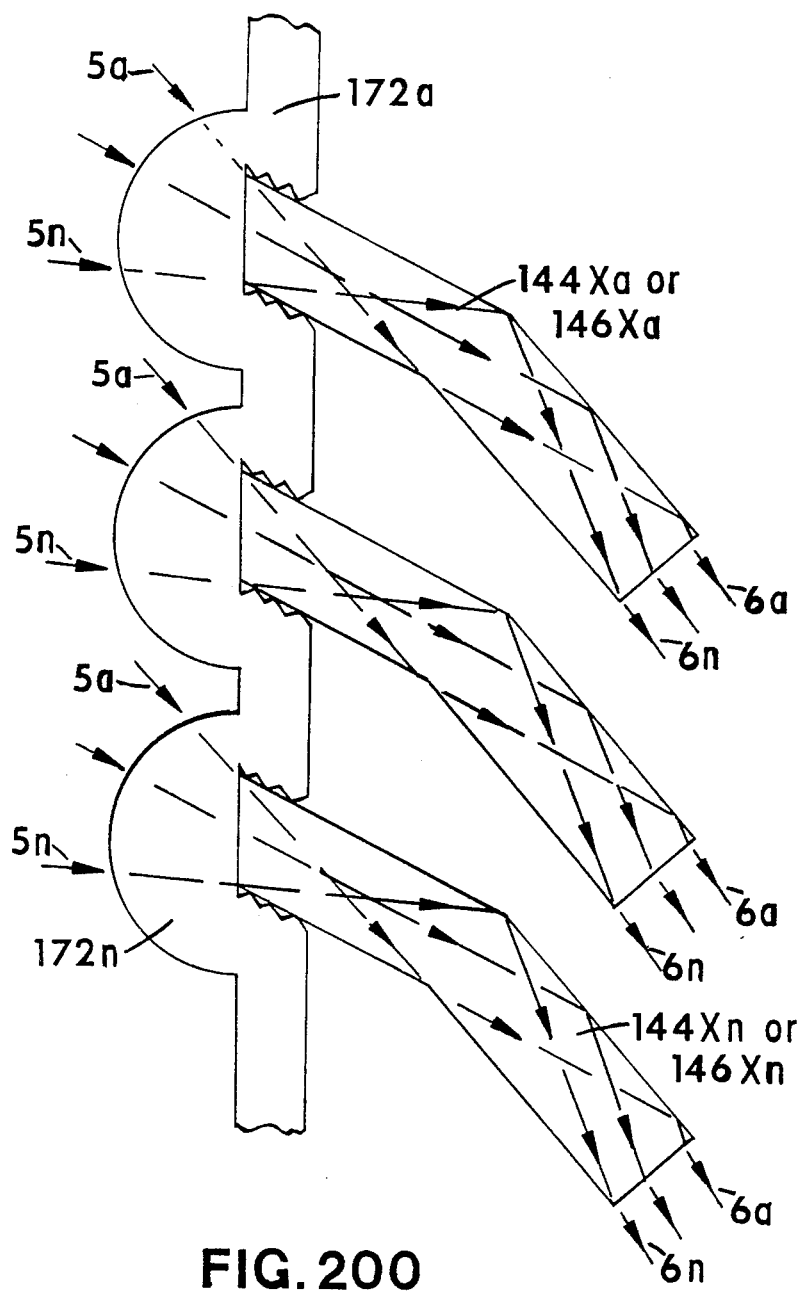
FIGS. 200, 201, and 202 Illustrates schematically a side view cross-section of an array of transparent solid material matrix lens-cap modular assembled light-steering lens embodiment combined with light dispersing means and their effect upon the projected light beams.
Figure 201:
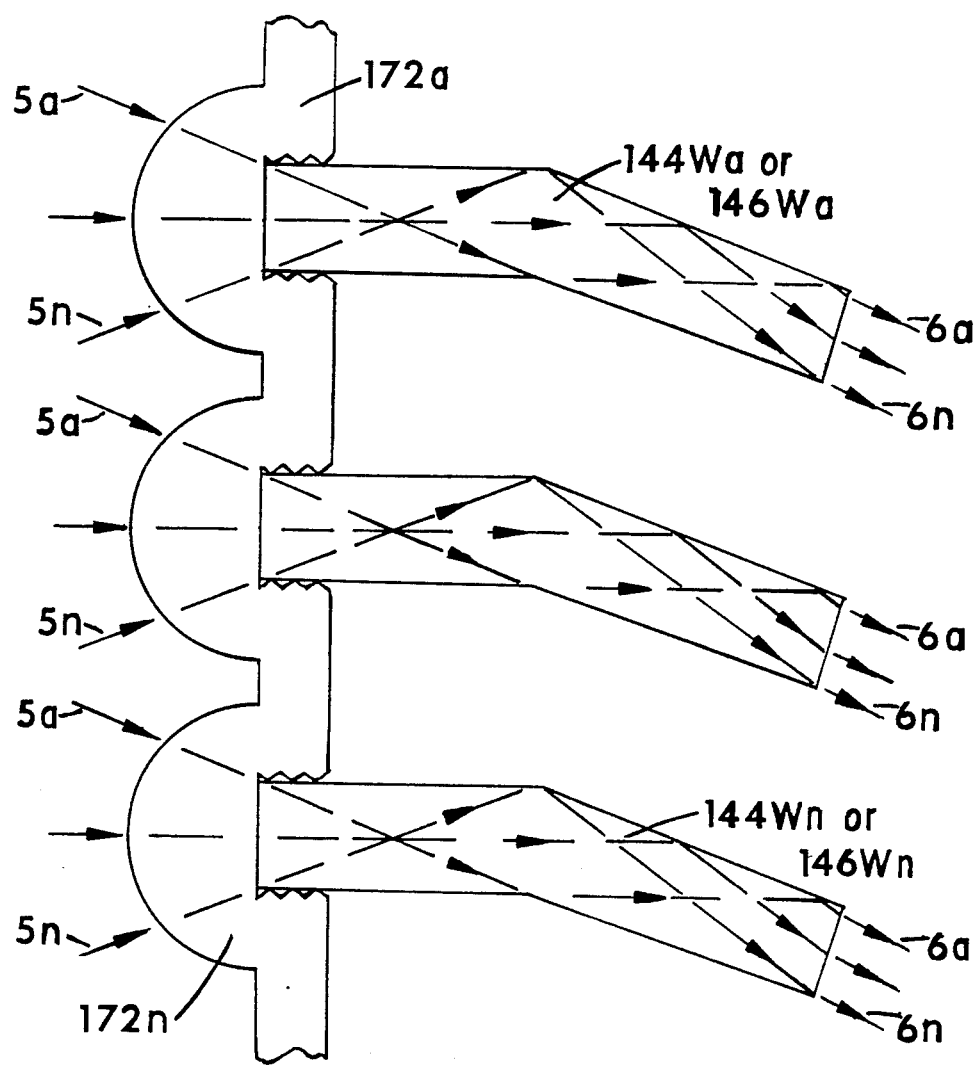
Figure 202:
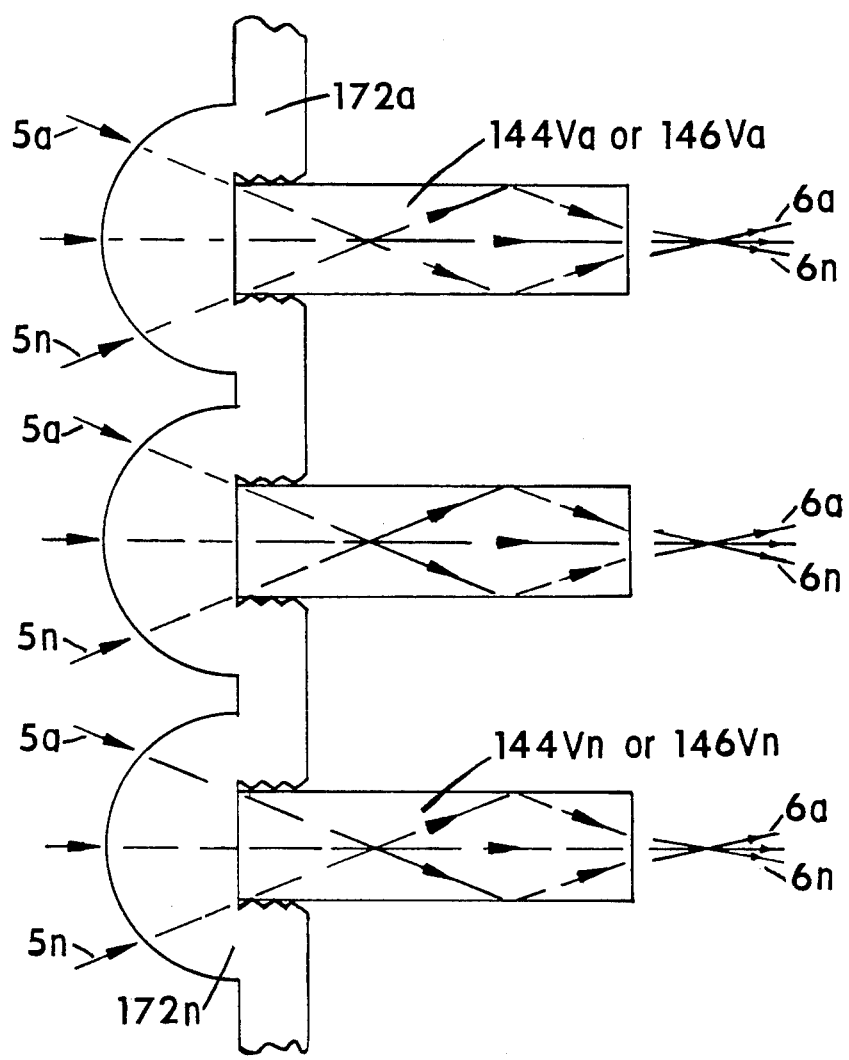
Figure 203:
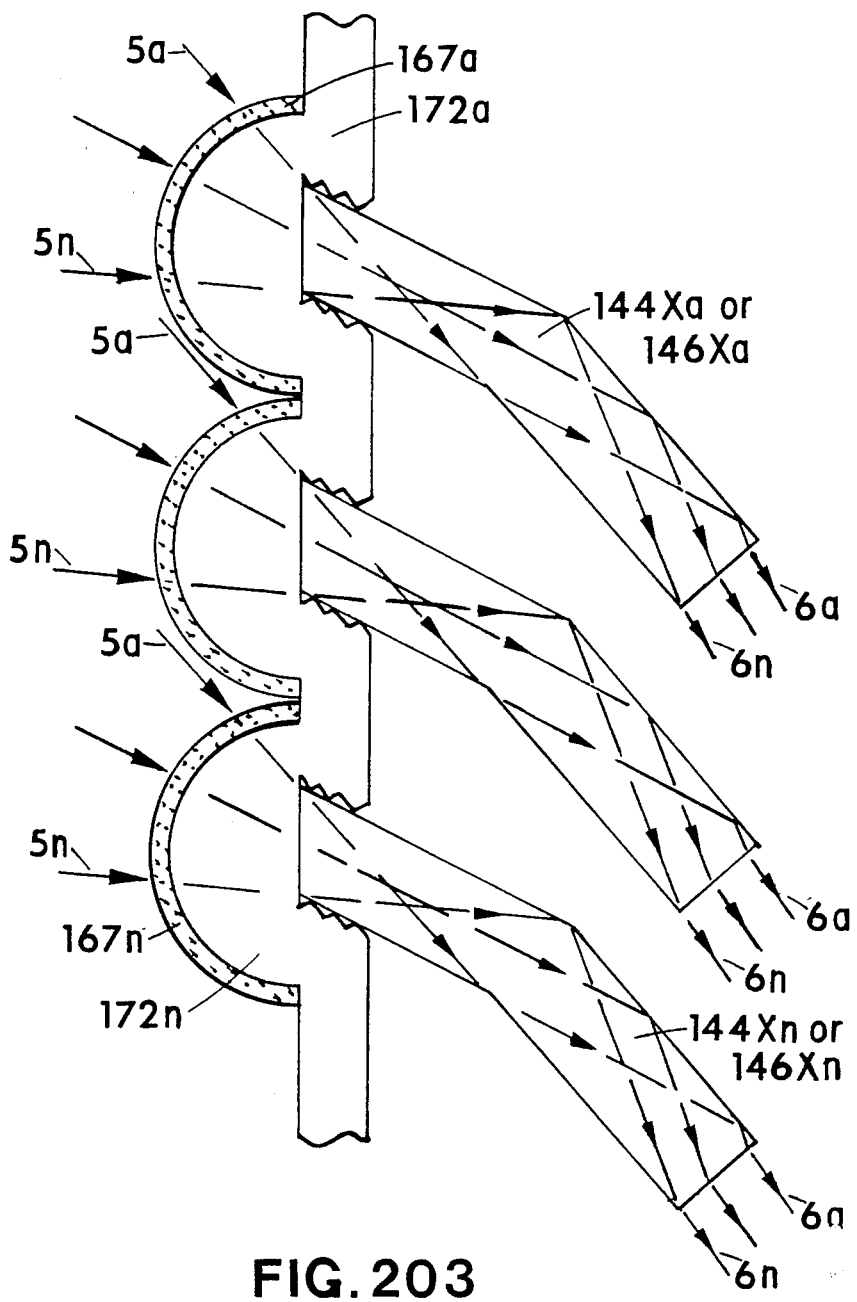
FIGS. 203, 204, and 205 Illustrates schematically a side view cross-section of an array of filter coated curved-surface transparent solid material matrix lens-cap modular assembled light-steering lens embodiment combined with light dispersing means and their effect upon the projected light beams.
Figure 204:
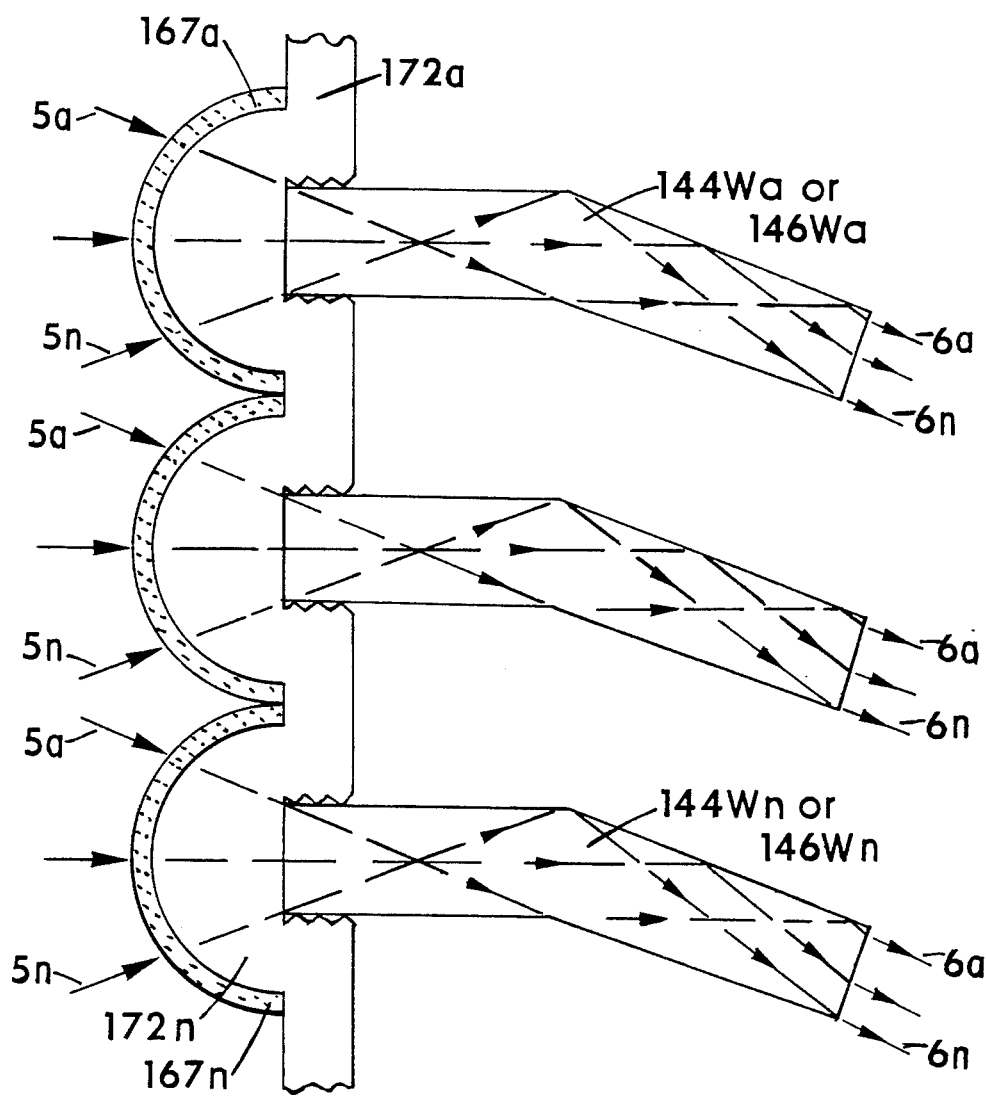
Figure 205:
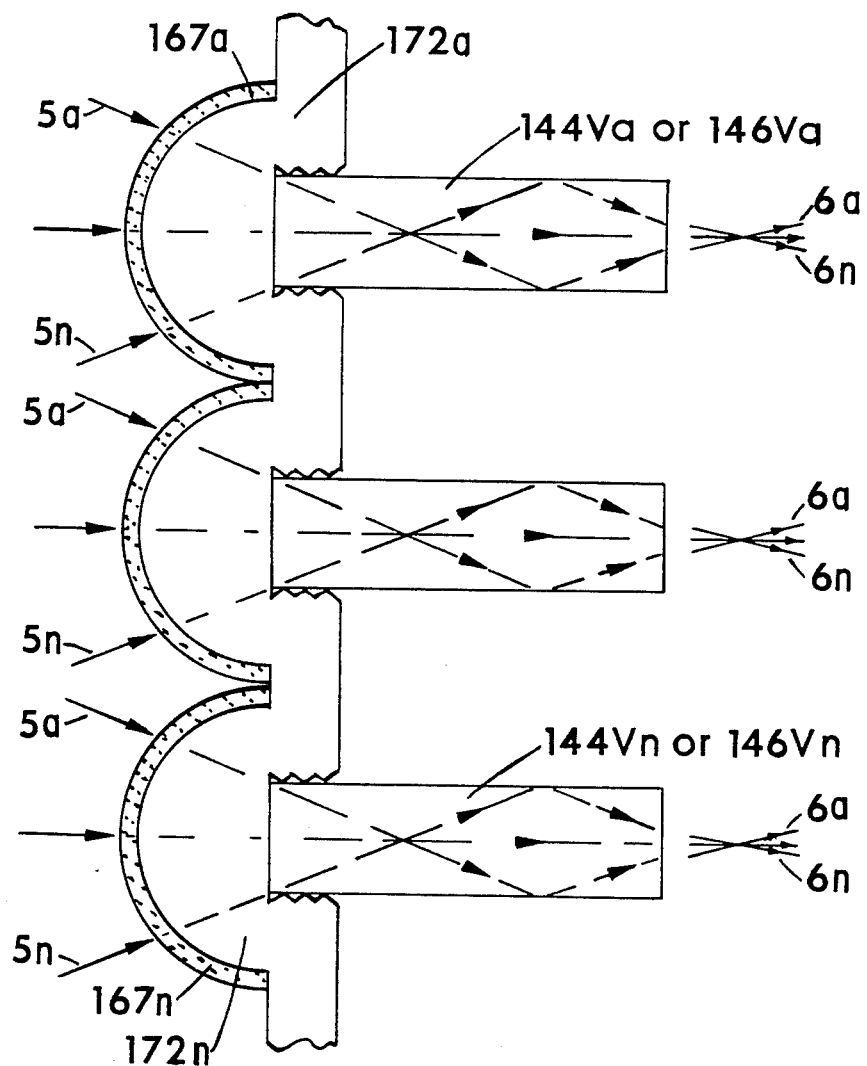
Figure 206:
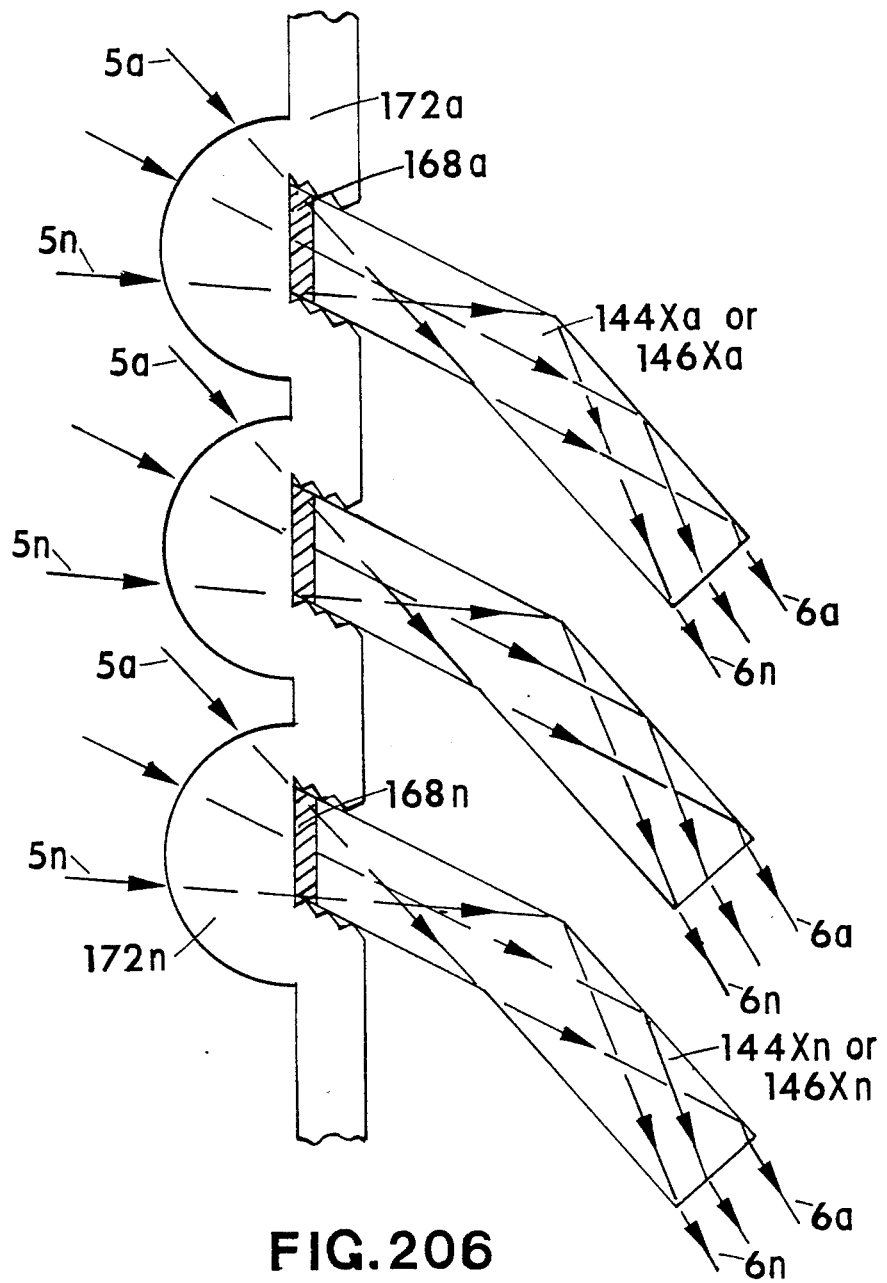
FIGS. 206, 207, and 208 Illustrates schematically a side view cross-section of an array of filter coated flat-surface transparent solid material matrix lens-cap modular assembled light-steering lens embodiment combined with light dispersing means and their effect upon the projected light beams.
Figure 207:
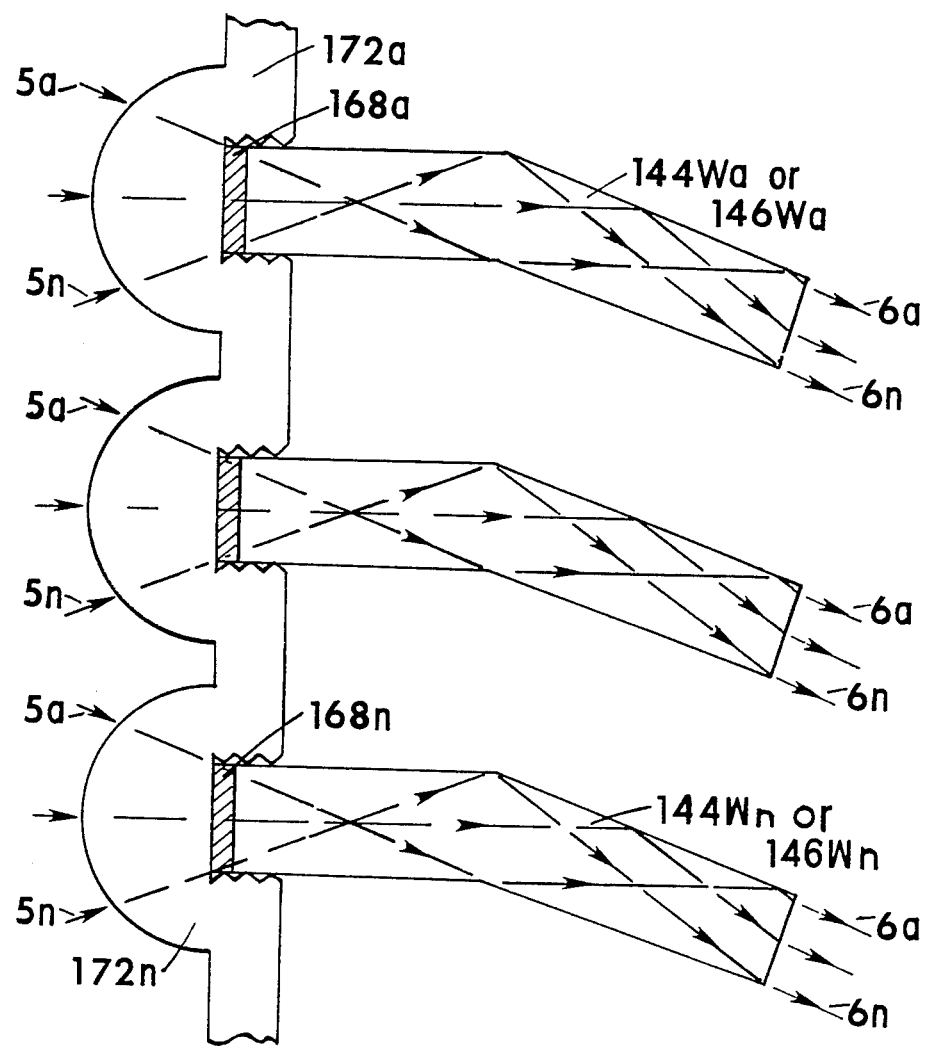
Figure 208:
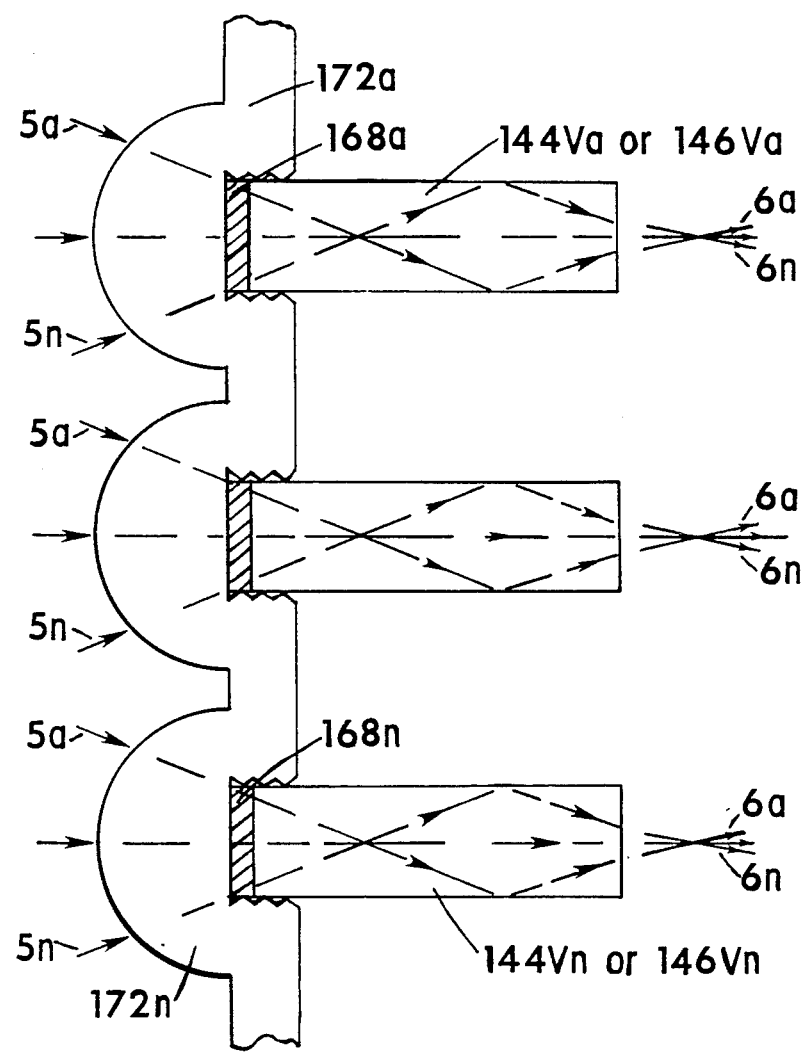
Figure 209:
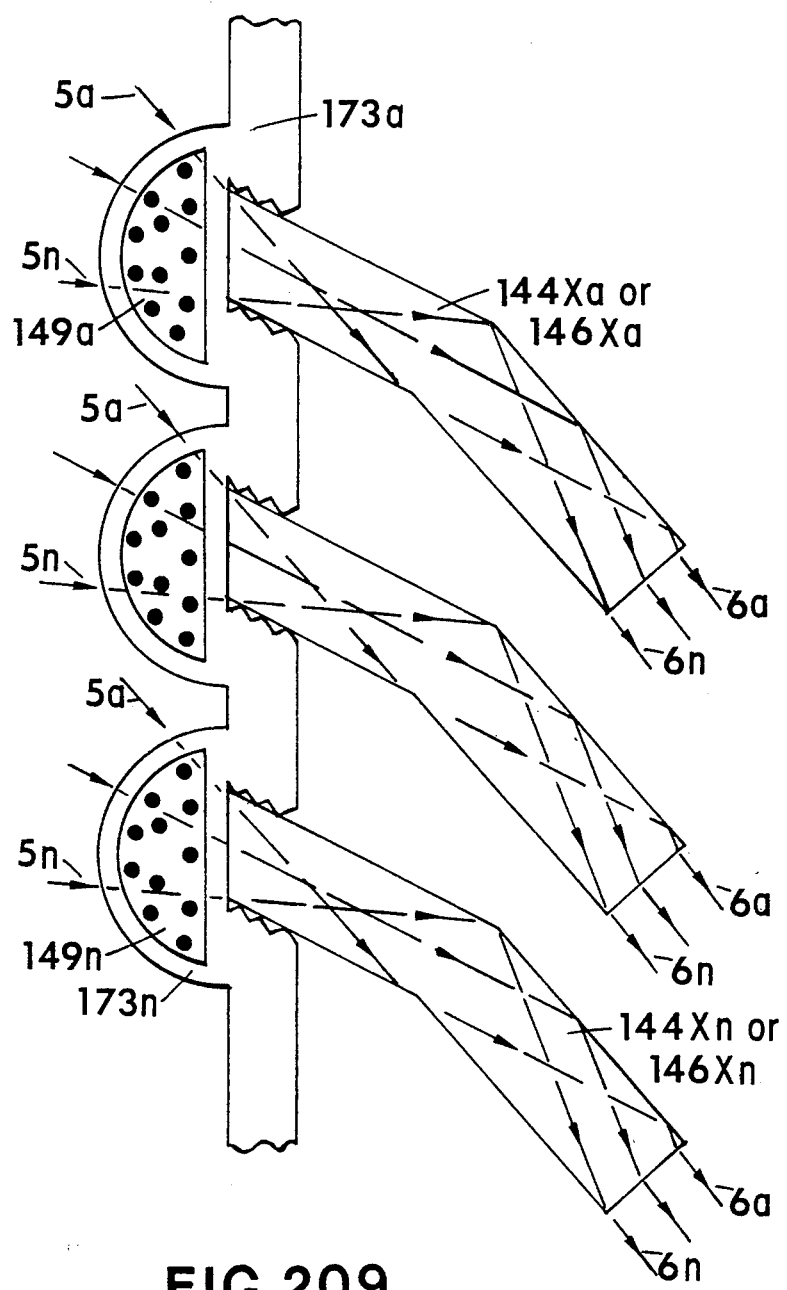
FIGS. 209, 210, and 211 Illustrates schematically a side view cross-section of an array of transparent thin-walled material light transmittal gas filled matrix lens-cap modular assembled light-steering lens embodiment combined with light dispersing means and their effect upon the projected light beams.
Figure 210:
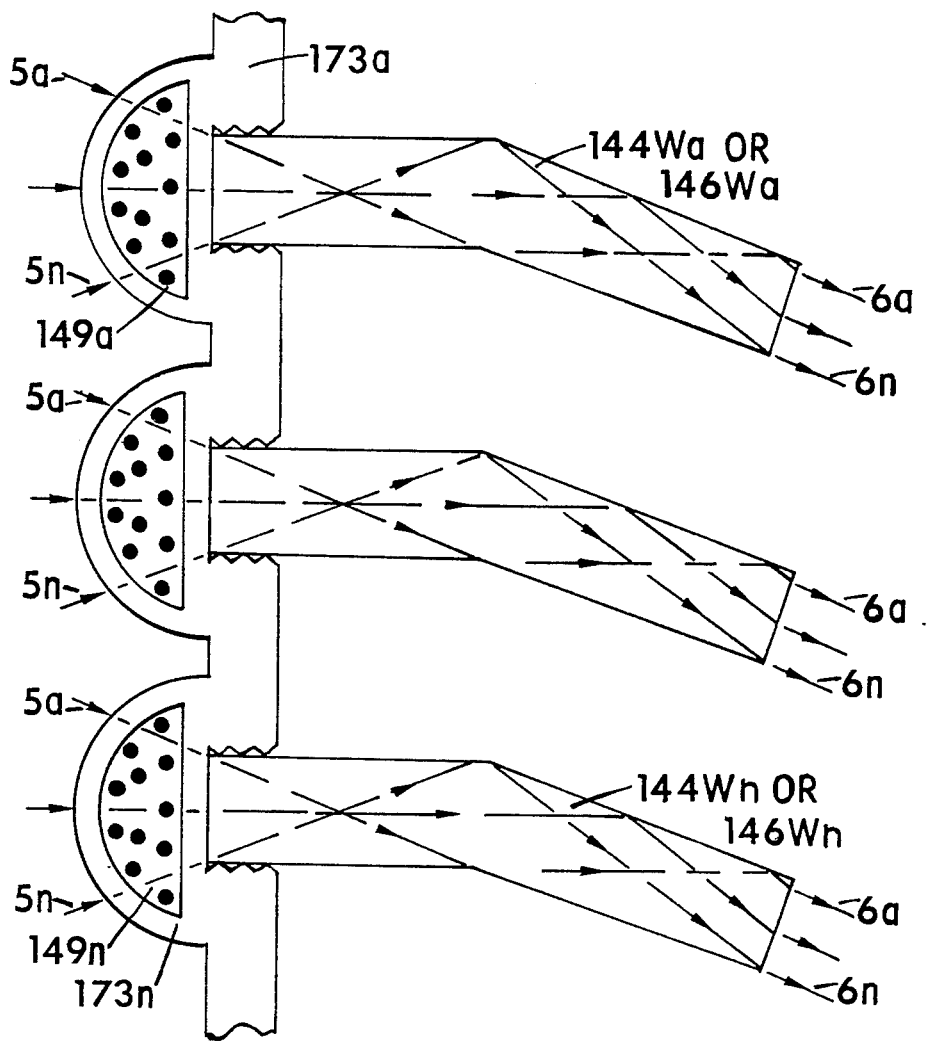
Figure 211:
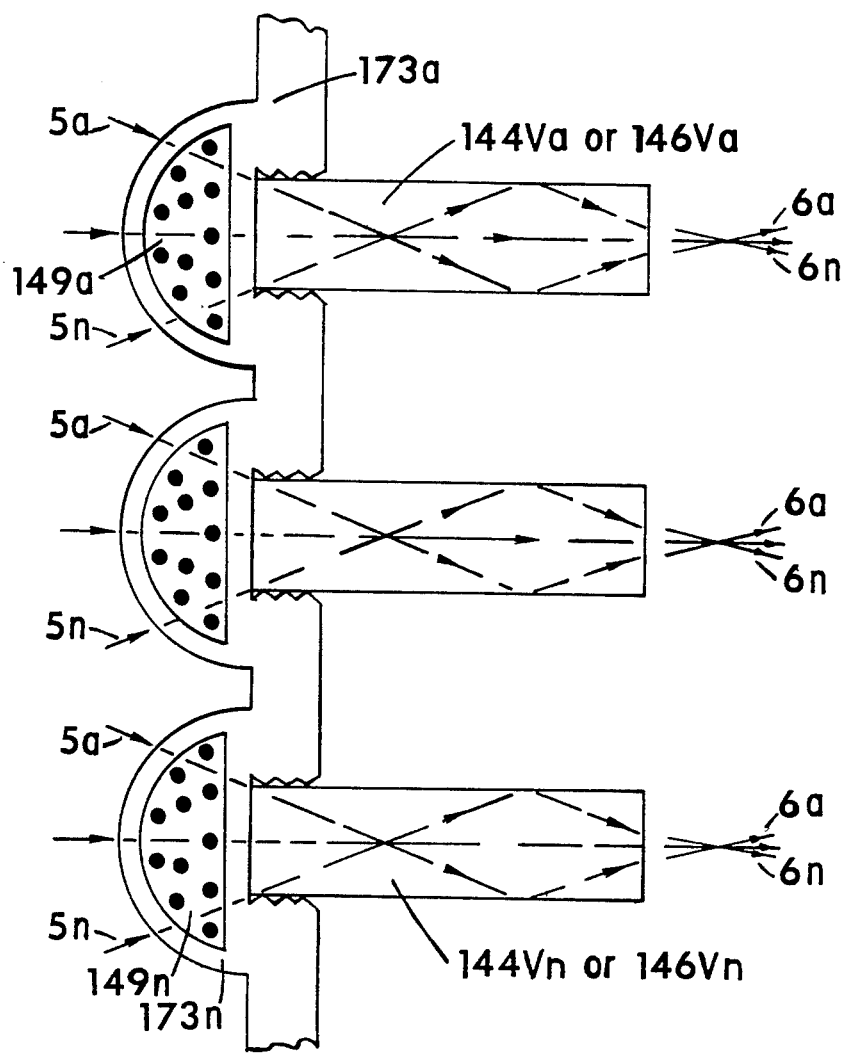
Figure 212:
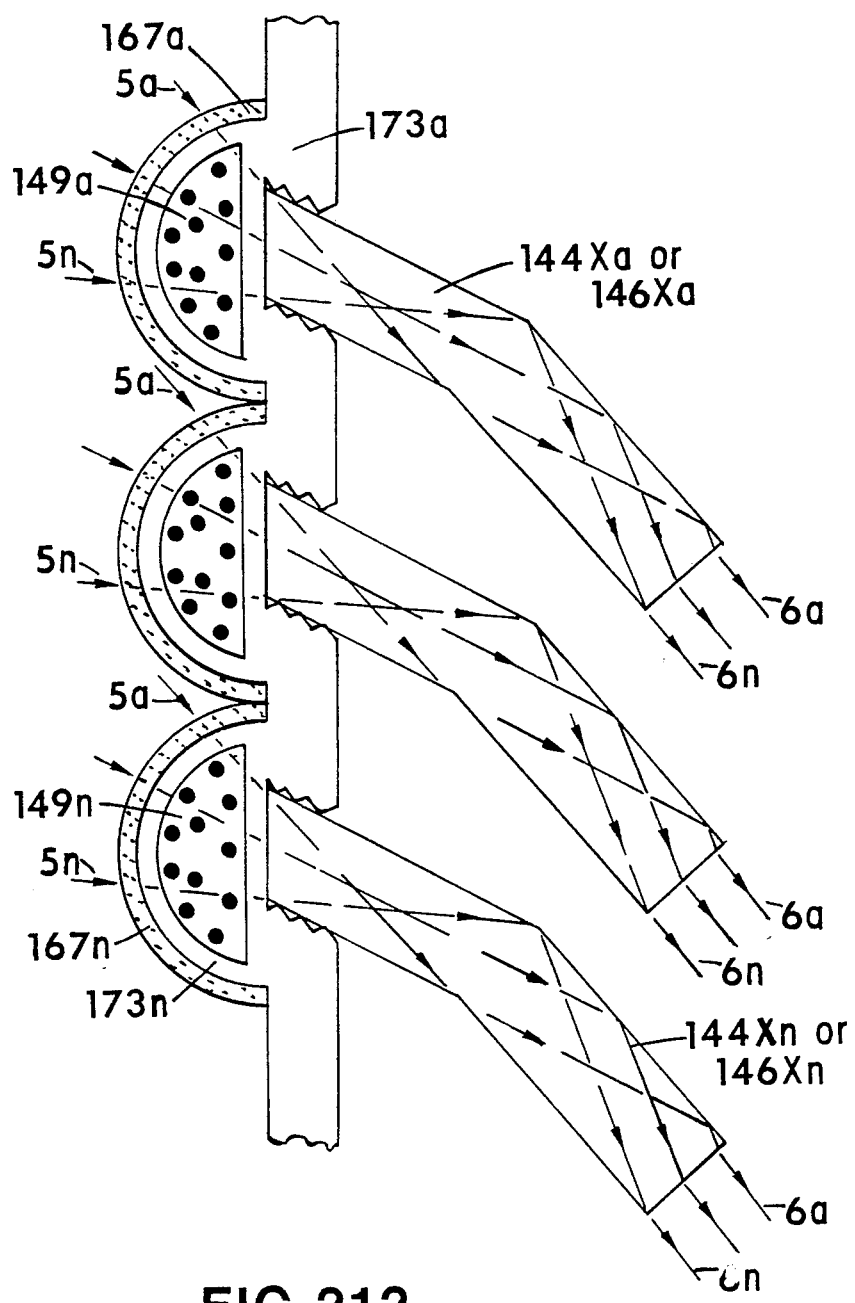
FIGS. 212, 213, and 214 Illustrates schematically a side view cross-section of an array of filter coated curved-surface transparent thin-walled material light transmittal gas filled matrix lens-cap modular assembled light-steering lens embodiment combined with light dispersing means and their effect upon the projected light beams.
Figure 213:
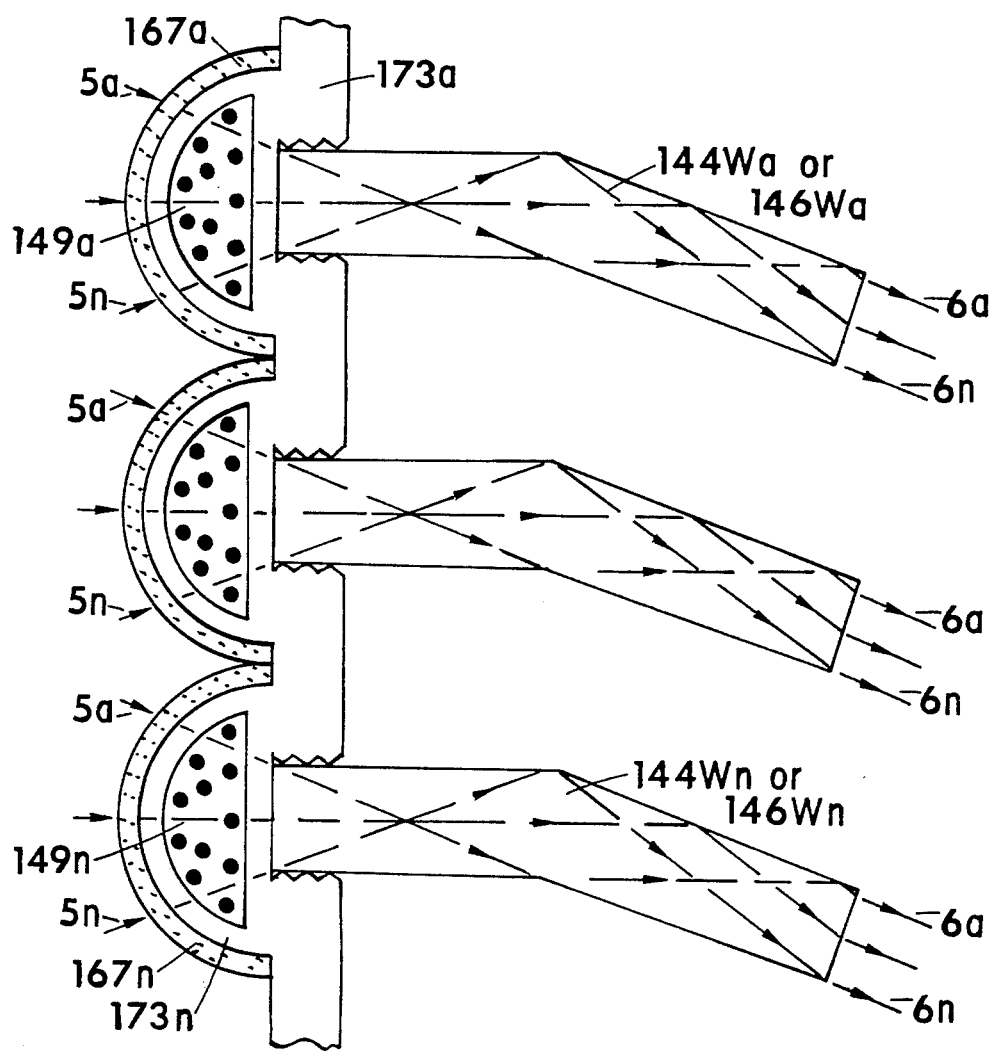
Figure 214:
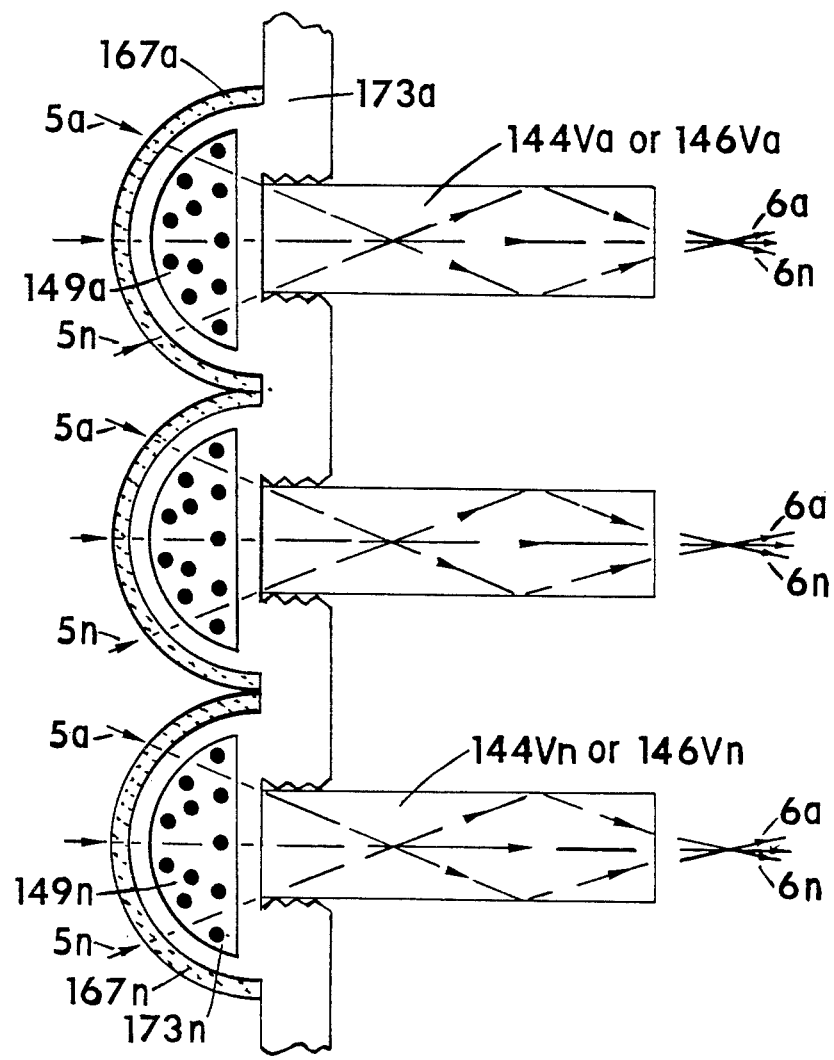
Figure 215:
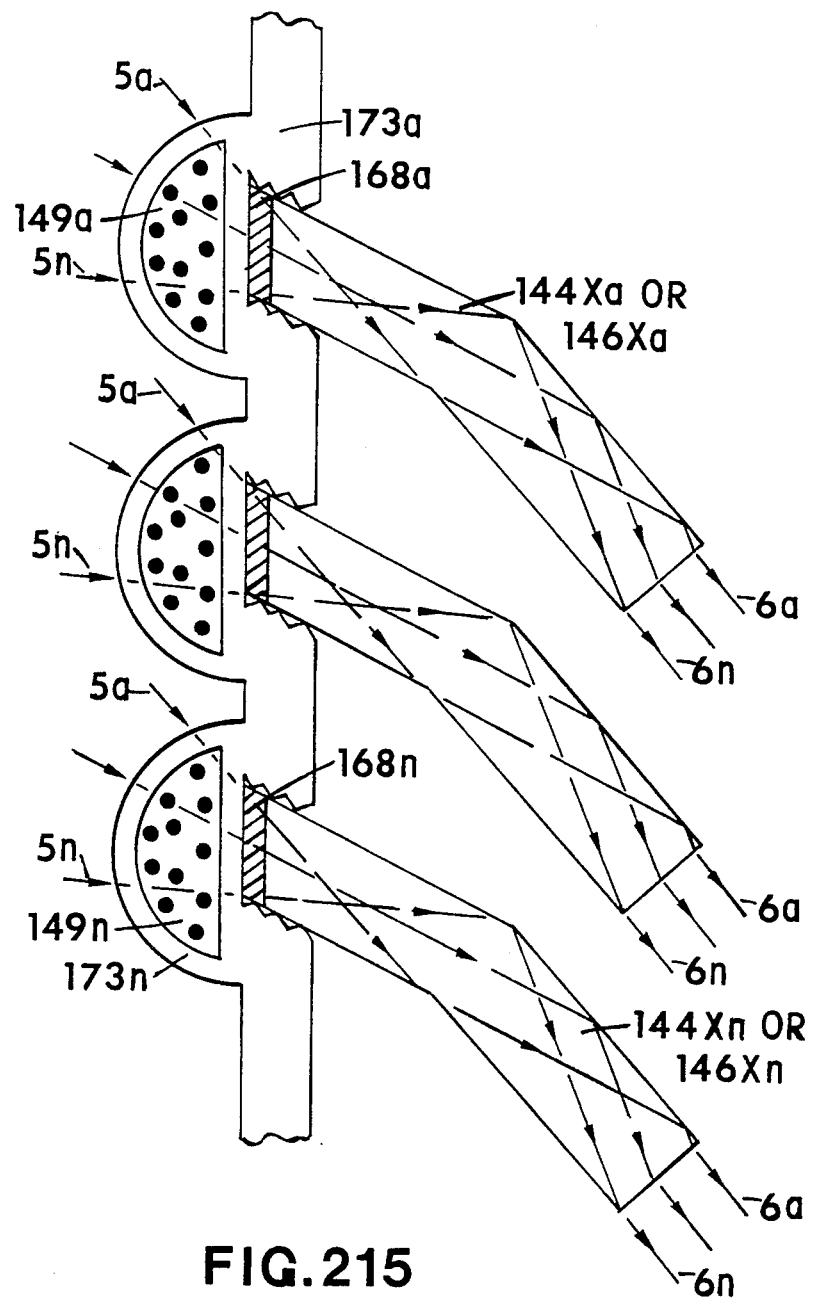
FIGS. 215, 216, and 217 Illustrates schematically a side view cross-section of an array of filter coated flat-surface transparent thin-walled material light transmittal gas filled matrix lens-cap modular assembled light-steering lens embodiment combined light dispersing means and their effect upon the projected light beams.
Figure 216:
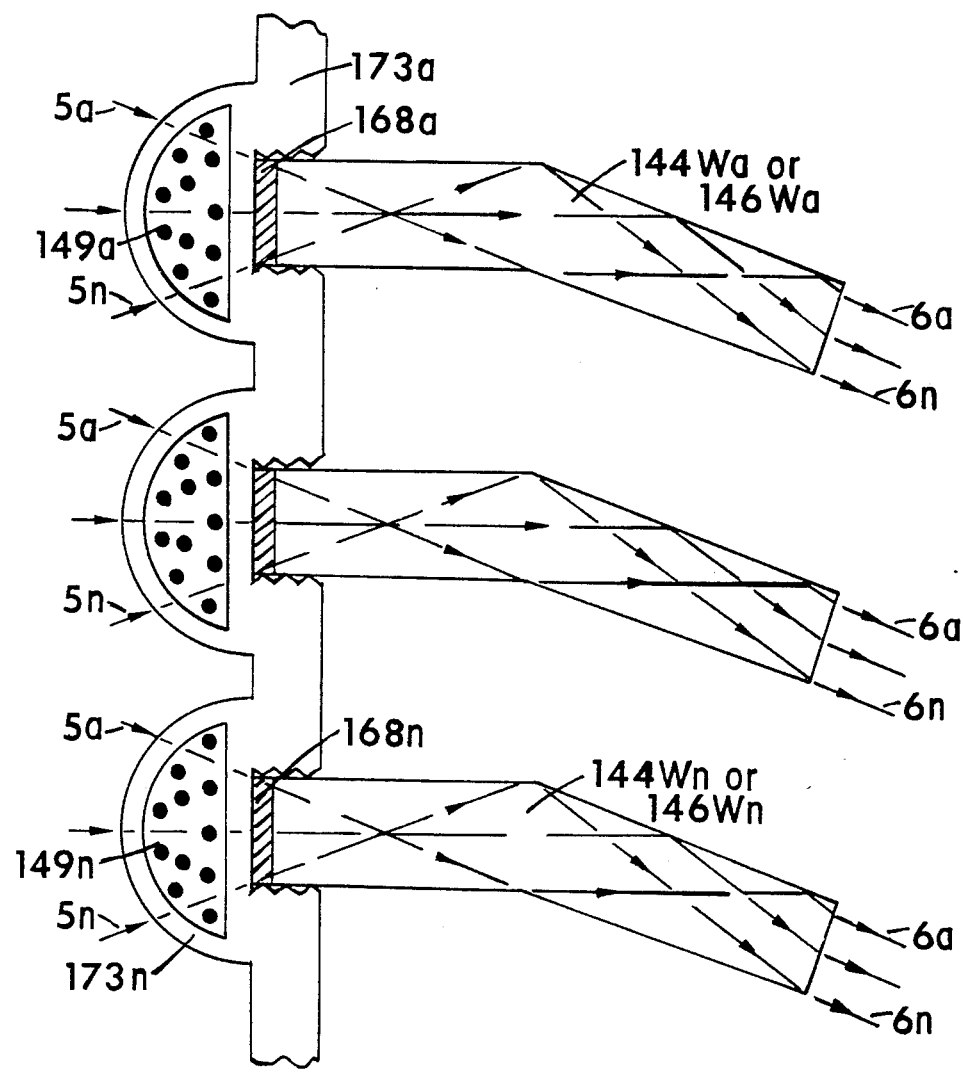
Figure 217:
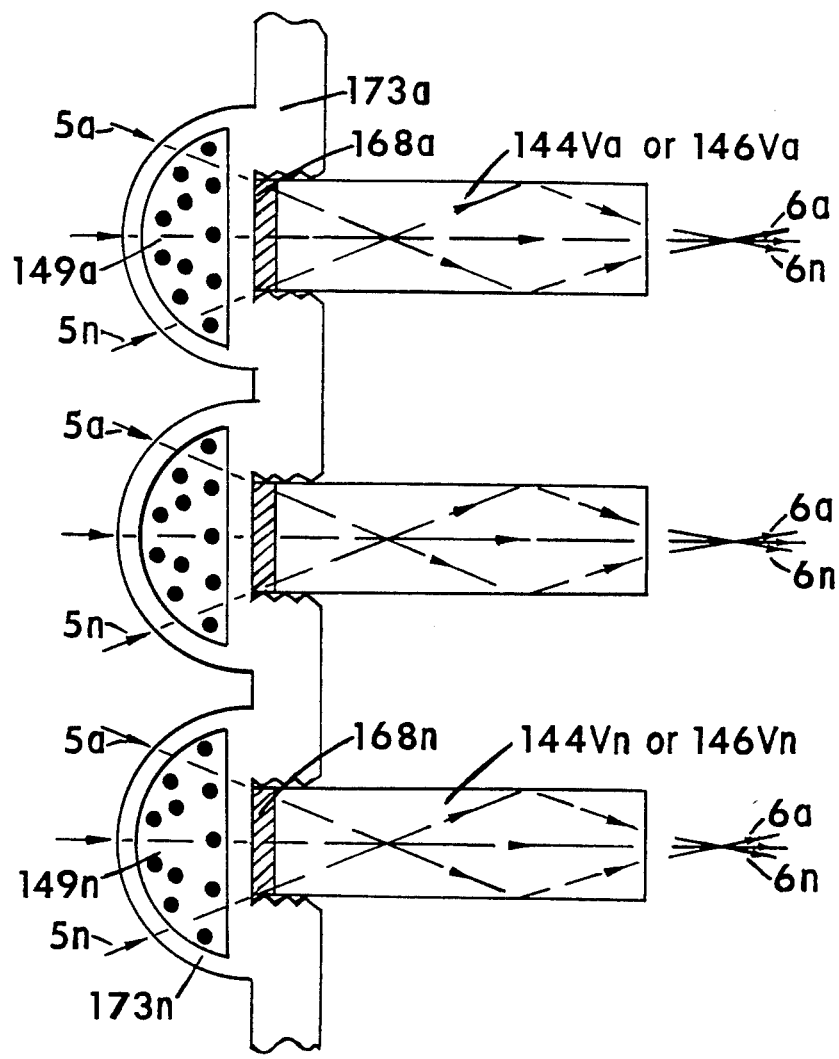
Figure 218:
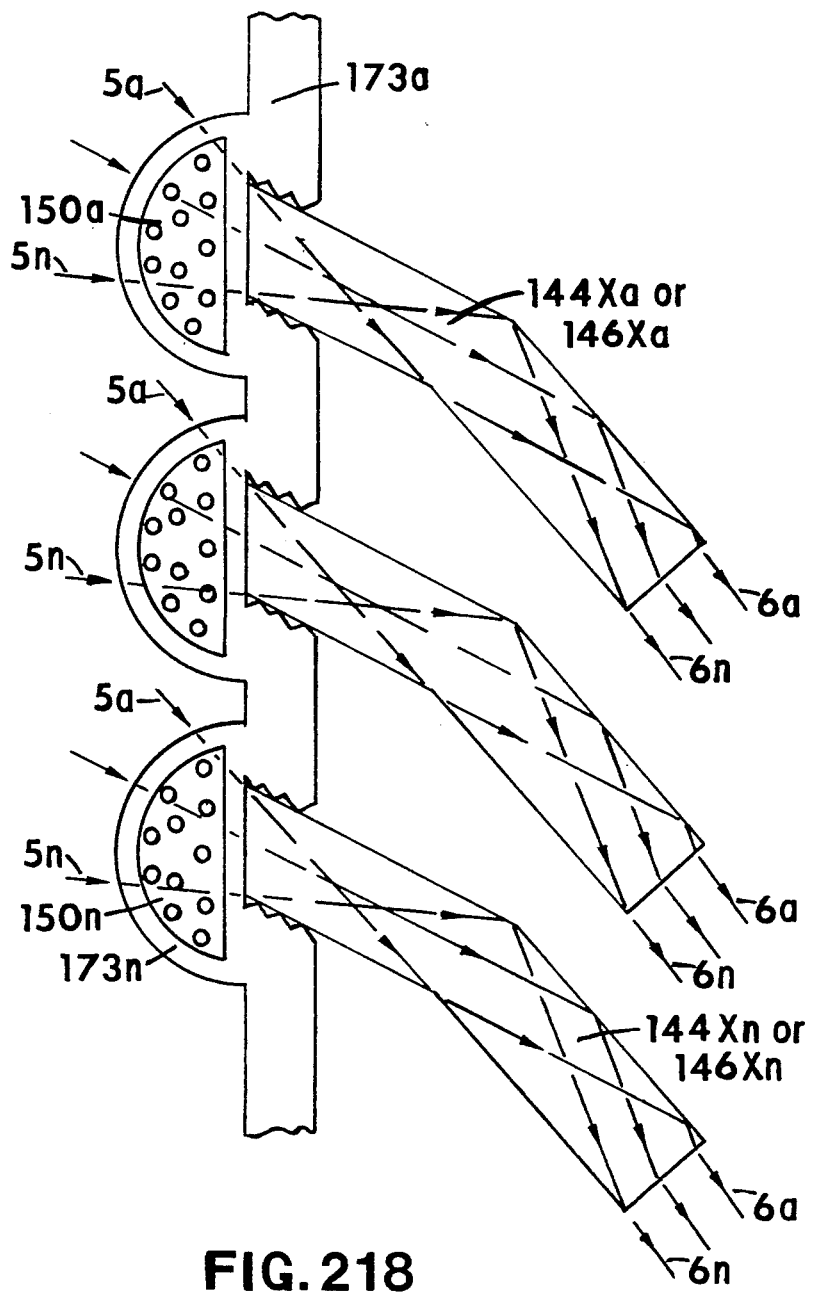
FIGS. 218, 219, and 220 Illustrates schematically a side view cross-section of an array of transparent thin-walled material light transmittal liquid filled matrix lens-cap modular assembled light-steering lens embodiment combined with light dispersing means and their effect upon the projected light beams.
Figure 219:
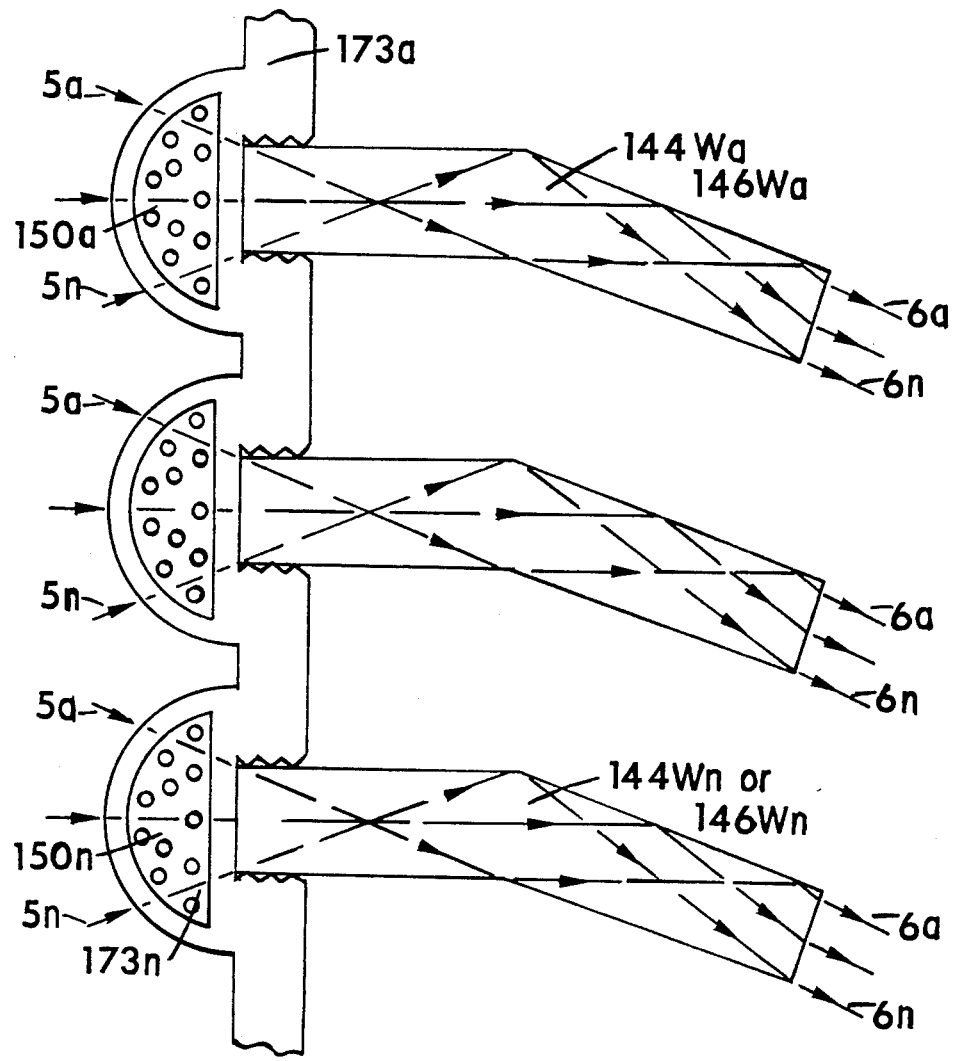
Figure 220:
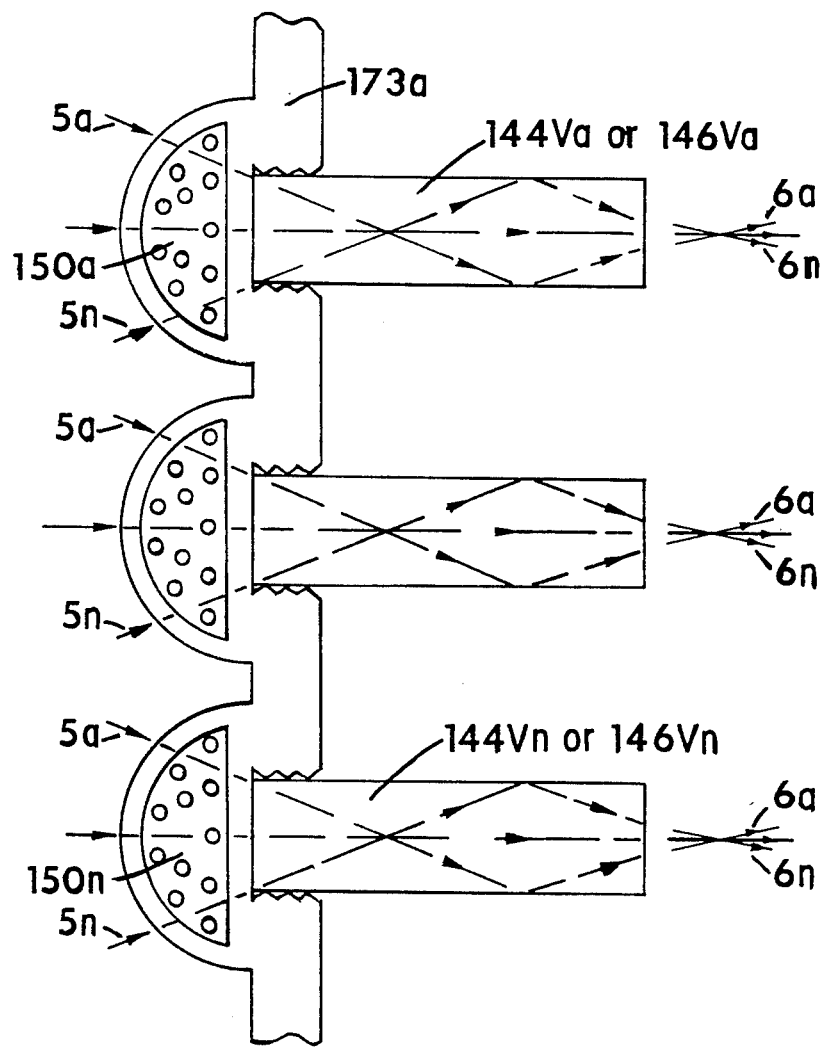
Figure 221:
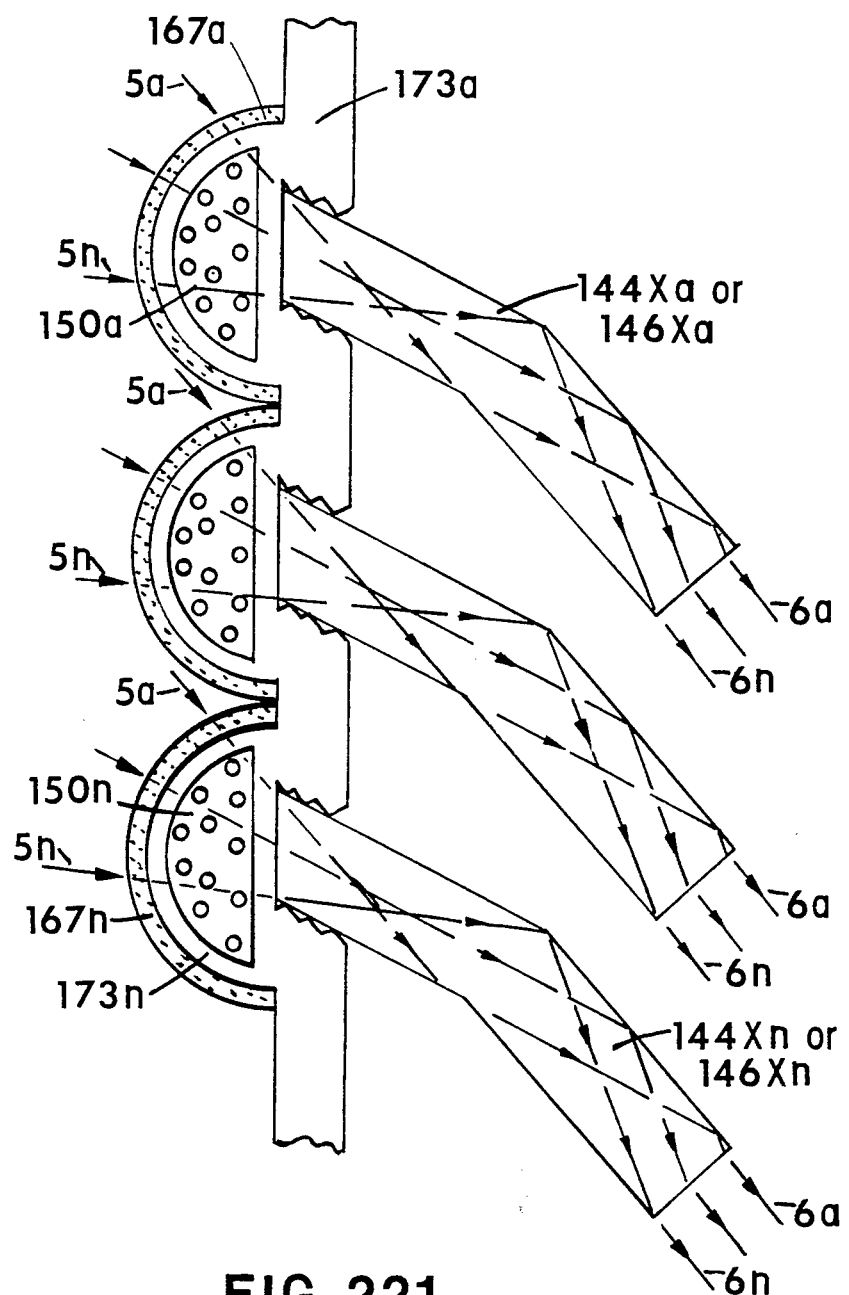
FIGS. 221, 222, and 223 Illustrates schematically a side view cross-section of an array of filter coated curved-surface transparent thin-walled material light transmittal liquid filled matrix lens-cap modular assembled light-steering lens embodiment combined with light dispersing means and their effect upon the projected light beams.
Figure 222:
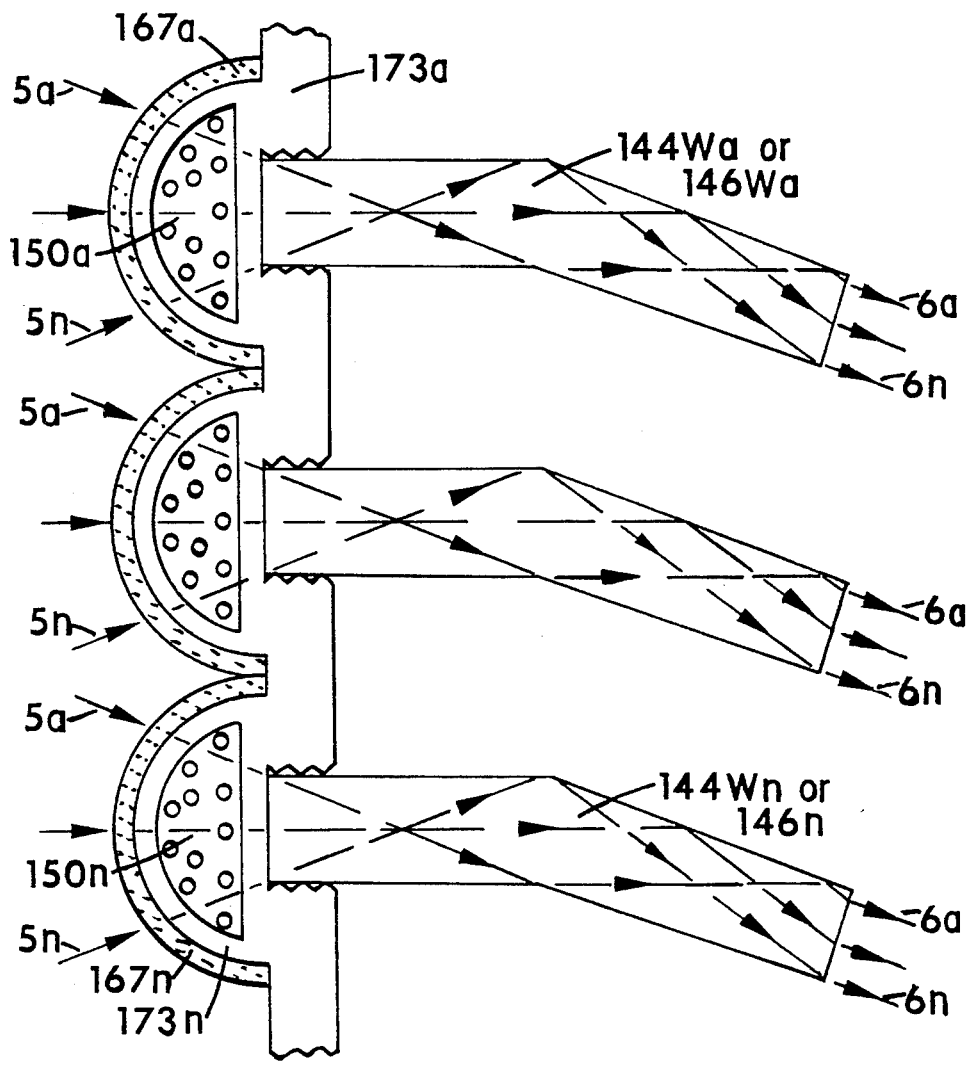
Figure 223:
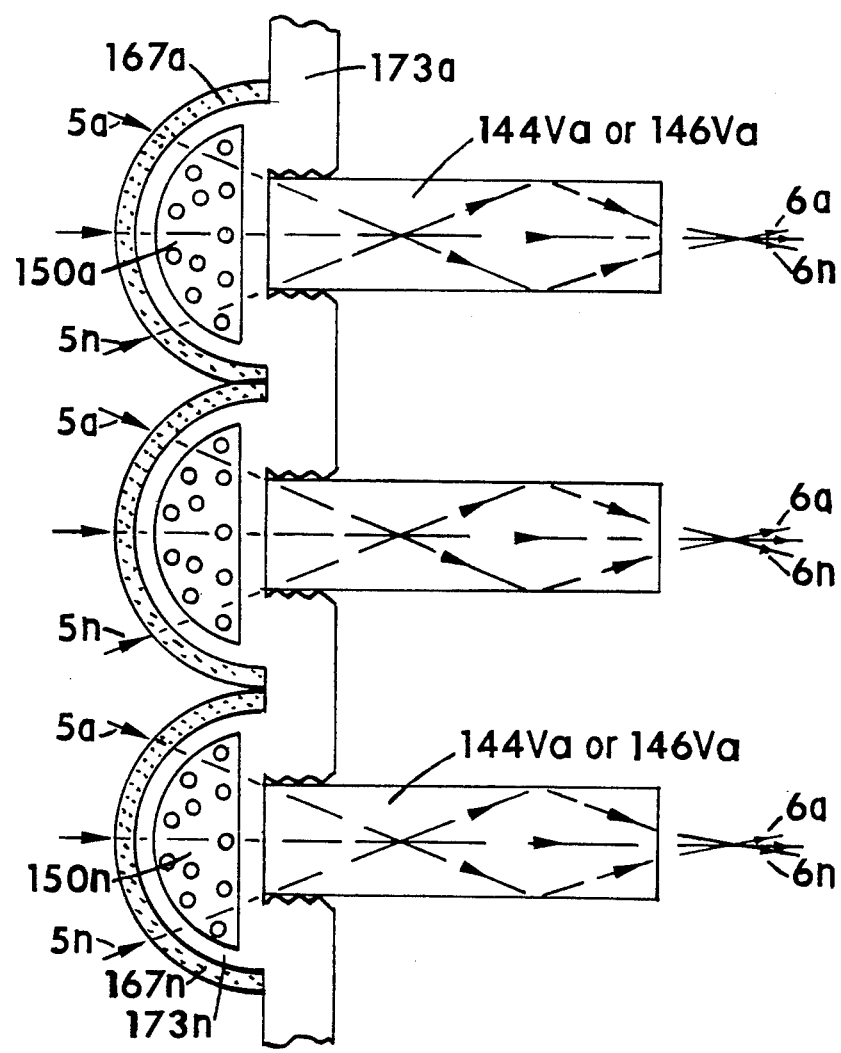

By simply bending the light-guide stems bundle array 144a xxx n to conform to anyone of the geometrical shapes 144V of FIG. 13, 144W of FIG. 14, 144X of FIG. 15, 144Y of FIG. 16, and 144Z of FIG. 17, the light transmission can be angularly displaced as compared to linear light transmission. Straight light-guide stem bundle array 144a xxx n (FIG. 26, FIG. 29, FIG. 35, FIG. 38, FIG. 44, FIG. 47, FIG. 53, FIG. 56, FIG. 64, FIG. 67, FIG. 73, and FIG. 76) illustrates multiple lens-cores total internal reflection linear light transmission; angular light-guide stem bundle array 144Wa xxx n (FIG. 28, FIG. 31, FIG. 37, FIG. 40, FIG. 46, FIG.

55, FIG. 58, FIG. 62, FIG. 65, FIG. 71, and FIG. 74) illustrates multiple lens-cores total internal reflection angular light transmission from horizontal line 153 to critical angle of reflection 152; Tilt-angular light-guide stem bundle array 144X*a xxx n* (FIG. 27, FIG. 30, FIG. 36, FIG. 39, FIG. 45, FIG. 48, FIG. 54, FIG. 57, FIG. 63, FIG. 66, FIG. 72, and FIG. 75) illustrates multiple lens-cores total internal reflection angular light transmission from critical angle of reflection 152 to more than forty-five degrees from horizontal (line 153 of FIG. 15).

FIG. 77 through FIG. 94 illustrates cross-sectional end view of single (light-guide stem 144 or 146) or bundle array (light-guide stems 144*a xxx n* or 146*a xxx n*) light-guide stems in circular configuration. In application, the round shape light-guide stem 144 or 146 provides for maximum light concentration per given area over other cross-sectional end view design configurations. Bundle array 144*a xxx n* or 146*a xxx n* can change from circular to other cross-sectional end view design configurations for a given purpose.

Figure 2:
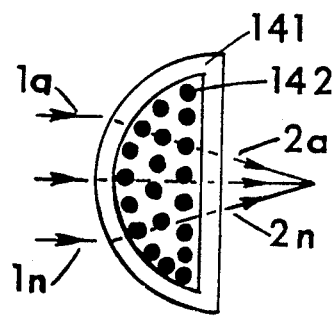
FIG. 2 Illustrates schematically a side view cross-section of a transparent thin-walled material light-guide lens-cap structure filled with a light transmittal gas combined with light dispersing means and their effect upon the projected light beams.
Figure 3:
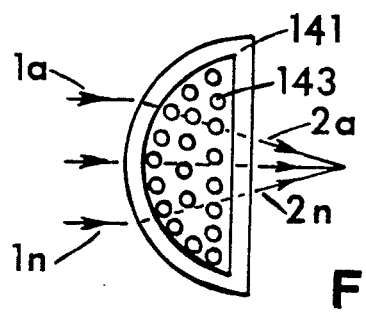
FIG. 3 Illustrates schematically a side view cross-section of a transparent thin-walled material light-guide lens-cap structure filled with a light transmittal liquid combined with light dispersing means and their effect upon the projected light beams.
Figure 23:
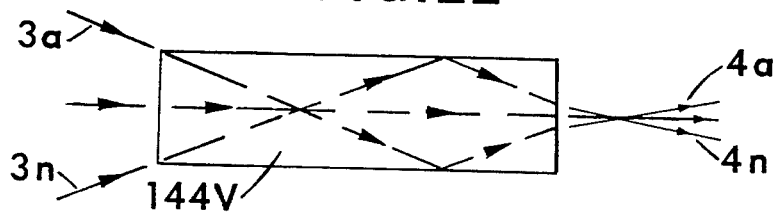
FIGS. 23, 24, and 25 Illustrates schematically a side view cross-section of a transparent solid material light-guide stem structure combined with light dispersing means and their effect upon the projected light beams.
Figure 96:
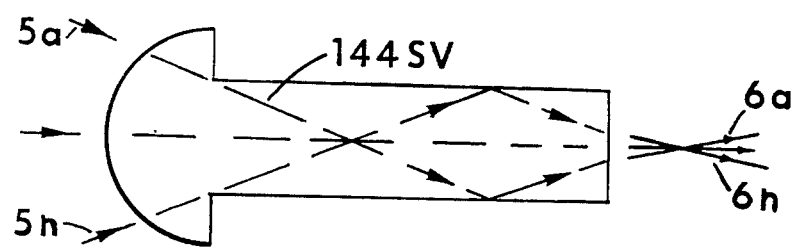

By affixing a lens-cap focusing lens (FIG. 1, FIG. 2, or FIG. 3) to anytype of light-guide stem (solid 144 or tubular 146, single or bundle array), incident light energy increases by more than 20% through the lens-core area (144 or 146). Likewise, the incident light collection scan range 3*a xxx n* (60 degree arc) of any light-guide stem (as shown in FIG. 23) is expanded to 5*a xxx n* (80 degrees or more) as illustrated in FIG. 96. FIG. 1, FIG. 2, and FIG. 3, illustrates a permanent mounted lens-cap structure (140 or 141); FIG. 119 through FIG. 127 illustrates a removable lens-cap structure (170 or 171); FIG. 155 through 163 illustrates a single-unit lens-cap focusing plate structure (172 or 173); and FIG. 191 through FIG. 199 illustrates an unitary array lens-cap focusing plate structure (172*a xxx n* or 173*a xxx n*.

In whatever component combination of assembly, any kind of lens-cap focusing lens can be attached to anytype of light-guide stem structure (single or bundled array) to form a light-steering lens embodiment. FIG. 95 through FIG. 118 illustrates a unitary structure light-steering lens (solid or hollow center) embodiment; FIG. 128 through FIG. 154 illustrates a removable lens-cap light-steering embodiment; and, FIG. 164 through 190 illustrates an inserted light-guide stem (single or bundle array) lens-cap focusing plate light-steering lens embodiment- forming the basic assembly structure of a light-guide lens embodiment.

Figure 11:
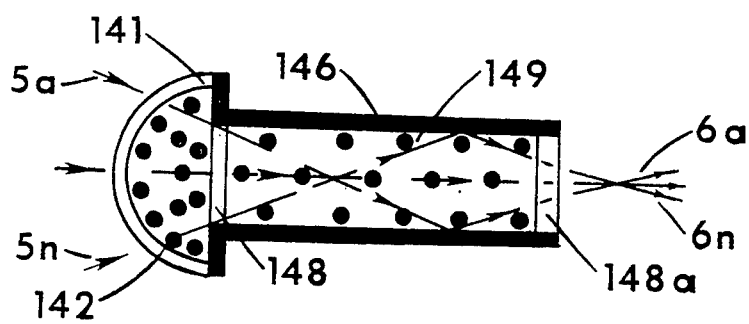
FIG. 11 Illustrates schematically a side view cross-section of a transparent thin-walled light transmittal gas filled light-steering lens embodiment with its lens-cap structure affixed to a light-guide stem structure combined with light dispersing means and their effect upon the projected light beams.
Figure 12:
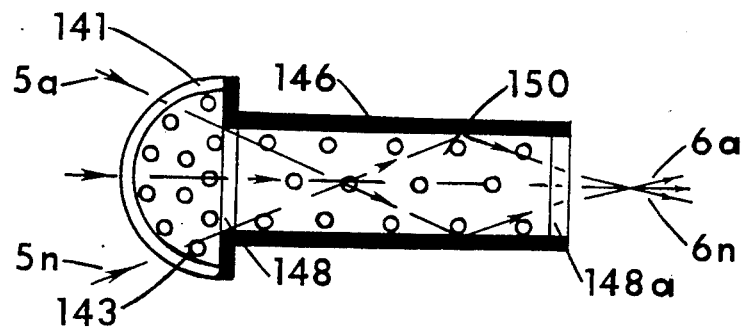
FIG. 12 Illustrates schematically a side view cross-section of a transparent thin-walled light transmittal liquid filled light-steering lens embodiment with its lens-cap structure affixed to a light-guide stem structure combined with light dispersing means and their effect upon the projected light beams.
Figures 19, 20, 21:
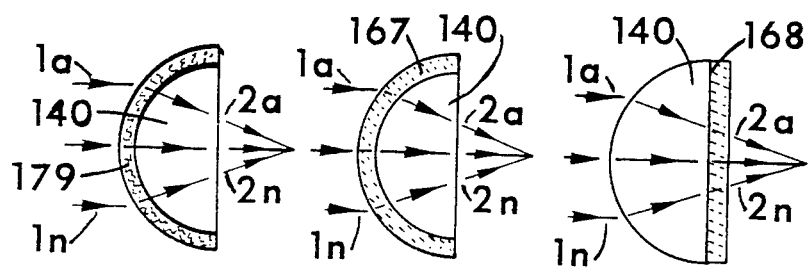
FIG. 19 Illustrates schematically a side view cross-section of a lens-cap structure without a filter-lens combined with light dispersing means and their effect upon the projected light beams.
FIG. 20 Illustrates schematically a side view cross-section of a lens-cap structure with a filter coating on its curved-surface combined with light dispersing means and their effect upon the projected light beams.
FIG. 21 Illustrates schematically a side view cross-section of a lens-cap structure with a filter affixed to its flat-surface combined with light dispersing means and their effect upon the projeted light beams.
Figure 22:
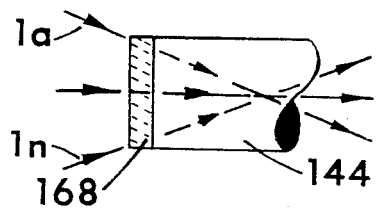
FIG. 22 Illustrates schematically a side view cross-section of a light-guide stem structure with a filter material affixed to its end combined with light dispersing means and their effect upon the projected light beams.

To prevent harmful or unwanted incident light waves from passing through a light-steering lens embodiment, a light filter material 167 of FIG. 20 can be applied to any kind of lens-cap outer curved-surface area. In place of 167, light filter material 168 of FIG. 21 can be placed on flat-surface of any modular structure lens-cap focusing lens. Light filter material 168 can also be placed between the lens-cap structure and any light-guide stem structure (single or bundled array) as illustrates in FIG. 136. If no lens-cap is needed (as shown in FIG. 22) then light filter material 168 can be directly attached to anytype of light-guide stem structure. Basically, light filter material 167 of FIG. 20 and material 168 of FIG. 21 can apply directly to any light transparent material. To simplify light wave filtering still further, material 167 or 168 can actually become the material used to form anytype of lens-cap structure and/or anytype of light-guide stem structure and/or anytype of light-steering lens embodiment. Still another light filtering method is used different types of liquid (150) or gas (149) light transmittance substances within a given lens-cap thin-walled structure (as illustrated in FIG. 2), within a given light-guide thin-walled stem structure (as illustrates in FIG. 8), or within a given light-steering lens thin-walled structure (as illustrated in FIG. 11).

In cases where incident light energy is to be prevented from passing through anytype of light-steering lens embodiment, a electro-optical coating material 179 of FIG. 19 can be applied to the curved-surface lens-cap area or to the light-guide stem interface-surface area. When an electrical potential (voltage, or current, or both) is applied to the electro-optical coating material 179 the incident light rays are shut-off or stopped-performing the same function as a light-switch. By simply removing the applied electrical potential from the electro-optical coating material 179 allows the incident light energy to flow through the light-steering lens once again. Still other electro-optical materials act as a light-switch (stops or allows the flow of light energy) in reverse to the applied electrical potential.

As illustrated in FIG. 240, unitary structure light-steering lens 144SV (as shown in FIG. 96) can be inserted into a lens-plate 174 of FIG. 227 and be permanently mounted by cement material 177 of FIG. 240 to form a light-guide lens V-shape embodiment in its simplest arrangement. Unitary structured light-steering lenses (solid or hollow centered) of FIG. 99, FIG. 102, FIG. 104, FIG. 107, FIG. 110, FIG. 113, or FIG. 116 can replace light-steering lens 96 of FIG. 240 under the same permanent mounting conditions 177 of FIG. 240—forming the same V-shape light-guide lens embodiment of FIG. 240.

Figure 95:
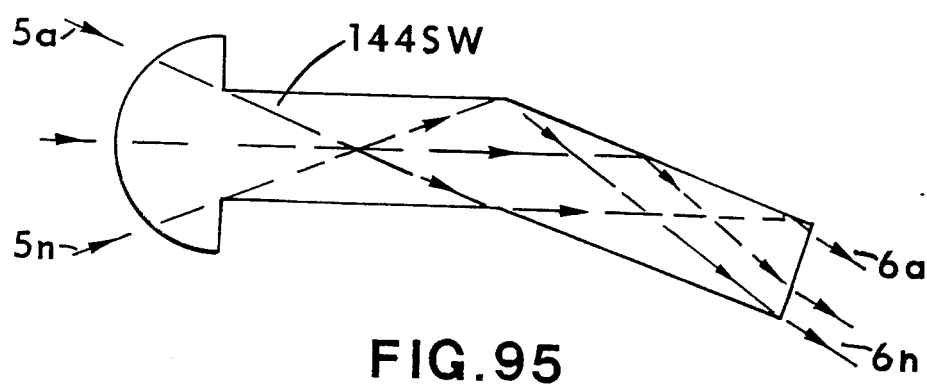
FIGS. 95, 96, and 97 Illustrates schematically a side view cross-section of a transparent solid material light-steering lens embodiment in its simplest form combined with light dispersing means and their effect upon the projected light beams.

FIG. 239 illustrates the insertion of a unitary structure light-steering lens 144SW of FIG. 95 into lens-plate 174 of FIG. 227 to form a light-guide lens W-shape embodiment in its simplest assembly. Unitary structure light-steering lenses (solid or hollow centered) of FIG. 98, FIG. 101, FIG. 106, FIG. 109, FIG. 113, FIG. 115, or FIG. 118, can replace light-steering lens 144SW of FIG. 239 under the same mounting condition 177 of FIG. 240—forming the same W-shape light-guide lens embodiment of FIG. 239.

Figure 97:
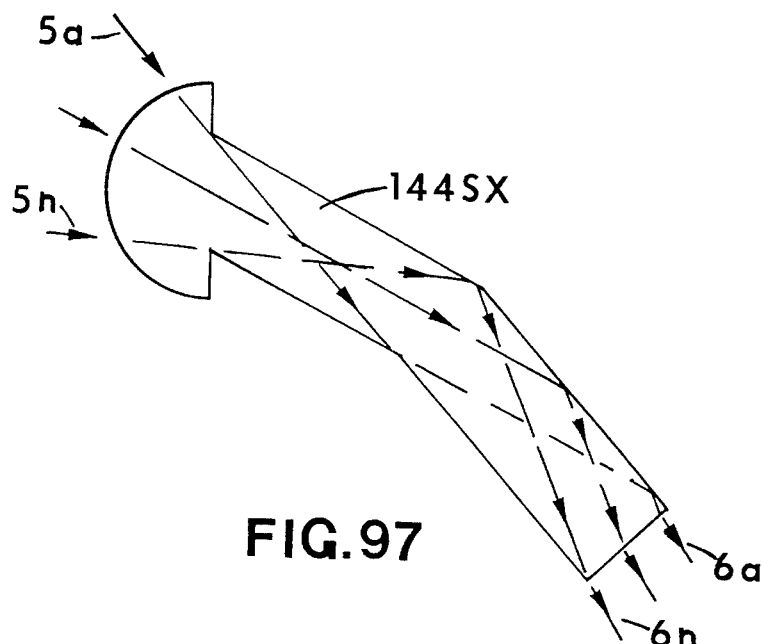
Figure 98:
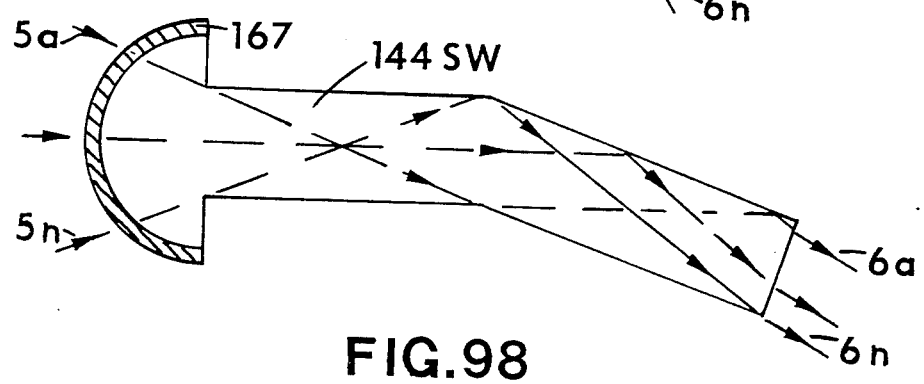
FIGS. 98, 99, and 100 Illustrates schematically a side view cross-section of a filter coated lens-cap curved-surface transparent solid material light-steering lens embodiment combined with light dispersing means and their effect upon the projected light beams.
Figure 99:
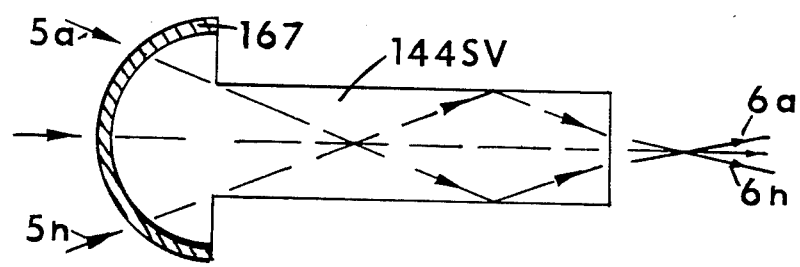
Figure 100:
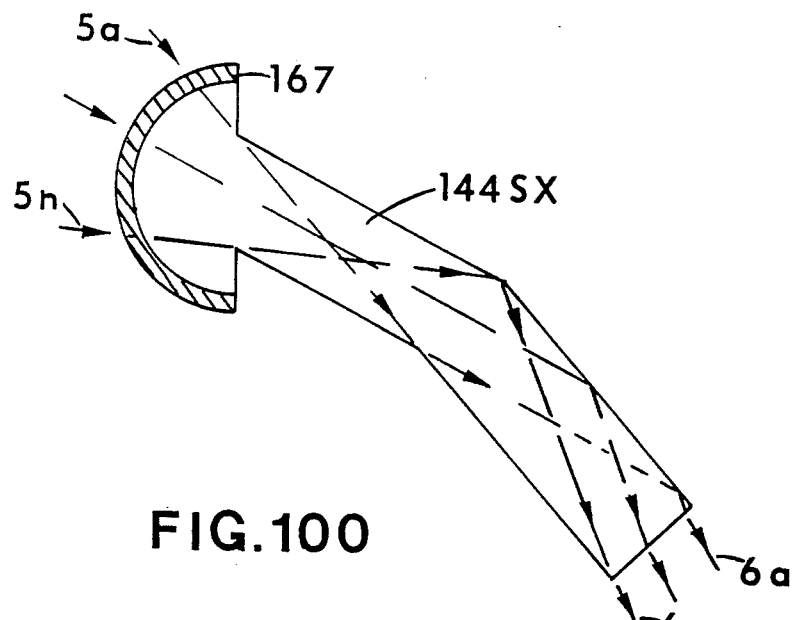
Figure 101:
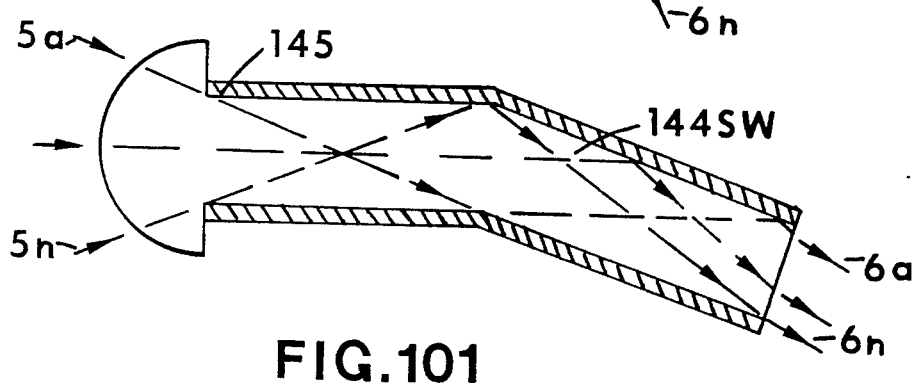
FIGS. 101, 102, and 103 Illustrates schematically a side view cross-section of a different refractive index material coated outer-stem-surface transparent solid material light-steering lens embodiment combined with light dispersing means and their effect upon the projected light beams.
Figure 102:
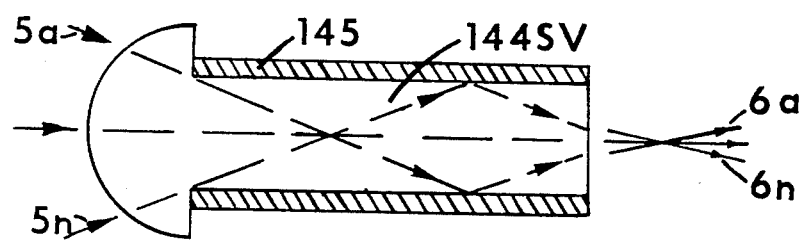
Figure 103:
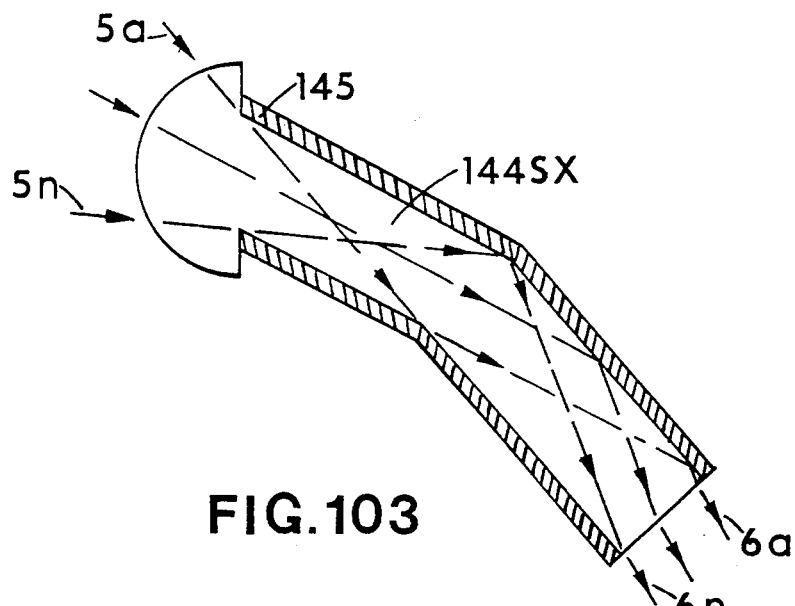
Figure 104:
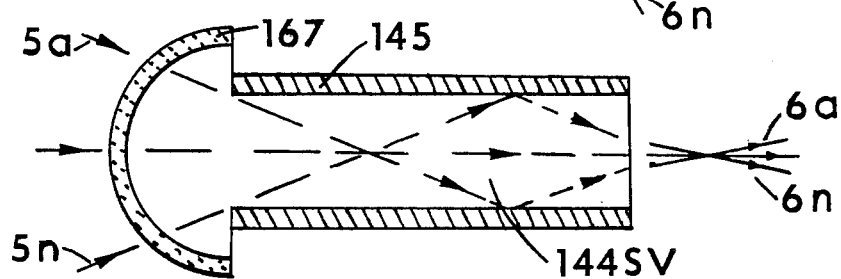
FIGS. 104, 105, and 106 Illustrates schematically a side view cross-section of a filter coated lens-cap curved-surface different refractive index material coated outer-stem-surface transparent solid material light-steering lens embodiment combined with light dispersing means and their effect upon the projected light beams.
Figure 105:
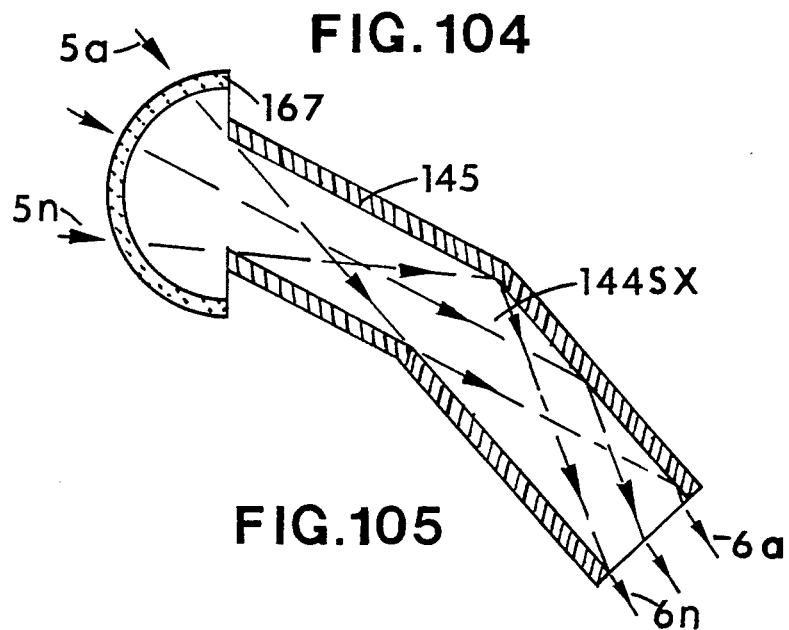
Figure 106:
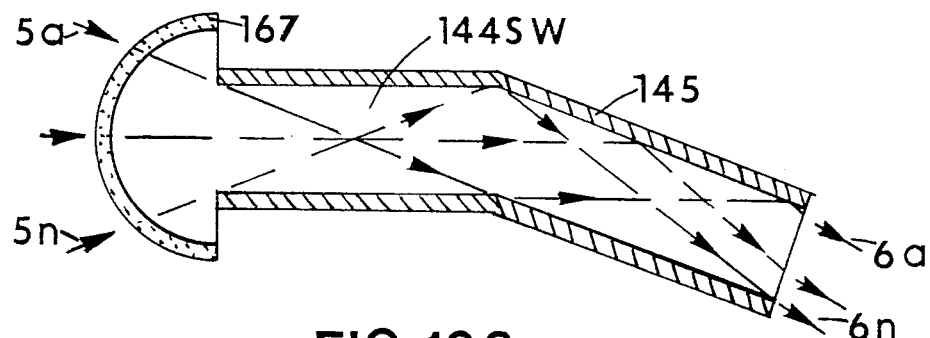
Figure 107:
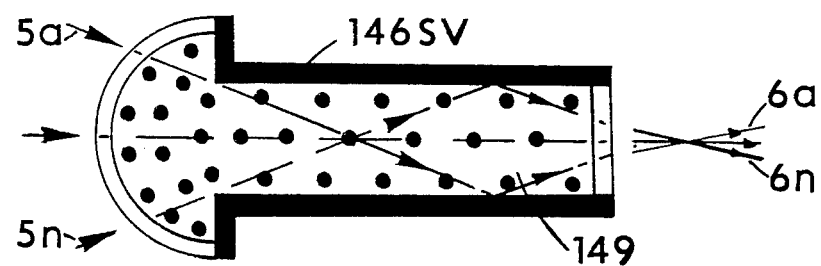
FIGS. 107, 108, and 109 Illustrates schematically a side view cross-section of a transparent thin-walled light transmittal gas filled light-steering lens embodiment combined with light dispersing means and their effect upon the projected light beams.
Figure 108:
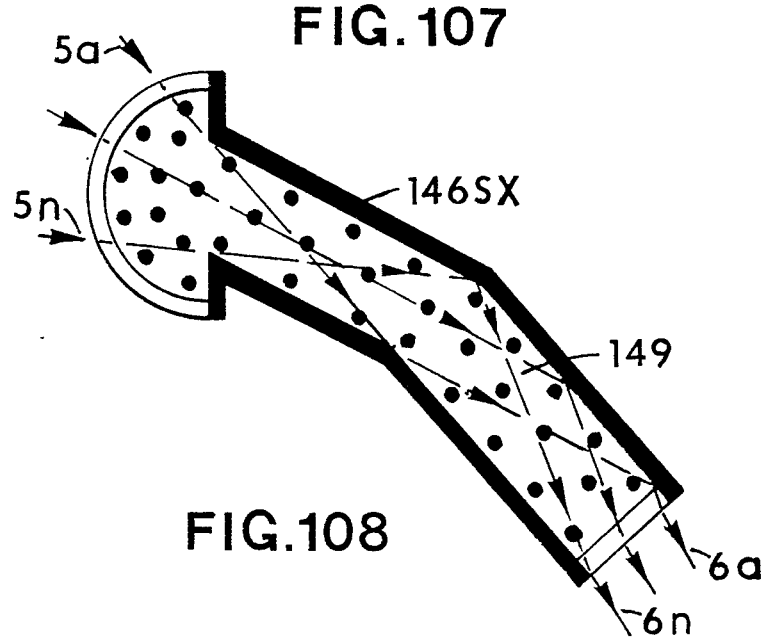
Figure 109:
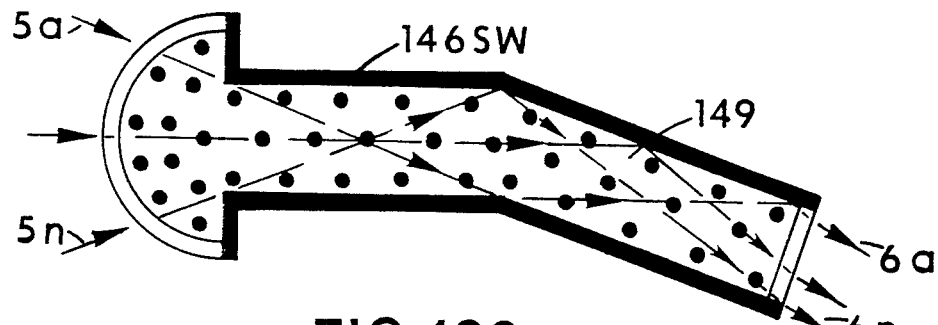
Figure 110:
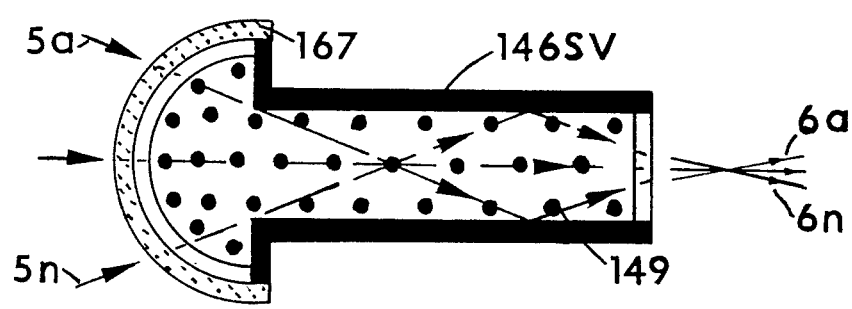
FIGS. 110, 111, and 112 Illustrates schematically a side view cross-section of a filter coated lens-cap curved-surface transparent thin-walled light transmittal gas filled light-steering lens embodiment combined with light dispersing means and their effect upon the projected light beams.
Figure 111:
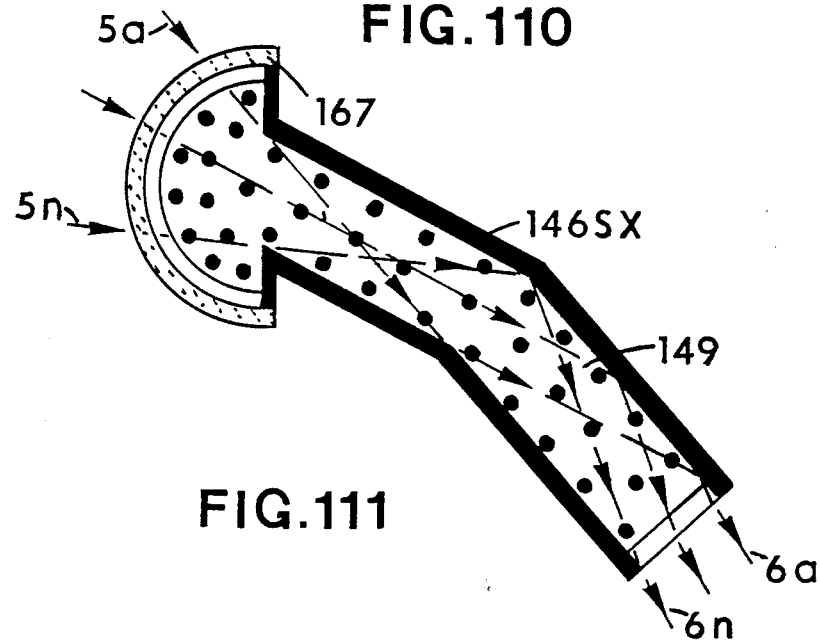
Figure 112:
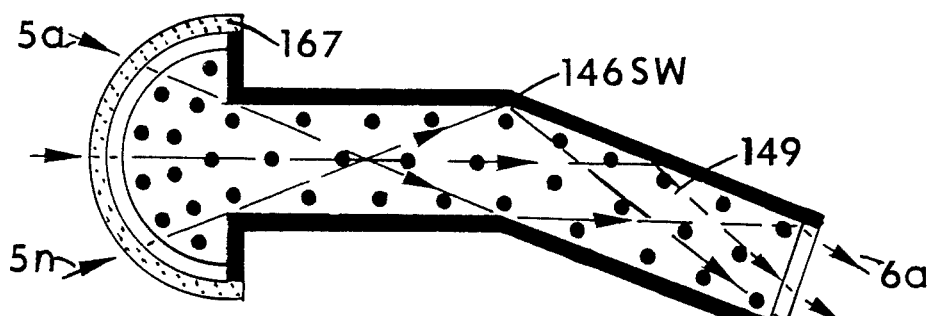
Figure 113:
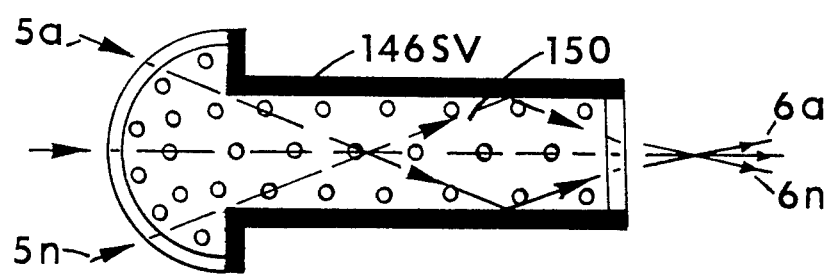
FIGS. 113, 114, and 115 Illustrates schematically a side view cross-section of a transparent thin-walled light transmittal liquid filled light-steering lens embodiment combined with light dispersong means and their effect upon the projected light beams.
Figure 114:
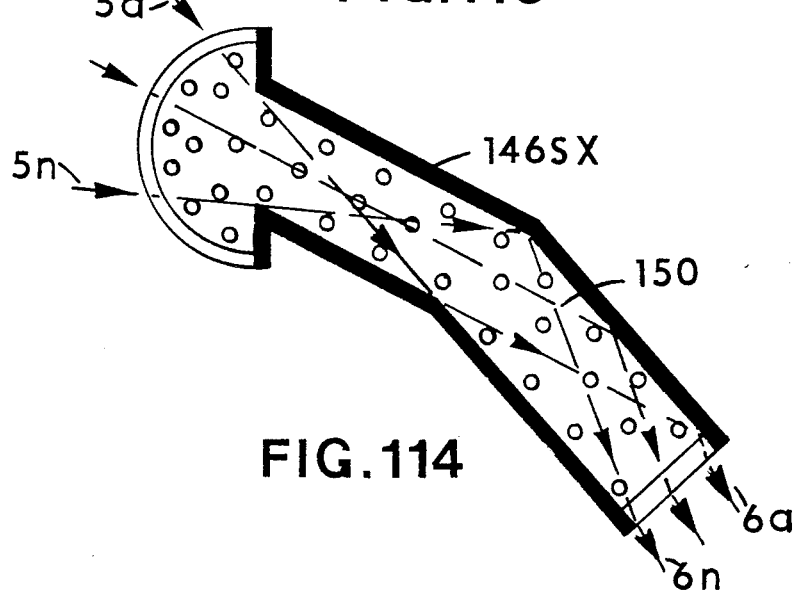
Figure 115:
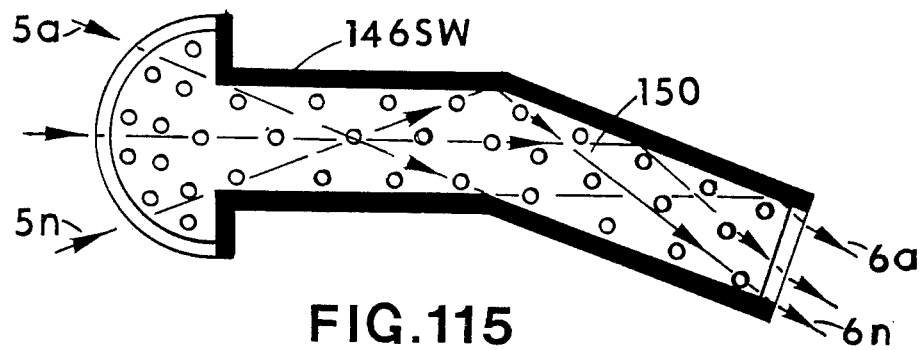
Figure 116:
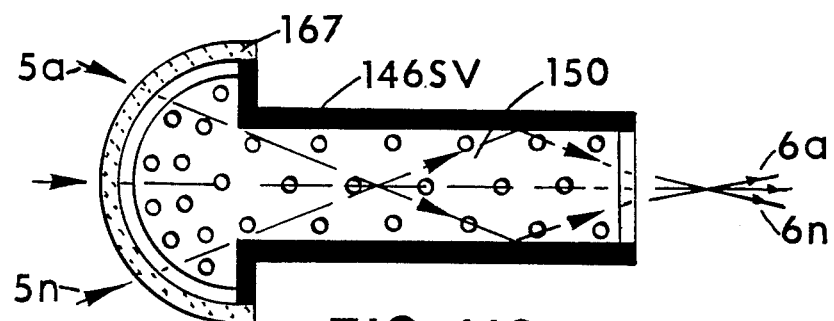
FIGS. 116, 117, and 118 Illustrates schematically a side view cross-section of a filter lens-cap curved-surface transparent thin-walled light transmittal liquid filled light-steering lens embodiment combined with light dispersing means and their effect upon the projected light beams.
Figure 117:
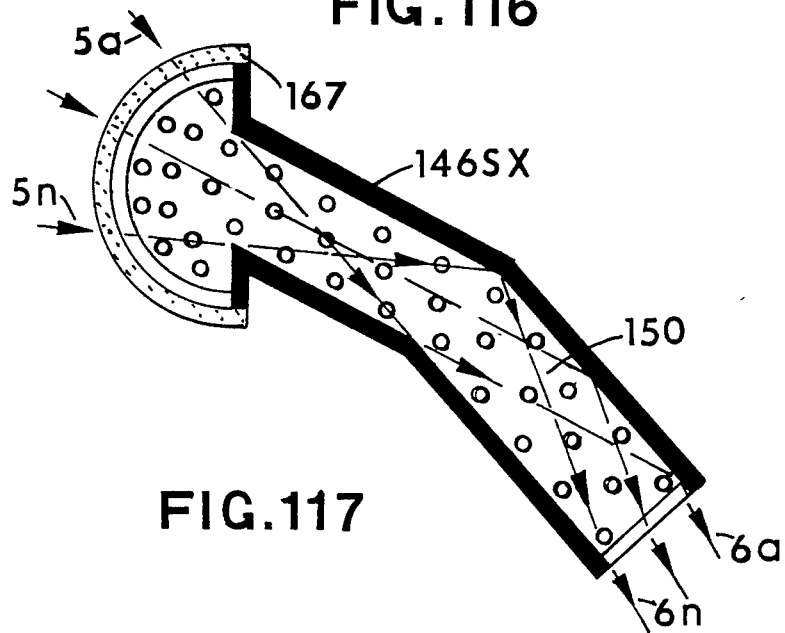
Figure 118:
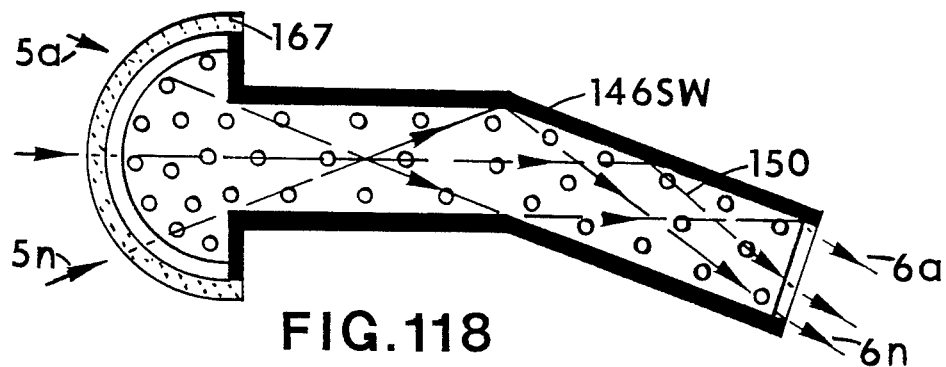
Figure 119:
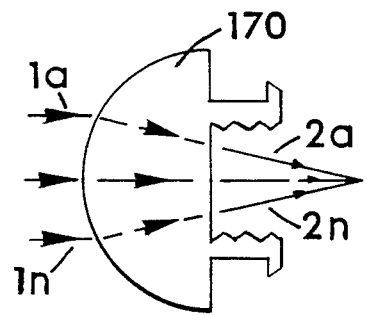
FIG. 119 Illustrates schematically a side view cross-section of a transparent solid material grip-lock collar lens-cap structure combined with light dispersing means and their effect upon the projected light beams.
Figure 120:
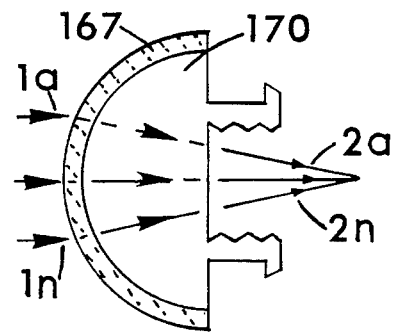
FIG. 120 Illustrates schematically a side view cross-section of a filter coated curved-surface transparent solid material grip-lock collar lens-cap structure combined with light dispersing means and their effect upon the projected light beams.
Figure 121:
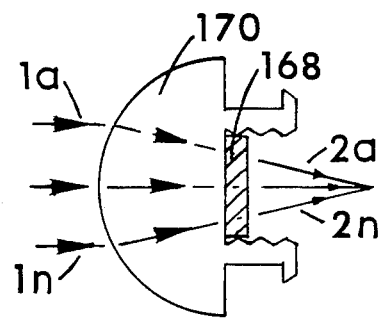
FIG. 121 Illustrates schematically a side view cross-section of a filter coated flat-surface transparent solid material grip-lock collar lens-cap structure combined with light dispersing means and their effect upon the projected light beams.
Figure 122:
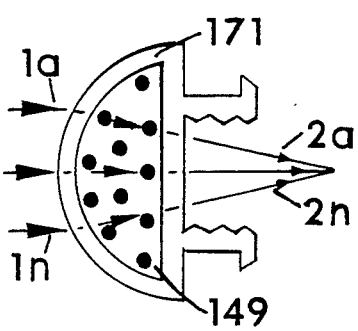
FIG. 122 Illustrates schematically a side view cross-section of a transparent thin-walled material light transmittal gas filled grip-lock collar lens-cap structure combined with light dispersing means and their effect upon the projected light beams.
Figure 128:
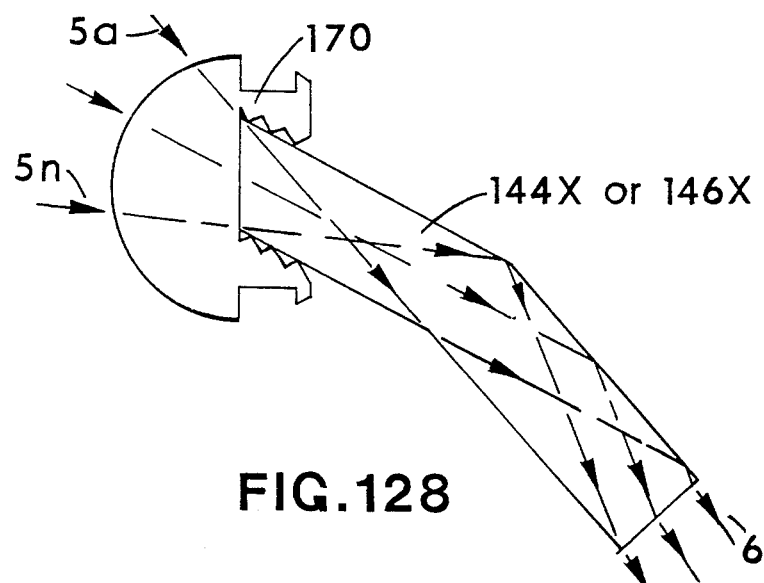
FIGS. 128, 129, and 130 Illustrates schematically a side view cross-section of a transparent solid material modular assembled grip-lock light-steering lens embodiment in its simplest form combined with light dispersing means and their effect upon the projected light beams.
Figure 129:
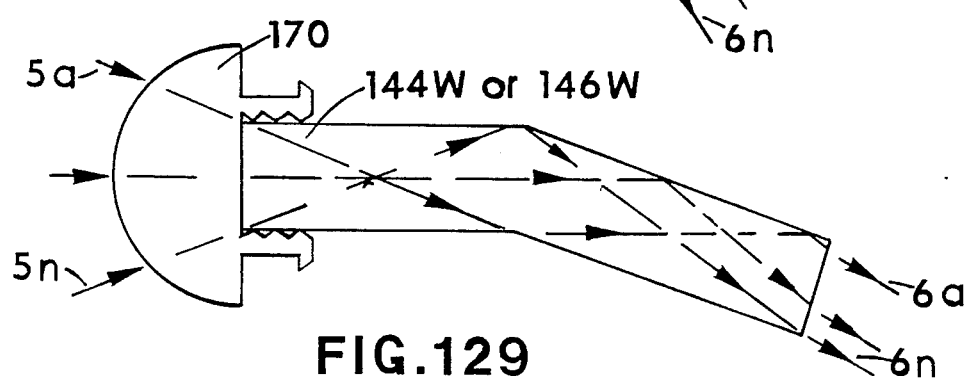
Figure 130:
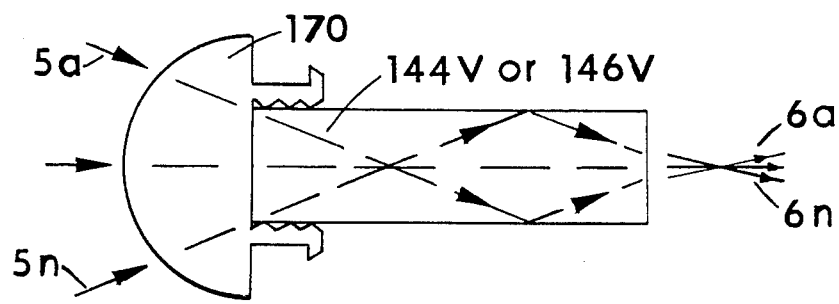
Figure 131:
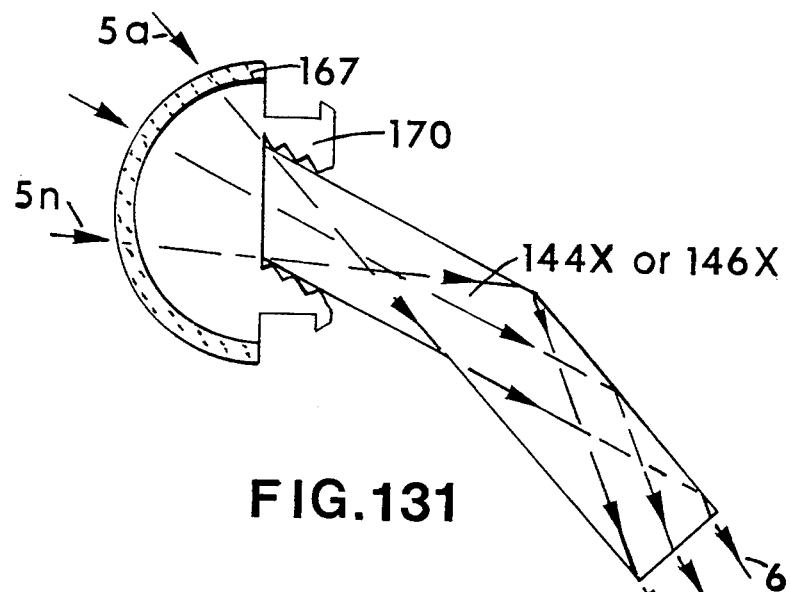
FIGS. 131, 132, and 133 Illustrates schematically a side view cross-section of a filter coated curved-surface transparent solid material modular assembled grip-lock light-steering lens embodiment combined with light dispersing means and their effect upon the projected light beams.
Figure 132:
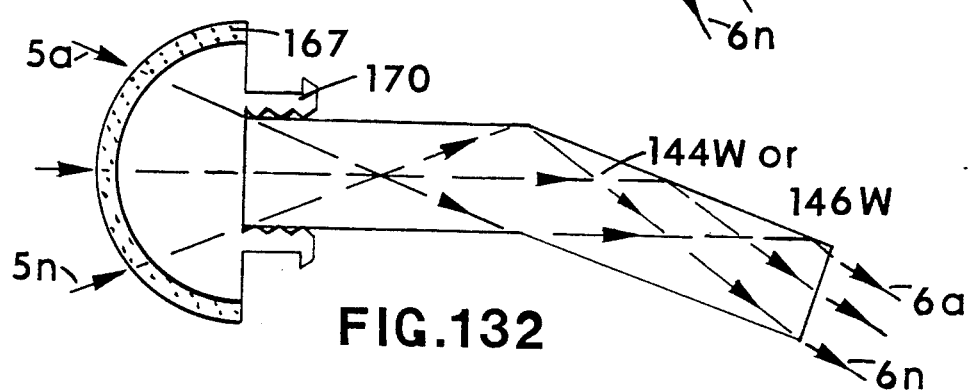
Figure 133:
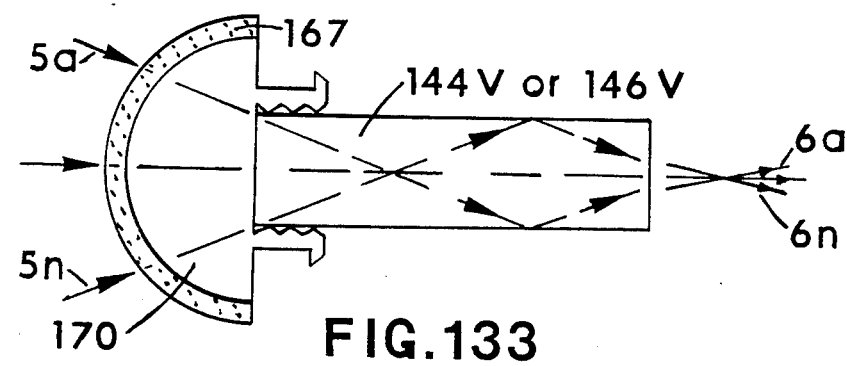
Figure 134:
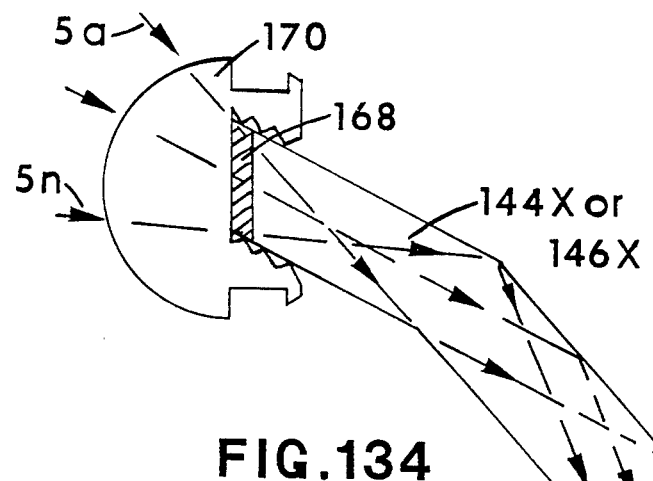
FIGS. 134, 135, and 136 Illustrates schematically a side view cross-section of a filter coated flat-surface transparent solid material modular assembled grip-lock light-steering lens embodiment combined with light dispersing means and their effect upon the projected light beams.
Figure 135:
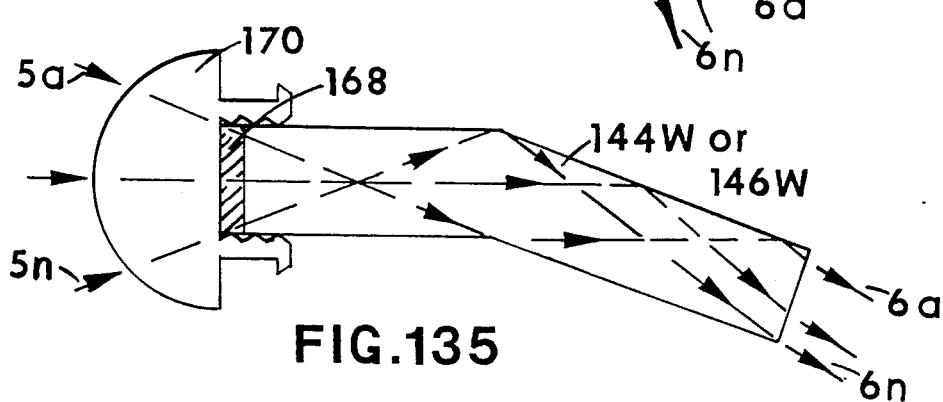
Figure 136:
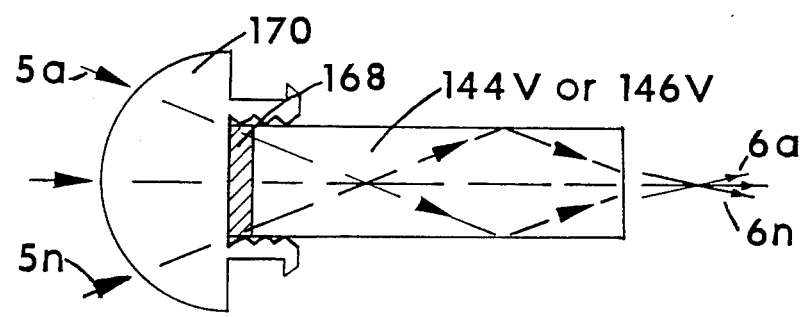
Figure 137:
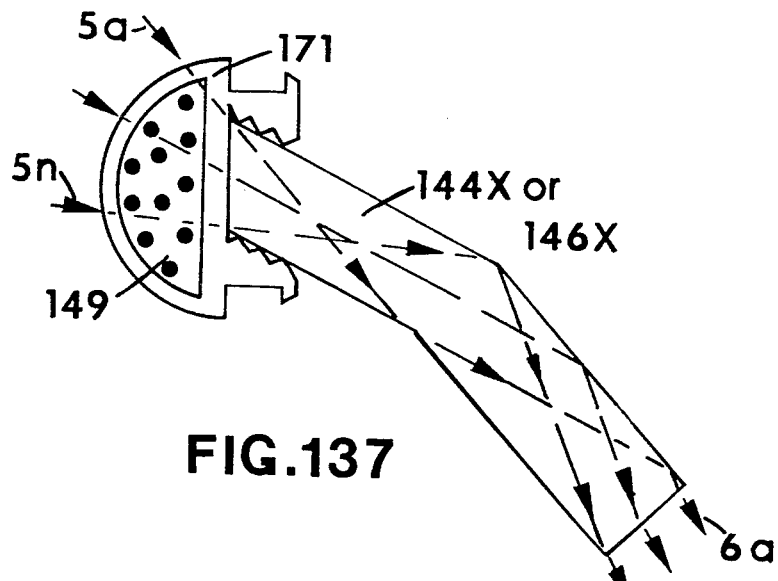
FIGS. 137, 138, and 139 Illustrates schematically a side view cross-section of a transparent thin-walled light transmittal gas filled modular assembled grip-lock light-steering lens embodiment combined with light dispersing means and their effect upon the projected light beams.
Figure 138:
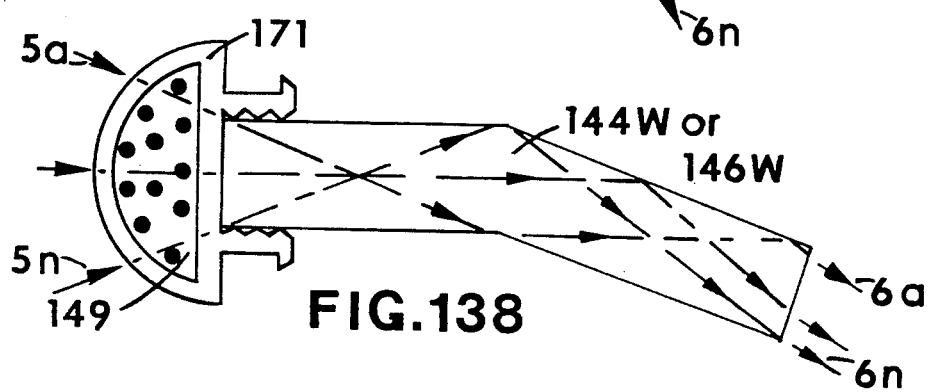
Figure 139:
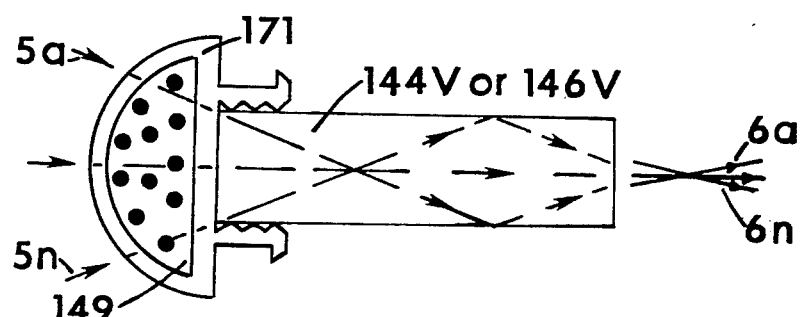
Figure 140:
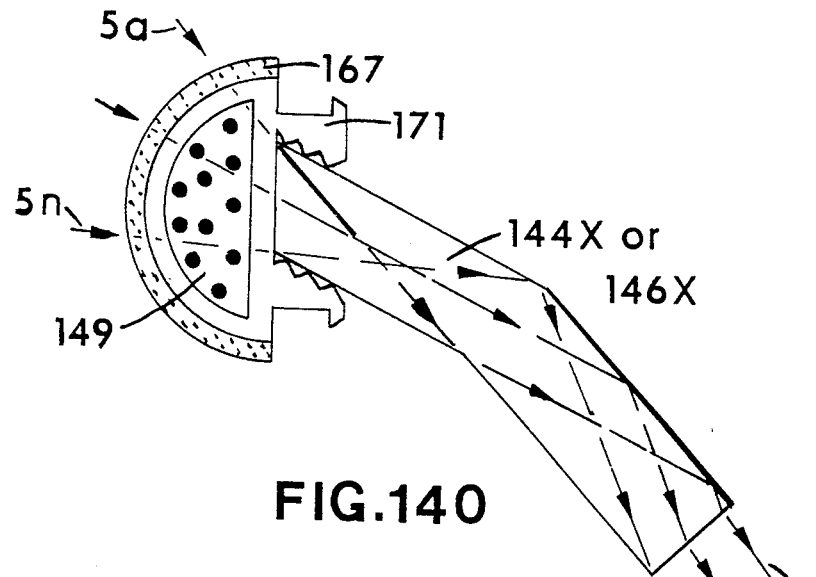
FIGS. 140, 141, and 142 Illustrates schematically a side view cross-section of a filter coated curved-surface transparent thin-walled light transmittal gas filled modular assembled grip-lock light-steering lens embodiment combined with light dispersing means and their effect upon the projected light beams.
Figure 141:
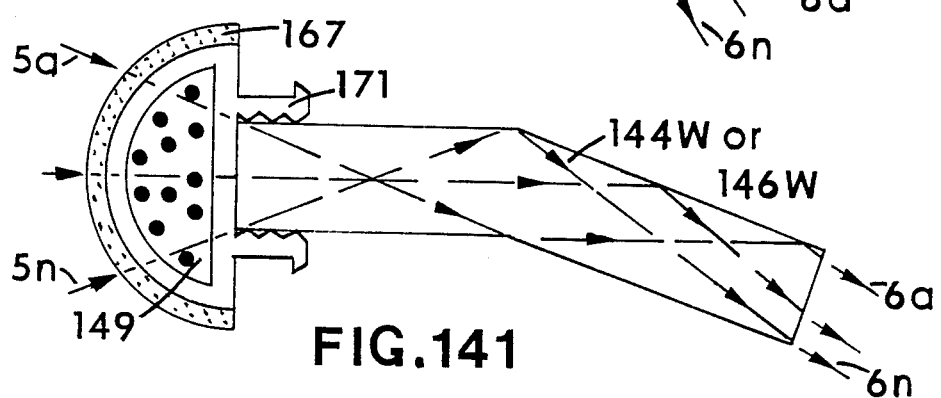
Figure 142:
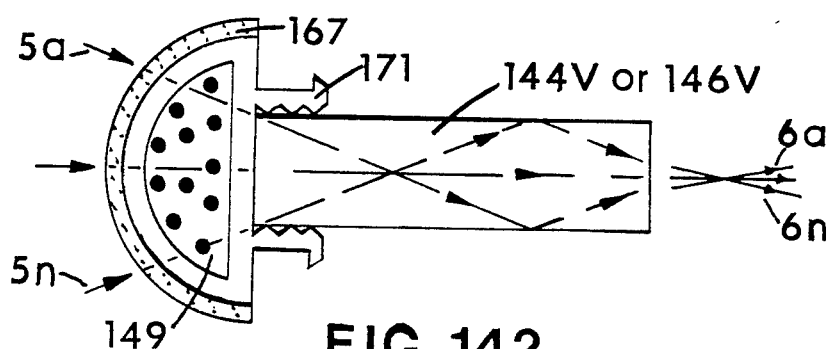
Figure 143:
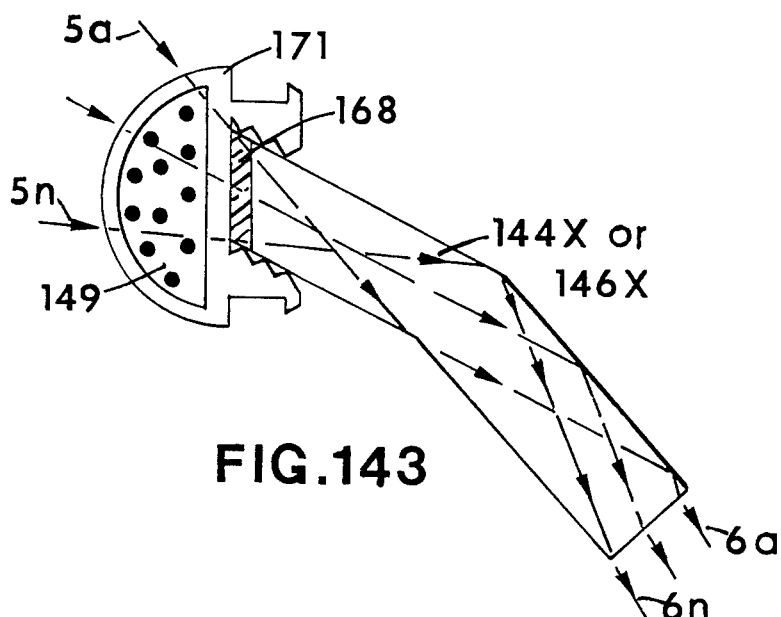
FIGS. 143, 144, and 145 Illustrates schematically a side view cross-section of a filter coated flat-surface transparent thin-walled light transmittal gas filled modular assembled grip-lock light-steering lens embodiment combined with light dispersing means and their effect upon the projected light beams.

FIG. 241 illustrates the insertion of a unitary structure light-steering lens 144SX of FIG. 97 into lens-plate 174 of FIG. 227 to form a light-guide lens X-shape embodiment in its simplest assembly. Unitary structure light-steering lens (solid or hollow centered) of FIG. 100, FIG. 103, FIG. 105, FIG. 108, FIG. 111, FIG. 114, or FIG. 117, can replace light-steering lens 144SX of FIG. 241 under the same mounting condition 177 of FIG. 240—forming the same X-shape light-guide lens embodiment of FIG. 239.

In cases where a removable unitary light-steering lens is required when forming a light-guide lens embodiment, a snap-lock collar 175 of FIG. 228 can be placed around the light-guide stem on any unitary light-steering lens as illustrated in FIG. 242 through FIG. 244. The resultant assembly with snap-lock collar 175 of FIG. 228 can, now, be inserted into lens-plate 174 as shown in FIG. 245 through FIG. 247.

When using a light-guide stem embodiment (single or bundle array) inserted into lens-plate 174 of FIG. 227 to form a non-lens-cap light-guide lens assembly, the same permanent (as shown in FIG. 230 through FIG. 232) or removable (as shown in FIG. 236 through FIG. 238) mounting techniques can be applied as illustrated in FIGS. 239 through 247.

To expand the incident light collection capabilities of a single light-guide lens embodiment, lens-plate 174 of FIG. 227 can be enlarged to lens-plate 174A of FIG. 263 (inline perforated hole arrangement) or to lens-plate 174B of FIG. 264 (alternating perforated hole arrangement) in order to accommodate for any number of light-steering lenses equal to the number of holes available per lens-plate sheet. In schematic cross-sectional view, FIG. 265 through FIG. 267 illustrates an array of permanently mounted light-guide stems (144W*a xxx n* of FIG. 265, 144V*a xxx n* of FIG. 266, and 144X*a xxx n* of FIG. 267) is a non-lens-cap light-guide lens structure. FIG. 271 through FIG. 273 illustrates an array of removable light-guide stems in a non-lens-cap light-guide lens structure. FIG. 268 through FIG. 270 illustrates an array of permanently mounted light-steering lenses (144SW*a xxx n* of FIG. 268, 144SV*a xxx n* of FIG. 269, and 144SX*a xxx n* of FIG. 270) in a light-guide lens structure. FIGS. 274 through 276 illustrates an array of removable light-steering lenses in a light-guide lens structure.

FIG. 257, FIG. 259, and FIG. 261, illustrates an array of permanently mounted light-guide stems (144X*a xxx n* of FIG. 257, 144W*a xxx n* of FIG. 259, and 144V*a xxx n* of FIG. 261) inserted into an array of lens-cap focusing lenses formed into a unitary lens-plate structure (172*a xxx n* of FIG. 191 through FIG. 193, or 173*a xxx n* of FIG. 194 thriugh FIG. 199) to makeup a light-guide lens structure (as shown in FIG. 200 through FIG. 226). FIG. 258, FIG. 260, and FIG. 262, illustrates an array of removable light-guide stems inserted into an array of lens-cap focusing plates (as illustrated in FIG. 200 through FIG. 226) to form a light-guide lens structure.

As illustrated in FIG. 200 through FIG. 226, FIG. 257 through FIG. 262, and FIG. 265 through FIG. 276, the light-guide lens embodiments demonstrates the uniform control of the directivity of incident light rays 5*a xxx n* to projected light rays 6*a xxx n* beyond a single to an array of light-steering lenses—evenly distributed and linearly alligned. Light-guide lens non-linearly allignment of projected light rays 6*a xxx n* is simply accomplished by longitudinally rotating one or more light-steering lenses within an array as shown in FIG. 278 and FIG. 279, by placement of different design light-steering lenses within the same array as illustrated in FIG. 280 and FIG. 281, or by combination of both (rotation and placement substitution within an array of light-steering lenses) as illustrated in FIG. 282.

With reference to FIG. 277, there is illustrated the fundamental principle of an array of light-steering lenses 41*a xxx* 41*n* of the present invention in controlling the directivity of incident light radiation from an arc of 80 degrees. In this embodiment the array of light-steering lenses (linear light-guide stem—identical in length and diameter) causes the incoming incident light rays 43*a xxx* 43*n* to be transmitted as light ray 44 to a focal region 45—providing non-focusing light transmission. By substituting linear stem light-steering lenses 41*a xxx* 41*n* of FIG. 277 with angular stem light-steering lenses 46*a xxx* 46*n* of FIG. 278 and rotated in opposite direction from center of array, the incoming light rays 49*a xxx* 49*n* (80° arc) will be transmitted as light rays 50 and 50*a* to a focal region 51—providing convergent focusing light transmission. With the angular stem light-steering lenses oriented in opposite direction from FIG. 278, the incoming incident light rays 56*a xxx* 56*n* (80° arc) will be transmitted as light rays 57 and 57*a* to a focal region 58—providing divergent focusing light transmission.

In another array of light-steering lenses, FIG. 280 illustrates FIG. 277 in combination arrangement with FIG. 278; FIG. 281 illustrates FIG. 277 in combination arrangement with FIG. 279; FIG. 282 illustrates a series combination arrangement 280; and FIG. 281 can be used in opposite orientation of FIG. 282.

Still in another array of light-steering lenses and somewhat similar to FIG. 279, the light-steering lenses 21*a xxx* 21*n* of lens-plate 23 and light-steering 22*a xxx* 22*n* of lens-plate 23*a* are linearly placed side-by-side as shown in FIG. 283. In this instance the lens-plate 23 comprising light-steering lenses 21*a xxx* 21*n* and lens-plate 23*a* comprising light-steering lenses 22*a xxx* 22*n* are at an angle (displaced from the horizontal) relative to each other. The result obtained is similar to that of FIG. 278. With the angle of lens-plate 23 and 23*a* as shown in FIG. 283, the incoming light rays 24*a xxx* 24*n* (80° arc) and 25*a xxx* 25*n* (80° arc) passes through the light-steering lenses 22*a xxx* 22*n* and 21*a xxx* 21*n* are transmitted as light rays 26 and 26*a* to a focal region 27.

With the angle of lens-plate 93 and 93*a* of FIG. 285 in reversed position from that shown in FIG. 283, the incoming light rays 94*a xxx* 94*n* (80° arc) will be transmitted as light radiation 95 and 96 but in dispersed direction to focal region 97 and 98 of of FIG. 285. By combining FIG. 283 with lens-plate 93 of FIG. 285 (light-steering lens 91*a xxx* 91*n* oriented in reverse direction) on one side and lens-plate 93*a* of FIG. 285 (light-steering lenses 92*a xxx* 92*n* orientated in reverse direction) on the other side, FIG. 288 is formed for the purpose of trifocusing incident light rays 127*a xxx* 127*n* (80° arc).

The angle of the incoming light 43 of the light-steering lenses 41*a xxx* 41*n* of the planar array of FIG. 277 is depicted in an arc of 80 degrees from the horizontal. similarly, the incident light rays 49 of FIG. 278 and light rays 24 and 25 of FIG. 283 are in an arc of 80 degrees from the vertical. In certain lighting instances, whether natural as the sun or artificial, the light source is displaced at some angle in both the vertical and the horizontal. Also as with the sun, the displaced angle will vary from one period of time to another. To utilize the light rays from a light source in a continuous movement—at some angle starting in the horizontal, passing through the vertical, and again to the horizontal—the contoured configuration of FIG. 286 is used. The lens-plate 102, comprising the array of light-steering lenses 101*a xxx* 101*n*, is a unitary semi-circular structure as shown. With the light-steering lenses 101*a xxx* 101*n* of FIG. 286, the incoming light rays 103*a xxx* 103*n* are directed and transmitted as light radiation 104 to the central focal region 105. The light transmission is continuous through the horizontal-vertical-horizontal angular excursion of the incident light 103*a xxx* 103*n* from the moving light source.

Likewise, FIG. 287 performs the same directivity of light control as FIG. 280 except for the fact that FIG. 287 scan range is extended from 180 degrees of FIG. 286 to 360 degrees of FIG. 287.

Referring now to FIG. 284, there is illustrated an arrangement of light-steering lenses that utilize the aforementioned control principles. In this embodiment the light-steering lenses 31*a xxx* 31*n* and 32*a xxx* 32*n* are also at an angle intermediate between the vertical and the horizontal. The lens-plate 33 and 34 are placed upright to direct the incident light 35*a xxx* 35*n* and 36*a* xxx 36n as transmitted light radiation 37 and 37a to focal region 38.

As set forth above relative to FIG. 286, the light source may pass through an angular excursion of horizontal-vertical-horizontal. Similarly the light source may have an angular excursion only in the horizontal. The embodiment of light-steering lenses 35a xxx 35n and 36a xxx 36n of FIG. 284 is effective to control to focal region 38 the incident light from a source having opposing directions intermediate of the vertical and horizontal. The incident light 35a xxx 35n and incident light 36a xxx 36n of FIG. 284 may emanate from a pair of alternately positioned light sources. In that instance the lens-plate 33 and lens-plate 34 are a pair of upright planar arrays. However, if the incident light 35 and the incident light 36 emanate from a single source passing from left to right, the lens-plate 33 and the lens-plate 34 are, in actuality, of cylindrical or semi-cylindrical configuration.

In furtherance of the invention, light-guide lens structure 20 of FIG. 283 can be placed on top of light-guide lens structure 30 of FIG. 284 to form silo capping lens assembly (primary stage) 190 of FIG. 290 to provide a central focal region 133 for transmitted light radiation 26a xxx 26n and 37a xxx 37n. Similarly in assembly, light-guide lens sructure 40A of FIG. 277, 40B of FIG. 278, 40C of FIG. 279, 40D of FIG. 280, 40E of FIG. 281, or 40F of FIG. 282 can be placed on top of lens structure 30 of FIG. 284 to form feeder lens assembly (secondary stage) 180 of FIG. 289 to provide a central focal region 132 for transmitted light radiation 44a xxx 44n and 37a xxx 37n.

By simply placing silo capping lens assembly (primary stage) 190 of FIG. 290 on top of feeder lens assembly (secondary stage) 180 of FIG. 289 to form modular assembled silo lens assembly 200 of FIG. 291, the central focal region 132 of FIG. 289 and focal region 133 of FIG. 290 is, now, changed to focal region 134 of FIG. 291. To increase incident light collection still further, additional feeder stages 180a xxx 180n can be stacked one on top of the other (vertical arrangement) and joined beneath FIG. 291 to form a more vertical upright silo lens modular structure. Regardless of the number of stacked feeder lens stages 180a xxx 180n, the focal region 134 of FIG. 291 will always remain at bottom of vertically extended silo lens modular structure.

To increase focusability of silo lens assembly 200 of FIG. 291 still further, focal region 134 of FIG. 291 can be replaced by lens structure 40A through 40F—as illustrated in silo lens assembly 210 of FIG. 292. Instead of having a singular focal region 135 (as illustrated in FIG. 292), a multi-focal region 136, 136a, and 137, can be obtained by using angular lens structure 120 of FIG. 288 in place of 40 series lens structures as shown in silo lens assembly 220 of FIG. 293.

FIG. 1 through FIG. 293 are aforesaid schematic in cross-sectional view to illustrate the function and operation of an array of light-steering lenses within a given light-guide lens form to control the directivity of light rays emanating from a stationary or moving light source at various angles.

With reference to FIG. 294 through FIG. 371, there are illustrated several additional embodiments in an overall pictorial view of the present invention. FIG. 294 is a lens-cap 140; FIG. 295 is a modular lens-cap 170; FIG. 296 is a lens-plate 174; FIG. 297 is a modular assembled lens-cap focusing plate 174-170; FIG. 298 is a unitary lens-cap focusing plate 174-140; FIG. 299 is a disc light filter 168; FIG. 300 is a lens-cap light filter 167; FIG. 301 through FIG. 304 are optical-rod light-guide stems; FIG. 305 through 308 are bundle array of optical-rod light-guide stems; FIG. 309 through 312 are sheathe bundle array of optical-rod light-guide stems; FIG. 313 through 316 are optical-tubing light-guide stems; FIGS. 317 and 318 are gripping collars; FIG. 319 through FIG. 326 are grip-lock collars mounted on light-guide stems; FIGS. 327 through 330 are solid structured light-steering lenses; FIG. 331 through FIG. 338 are modular assembled light-steering lenses.

Still further in pictorial view, FIG. 339 through FIG. 342 are non-removable light-guide lens structures; FIG. 343 through FIG. 346 are removable light-guide lens structures; FIGS. 347 through 350 are non-removable non-lens-cap light-guide lens structures; FIG. 351 is a perforated lens-plate; FIG. 352 is a removable lens-cap lens plate; FIG. 353 is non-removable lens-cap lens-plate; FIG. 354 is linear light-guide lens embodiment; FIG. 355 is a angular light-guide lens embodiment; FIG. 356 is a tilt angular light-guide lens embodiment; FIG. 357 is a curved-angular light-guide lens embodiment; FIG. 358 is a linear/angular/tilt-angular/curved-angular light-guide lens embodiment.

Still further in component assembly in pictorial view, FIG. 359 is a disc-shaped light-guide lens embodiment; FIG. 360 is a cone-shaped light-guide lens embodiment; FIG. 361 is a cylindrical-shaped light-guide lens embodiment; FIG. 362 is a hemispherical-shaped light-guide lens embodiment; FIG. 363 is a square-shaped light-guide lens embodiment; FIG. 364 is a V-shaped light-guide lens embodiment; FIG. 365 is a semi-circular-shaped light-guide lens embodiment; FIG. 366 is a disc-cone-shaped light-guide lens embodiment; FIG. 367 is a unidirectional-triangular-shaped light-guide lens embodiment; FIG. 368 is a silo light-guide lens embodiment; FIG. 369 is a feeder stage light-guide lens embodiment; FIG. 370 is a multi-stage silo light-guide lens embodiment; and FIG. 371 is a multi-stage silo light-guide lens embodiment with condensing lens embodiment.

Although only a specific and preferred embodiment of the invention has been shown and described, it is understood that modifications may be had thereto without departing from the true spirit and scope of the invention.

What is claimed is:

1. A solar energy light-guide collector-concentrator silo lens comprising an array of light-steering lenses inserted into a silo lens-plate in combination:

an enclosure, a contoured capping light-guide lens positioned in the upper most region of said enclosure, said contoured capping light-guide lens comprising an array of light-steering lenses inserted into said contoured capping lens-plate, said light-steering lenses periodically displaced from each other in said array and wherein said light-steering lenses are directive to focus said solar energy to a plurality of spaced transference light-guide lenses in stacked relationship.

A focusing light-guide lens section positioned in the lower most region of said enclosure, said focusing light-guide lens comprising an array of light-steering lenses inserted into said focusing lens-plate, said light-steering lenses periodically displaced from each other in said array and wherein said light-steering lenses are directive to focus said collected solar energy to a central region.

A contoured light-guide wall lens positioned within said enclosure intermediate of said contoured capping light-guide lens and said focusing light-guide lens and perimeter position around said transference light-guide lenses, said wall lens comprising an array of light-steering lenses inserted into said contoured wall lens-plate, said light-steering lenses periodically displaced in said array and wherein said light-steering lenses are operative to uniformly distribute said solar energy to said transference light-guide lenses.

Said enclosure further comprises a plurality of spaced transference light-guide lenses in stacked relationship within said wall lens, said transference light-guide lens comprising an array of light-steering lenses inserted into said flat-surface lens-plate, said light-steering lenses periodically displaced from each other in said array and wherein said light-steering lenses are directive to transfer said collected solar energy to said focusing lens.

2. The light-guide silo lens of claim 1 wherein said light-guide lenses further comprises an array of removable light-steering lenses inserted into said lens-plate.

3. The light-guide lens of claim 2 wherein said light-steering lenses can be replaced by light-guide stems either in part or all of said array.

4. The light-guide lens of claim 2 wherein said lens-plate can be any type of perforated material that conforms to any desired geometrical shape.

5. The light-guide lens of claim 3 wherein said light-guide stem lens-core is made up of material (solid, liquid, or gas) that is transparent and reflective to incident light radiation and wherein said transparent material uses the principle of total internal reflection for light transmission.

6. The light-guide lens of claim 3 wherein said light-guide stem can be angularly displaced to change the transmission angle of the incident light rays from horizontal to vertical at an angle-of-bend not to exceed the critical angle of reflection of the transparent material being used.

7. The light-guide lens of claim 2 wherein said light-steering lens is formed by affixing said focusing lens-cap to said light-guide stem.

8. The light-guide lens of claim 2 wherein said light-steering lens can be formed (in part or all) by an light-filtering material for the purpose of blocking any or all unwanted or harmful light rays.

9. The light-guide lens of claim 1 wherein said light-steering lens can have an electro-optical material affixed to said light-steering lens in order to shut-off the flow of incoming incident light rays when an electrical potential (voltage, current, or both) is applied to said electro-optical material.

10. The light-guide lens of claim 4 wherein said lens-plate can have the focusing lens-cap affixed to said lens-plate and wherein said light-guide stem can be inserted into said lens-cap-focusing-plate assembly to form said light-guide lens.

* * * * *